(12) United States Patent
Iida et al.

(10) Patent No.: US 8,692,234 B2
(45) Date of Patent: Apr. 8, 2014

(54) POLYMER COMPOUND, NET-LIKE POLYMER COMPOUND PRODUCED BY CROSSLINKING THE POLYMER COMPOUND, COMPOSITION FOR ORGANIC ELECTROLUMINESCENCE ELEMENT, ORGANIC ELECTROLUMINESCENCE ELEMENT, ORGANIC EL DISPLAY, AND ORGANIC EL LIGHTING

(75) Inventors: Koichiro Iida, Kanagawa (JP); Kyoko Endo, Kanagawa (JP); Yanjun Li, Kanagawa (JP); Kazuki Okabe, Kanagawa (JP); Masayoshi Yabe, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 466 days.

(21) Appl. No.: 12/936,136

(22) PCT Filed: Apr. 1, 2009

(86) PCT No.: PCT/JP2009/056829
§ 371 (c)(1),
(2), (4) Date: Jan. 24, 2011

(87) PCT Pub. No.: WO2009/123269
PCT Pub. Date: Oct. 8, 2009

(65) Prior Publication Data
US 2011/0108814 A1    May 12, 2011

(30) Foreign Application Priority Data
Apr. 2, 2008  (JP) .................................. 2008-096522

(51) Int. Cl.
*H01L 35/24* (2006.01)

(52) U.S. Cl.
USPC ...................................... 257/40; 257/E51.001

(58) Field of Classification Search
USPC .............................................. 257/40, E51.001
See application file for complete search history.

(56) References Cited

U.S. PATENT DOCUMENTS

| 5,929,194 A | 7/1999 | Woo et al. |
| 2003/0068527 A1 | 4/2003 | Noguchi et al. |
| 2007/0063191 A1 | 3/2007 | Inbasekaran et al. |
| 2007/0102695 A1 | 5/2007 | Inbasekaran et al. |
| 2008/0097076 A1 | 4/2008 | Radu et al. |

FOREIGN PATENT DOCUMENTS

| CN | 101945925 A | 1/2011 |
| EP | 2 112 702 A1 | 10/2009 |
| EP | 2 270 069 A1 | 1/2011 |

(Continued)

OTHER PUBLICATIONS

International Search Report issued Jun. 16, 2009 in PCT/JP09/56829 filed Apr. 1, 2009.

(Continued)

*Primary Examiner* — Anthony Ho
(74) *Attorney, Agent, or Firm* — Oblon, Spivak, McClelland, Maier & Neustadt, L.L.P.

(57) ABSTRACT

An object of the invention is to provide a polymer compound having a high hole transport capacity, excellent in electrochemical stability, and suitable to film formation according to a wet film formation method. Another object of the invention is to provide an organic electroluminescence element having a high current efficiency, a low drive voltage, and a long derive lifetime. The polymer compound has a crosslinking group bonding to the arylamine moiety in the repeating unit via at least one single bond therebetween.

9 Claims, 1 Drawing Sheet

1: Substrate
2: Anode
3: Hole Injection Layer
4: Hole Transport Layer
5: Light Emission Layer
6: Hole Inhibition Layer
7: Electron Transport Layer
8: Electron Injection Layer
9: Cathode

(56) References Cited

FOREIGN PATENT DOCUMENTS

| JP | 2003 147347 | 5/2003 |
|----|----|----|
| JP | 2007-511636 | 5/2007 |
| JP | 2007 528916 | 10/2007 |
| JP | 2007 324280 | 12/2007 |
| JP | 2008 280386 | 11/2008 |
| JP | 4761006 | 6/2011 |
| TW | 588105 | 5/2004 |
| WO | WO 2005/052027 A1 | 6/2005 |
| WO | WO 2006/043087 A1 | 4/2006 |
| WO | WO 2007/076146 A2 | 7/2007 |
| WO | WO 2007/076146 A3 | 7/2007 |
| WO | 2008 024379 | 2/2008 |
| WO | 2008 032843 | 3/2008 |

OTHER PUBLICATIONS

Jungermann, Steffen et al., "Novel Photo-Cross-Linkable Hole-Transporting Polymers: Synthesis, Characterization, and Application in Organic Light Emitting Diodes", Macromolecules, vol. 39, No. 26, pp. 8911-8919, (2006).

Office Action issued Jun. 11, 2012, in European Patent Application No. 09 728 039.0.

Extended European Search Report issued May 25, 2011, in Patent Application No. 09728039.0.

Office Action issued Apr. 5, 2012 in Chinese Application No. 200980110914.0 (with English Translation).

Chinese Office Action issued Jan. 16, 2013, in China patent application No. 200980110914.0 (with English translation).

European Office Action Issued May 10, 2013 in Patent Application No. 09 728 039.0.

Taiwanese Office Action issued Jul. 15, 2013, in Taiwan Patent Application No. 098110994 (with English translation).

Office Action issued Aug. 14, 2013 in CN Patent application No. 200980110914.0 with English language translation.

Office Action issued Dec. 13, 2013 in JP patent application No. 2009-090537 with English language translation.

Office Action issued Dec. 17, 2013 in CN patent application No. 200980110914.0 with English language translation.

Office Action issued Jan. 10, 2014 in EP patent application No. 09 728 039.0-1306.

Office Action issued Feb. 10, 2014, in TW Patent Application No. 098110994 with English translation.

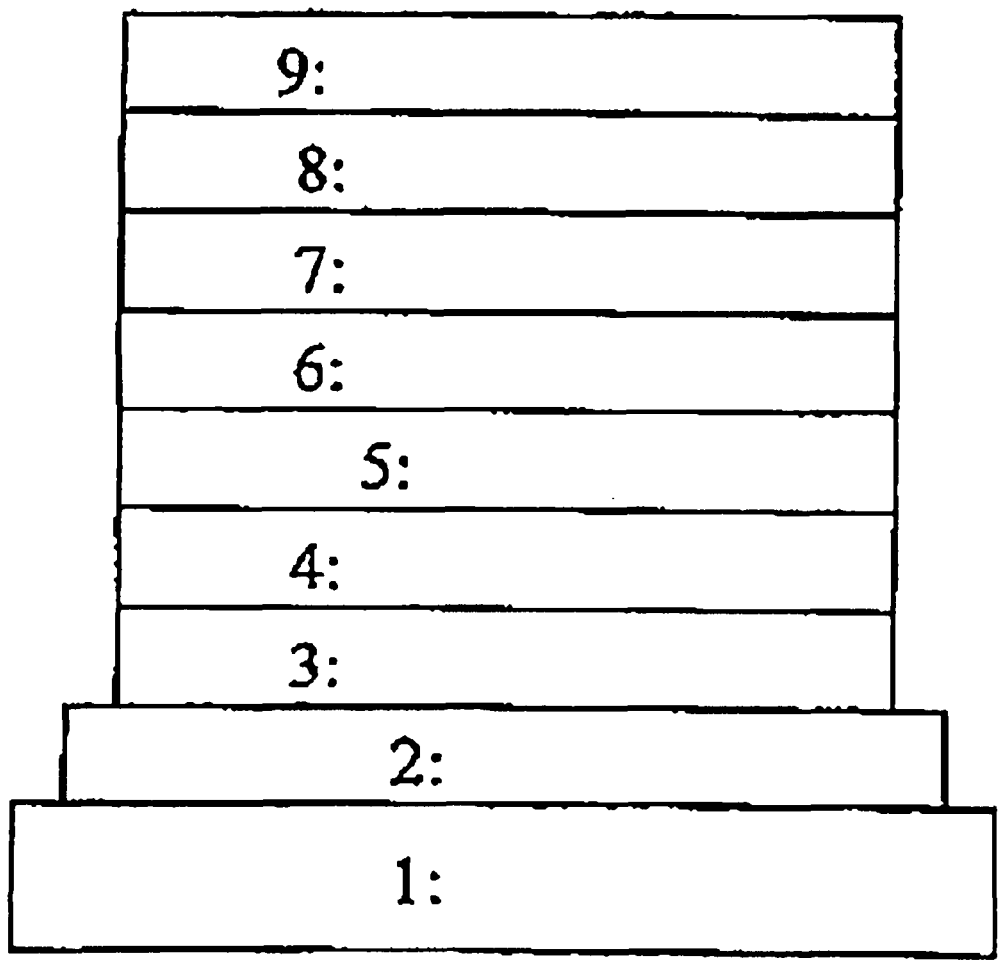
1: Substrate
2: Anode
3: Hole injection Layer
4: Hole Transport Layer
5: Light Emission Layer
6: Hole Inhibition Layer
7: Electron Transport Layer
8: Electron Injection Layer
9: Cathode

POLYMER COMPOUND, NET-LIKE POLYMER COMPOUND PRODUCED BY CROSSLINKING THE POLYMER COMPOUND, COMPOSITION FOR ORGANIC ELECTROLUMINESCENCE ELEMENT, ORGANIC ELECTROLUMINESCENCE ELEMENT, ORGANIC EL DISPLAY, AND ORGANIC EL LIGHTING

TECHNICAL FIELD

The present invention relates to a polymer compound having a crosslinking group and capable of forming a film according to a wet film formation method, to a net-like polymer compound produced by crosslinking the polymer compound, to a composition for organic electroluminescence elements that contains the polymer compound, to an organic electroluminescence element having a layer that contains the net-like polymer compound, having a high current efficiency and excellent in drive stability, and to an organic EL display and an organic EL lighting equipped with the device.

BACKGROUND ART

Recently, an electroluminescence element comprising an organic thin film (organic electroluminescence element) has been developed. For forming an organic thin film in an organic electroluminescence element, there are mentioned a vacuum evaporation method and a wet film formation method.

The vacuum evaporation method facilitates lamination, therefore having the advantages in that it improves charge injection from anode and/or cathode and facilitates exciton containment in light emission layer. The wet film formation method has the advantages in that it does not require a vacuum process and facilitates large-area film formation and facilitates incorporation of plural materials having different functions in one layer (coating liquid).

However, lamination is difficult in the wet film formation method, and therefore the method is inferior to the vacuum evaporation method in drive stability, and at present, it is not as yet on a practicable level except some cases. In particular, the wet film formation method may enable two-layer lamination using an organic solvent and a water-base solvent, but three-layer or more multi-layer lamination is difficult in the method.

To solve the problems with lamination, Patent Reference 1 has proposed a polymer compound having a crosslinking group and having repeating units (III-1) and (III-2) mentioned below, and discloses a lamination method in which the reaction of the crosslinking group makes the compound insoluble in organic solvent.

[Chemical Formula 1]

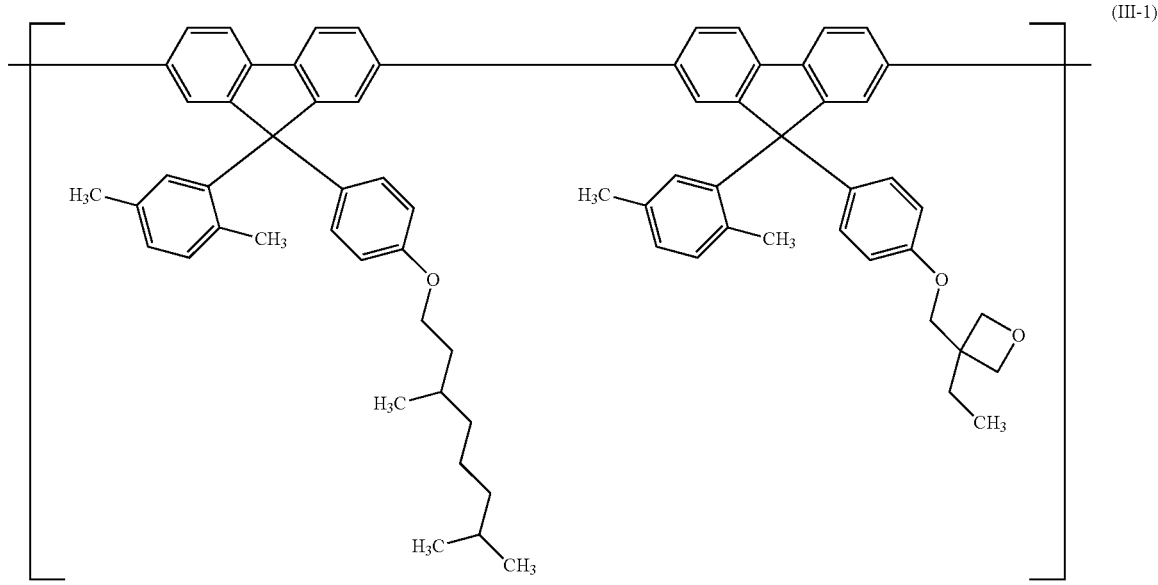

[Chemical Formula 2]

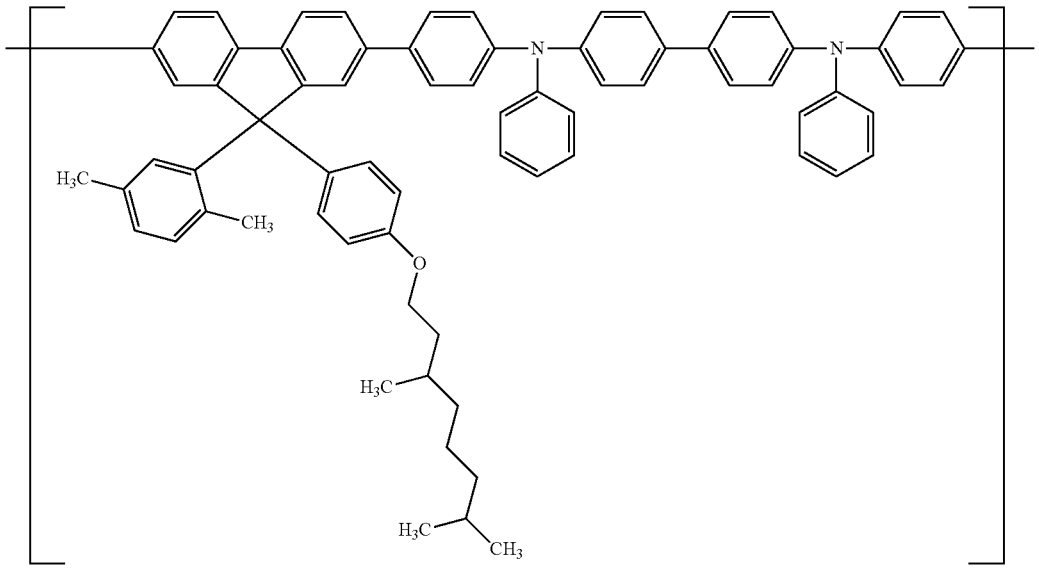

(III-2)

However, the polymer compound described in Patent Reference 1 has a crosslinking group at the 9-position of the fluorene ring thereof, and is therefore poor in electrochemical stability, especially in resistance to reduction (electron); and it is considered that the drive stability of the organic electroluminescence element comprising the polymer compound described in Patent Reference 1 may be insufficient.

Patent References 2 and 3 disclose polymer compounds each having a repeating unit represented by the formula mentioned below; however, in case where these compounds are used in producing devices, there occur some problems in that flat films could not be formed and the drive lifetime of the devices to be obtained is short.

[Chemical Formula 3]

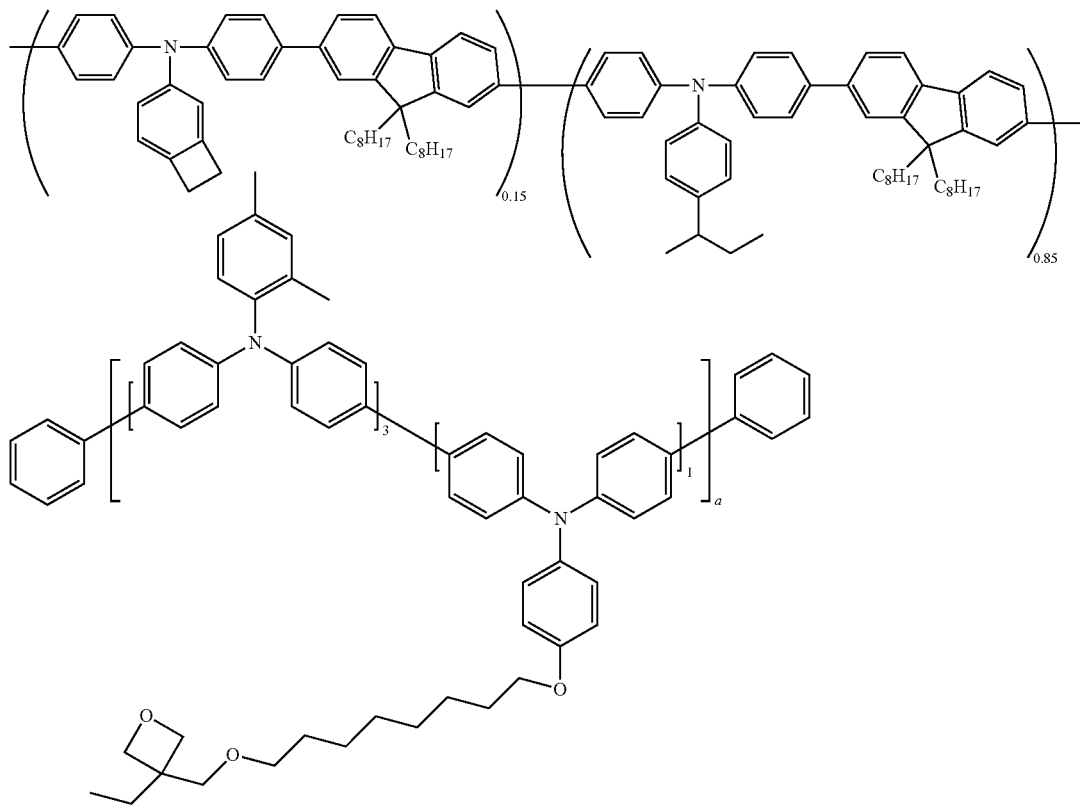

PRIOR ART REFERENCES

Patent References

Patent Reference 1: JP-T 2004-505169
Patent Reference 2: WO2008/038747
Patent Reference 3: WO2005/053056

Problems that the Invention is to Solve

An object of the invention is to provide a polymer compound having a high hole transport capacity, excellent in electrochemical stability, and suitable to film formation according to a wet film formation method.

Another object of the invention is to provide an organic electroluminescence element having a high current efficiency, a low drive voltage, and a long derive lifetime.

Means for Solving the Problems

The present inventors have assiduously studied for the purpose of solving the above-mentioned problems and, as a result, have found that the polymer compound having a specific repeating unit mentioned below has high electrochemical stability and high hole transport performance and is suitable to a wet film formation method where layer lamination is easy, and have reached the present invention.

Specifically, the invention includes the following features.

The invention is directed to a polymer compound having a repeating unit represented by the following formula (I) (hereinafter this is referred to as "polymer compound (i) of the invention"):

[Chemical Formula 4]

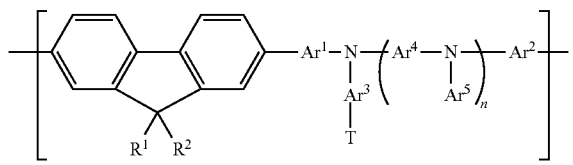
(I)

(In the formula, $R^1$ and $R^2$ each independently represent a hydrogen atom, an aromatic hydrocarbon group optionally having a substituent, an aromatic heterocyclic group optionally having a substituent, or an alkyl group optionally having a substituent, $R^1$ and $R^2$ may bond to each other to form a ring;

n indicates an integer of from 0 to 3;

$Ar^1$ and $Ar^2$ each independently represent a direct bond, an aromatic hydrocarbon group optionally having a substituent, or an aromatic heterocyclic group optionally having a substituent;

$Ar^3$ to $Ar^5$ each independently represent an aromatic hydrocarbon group optionally having a substituent, or an aromatic heterocyclic group optionally having a substituent.

T represents a group containing a crosslinking group.

However, when $Ar^1$, $Ar^2$ and $Ar^4$ are fluorene rings, then they do not have a group containing a crosslinking group as the substituent.)

Preferably, the above polymer compound (i) further contains a repeating unit represented by the following formula (I'):

[Chemical Formula 5]

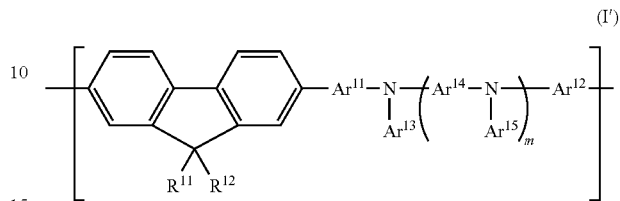
(I')

(In the formula, $R^{11}$ and $R^{12}$ each independently represent a hydrogen atom, an aromatic hydrocarbon group optionally having a substituent, an aromatic heterocyclic group optionally having a substituent, or an alkyl group optionally having a substituent, $R^{11}$ and $R^{12}$ may bond to each other to form a ring;

m indicates an integer of from 0 to 3;

$Ar^{11}$ and $Ar^{12}$ each independently represent a direct bond, an aromatic hydrocarbon group optionally having a substituent, or an aromatic heterocyclic group optionally having a substituent;

$Ar^{13}$ to $Ar^{15}$ each independently represent an aromatic hydrocarbon group optionally having a substituent, or an aromatic heterocyclic group optionally having a substituent.

However, $R^{11}$ and $R^{12}$, and $Ar^{11}$ to $Ar^{15}$ do not have a crosslinking group as the substituent.)

In the above polymer compound (i), preferably, the crosslinking group is selected from a group of the following crosslinking groups T':

<Group of Crosslinking Groups T'>

[Chemical Formula 6]

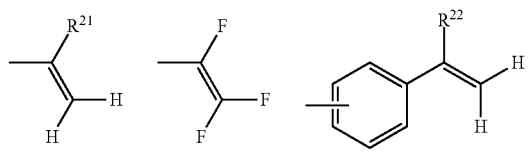

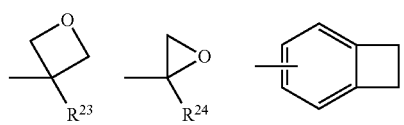

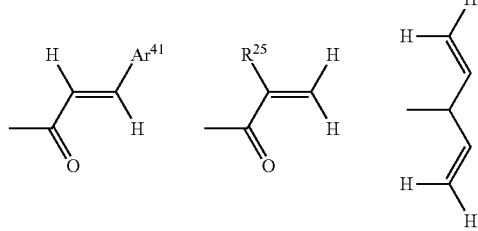

-continued

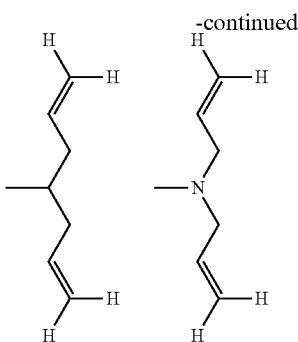

(In the formulae, $R^{21}$ to $R^{25}$ each independently represent a hydrogen atom or an alkyl group. $Ar^{41}$ represents an aromatic hydrocarbon group optionally having a substituent, or an aromatic heterocyclic group optionally having a substituent.

The benzocyclobutene ring may have a substituent.

The substituents may together form a ring.)

The invention is also directed to a polymer compound having a repeating unit represented by the following formula (II) (hereinafter this is referred to as "polymer compound (ii) of the invention"):

[Chemical Formula 7]

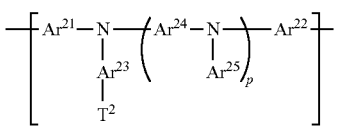

(II)

(In the formula, p indicates an integer of from 0 to 3;

$Ar^{21}$ and $Ar^{22}$ each independently represent a direct bond, an aromatic hydrocarbon group optionally having a substituent, or an aromatic heterocyclic group optionally having a substituent;

$Ar^{23}$ to $Ar^{25}$ each independently represent an aromatic hydrocarbon group optionally having a substituent, or an aromatic heterocyclic group optionally having a substituent;

$T^2$ represents a group containing a group represented by the following formula (IV).

However, $Ar^{21}$ and $Ar^{22}$ are not direct bonds at the same time.

Further, when $Ar^{21}$, $Ar^{22}$ and $Ar^{24}$ are fluorene rings, they do not have a group containing a crosslinking group as the substituent.)

[Chemical Formula 8]

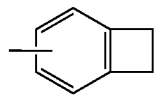

(IV)

(The benzocyclobutene ring in the formula (IV) may have a substituent. The substituents may bond to each other to form a ring.)

Preferably, the polymer compound (ii) further contains a repeating unit represented by the following formula (II'):

[Chemical Formula 9]

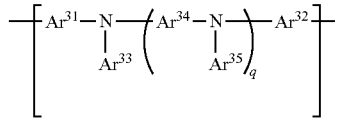

(II')

(In the formula (II'), q indicates an integer of from 0 to 3;

$Ar^{31}$ and $Ar^{32}$ each independently represent a direct bond, an aromatic hydrocarbon group optionally having a substituent, or an aromatic heterocyclic group optionally having a substituent;

$Ar^{33}$ to $Ar^{35}$ each independently represent an aromatic hydrocarbon group optionally having a substituent, or an aromatic heterocyclic group optionally having a substituent.

However, $Ar^{31}$ and $Ar^{32}$ are not direct bonds at the same time.

$Ar^{31}$ to $Ar^{35}$ do not have a group containing a group of the formula (IV) as the substituent.

Further, when $Ar^{31}$, $Ar^{32}$ and $Ar^{34}$ are fluorene rings, they do not have a group containing a crosslinking group as the substituent.)

The invention is also directed to a polymer compound having at least one repeating unit selected from a group of the following repeating units A, and at least one repeating unit selected from a group of the following repeating units B.

<Group of Repeating Units A>

[Chemical Formula 10]

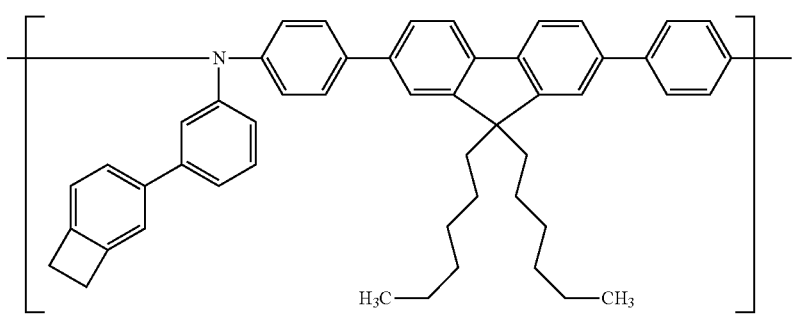

-continued
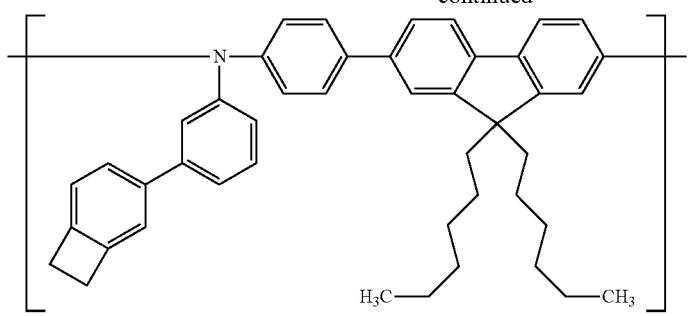
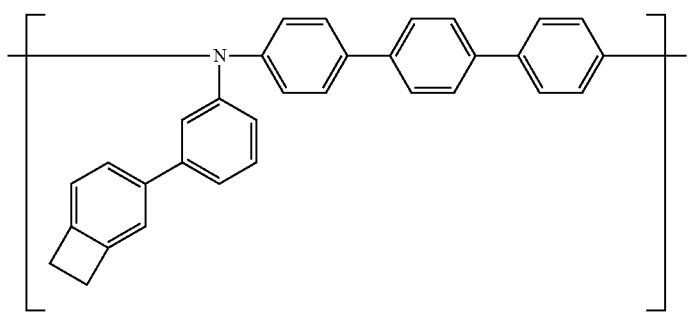
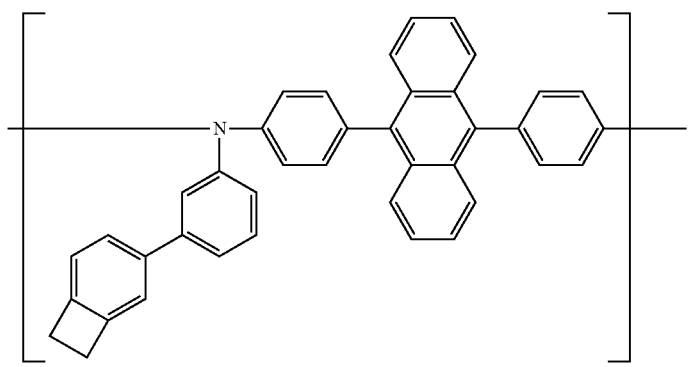
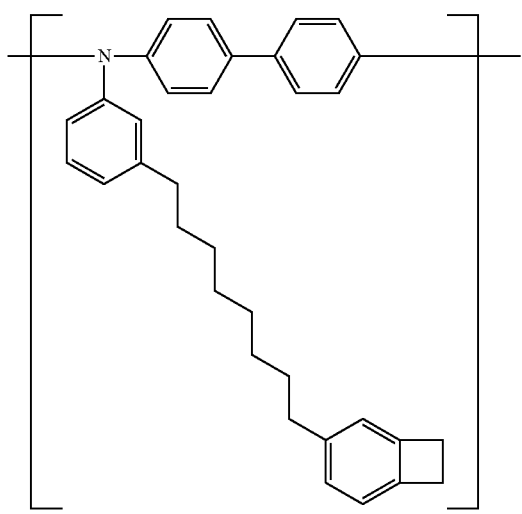

-continued
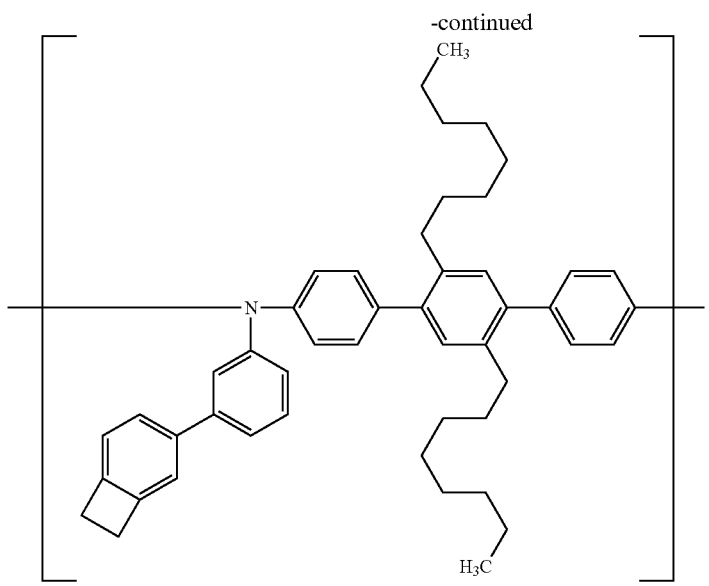
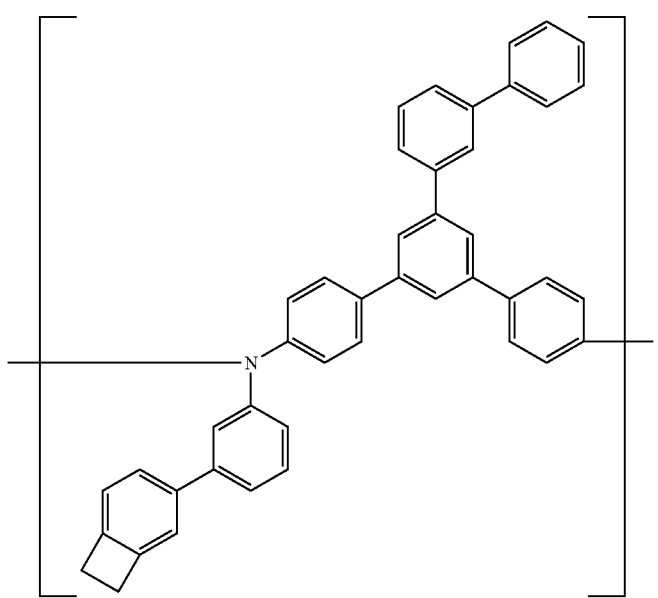
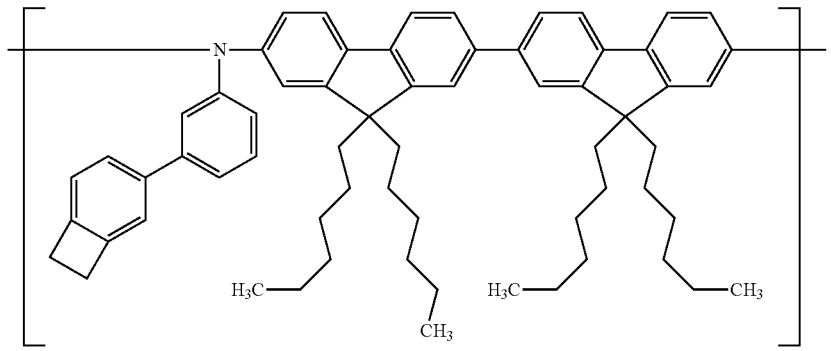

<Group of Repeating Units B>
[Chemical Formula 11]
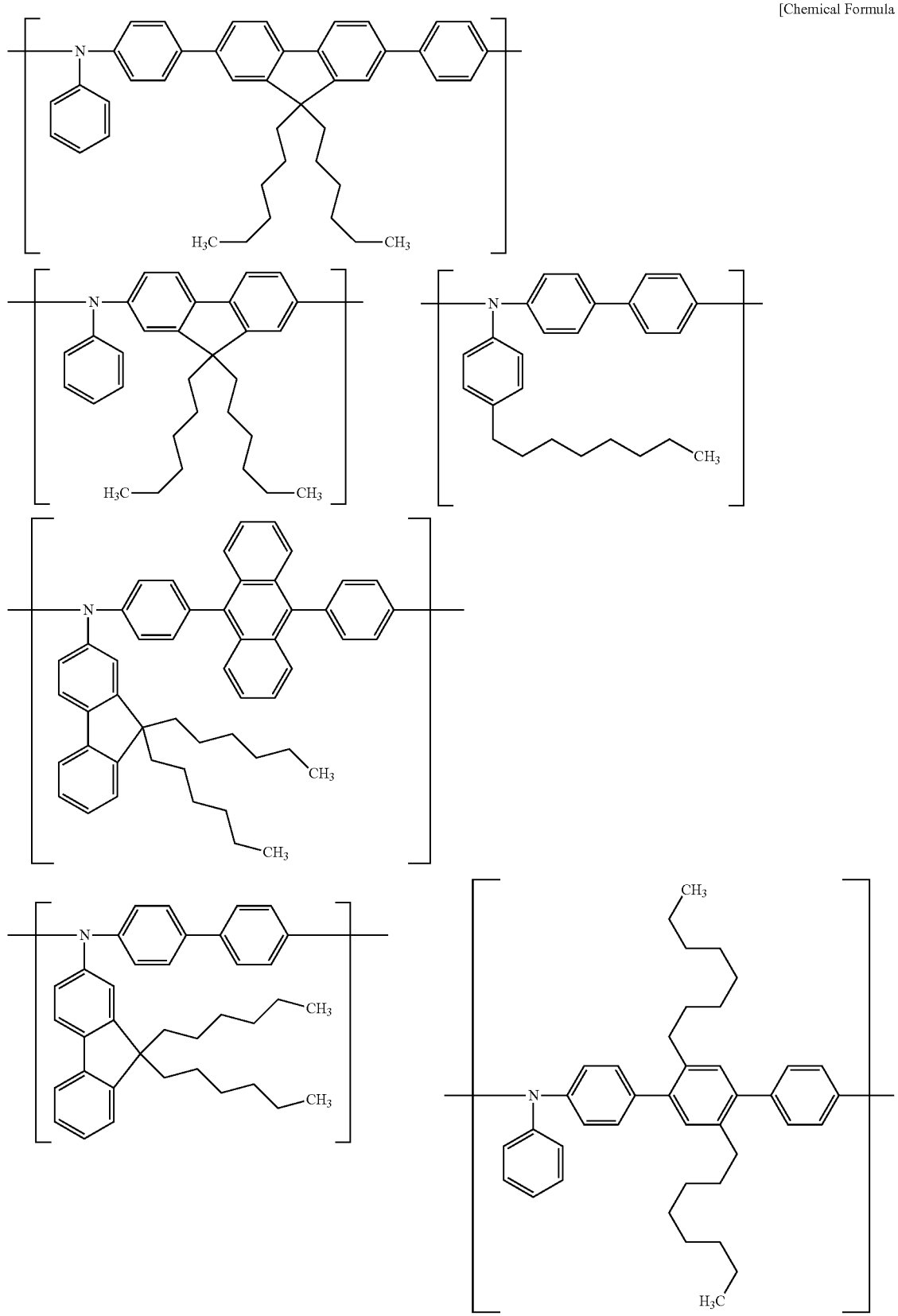

-continued

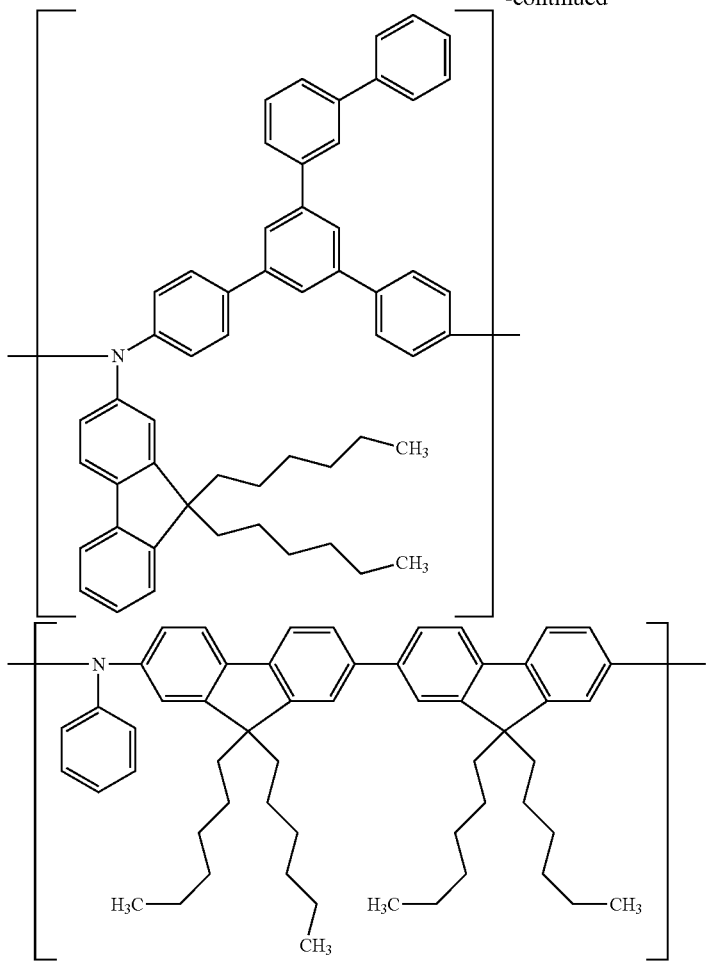

The invention is also directed to a net-like polymer compound, a composition for organic electroluminescence element, an organic electroluminescence element, as well as to an organic EL display and an organic EL lighting.

A net-like polymer compound produced by crosslinking the polymer compound of the invention.

A composition for organic electroluminescence element, containing the polymer compound of the invention.

An organic electroluminescence element having, on a substrate, an anode, a cathode and an organic layer between the anode and the cathode, wherein the organic layer has a layer containing the net-like polymer compound of the invention.

The organic electroluminescence element wherein the layer containing the net-like polymer compound is a hole injection layer or a hole transport layer.

The organic electroluminescence element wherein the organic layer has a hole injection layer, a hole transport layer and a light emission layer, and all the hole injection layer, the hole transport layer and the light emission layer are formed according to a wet film formation method.

An organic EL display comprising the organic electroluminescence element of the invention.

An organic EL lighting comprising the organic electroluminescence element of the invention.

Hereinafter the "polymer compound of the invention" is meant to indicate both the "polymer compound (i) of the invention" and the "polymer compound (ii) of the invention".

Advantage of the Invention

The polymer compound of the invention has a high hole transport capacity and has a sufficient solubility in solvent, and may increase surface smoothness in film formation. Accordingly, an organic electroluminescence element that has a layer containing a net-like polymer compound produced by crosslinking the polymer compound of the invention (hereinafter this may be referred to as "crosslinked layer") can be driven at a low voltage and has a high light emission efficiency, high heat resistance and a long drive lifetime.

Further, the polymer compound of the invention is excellent in electrochemical stability, film formability, charge transferability, light emission capability and heat resistance, and is therefore applicable to a hole-injecting material, a hole-transporting material, a light-emitting material, a host material, an electron-injecting material, an electron-transporting material and the like, in accordance with the layer constitution of devices.

BRIEF DESCRIPTION OF THE DRAWING

FIG. 1 This is a cross-sectional view graphically showing one example of the structure of the organic electroluminescence element of the invention.

MODE FOR CARRYING OUT THE INVENTION

Embodiments of the invention are described in detail hereinunder, however, the description of the constitutive features given below is for some examples (typical examples) of embodiments of the invention, and the invention should not be limited to these contents, not overstepping the scope and the spirit thereof <1. Polymer Compound (i)>

The polymer compound (i) of the invention is a polymer compound containing a repeating unit of the following formula (I):

[Chemical Formula 12]

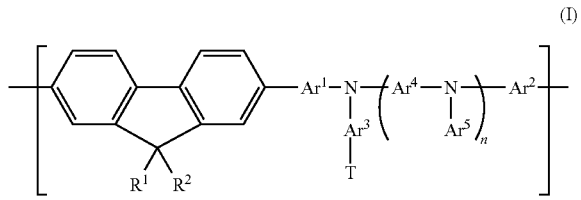

(I)

(In the formula, $R^1$ and $R^2$ each independently represent a hydrogen atom, an aromatic hydrocarbon group optionally having a substituent, an aromatic heterocyclic group optionally having a substituent, or an alkyl group optionally having a substituent, $R^1$ and $R^2$ may bond to each other to form a ring; n indicates an integer of from 0 to 3;

$Ar^1$ and $Ar^2$ each independently represent a direct bond, an aromatic hydrocarbon group optionally having a substituent, or an aromatic heterocyclic group optionally having a substituent;

$Ar^3$ to $Ar^5$ each independently represent an aromatic hydrocarbon group optionally having a substituent, or an aromatic heterocyclic group optionally having a substituent.

T represents a group containing a crosslinking group.

However, when $Ar^1$, $Ar^2$ and $Ar^4$ are fluorene rings, then they do not have a group containing a crosslinking group as the substituent.)

1-1. Structural Characteristics

The polymer compound (i) of the invention has a group that contains at least one crosslinking group in one molecule as the substituent, and therefore its film formed according to a wet film formation method can be made insoluble in organic solvent under a mild condition.

The fluorene ring in the main chain strongly participates in charge transfer with expanding HOMO (highest occupied molecular orbital) and LUMO (lowest unoccupied molecular orbital) thereof.

The polymer compound (i) of the invention does not have a group containing a crosslinking group in the fluorene ring in the main chain, and is therefore excellent in electrochemical stability, especially in reduction resistance stability. In addition, the compound has a crosslinking group bonding to the arylamine moiety via at least one single bond therebetween, and is therefore excellent in oxidation resistance.

1-2. $Ar^1$ to $Ar^5$

In the formula (I), $Ar^1$ and $Ar^2$ each independently represent a direct bond, an aromatic hydrocarbon group optionally having a substituent, or an aromatic heterocyclic group optionally having a substituent; $Ar^3$ to $Ar^5$ each independently represent an aromatic hydrocarbon group optionally having a substituent, or an aromatic heterocyclic group optionally having a substituent. $Ar^1$ to $Ar^4$ are divalent groups, and $Ar^5$ is a monovalent group.

The aromatic hydrocarbon group optionally having a substituent includes, for example, those derived from 6-membered monocyclic rings or di- to penta-condensed rings such as benzene ring, naphthalene ring, anthracene ring, phenanthrene ring, perylene ring, tetracene ring, pyrene ring, benzopyrene ring, chrysene ring, triphenylene ring, acenaphthene ring, fluoranthene ring, fluorene ring.

The aromatic heterocyclic group optionally having a substituent includes, for example, those derived from 5- or 6-membered monocyclic rings or di- to tetra-condensed rings such as furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, azurene ring.

From the viewpoint of the solubility in organic solvent and the heat resistance, $Ar^1$ to $Ar^5$ are preferably each independently a group derived from a ring selected from a group consisting of benzene ring, naphthalene ring, anthracene ring, phenanthrene ring, triphenylene ring, pyrene ring, thiophene ring, pyridine ring and fluorene ring.

$Ar^1$ to $Ar^5$ each are also preferably a divalent group composed of one or more rings selected from the above-mentioned group and bonding to each other either directly or via a group of —CH═CH—, more preferably a biphenylene ring or a terphenylene ring.

Not specifically defined, the substituent that the aromatic hydrocarbon group and the aromatic heterocyclic group for $Ar^1$ to $Ar^5$ may have apart from the crosslinking group to be mentioned below includes, for example, one or more selected from the following "group of substituents Z".

[Group of Substituents Z]

Alkyl group having from 1 to 24 carbon atoms, preferably from 1 to 12 carbon atoms, such as methyl group, ethyl group;

Alkenyl group having from 2 to 24 carbon atoms, preferably from 2 to 12 carbon atoms, such as vinyl group;

Alkynyl group having from 2 to 24 carbon atoms, preferably from 2 to 12 carbon atoms, such as ethynyl group;

Alkoxy group having from 1 to 24 carbon atoms, preferably from 1 to 12 carbon atoms, such as methoxy group, ethoxy group;

Aryloxy group having from 4 to 36 carbon atoms, preferably from 5 to 24 carbon atoms, such as phenoxy group, naphthoxy group, pyridyloxy group;

Alkoxycarbonyl group having from 2 to 24 carbon atoms, preferably from 2 to 12 carbon atoms, such as methoxycarbonyl group, ethoxycarbonyl group;

Dialkylamino group having from 2 to 24 carbon atoms, preferably from 2 to 12 carbon atoms, such as dimethylamino group, diethylamino group;

Diarylamino group having from 10 to 36 carbon atoms, preferably from 12 to 24 carbon atoms, such as diphenylamino group, ditolylamino group, N-carbazolyl group;

Arylaminoalkyl group having from 6 to 36 carbon atoms, preferably from 7 to 24 carbon atoms, such as phenylmethylamino group;

Acyl group having from 2 to 24 carbon atoms, preferably from 2 to 12 carbon atoms, such as acetyl group, benzoyl group;

Halogen atom such as fluorine atom, chlorine atom;

Haloalkyl group having from 1 to 12 carbon atoms, preferably from 1 to 6 carbon atoms, such as trifluoromethyl group;

Alkylthio group having from 1 to 24 carbon atoms, preferably from 1 to 12 carbon atoms, such as methylthio group, ethylthio group;

Arylthio group having from 4 to 36 carbon atoms, preferably from 5 to 24 carbon atoms, such as phenylthio group, naphthylthio group, pyridylthio group;

Silyl group having from 2 to 36 carbon atoms, preferably from 3 to 24 carbon atoms, such as trimethylsilyl group, triphenylsilyl group;

Siloxy group having from 2 to 36 carbon atoms, preferably from 3 to 24 carbon atoms, such as trimethylsiloxy group, triphenylsiloxy group;

Aromatic hydrocarbon group having from 6 to 36 carbon atoms, preferably from 6 to 24 carbon atoms, such as phenyl group, naphthyl group;

Aromatic heterocyclic group having from 3 to 36 carbon atoms, preferably from 4 to 24 carbon atoms, such as thienyl group, pyridyl group.

The above-mentioned substituents may further have a substituent, and its examples include those illustrated for the above-mentioned group of substituents Z.

The molecular weight of the substituent that the aromatic hydrocarbon group and the aromatic heterocyclic group for $Ar^1$ to $Ar^5$ may have apart from the crosslinking group to be mentioned below is preferably at most 500 inclusive of the group by which it is further substituted, more preferably at most 250.

From the viewpoint that the solubility in organic solvent may further increase, the substituent that the aromatic hydrocarbon group and the aromatic heterocyclic group for $Ar^1$ to $Ar^5$ may optionally have are preferably each independently an alkyl group having from 1 to 12 carbon atoms or an alkoxy group having from 1 to 12 carbon atoms.

In case where n is 2 or more, the repeating unit of the above formula (I) has at least two $Ar^4$'s and $Ar^5$'s. In this case, $Ar^4$'s and $Ar^5$'s each may be the same or different. Further, $Ar^4$'s and $Ar^5$'s each may bond to each other either directly or via a linking group, thereby forming a cyclic structure.

1-3. Crosslinking Group

T in the formula (I) is a group containing a crosslinking group. In other words, the polymer compound (i) of the invention has a group containing at least one crosslinking group in one molecule as the substituent. The crosslinking group means a group that reacts with the same or a different group of other molecule existing around it, through irradiation with heat and/or active energy rays, thereby forming a new chemical bond.

Above all, the crosslinking group is selected from the following <Group of Crosslinking Groups T'> from the viewpoint of the easy crosslinkability thereof.

<Group of Crosslinking Groups T'>

[Chemical Formula 13]

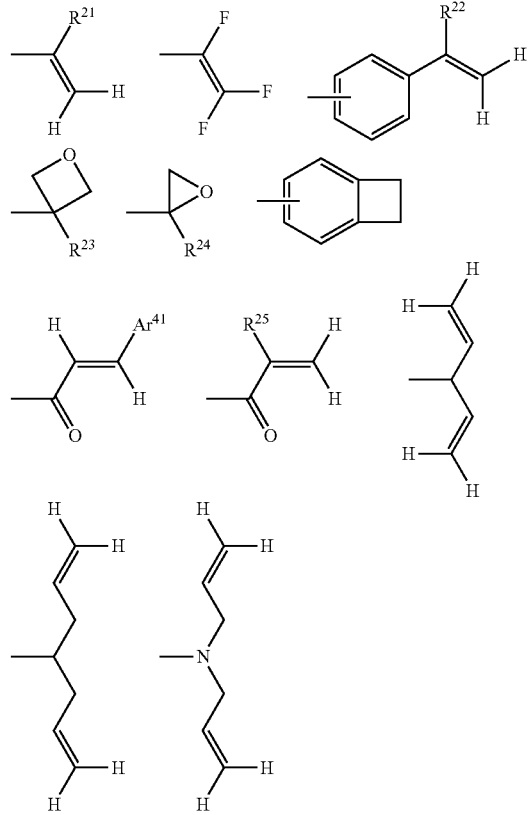

(In the formulae, $R^{21}$ to $R^{25}$ each independently represent a hydrogen atom or an alkyl group. $Ar^{41}$ represents an aromatic hydrocarbon group optionally having a substituent, or an aromatic heterocyclic group optionally having a substituent.

The benzocyclobutene ring may have a substituent.

The substituents may together form a ring.)

The crosslinking group is preferably a cyclic ether group such as epoxy group or oxetane group, or a cationic polymerizing group such as vinyl ether group, from the viewpoint of the high reactivity and the easy crosslinkability with organic solvent. Above all, especially preferred is an oxetane group from the viewpoint of easy controllability of the cationic polymerization speed; and also preferred is a vinyl ether group that hardly produces a hydroxyl group having a risk of degrading devices in cationic polymerization.

As the crosslinking group, preferred is a group that brings about cyclization addition reaction, for example, an arylvinylcarbonyl group such as cinnamoyl group, or a group derived from a benzocyclobutene ring, from the viewpoint of further enhancing the electrochemical stability.

In the molecule, the crosslinking group may direct bond to the aromatic hydrocarbon group or the aromatic heterocyclic group in the molecule, but preferably bonds to the aromatic hydrocarbon group or the aromatic heterocyclic group via a divalent group composed of from 1 to 30 groups selected from a group —O—, a group —C(=O)— and a group (optionally having a substituent) —CH$_2$— and bonding to each other in any desired order. Specific examples of the crosslinking group bonding via the divalent group, or that is, those of a group containing a crosslinking group are as shown in the following <Group of crosslinking Group-Containing Groups T">, to which, however, the invention should not be limited.
<Group of Crosslinking Group-Containing Groups T">
[Chemical Formula 14]
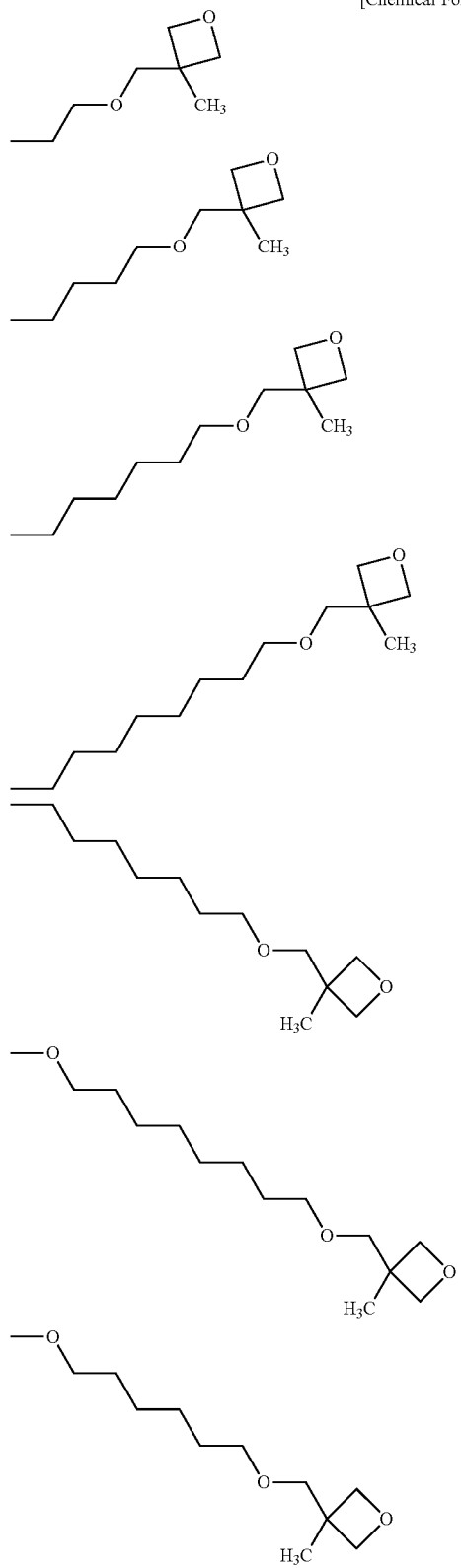
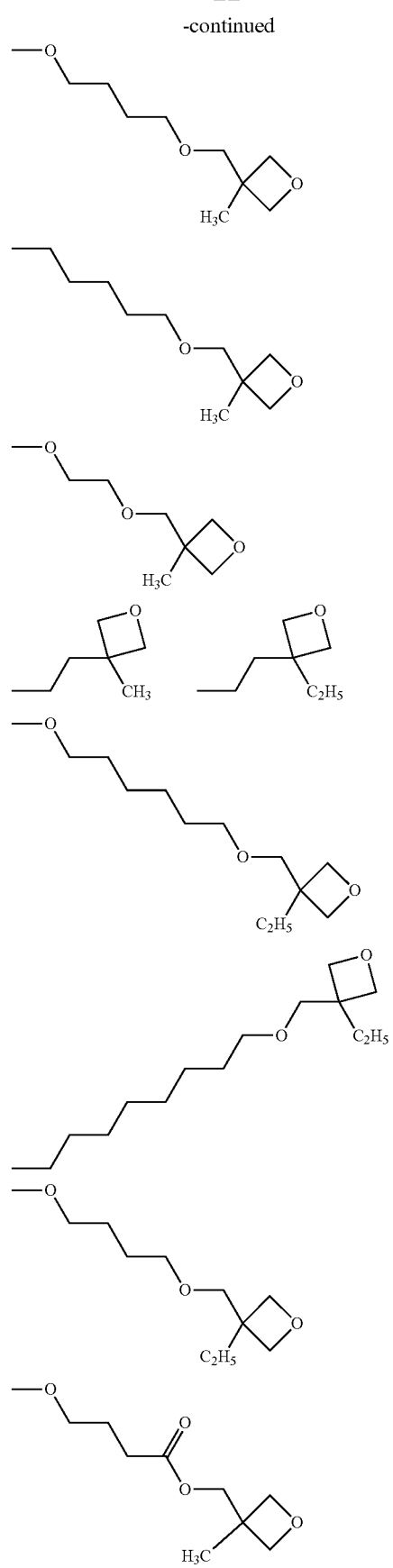

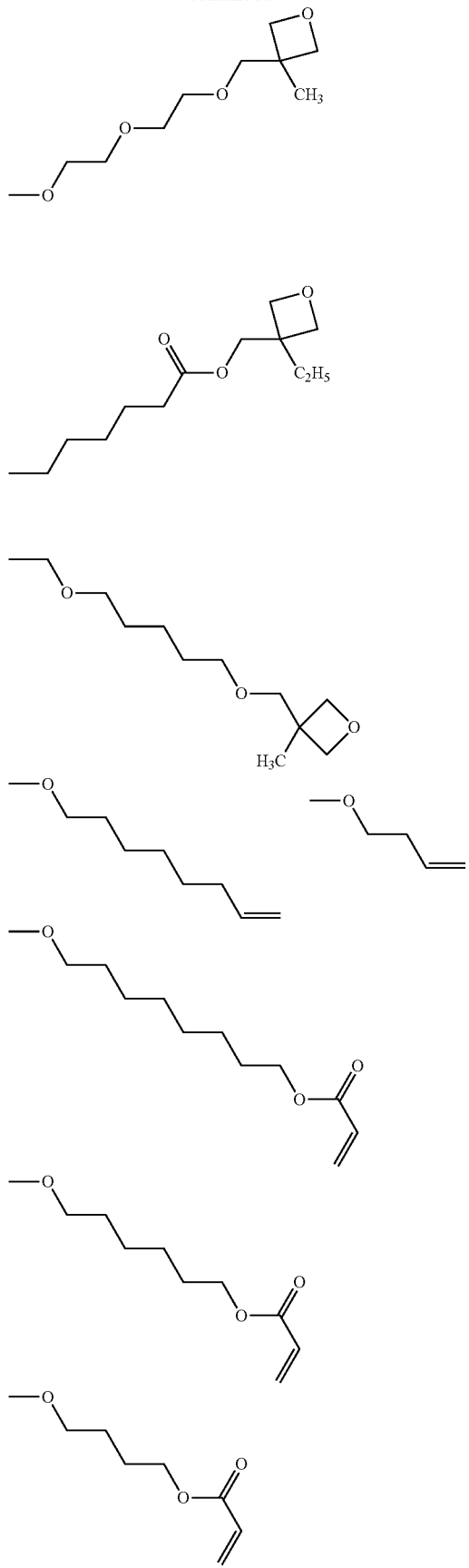
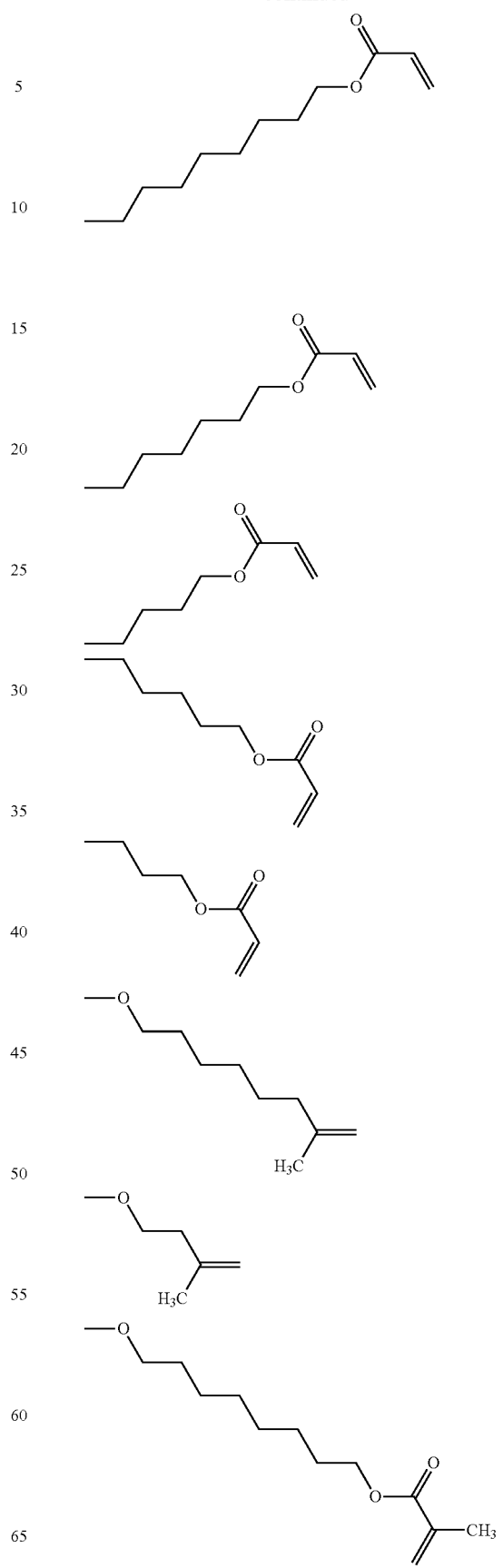

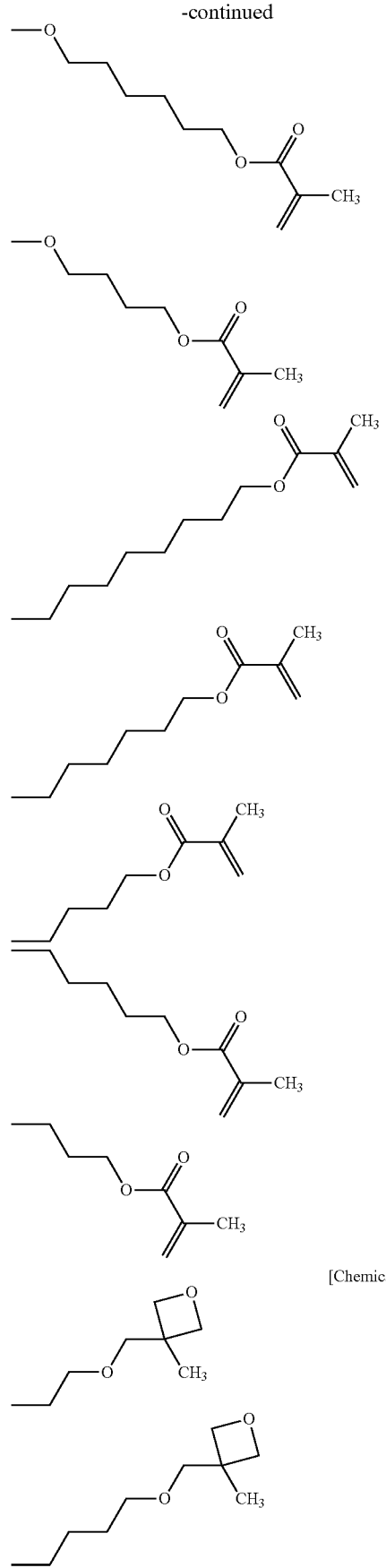
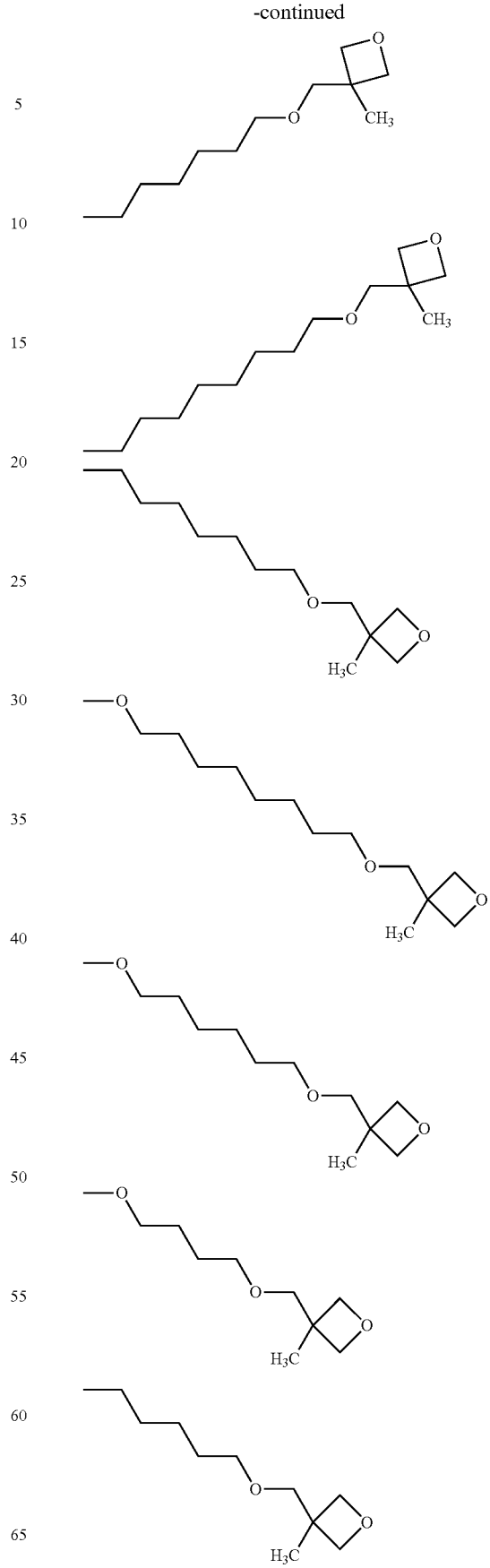
[Chemical Formula 15]

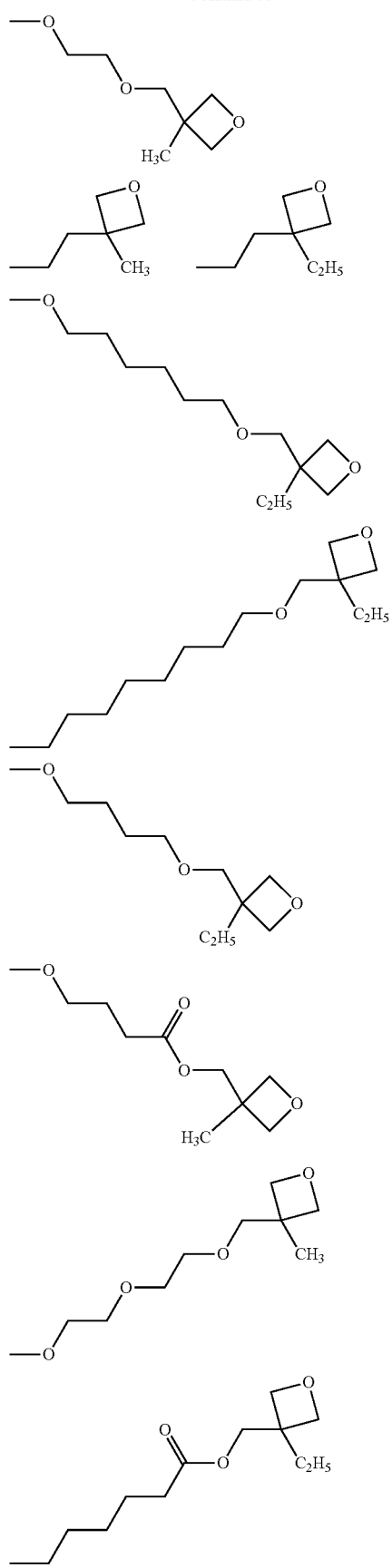
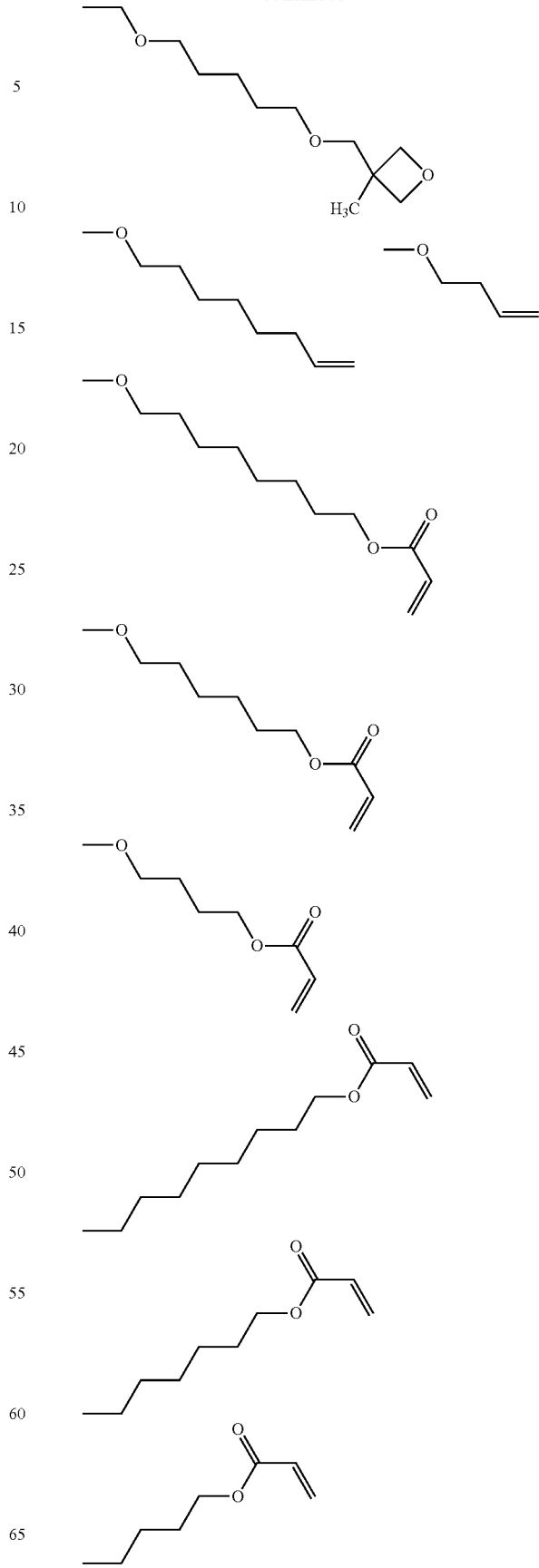

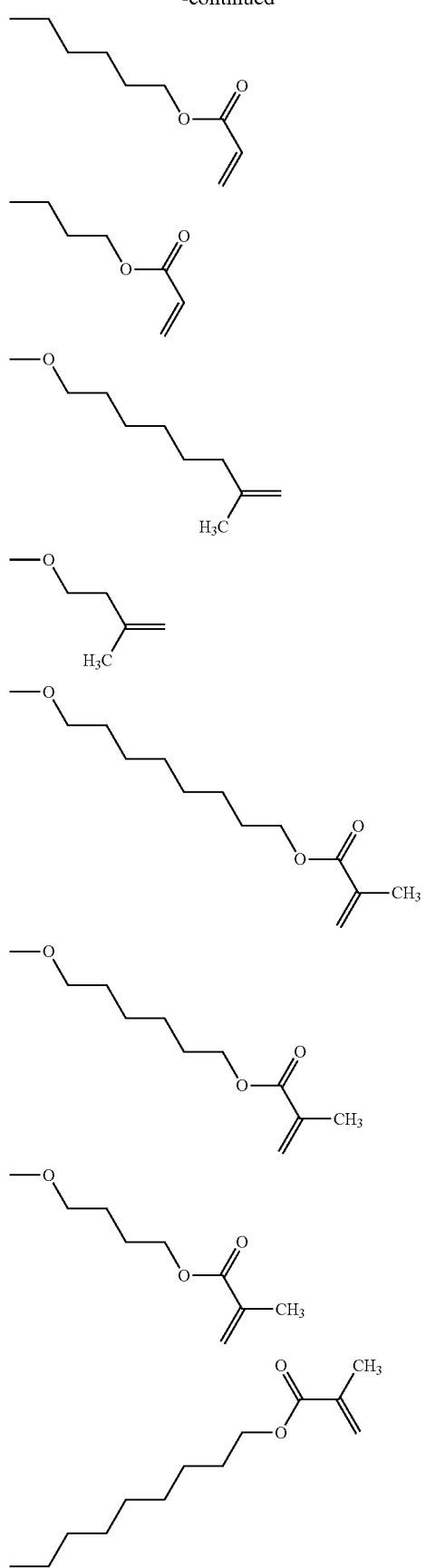
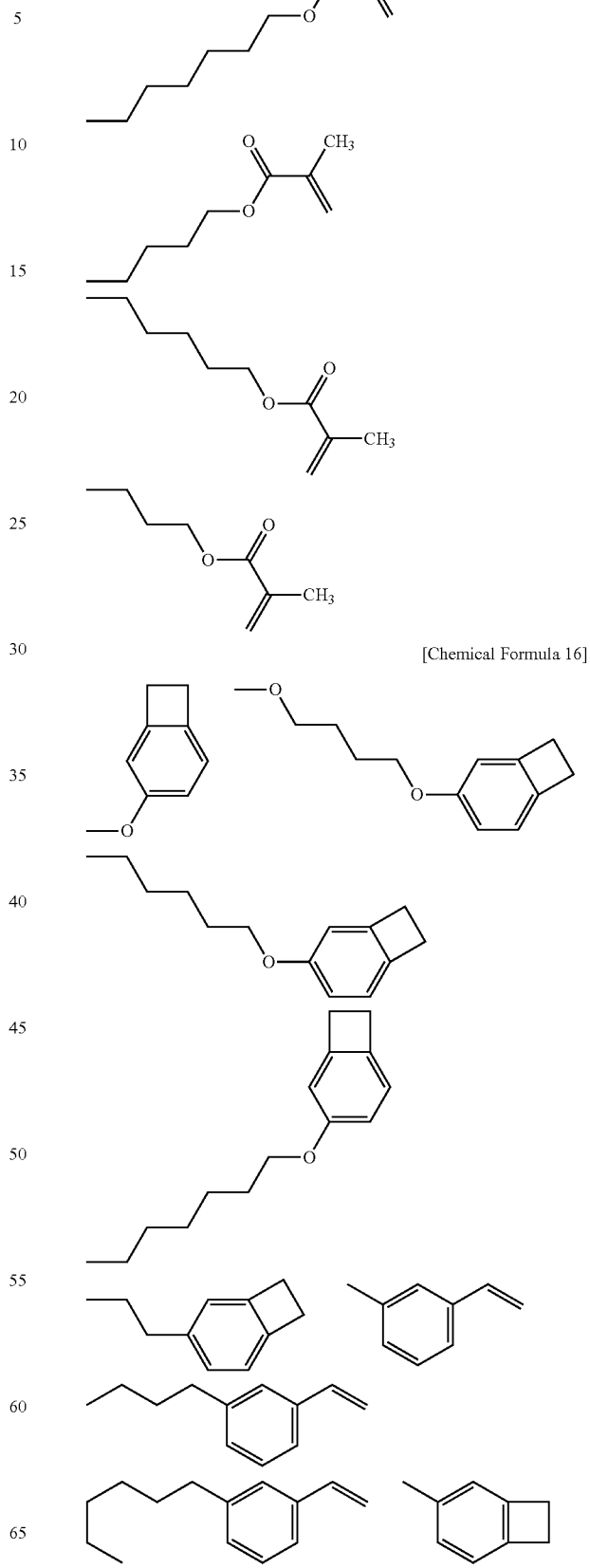
[Chemical Formula 16]

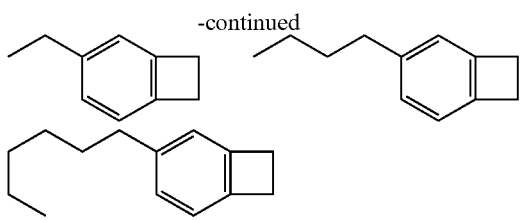

1-4. Position of Crosslinking Group

In the polymer compound (i) of the invention, $Ar^3$ has a group T containing a crosslinking group as the substituent.

In case where the polymer compound (i) of the invention has any other crosslinking group than T, it may be in the repeating unit or may be in any other moiety than the repeating unit. However, $R^1$ and $R^2$ to be mentioned below do not have a crosslinking group.

In case where a group containing a crosslinking group exists in any other site than $Ar^3$, the group is preferably in any of $Ar^1$, $Ar^2$, $Ar^4$ and $Ar^5$ from the viewpoint that the crosslinking group is hardly degraded by reduction. However, when $Ar^1$, $Ar^2$ and $Ar^4$ are fluorene groups, they do not have a group containing a crosslinking group as the substituent. This is because, when the polymer has a crosslinking group in the above-mentioned position, the polymer may be more hardly degraded by reduction than in the fluorene ring.

For reducing the number of unreacted crosslinking groups, the crosslinking groups are preferably only in T.

1-5. Content Ratio of Crosslinking Groups

The mean value of the number of the crosslinking groups that the polymer compound (i) of the invention has is preferably at least one in one molecule, more preferably at least 2, also preferably at most 200, more preferably at most 100.

The number of the crosslinking groups that the polymer compound (i) of the invention has may be expressed as the number thereof per the molecular weight of 1000.

When the number of the crosslinking groups that the polymer compound (i) of the invention is expressed as the number per the molecular weight thereof of 1000, it is generally at most 3.0 per the molecular weight of 1000, preferably at most 2.0, more preferably at most 1.0, and generally at least 0.01, preferably at least 0.05.

When the number is larger than the upper limit, a flat film could not be obtained as it may be cracked, or the crosslinking density may increase so that the unreacted crosslinking groups may increase in the crosslinked layer and they may have some influence on the lifetime of the devices to be obtained. On the other hand, the number is smaller than the lower limit, then the polymer may be insoluble in organic solvent and could not form a multilayered laminate structure according to a wet film formation method.

The number or the crosslinking groups per the molecular weight of 1000 in the polymer compound (i) of the invention may be computed from the molar ratio of the starting monomers in production and from the structural formula of the polymer compound from which the terminal group is removed.

For example, this is described with reference to the case of the product polymer 3 produced in Production Example 35 given below.

[Chemical Formula 17]

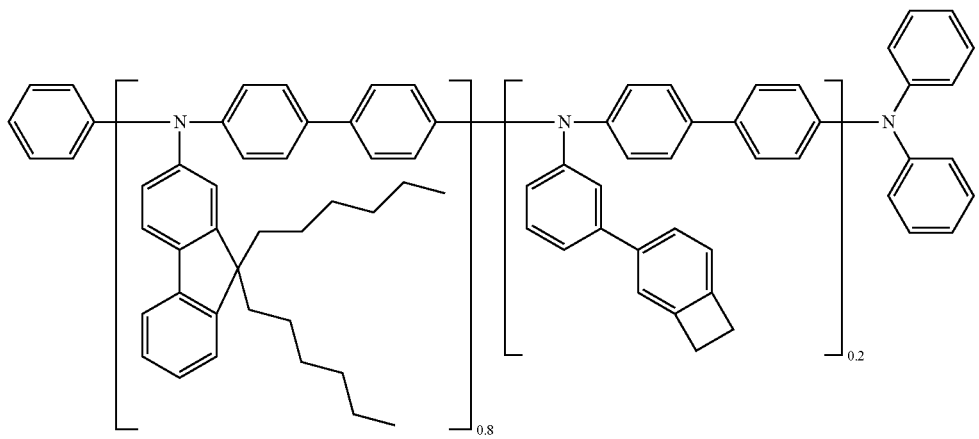

In the product 35, the molecular weight of the repeating unit except the terminal group is 468.9 on average, and the number of the crosslinking groups therein is 0.2 per one repeating unit on average. The data are computed in simple proportion, and the number of the crosslinking groups per the molecular weight of 1000 is 0.426.

1-6. $R^1$ and $R^2$ $R^1$ and $R^2$ each independently represent a hydrogen atom, an aromatic hydrocarbon group optionally having a substituent, an aromatic heterocyclic group optionally having a substituent, or an alkyl group optionally having a substituent, and $R^1$ and $R^2$ may bond to each other to form a ring.

The alkyl group optionally having a substituent is preferably a linear or branched alkyl group having from 1 to 8 carbon atoms, including, for example, methyl group, ethyl group, n-propyl group, 2-propyl group, n-butyl group, isobutyl group, tert-butyl group, n-pentyl group, n-hexyl group, n-octyl group, 2-ethylhexyl group, n-decyl group, n-dodecyl group.

The aromatic hydrocarbon group optionally having a substituent, and the aromatic heterocyclic group optionally having a substituent include those described in the above section, [1-2. $Ar^1$ to $Ar^5$]. Preferred examples are the same as therein.

In case where $R^1$ and $R^2$ each are an aromatic hydrocarbon group, an aromatic heterocyclic group or an alkyl group, the substituent that they may have includes those described in the above section [Group or Substituents Z]. Preferred examples are the same as therein.

In case where $R^1$ and $R^2$ bond to each other to form a ring, preferred examples containing the fluorene ring are shown in the following <Specific Examples>, to which, however, the invention should not be limited.

Specific Examples

[Chemical Formula 18]

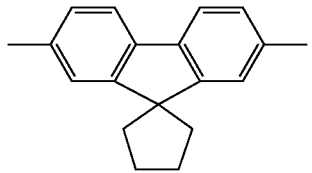
(S-1)

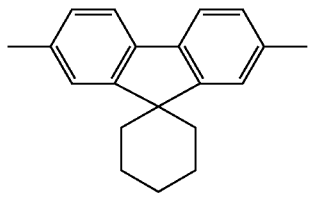
(S-2)

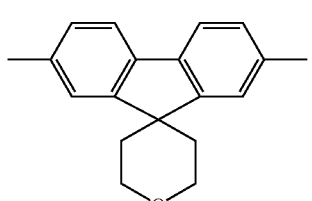
(S-3)

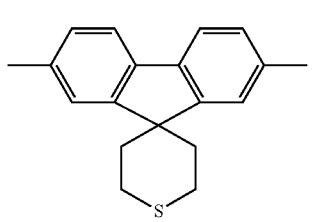
(S-4)

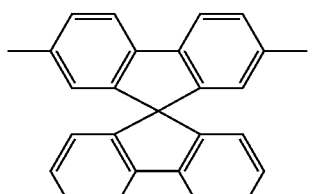
(S-5)

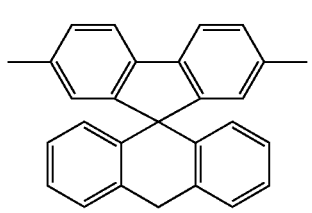
(S-6)

-continued

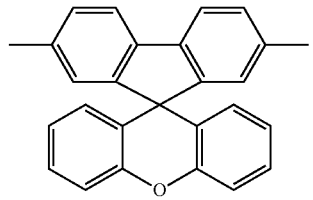
(S-7)

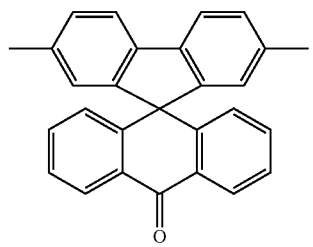
(S-8)

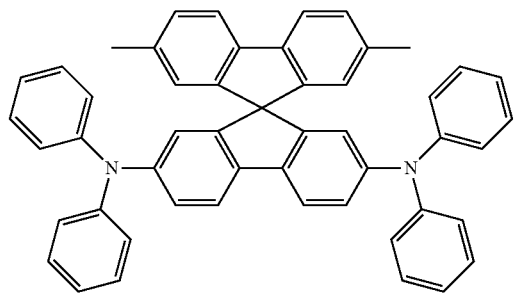
(S-9)

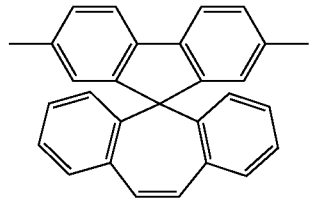
(S-10)

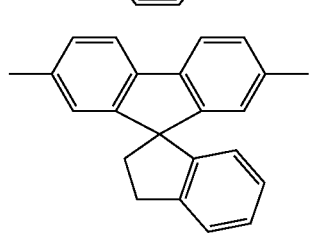
(S-11)

Above all, preferred are S-1, S-2, S-5 and S-9 from the viewpoint of the electrochemical stability; more preferred is S-5 from the viewpoint of the heat stability; and even more preferred are S-1 and S-2 from the viewpoint of the high solubility in organic solvent before crosslinking.

1-7. Regarding n

In the formula (I), n indicates an integer of from 0 to 3. Preferably, n is 0 from the viewpoint that the polymer compound may have increased solubility in organic solvent and may have increased film formability. Also preferably, n is from 1 to 3 from the viewpoint that the polymer compound may have increased hole transport capability.

1-8. Molecular Weight

The weight-average molecular weigh (Mw) of the polymer compound (i) of the invention is generally at most 3,000,000, preferably at most 1,000,000, more preferably at most 500, 0000, and is generally at least 1,000, preferably at least 2,500, even more preferably at least 5,000.

The number-average molecular weigh (Mn) of the polymer compound (i) of the invention is generally at least 3,000, preferably at least 6,000, and is generally at most 1,000,000, preferably at most 500,000. When the weight-average molecular weight or the number-average molecular weight is lower than the lower limit of the range, then the insolubility of the crosslinked layer in organic solvent may lower and layer lamination would be impossible, and the glass transition temperature may lower to detract from the heat resistance. When more than the upper limit of the range, then the polymer could not dissolve in organic solvent even before crosslinking, and a flat film could not be formed.

The dispersity (Mw/Mn) of the polymer compound (i) of the invention is generally at most 3.5, preferably at most 2.5, more preferably at most 2.0. When the dispersity of the polymer compound (i) is more than the upper limit of the range, then the polymer would be difficult to purify and the solubility thereof in organic solvent may lower, and the charge transfer capacity thereof may lower. The dispersity is ideally 1.0.

In general, the weight-average molecular weight is determined through SEC (size exclusion chromatography). In SEC, a fragment having a higher molecular weight has a shorter elution time, and a fragment having a lower molecular weight takes a longer elution time. Using a calibration curve computed from the elution time of polystyrene (standard sample) having a known molecular weight, the elution time of the sample to be analyzed is converted into the molecular weight thereof, and the weight-average molecular weight of the sample is thus computed.

1-9. Additional Repeating Unit

Preferably, the polymer compound (i) of the invention contains a repeating unit represented by the following formula (I'), in which the number of the uncrosslinked groups may be reduced by controlling the number of the crosslinking groups therein whereby the drive lifetime of the devices to be obtained can be prolonged.

[Chemical Formula 19]

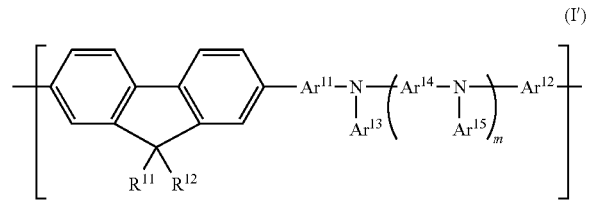

(I')

(In the formula, $R^{11}$ and $R^{12}$ each independently represent a hydrogen atom, an aromatic hydrocarbon group optionally having a substituent, an aromatic heterocyclic group optionally having a substituent, or an alkyl group optionally having a substituent, $R^{11}$ and $R^{12}$ may bond to each other to form a ring;

m indicates an integer of from 0 to 3;

$Ar^{11}$ and $Ar^{12}$ each independently represent a direct bond, an aromatic hydrocarbon group optionally having a substituent, or an aromatic heterocyclic group optionally having a substituent;

$Ar^{13}$ to $Ar^{15}$ each independently represent an aromatic hydrocarbon group optionally having a substituent, or an aromatic heterocyclic group optionally having a substituent.

However, $R^{11}$ and $R^{12}$, and $Ar^{11}$ to $Ar^{15}$ do not have a crosslinking group as the substituent.)

(1-9-1. $Ar^{11}$ to $Ar^{15}$)

$Ar^{11}$ and $Ar^{12}$ each independently represent a direct bond, an aromatic hydrocarbon group optionally having a substituent, or an aromatic heterocyclic group optionally having a substituent; $Ar^{13}$ to $Ar^{15}$ each independently represent an aromatic hydrocarbon group optionally having a substituent, or an aromatic heterocyclic group optionally having a substituent. $Ar^{11}$, $Ar^{12}$ and $Ar^{14}$ are divalent groups; and $Ar^{13}$ and $Ar^{15}$ are monovalent groups.

Specific examples of the aromatic hydrocarbon group optionally having a substituent and the aromatic heterocyclic group optionally having a substituent for $Ar^{11}$ to $Ar^{15}$ are the same as those described in the above-mentioned section [1-2. $Ar^1$ to $Ar^5$]. Preferred examples are the same as therein. However, $Ar^{11}$ to $Ar^{15}$ do not have a group containing a crosslinking group as the substituent.

(1-9-2. $R^{11}$ and $R^{12}$)

$R^{11}$ and $R^{12}$ each independently represent a hydrogen atom, an aromatic hydrocarbon group optionally having a substituent, an aromatic heterocyclic group optionally having a substituent, or an alkyl group optionally having a substituent.

Specific examples of the aromatic hydrocarbon group optionally having a substituent, the aromatic heterocyclic group optionally having a substituent, and the alkyl group optionally having a substituent for $R^{11}$ and $R^{12}$ are the same as those described in the above-mentioned section [1-6. $R^1$ and $R^2$]. Preferred examples are the same as therein.

(1-9-3. Regarding m)

m indicates an integer of from 0 to 3.

The above m is the same as n described in the section of [1-7. Regarding n]. Preferred examples are the same as therein.

1-10. Ratio of Repeating Unit

In case where the polymer compound (i) of the invention has a repeating unit of the formula (I'), the ratio of the repeating unit of the formula (I') to the repeating unit of the formula (I) [repeating unit of formula (I')/repeating unit of formula (I)] is generally at least 0.01 molar times, as the molar ratio of the starting monomers, preferably at least 50 molar times, more preferably at least 80 molar times, and is generally at most 100 molar times, preferably at most 50 molar times.

The above range is preferred, within which the polymer compound is excellent in the hole transport capability and the reduction resistance. Other advantages are that the drive voltage of the devices to be obtained could lower and the drive lifetime thereof may be long.

In case where the polymer compound (i) of the invention has any other repeating unit than the repeating unit of the formula (I) and the repeating unit of the formula (I'), the total content of the repeating unit of the formula (I) and the repeating unit of the formula (I') is generally at least 10 mol %, preferably at least 50 mol %, more preferably at least 80 mol %.

The above range is preferred, within which the polymer compound is excellent in the hole transport capability and the reduction resistance. Other advantages are that the drive voltage of the devices to be obtained could lower and the drive lifetime thereof may be long.

1-11. Physical Properties

The glass transition temperature of the polymer compound (i) of the invention is generally not lower than 50° C., preferably not lower than 80° C., more preferably not lower than 100° C., and is generally not higher than 300° C.

The above range is preferred, within which the polymer compound is excellent in the heat resistance and the drive lifetime of the devices to be obtained may be long.

The ionization potential of the polymer compound (i) of the invention is generally at least 4.5 eV, preferably at least 4.8 eV, and is generally at most 6.0 eV, preferably at most 5.7 eV.

The above range is preferred, within which the polymer compound is excellent in the charge injection/transfer capability and the drive voltage of the devices to be obtained could lower.

1-12. Specific Examples

Specific examples of the repeating unit of the formula (I) are shown in the following <Group of Repeating Units of Formula (I), C>, to which, however, the invention should not be limited.

<Group of Repeating Units of Formula (I), C>

[Chemical Formula 20]

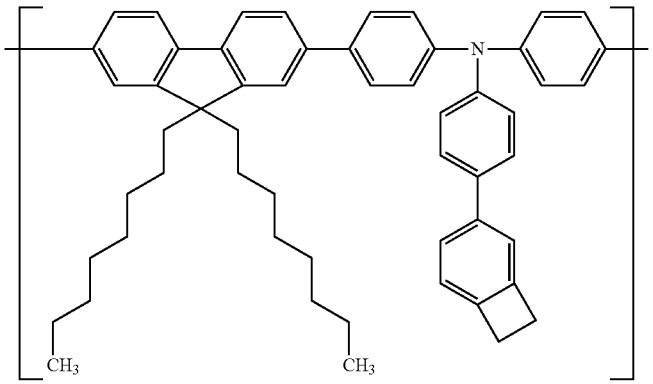

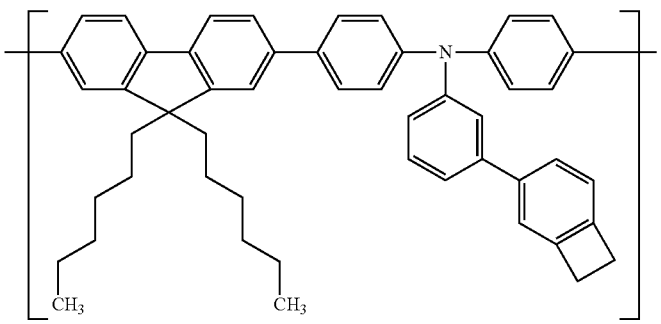

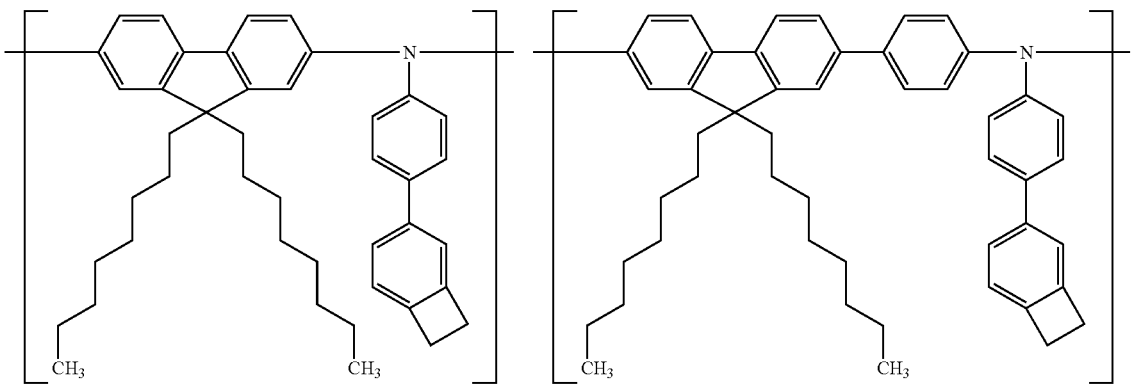

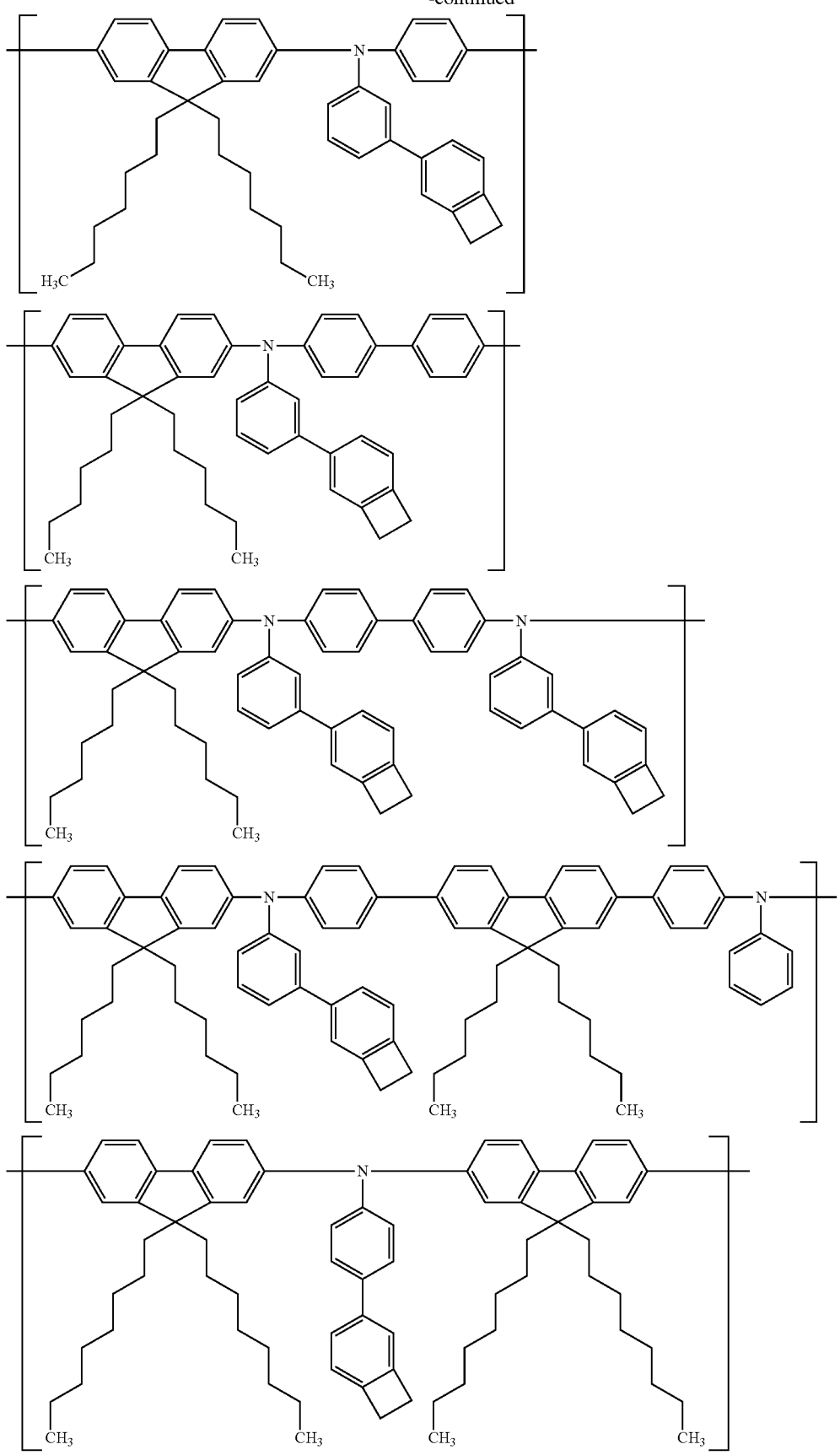

-continued
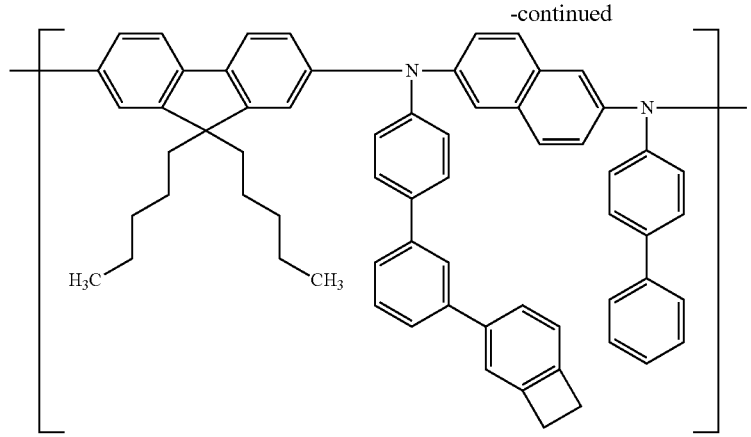
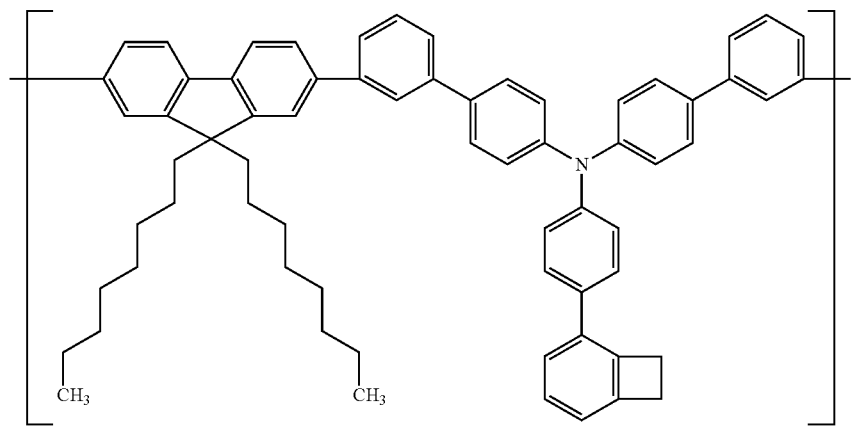
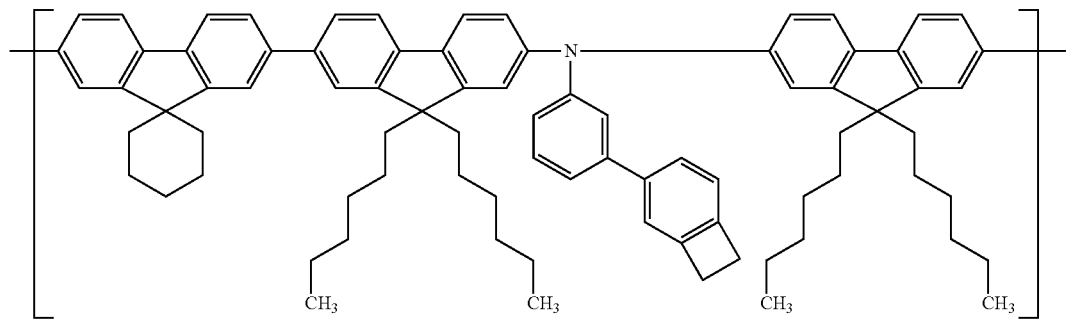
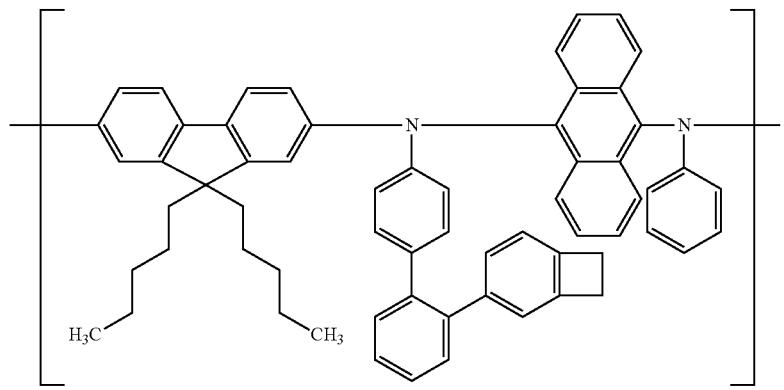

-continued
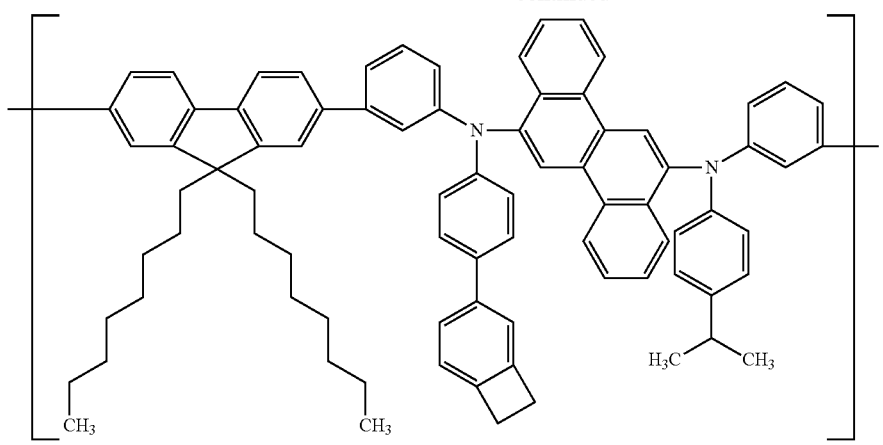
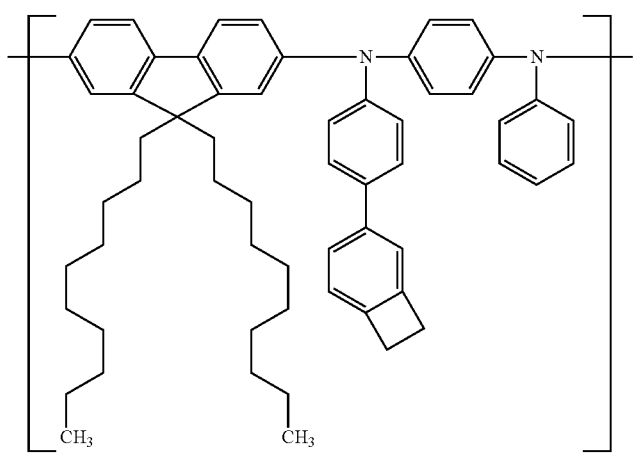
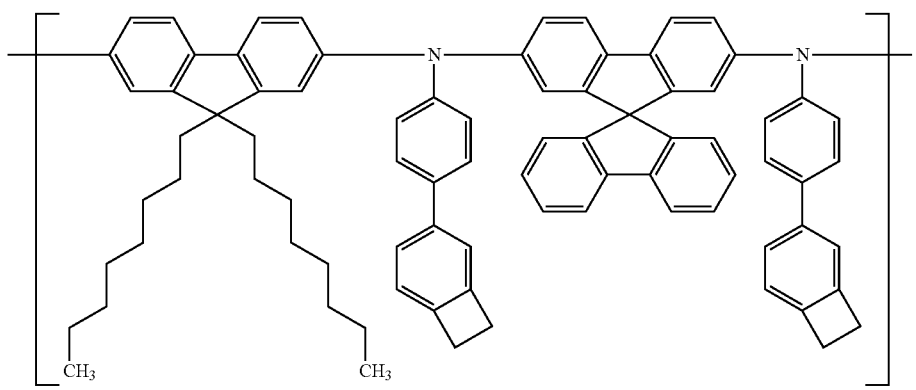

-continued
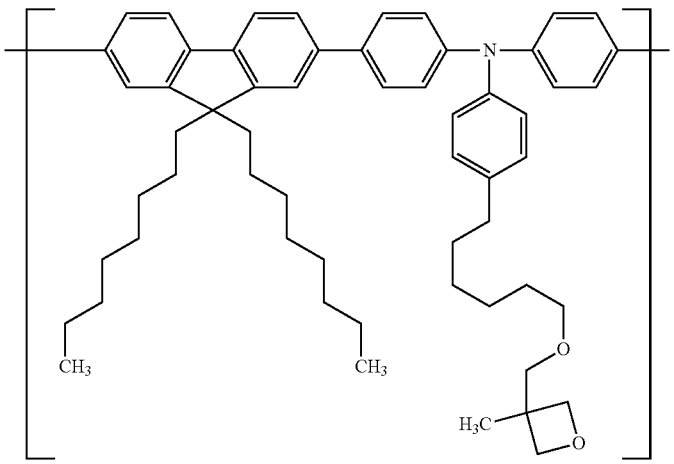
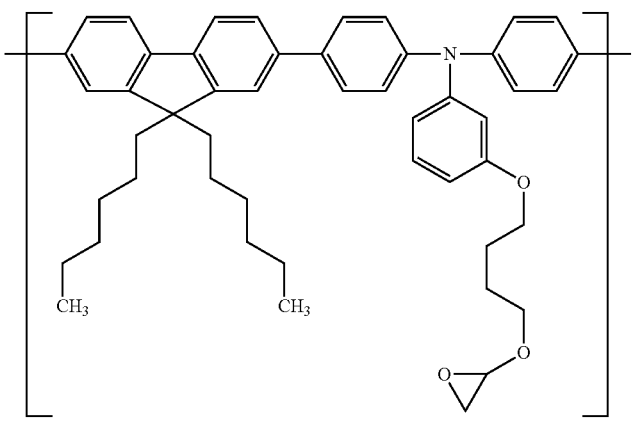
[Chemical Formula 21]
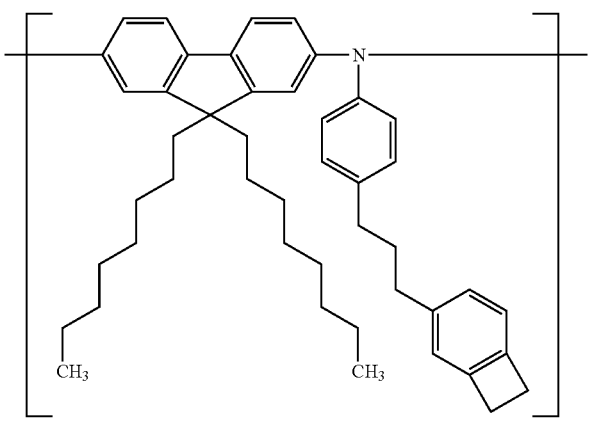

-continued
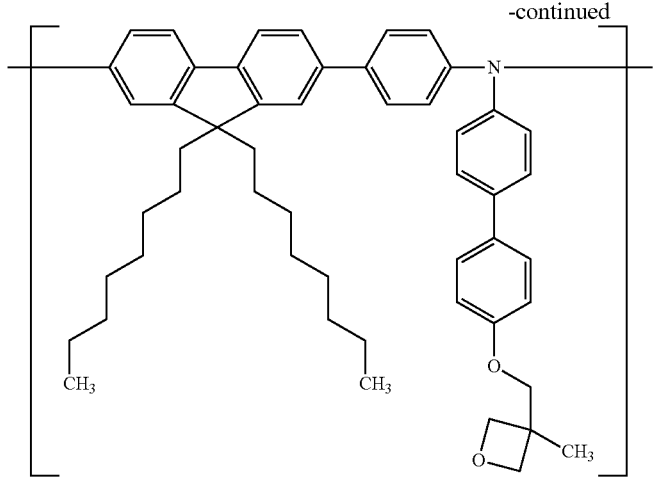
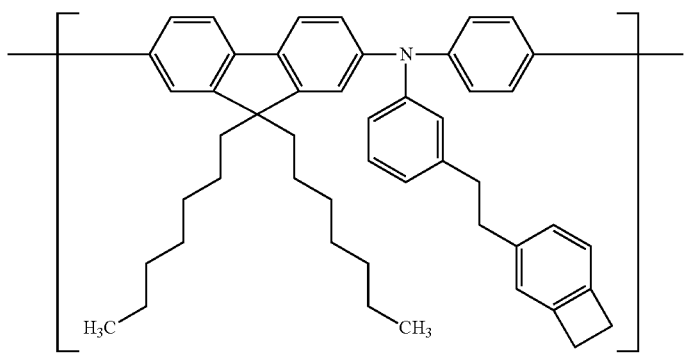
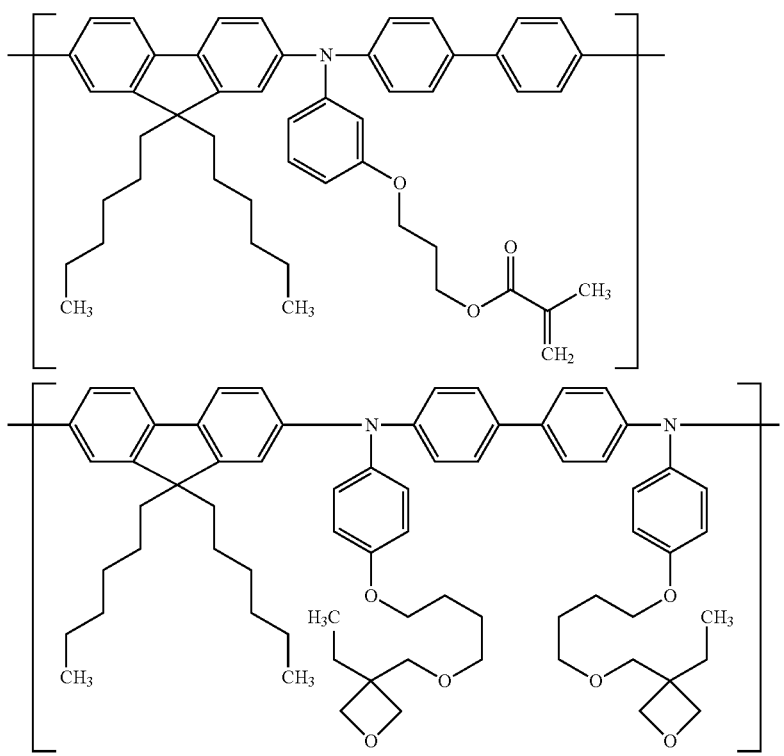

-continued
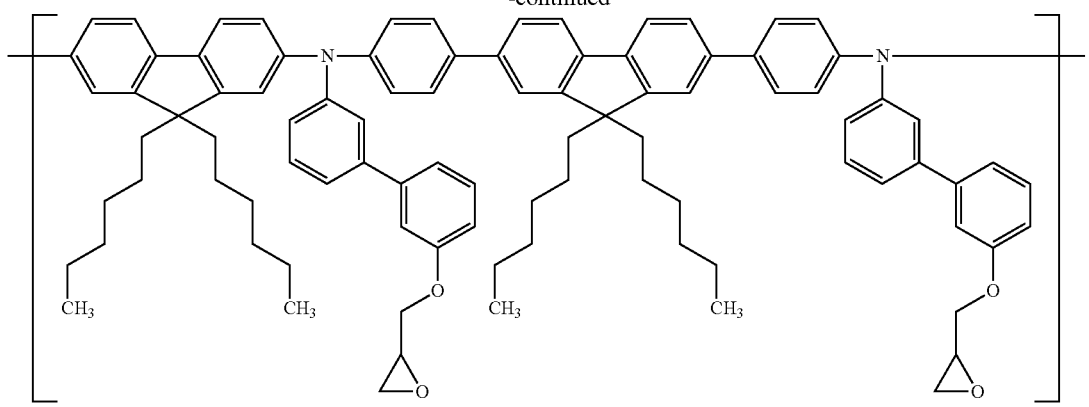
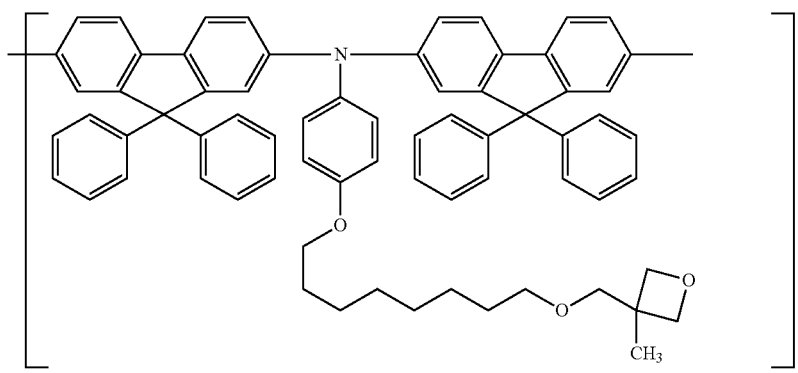
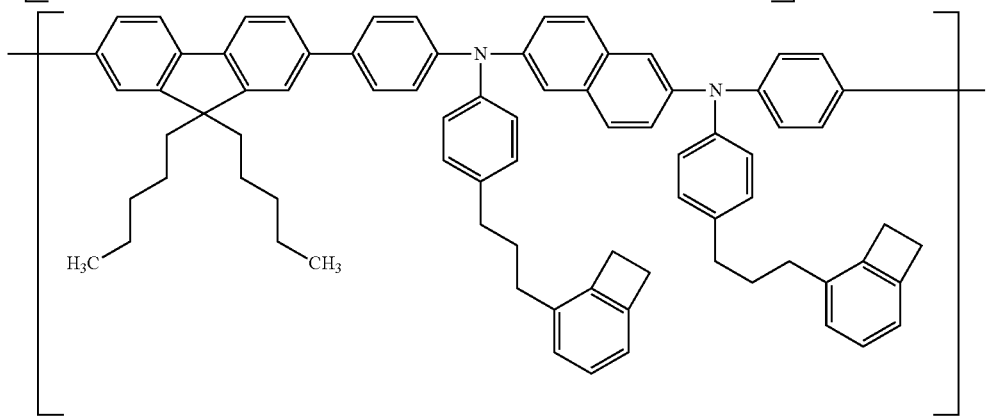
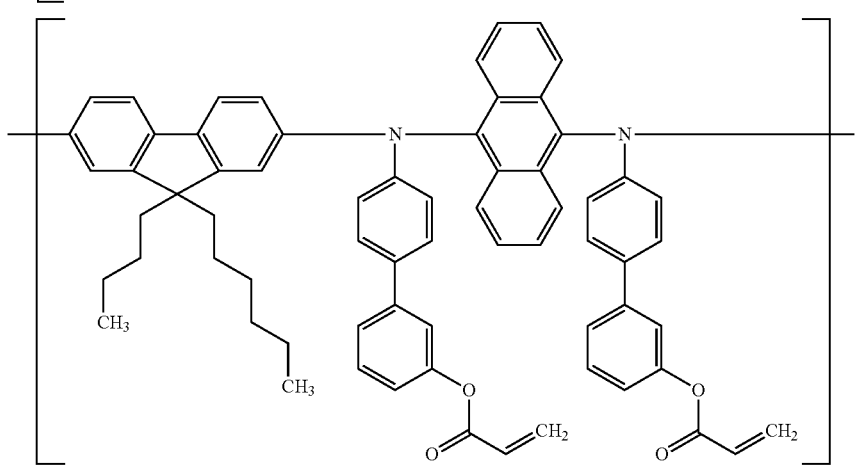

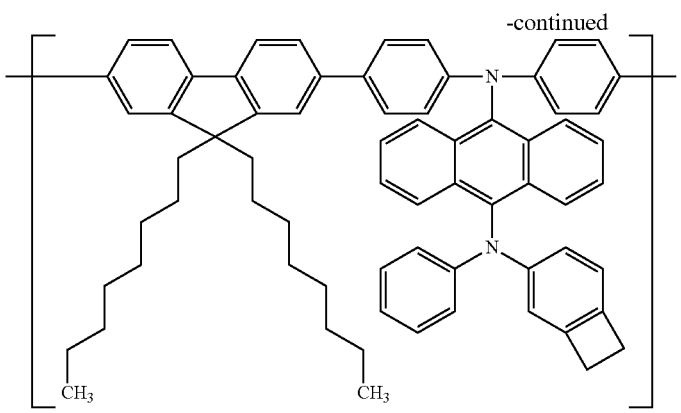
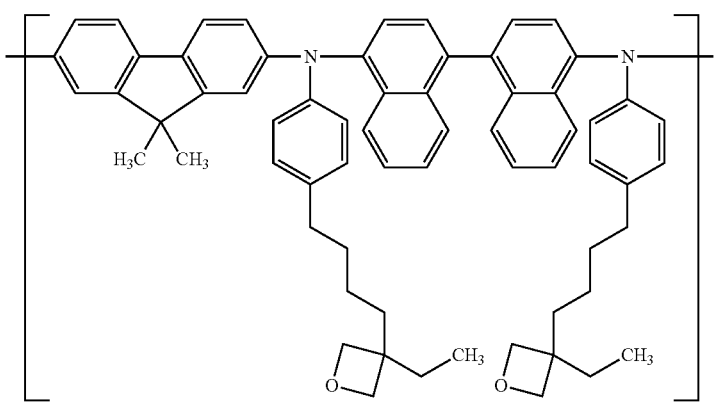
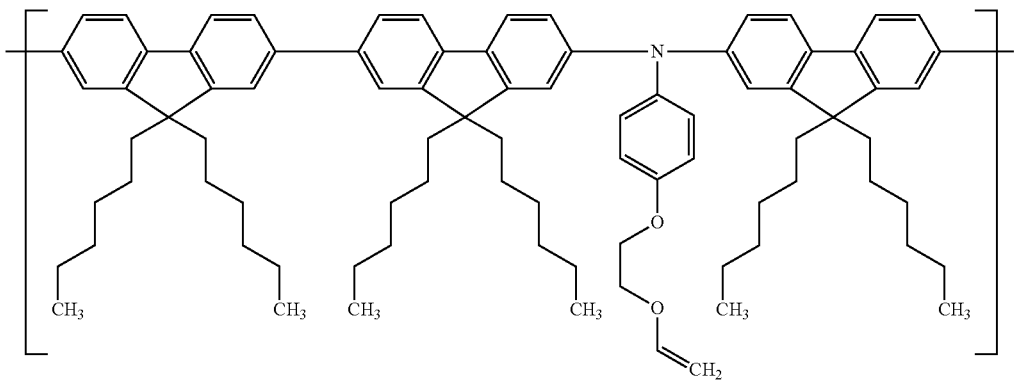
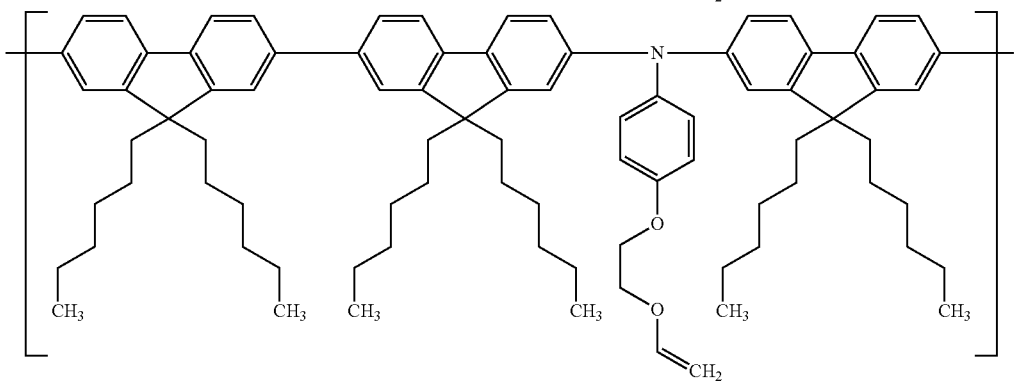

-continued
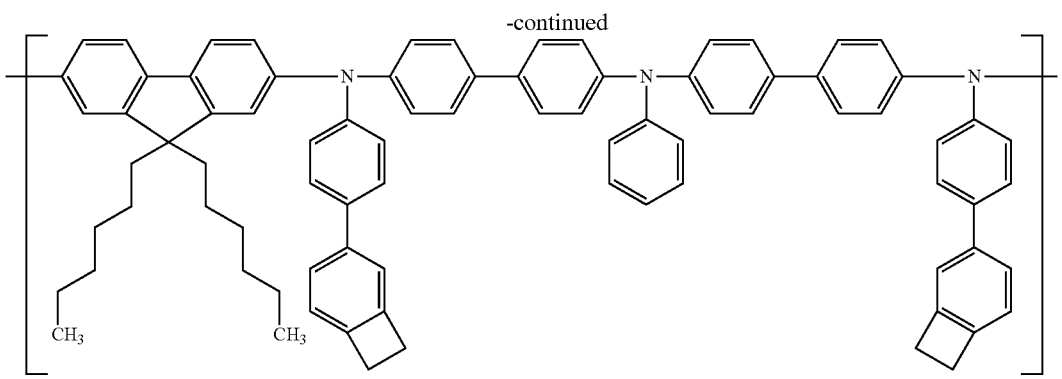
Specific examples of the repeating unit of the formula (I') are shown in the following <Group of Repeating Units of Formula (I'), D>, to which, however, the invention should not be limited.
<Group of Repeating Units of Formula (I'), D>
[Chemical Formula 22]
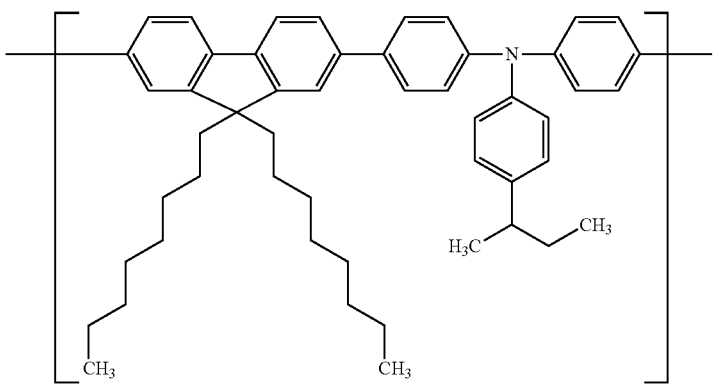
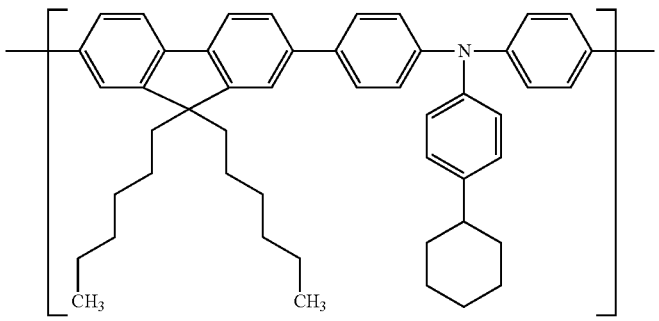
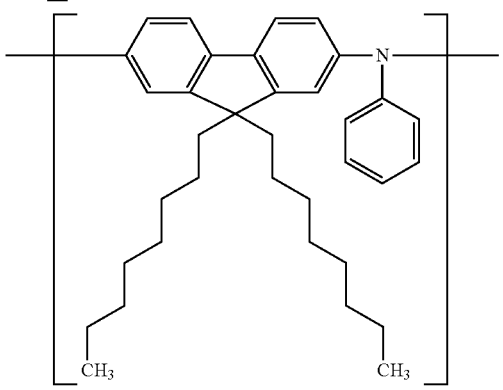
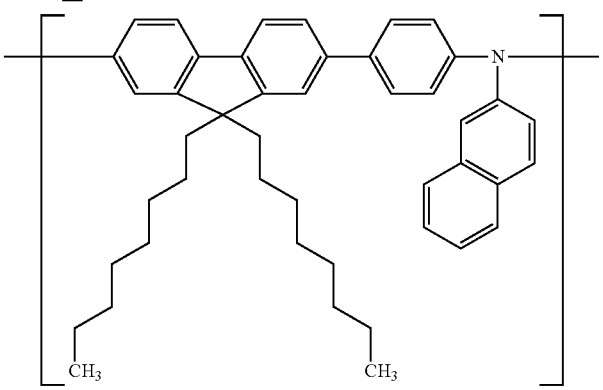

-continued
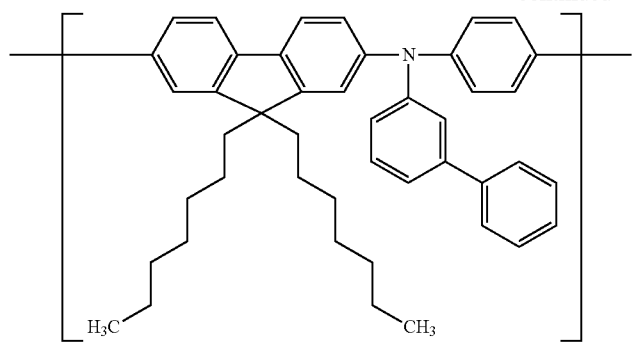
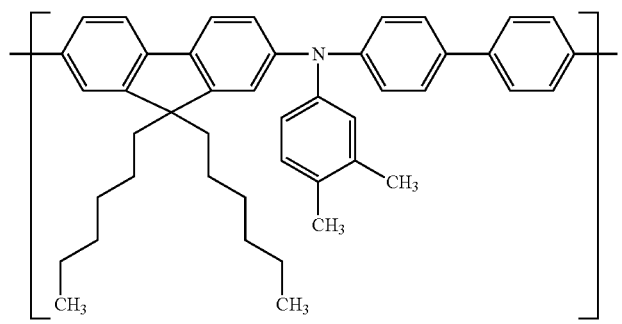
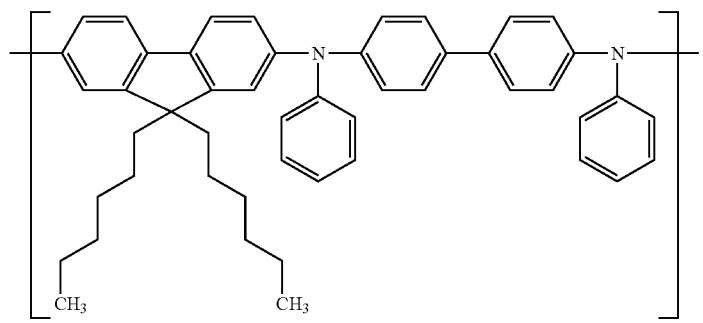
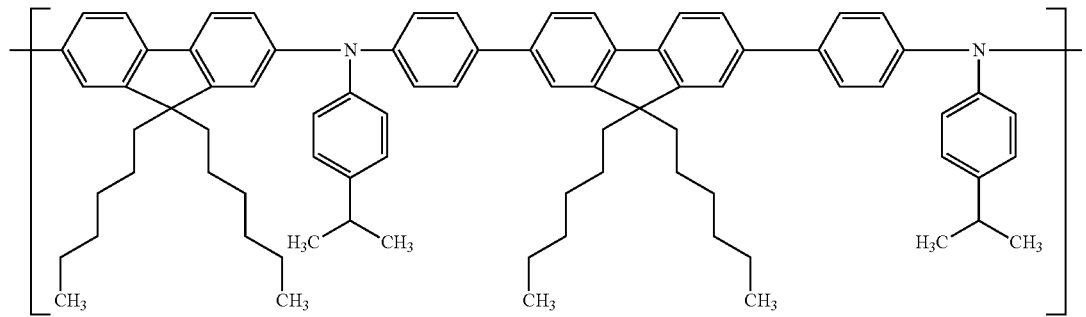
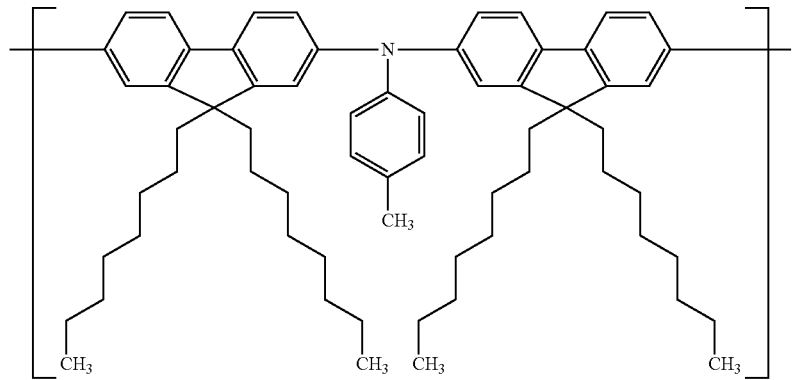

-continued
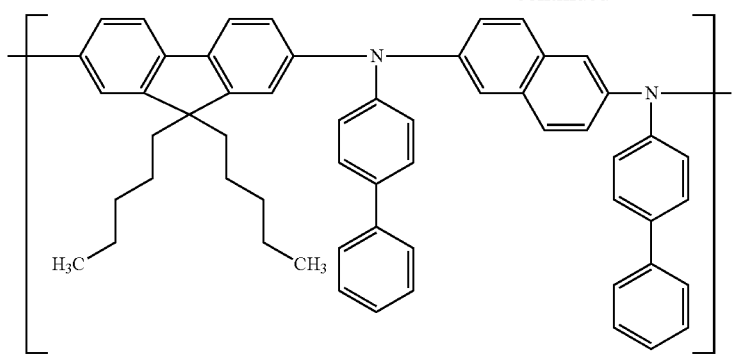
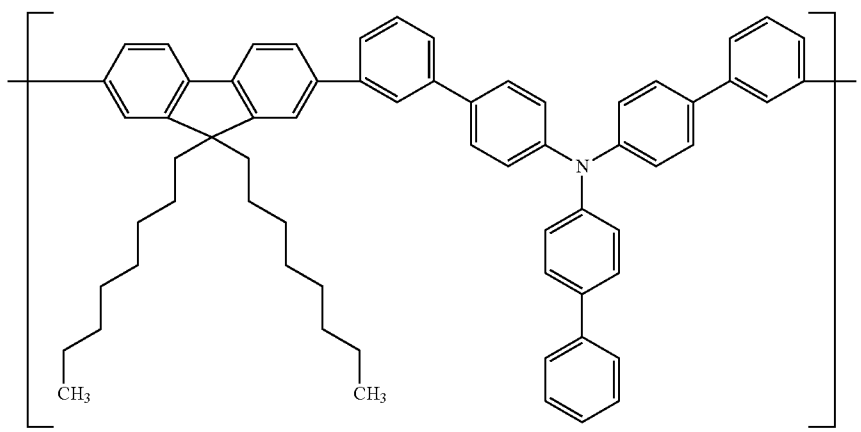
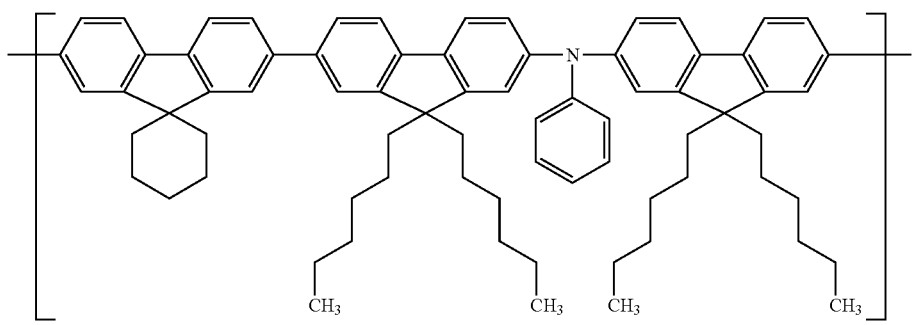
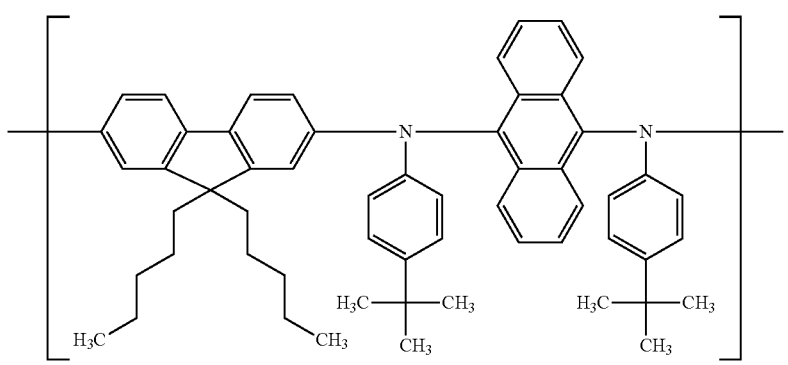

-continued
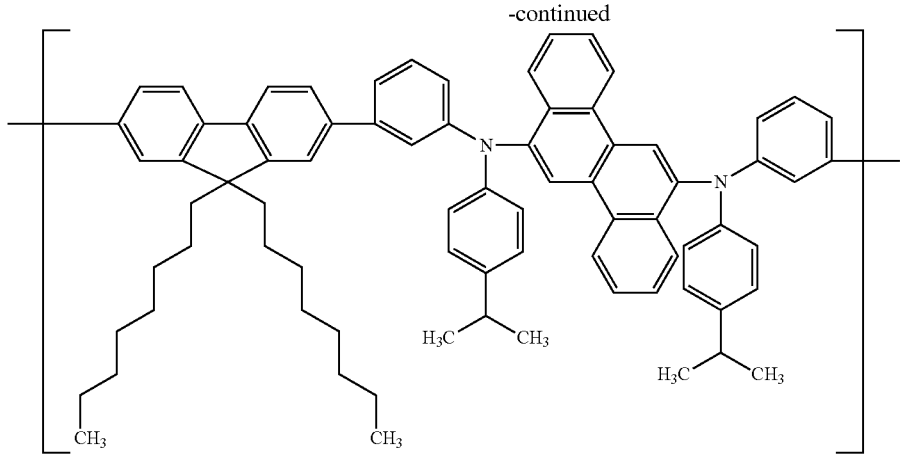
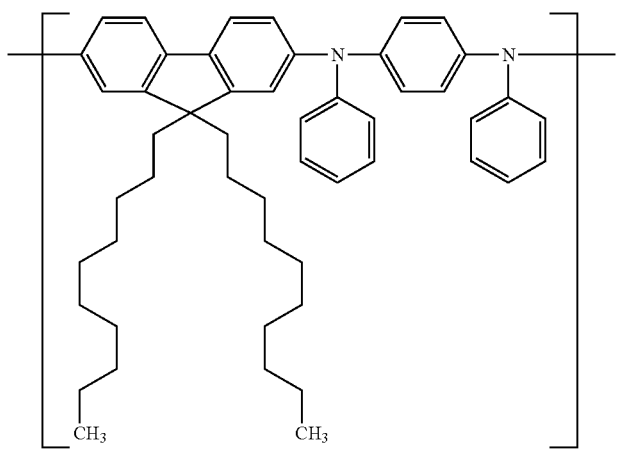
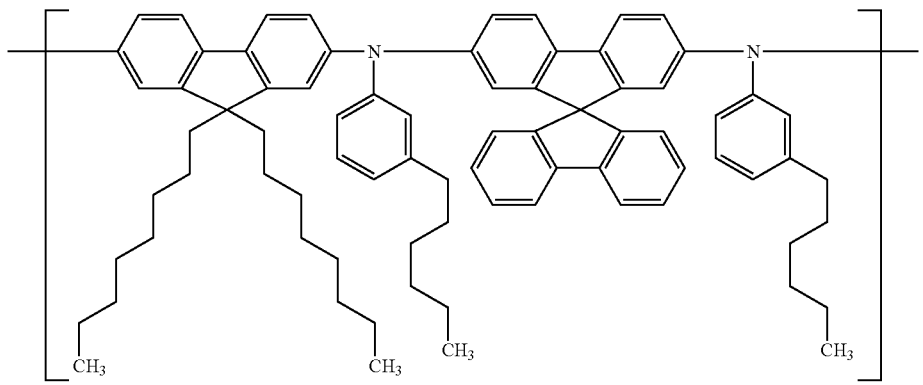

[Chemical Formula 23]

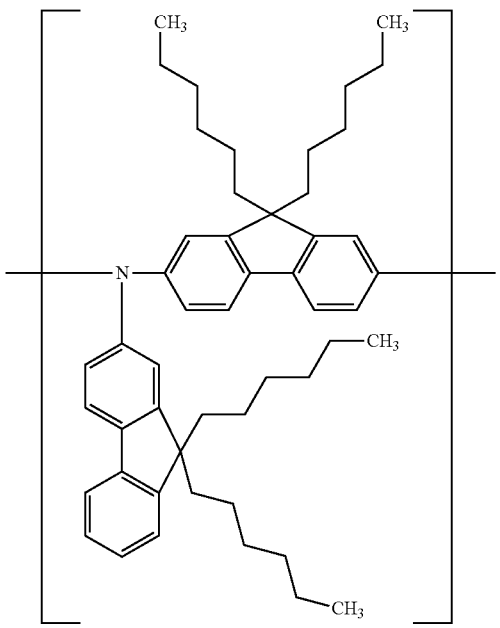

The other repeating unit than the repeating unit of the formula (I) and the repeating unit of the formula (I'), which may be in the polymer compound (i) of the invention, may be any divalent group of the repeating unit mentioned below in which $Ar^a$ and $Ar^c$ do not contain a triarylamine structure, as described in the section of <4. Production Example> given below.

[Chemical Formula 24]

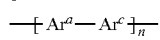

Preferred examples of the other repeating units than the repeating unit of the formula (I) and the repeating unit of the formula (I'), which may be in the polymer compound (i) of the invention, are shown in the following <Group of Other Repeating Units E>, to which, however, the invention should not be limited.

<Group of Other Repeating Units E>

[Chemical Formula 25]

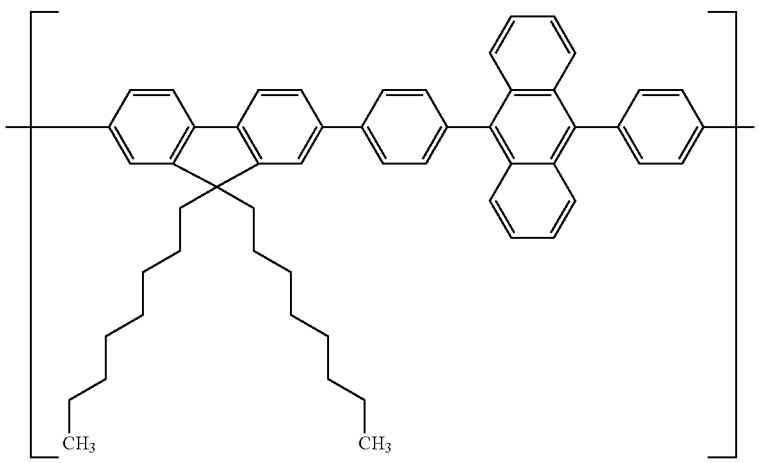

-continued
63
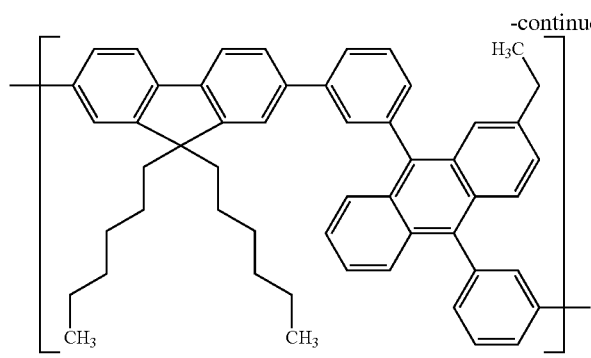
64
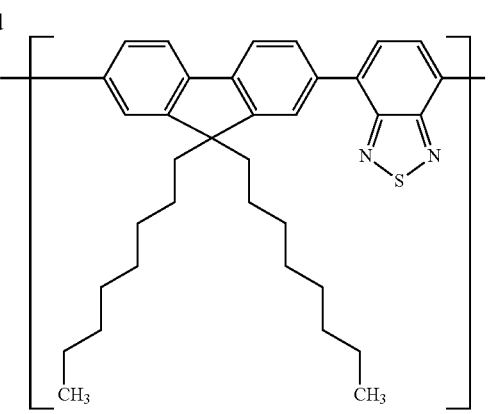
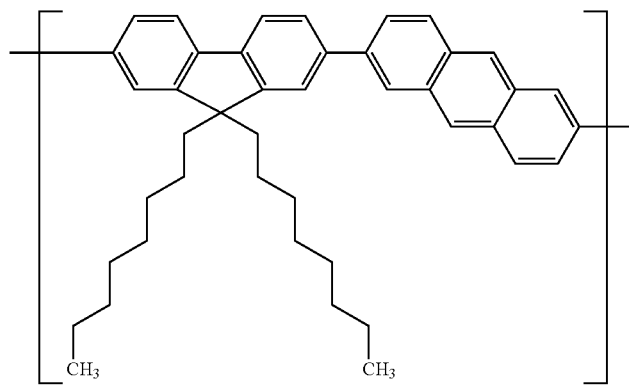
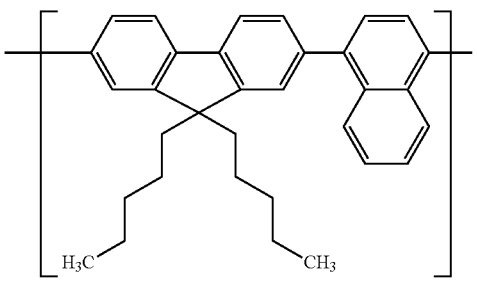
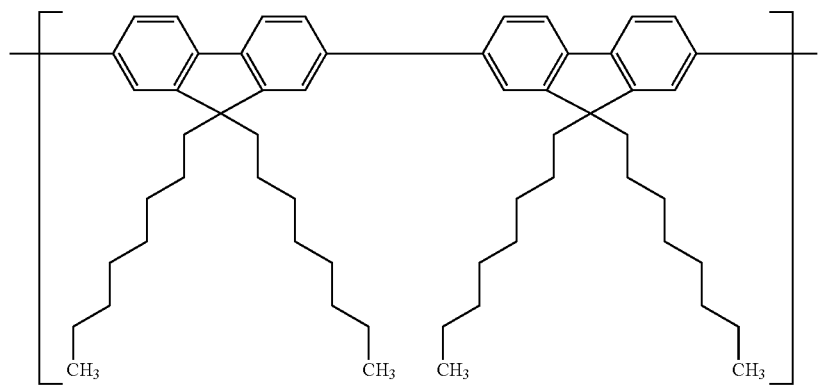
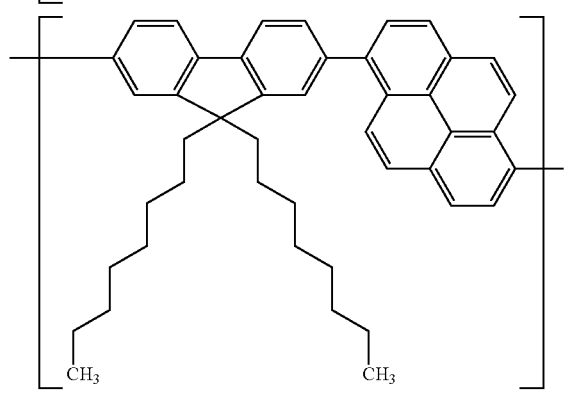

-continued
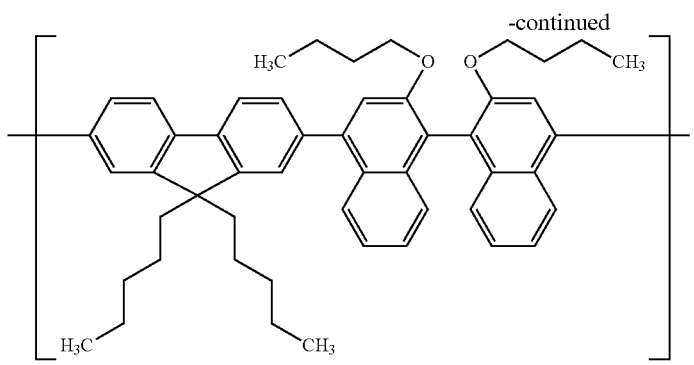
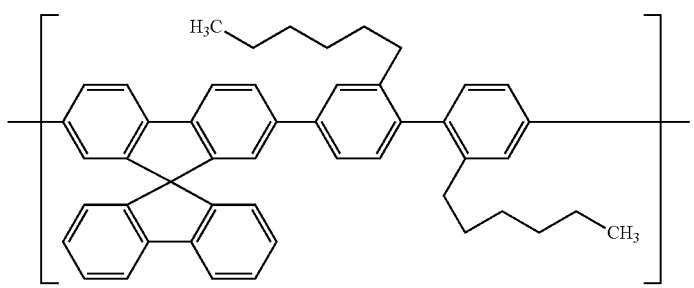
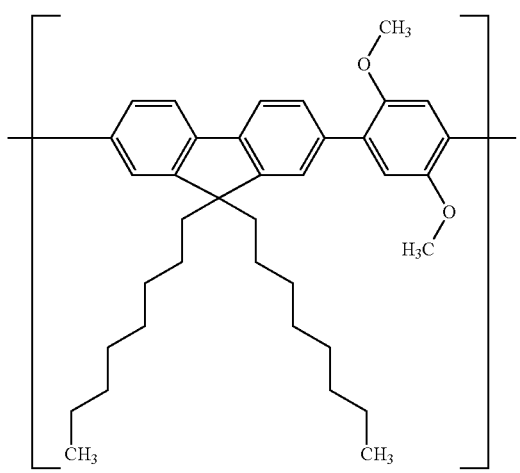
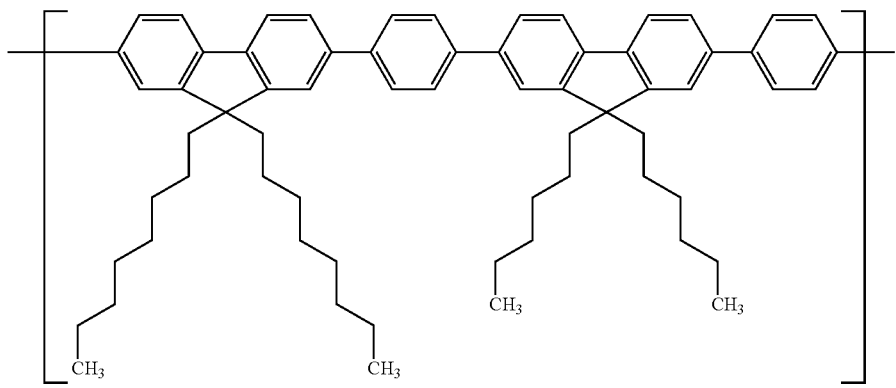

-continued
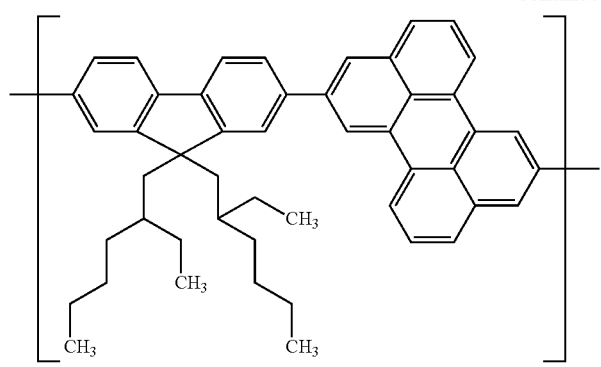
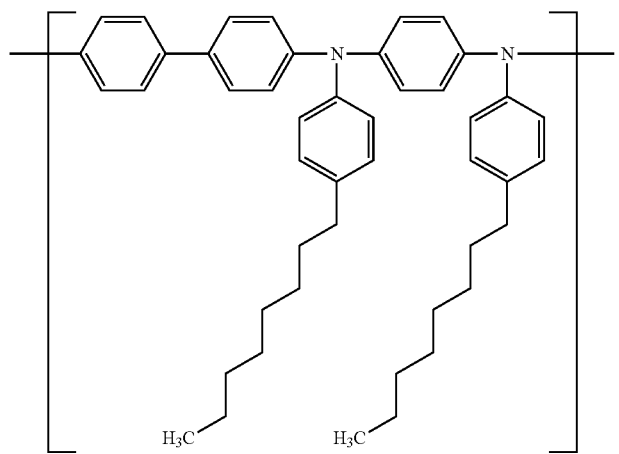
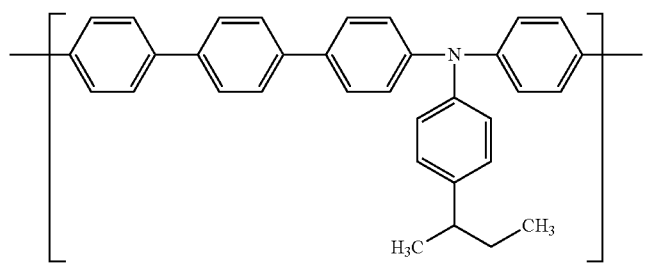
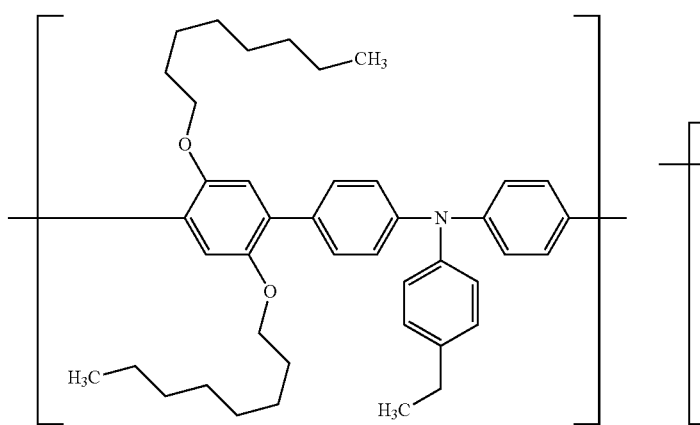
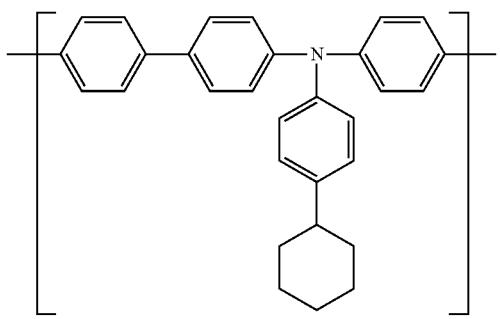

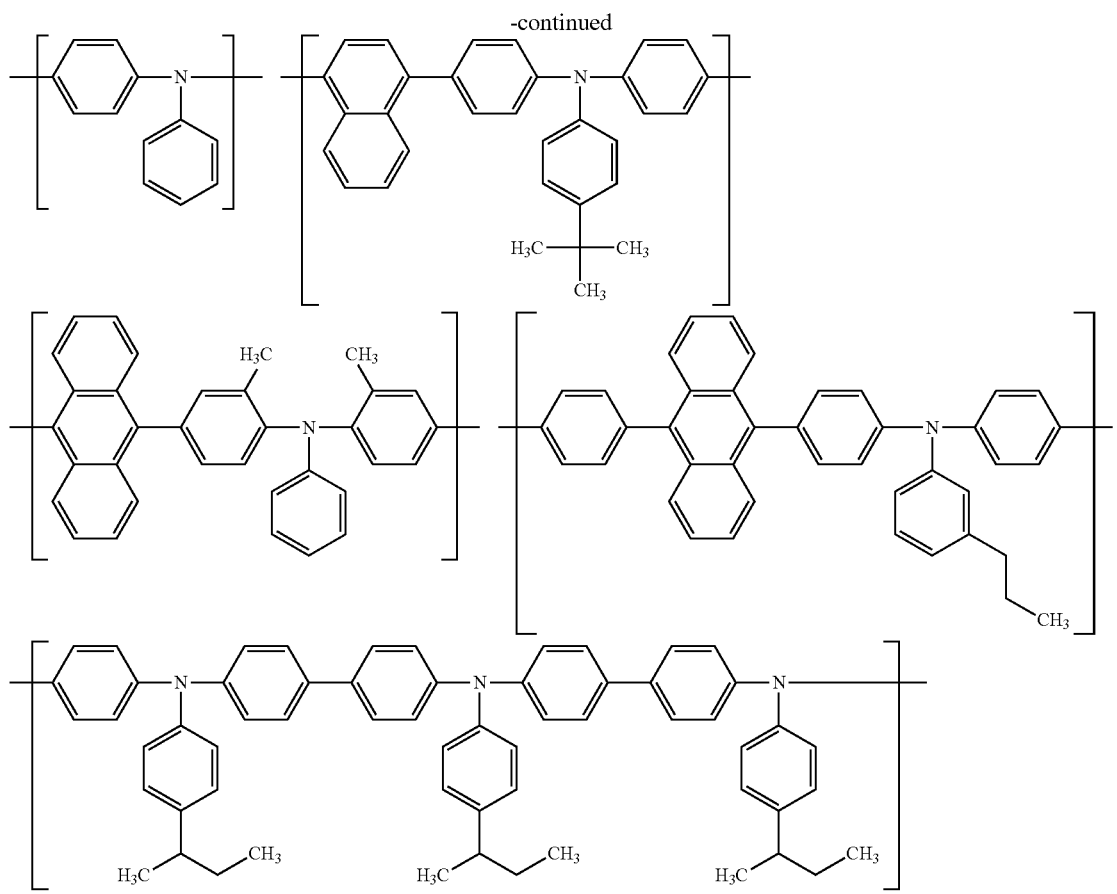

[Chemical Formula 26]

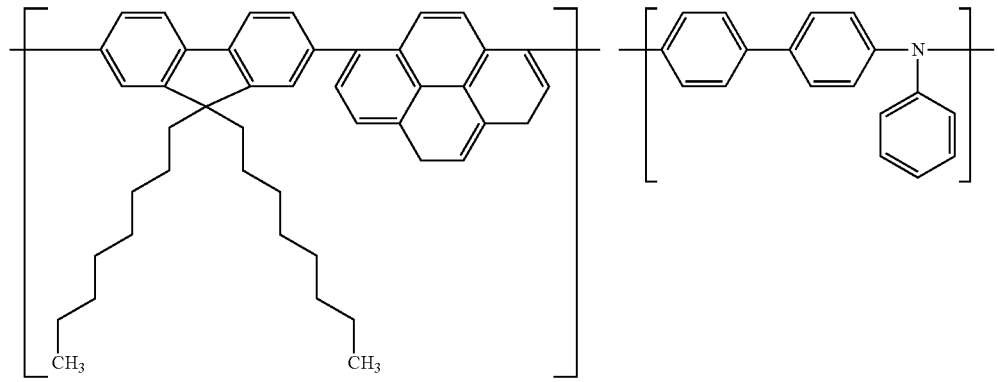

<2. Polymer Compound (ii)>

The polymer compound (ii) of the invention is a polymer compound containing a repeating unit of the following formula (II):

[Chemical Formula 27]

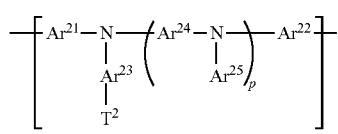

(II)

(In the formula, p indicates an integer of from 0 to 3;

$Ar^{21}$ and $Ar^{22}$ each independently represent a direct bond, an aromatic hydrocarbon group optionally having a substituent, or an aromatic heterocyclic group optionally having a substituent;

$Ar^{23}$ to $Ar^{25}$ each independently represent an aromatic hydrocarbon group optionally having a substituent, or an aromatic heterocyclic group optionally having a substituent;

$T^2$ represents a group containing a group represented by the following formula (IV).

However, $Ar^{21}$ and $Ar^{22}$ are not direct bonds at the same time.

Further, when $Ar^{21}$, $Ar^{22}$ and $Ar^{24}$ are fluorene rings, they do not have a group containing a crosslinking group as the substituent.)

[Chemical Formula 28]

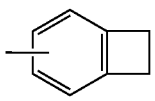

(IV)

(The benzocyclobutene ring in the formula (IV) may have a substituent. The substituents may bond to each other to form a ring.)

2-1. Structural Characteristics

The structure of the group of the formula (IV) is especially stable after crosslinked. Accordingly, when crosslinked, the solubility of the polymer compound (ii) of the invention in organic solvent can be fully lowered.

Further, the compound has a group of the formula (IV) bonding to the arylamine moiety via at least one single bond therebetween. Therefore, it is favorable since the lone electron existing in the nitrogen atom of the arylamine moiety hardly flows to the group of the formula (IV) and since the group of the formula (IV) is excellent in the electric stability. Another advantage is that the polymer compound hardly aggregates and is therefore free from the problem of charge transport capability depression of the polymer compound to be caused by aggregation thereof.

2-2. $Ar^{21}$ to $Ar^{25}$ $Ar^{21}$ and $Ar^{22}$ each independently represent a direct bond, an aromatic hydrocarbon group optionally having a substituent, or an aromatic heterocyclic group optionally having a substituent;

$Ar^{23}$ to $Ar^{25}$ each independently represent an aromatic hydrocarbon group optionally having a substituent, or an aromatic heterocyclic group optionally having a substituent. $Ar^{23}$ and $Ar^{24}$ are divalent groups, and $Ar^{25}$ is a monovalent group.

Specific examples of the aromatic hydrocarbon group optionally having a substituent and the aromatic heterocyclic group optionally having a substituent for $Ar^{21}$ to $Ar^{25}$ are the same as those described in the above-mentioned section [1-2. $Ar^{1}$ to $Ar^{5}$]. The preferred examples are the same as therein.

2-3. Group of Formula (IV)

$T^2$ in the formula (II) is a group that contains a group of the following formula (IV). In other words, the polymer compound (ii) of the invention has at least one group containing a group of the following formula (IV) in one molecule:

[Chemical Formula 29]

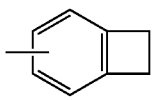

(IV)

(The benzocyclobutene ring in the formula (IV) may have a substituent. The substituents may bond to each other to form a ring.)

The substituent that the benzocyclobutene ring of the above formula (IV) may have includes those described in the above-mentioned section of [Group of Substituents Z]. Preferred examples are the same as therein; but most preferably, the ring is unsubstituted.

In the polymer compound (ii) of the invention, preferably, the group of the formula (IV) bonds to the aromatic hydrocarbon group or the aromatic heterocyclic group via a divalent group composed of from 1 to 30 groups selected from a group —O—, a group —C(=O)— and a group (optionally having a substituent) —CH$_2$— and bonding to each other in any desired order. Specifically, $T^2$ is preferably a group that contains a group of the formula (IV). This is because the benzocyclobutene ring of the formula (IV) is excellent in oxidation-reduction stability.

2-4. Position of Group of Formula (IV)

The polymer compound (ii) of the invention has a group that contains a group of the formula (IV) as $T^2$.

The group $T^2$ that contains a group of the formula (IV) bonds to $Ar^{23}$; and therefore, as compared with a case where the group bonds to any other position, the compound is favorable in that the formula is excellent in oxidation-reduction stability and the compound hardly aggregates.

In case where the polymer compound (ii) of the invention contain any other group that contain a group of the formula (IV) than $T^2$, the group may be in the repeating unit or may be in any other site than the repeating unit.

In case where the group that contains a group of the formula (IV) is in any other side than $Ar^{23}$, the group is preferably in any of $Ar^{21}$, $Ar^{22}$, $Ar^{24}$ or $Ar^{25}$ from the viewpoint that the group of the formula (IV) may be hardly degraded by reduction. However, when $Ar^{21}$, $Ar^{22}$ and $Ar^{24}$ are fluorene rings, they do not have a group containing a crosslinking group as the substituent.

2-5. Content Ratio of Groups of Formula (IV)

The content ratio of the groups of the formula (IV) in the polymer compound (ii) of the invention is the same as that in the above-mentioned section [1-5. Content Ratio of Crosslinking Groups] where the crosslinking group is a group of the formula (IV). Preferred ranges are the same as therein.

2-6. Description of p

In the formula (II), p indicates an integer of from 0 to 3.

The above p is the same as n described in the section of [1-7. Regarding n]. Preferred examples are the same as therein.

2-7. Additional Repeating Units

Preferably, the polymer compound (ii) of the invention further contains a repeating unit represented by the following formula (II').

[Chemical Formula 30]

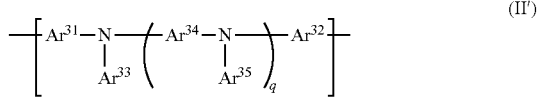

(II')

(In the formula (II'), q indicates an integer of from 0 to 3;

$Ar^{31}$ and $Ar^{32}$ each independently represent an aromatic hydrocarbon group optionally having a substituent, an aromatic heterocyclic group optionally having a substituent, or a double bond;

$Ar^{33}$, $Ar^{34}$ and $Ar^{35}$ each independently represent an aromatic hydrocarbon group optionally having a substituent, or an aromatic heterocyclic group optionally having a substituent.

However, $Ar^{31}$ and $Ar^{32}$ are not direct bonds at the same time.

$Ar^{31}$ to $Ar^{35}$ do not have a group containing a group of the formula (IV) as the substituent.

Further, when $Ar^{31}$, $Ar^{32}$ and $Ar^{34}$ are fluorene rings, they do not have a group containing a crosslinking group as the substituent.)

(2-5-1. $Ar^{31}$ to $Ar^{35}$)

$Ar^{31}$ and $Ar^{32}$ each independently represent an aromatic hydrocarbon group optionally having a substituent, an aromatic heterocyclic group optionally having a substituent, or a double bond;

$Ar^{33}$ to $Ar^{35}$ each independently represent an aromatic hydrocarbon group optionally having a substituent, or an aromatic heterocyclic group optionally having a substituent. $Ar^{31}$, $Ar^{32}$ and $Ar^{34}$ are divalent groups; and $Ar^{33}$ and $Ar^{35}$ are monovalent groups.]

Specific examples of the aromatic hydrocarbon group optionally having a substituent and the aromatic heterocyclic group optionally having a substituent for $Ar^{31}$ to $Ar^{35}$ are the same as those described in the above section [1-2. $Ar^1$ to $Ar^5$]. Preferred examples are the same as therein.

However, $Ar^{31}$ to $Ar^{35}$ do not contain a group of the formula (IV) as the substituent.

Further, when $Ar^{31}$, $Ar^{32}$ and $Ar^{34}$ are fluorene rings, they do not have a group containing a crosslinking group as the substituent.

(2-5-2. Regarding q)

In the formula (II'), q indicates an integer of from 0 to 3. The above q is the same as n described in the section of [1.7. Regarding n]. Preferred examples are the same as therein.

2-6. Ratio of Repeating Units

In case where the polymer compound (ii) of the invention has a repeating unit of the formula (II'), the ratio of the repeating units of the formula (II') to the repeating units of the formula (II) [repeating units of formula (II')/repeating units of formula (II)] is the same as that described in the above section [1-10. Ratio of Repeating Unit]. In other words, the repeating units of the formula (I) in the above section are replaced by the repeating units of the formula (II) in this case, and the repeating units of the formula (I') therein are replaced by the repeating units of the formula (II'). Preferred examples are the same as therein. The polymer compound (ii) of the invention may contain any other repeating unit than the repeating unit of the formula (II) and the repeating unit of the formula (II').

2-7. Physical Properties

The physical properties of the polymer compound (ii) of the invention are the same as those described in the above section [1-10. Physical Properties. Preferred examples are the same as therein.

2-8. Specific Examples

Preferred examples of the repeating unit of the formula (II) are shown in the following <Group of Repeating Units of Formula (II), F>, to which, however, the invention should not be limited.

<Group of Repeating Units of Formula (II), F>

[Chemical Formula 31]

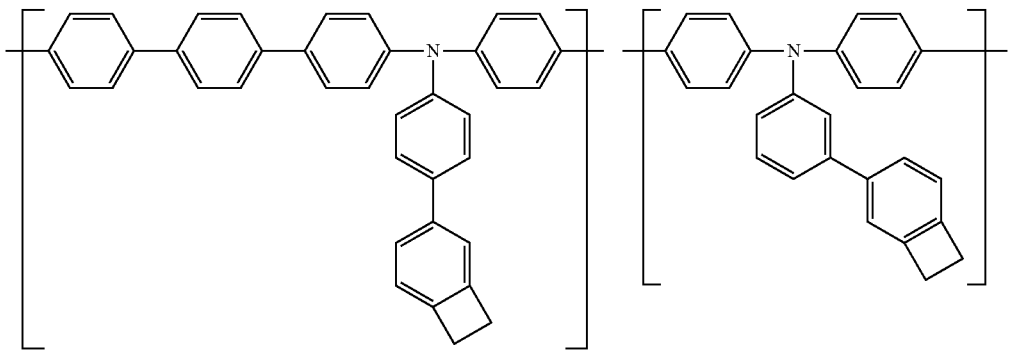

-continued
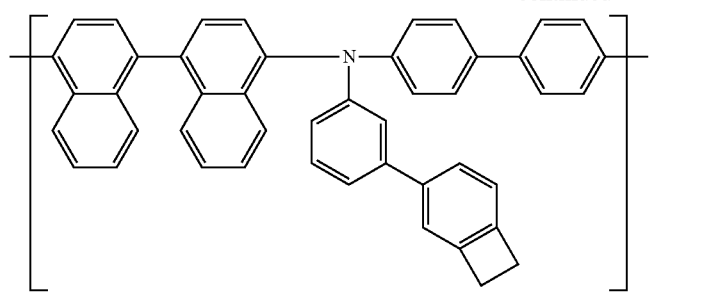
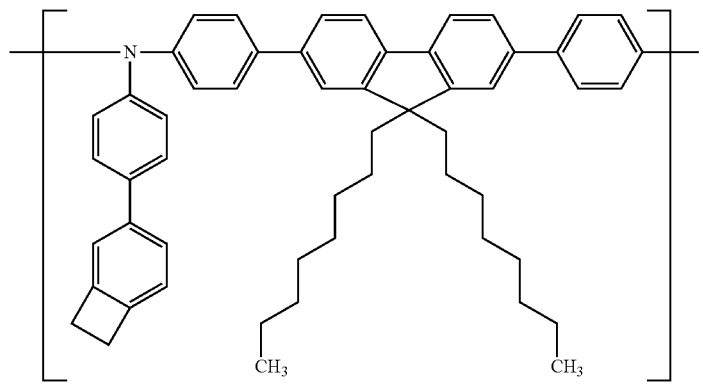
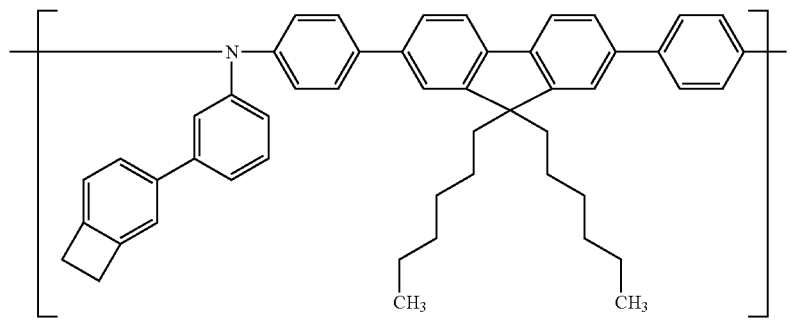
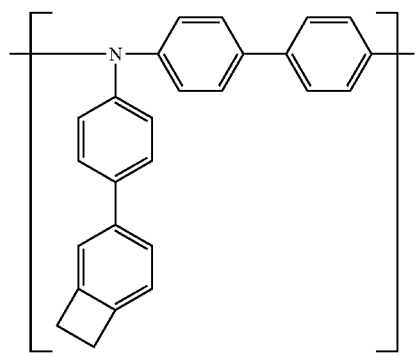
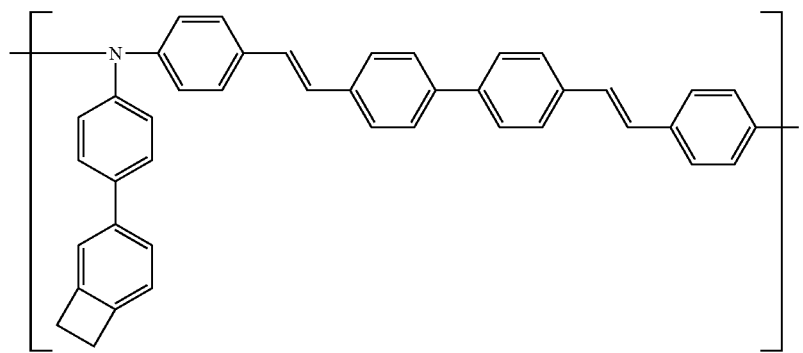

77 78
-continued
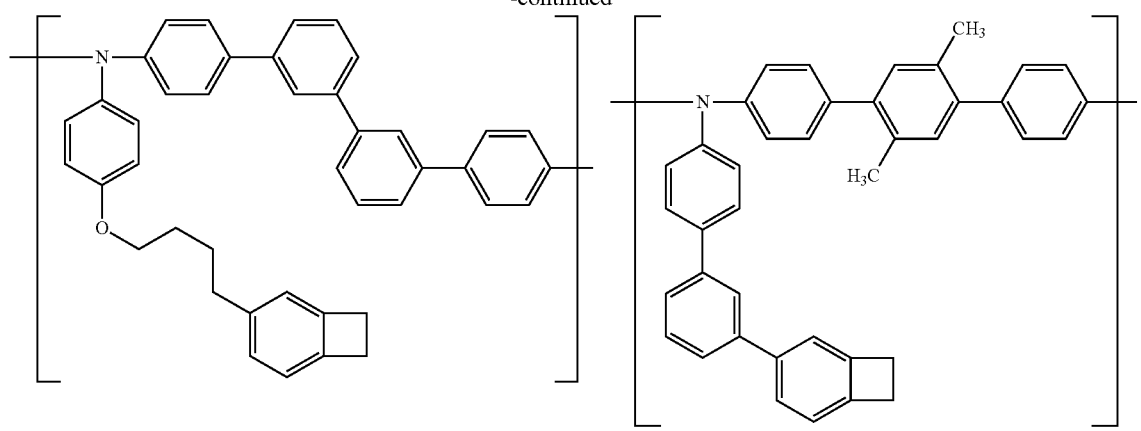
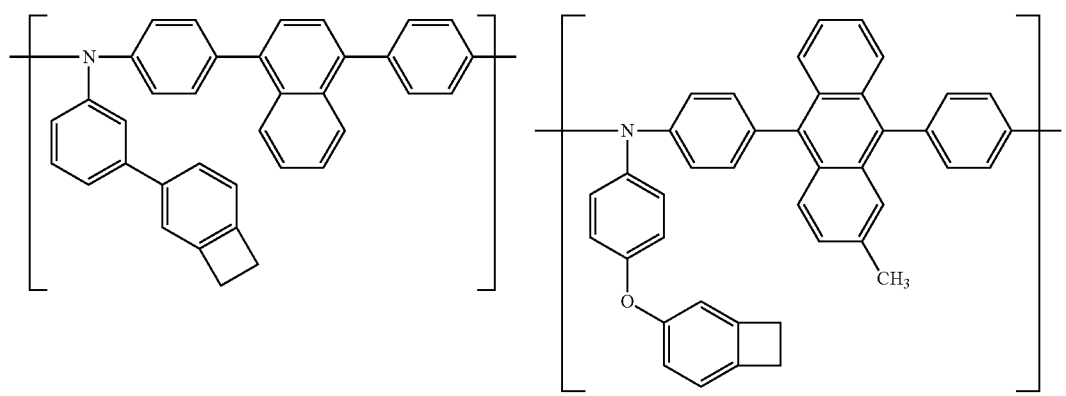
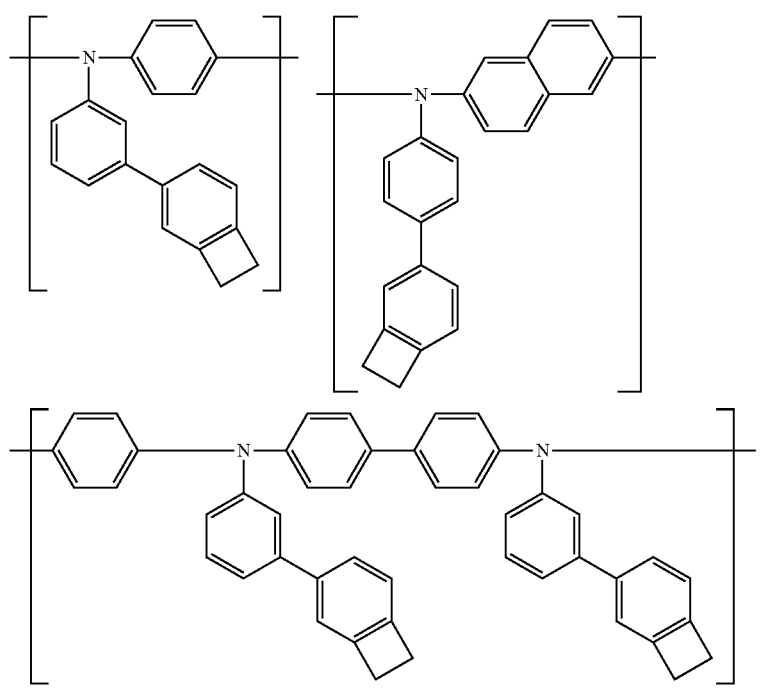

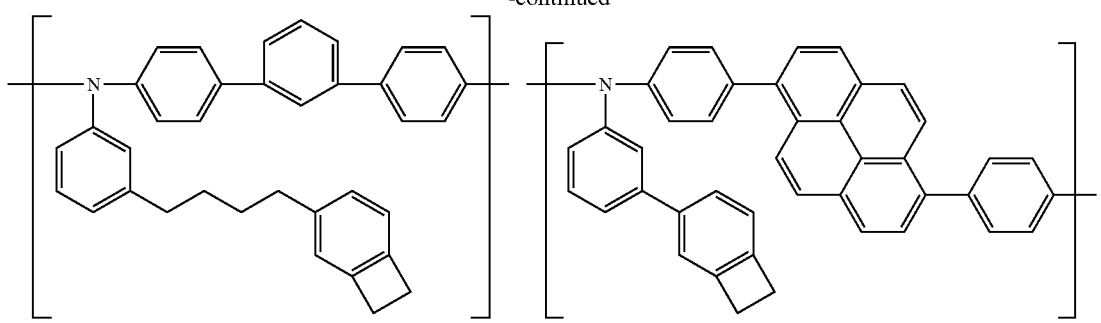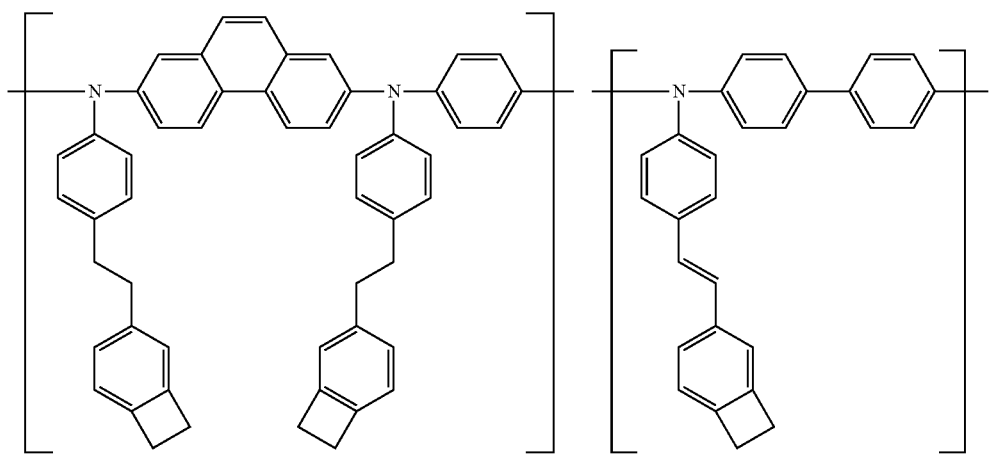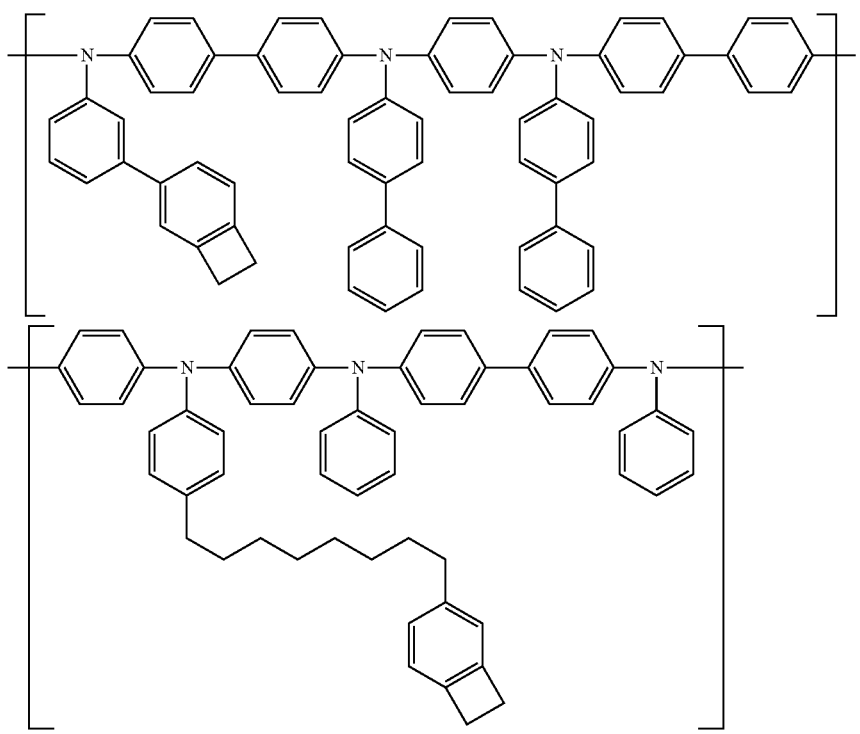

-continued
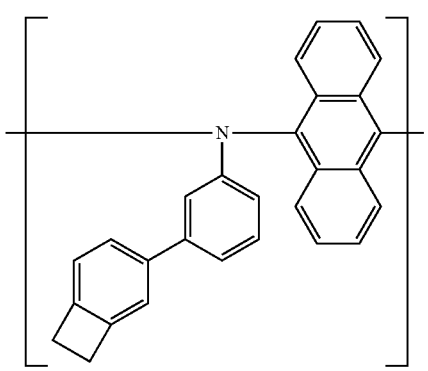
81
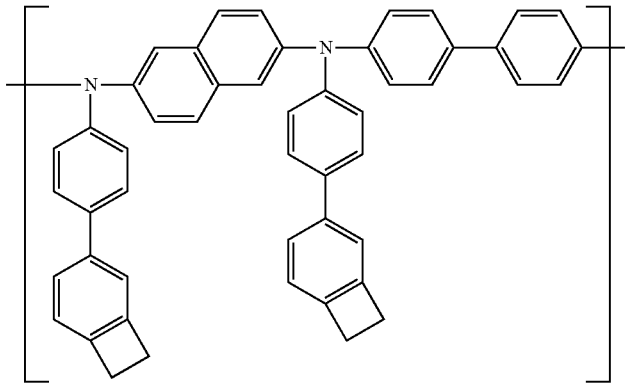
82
[Chemical Formula 32]
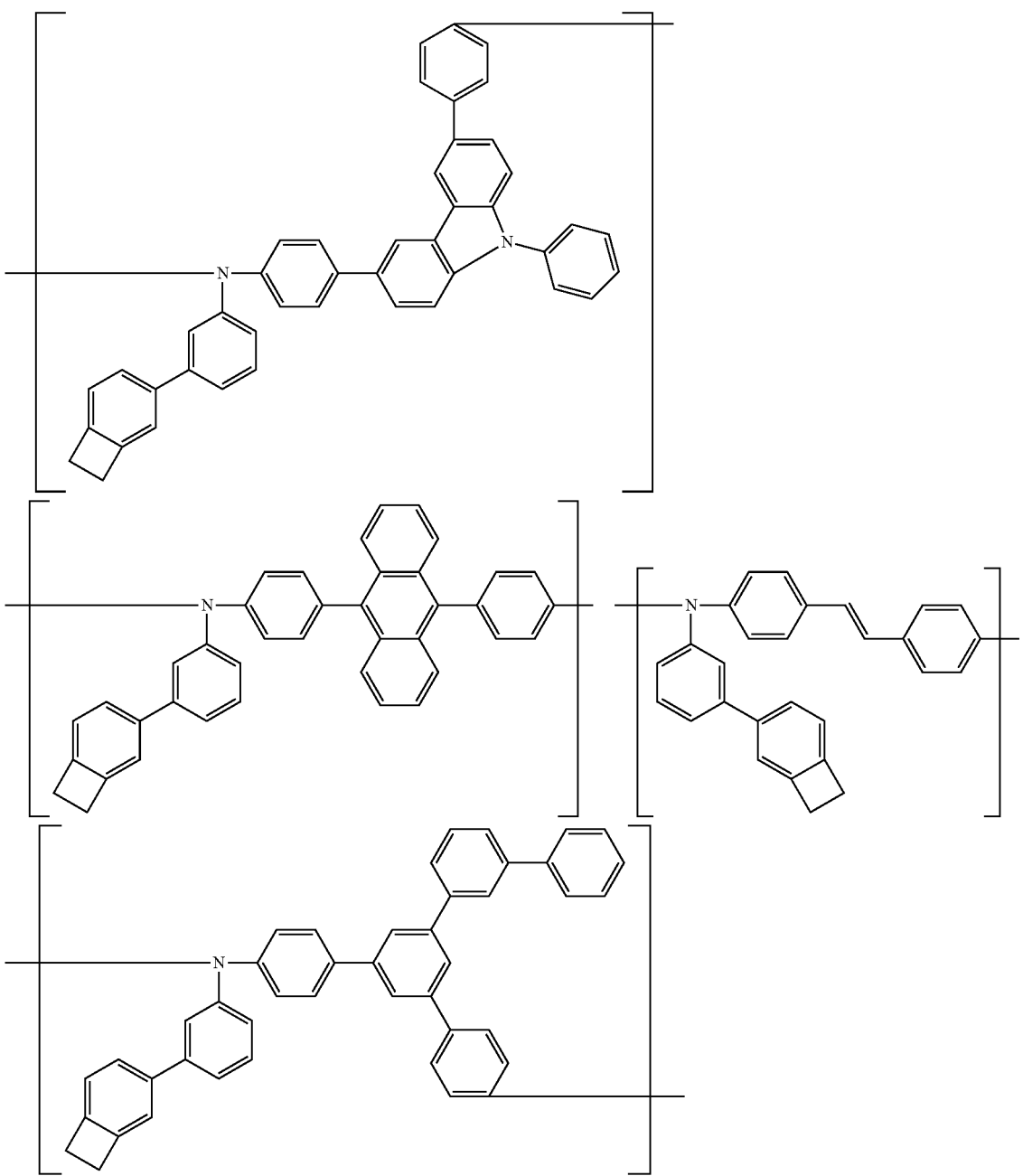

-continued
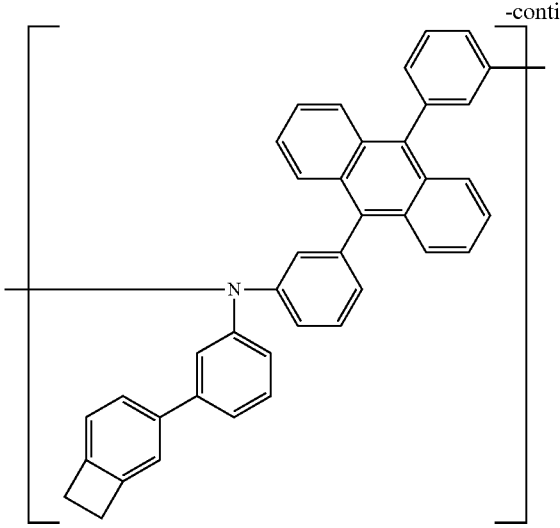
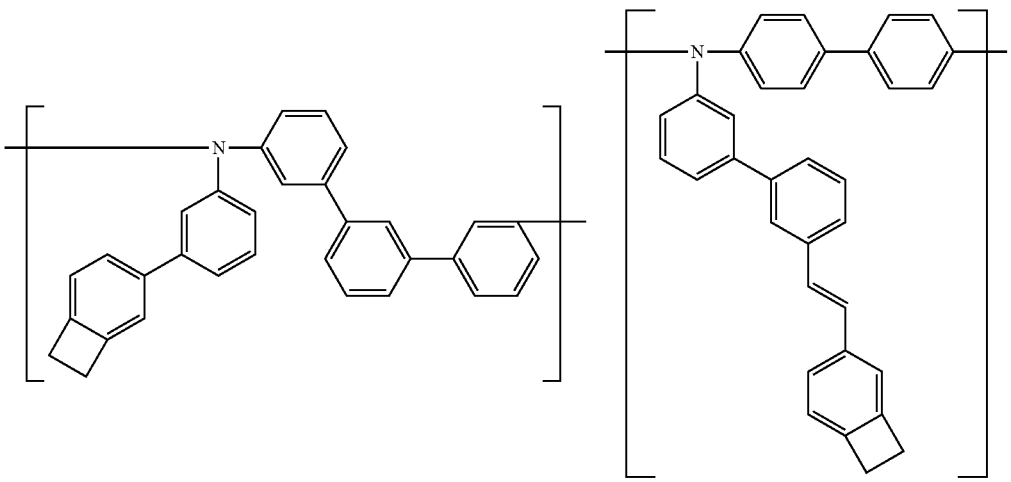
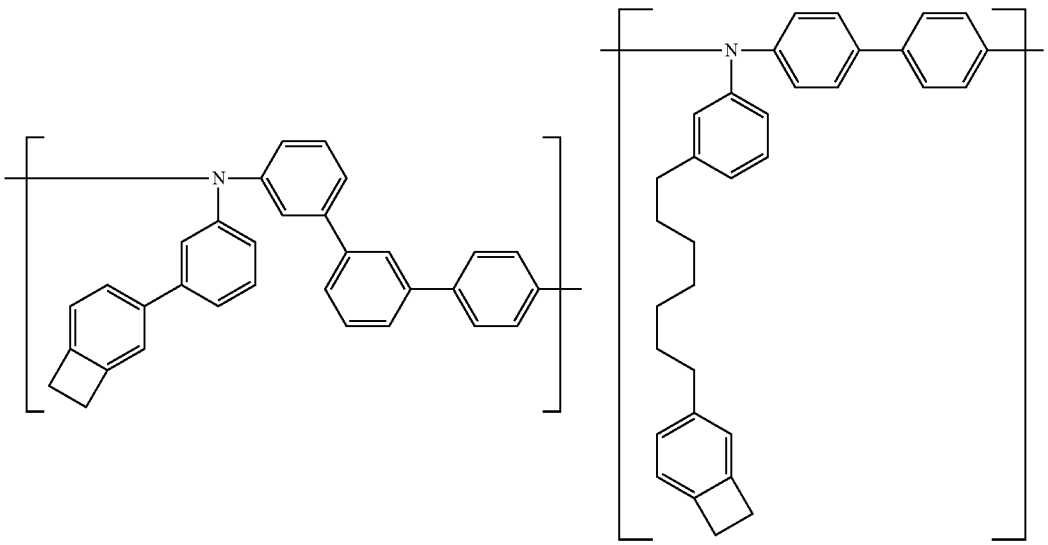

-continued

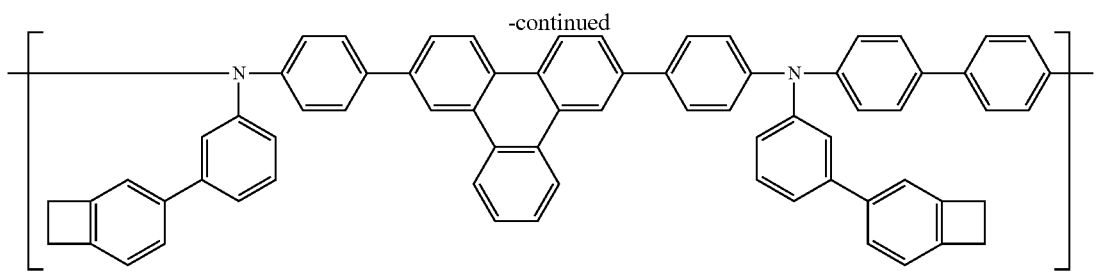

Of the specific examples described in the above section <Group of Repeating Units of Formula (I), C>, the repeating units having a group of the formula (IV) are also preferred examples of the repeating unit of the formula (II).

Preferred examples of the repeating unit of the formula (II') are shown in the following <Group of Repeating Units of Formula (II'), G>, to which, however, the invention should not be limited.

<Group of Repeating Units of Formula (II'), G>

[Chemical Formula 33]

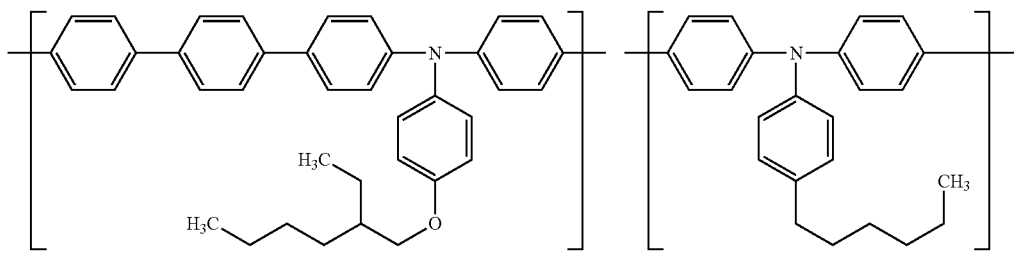

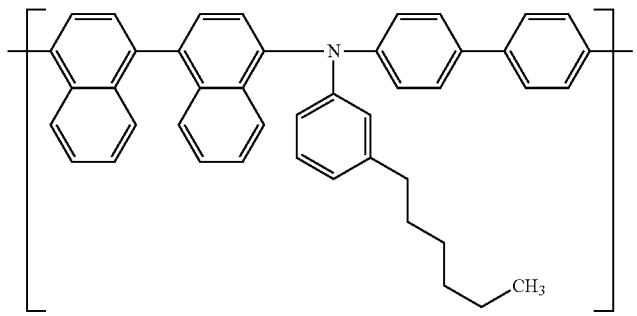

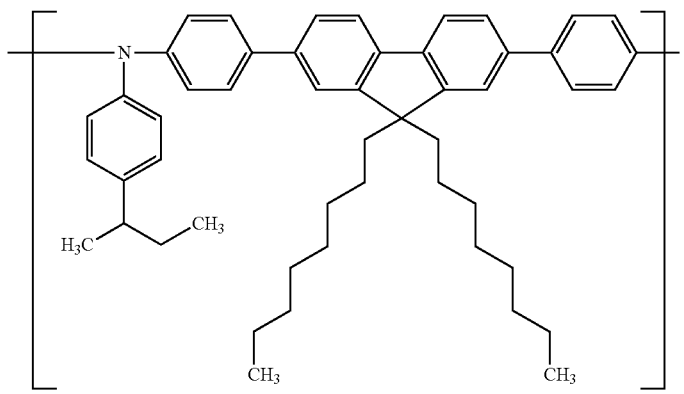

-continued
87
88
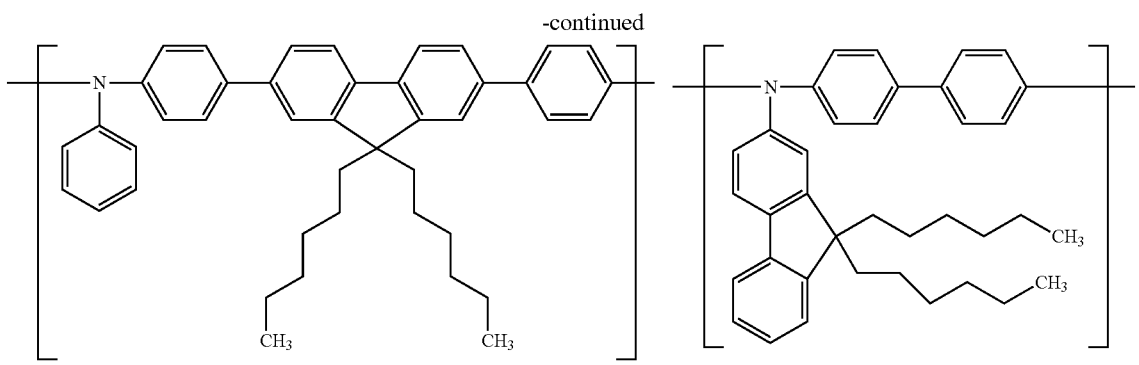
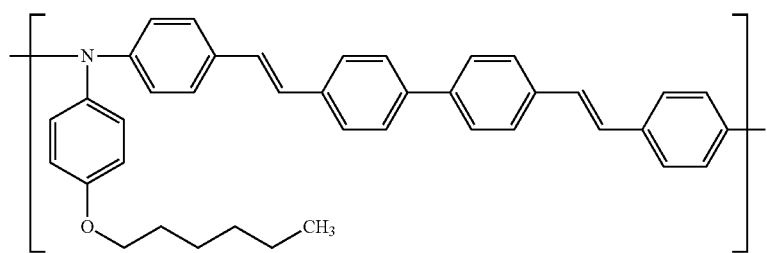
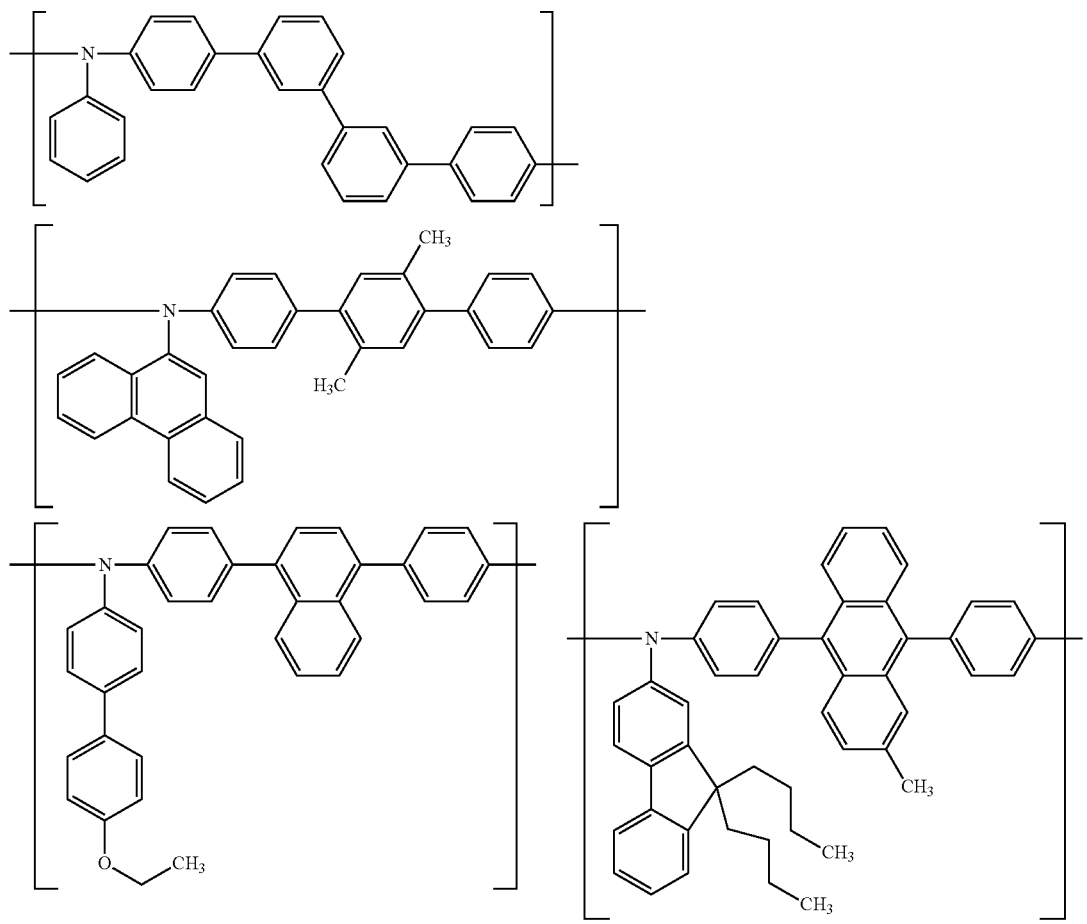

-continued
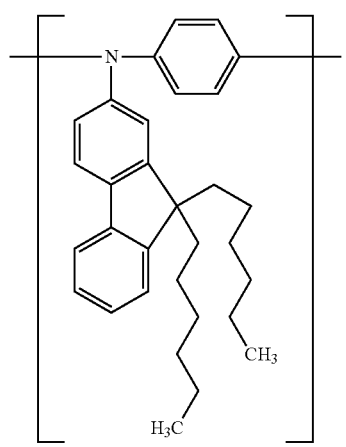
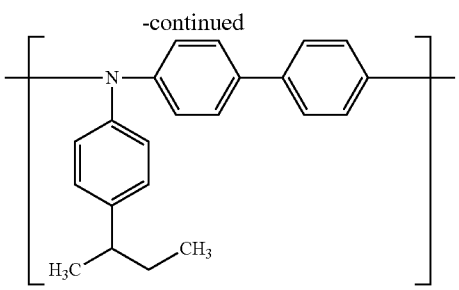
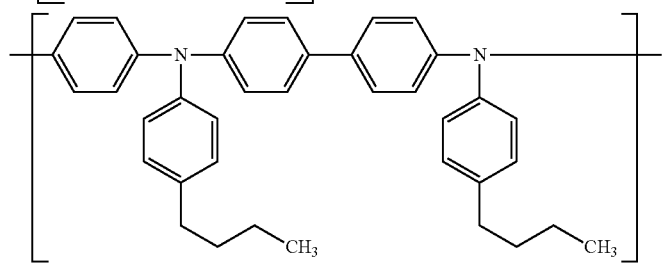
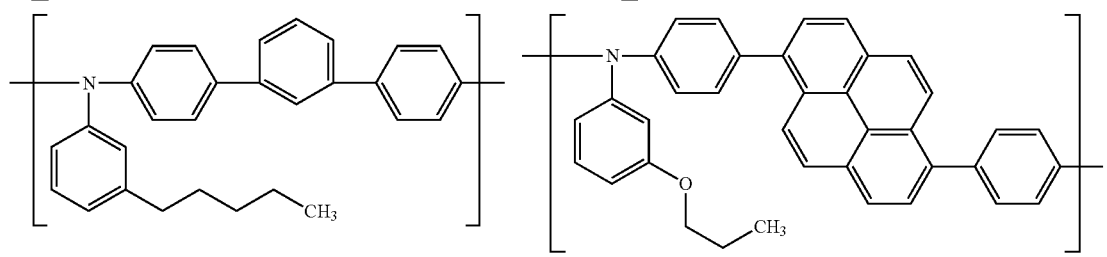
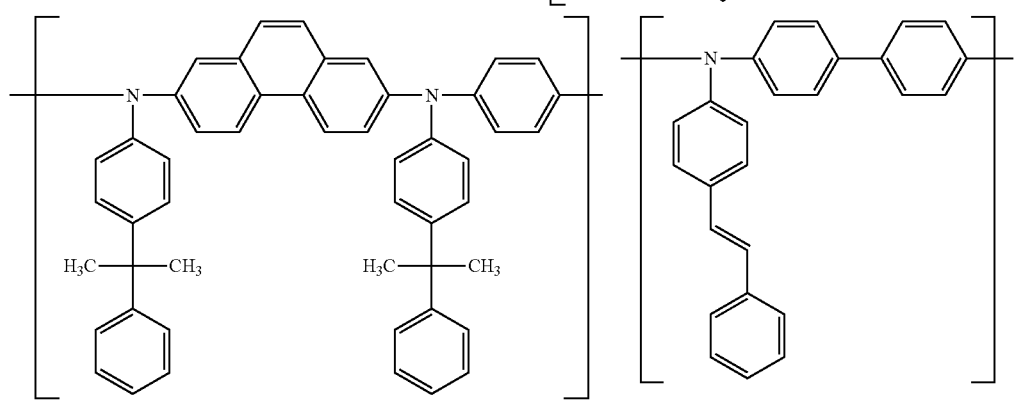
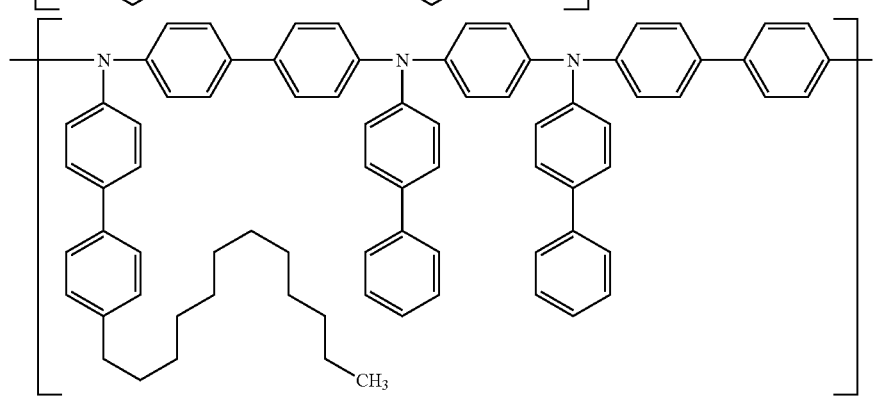

-continued
91
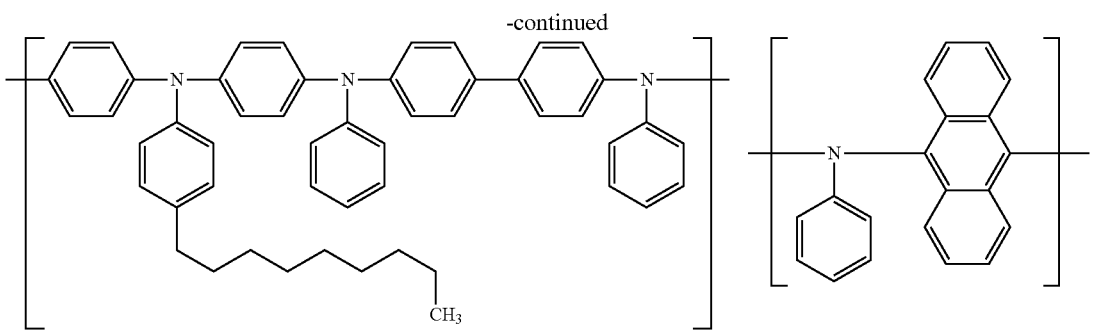
92
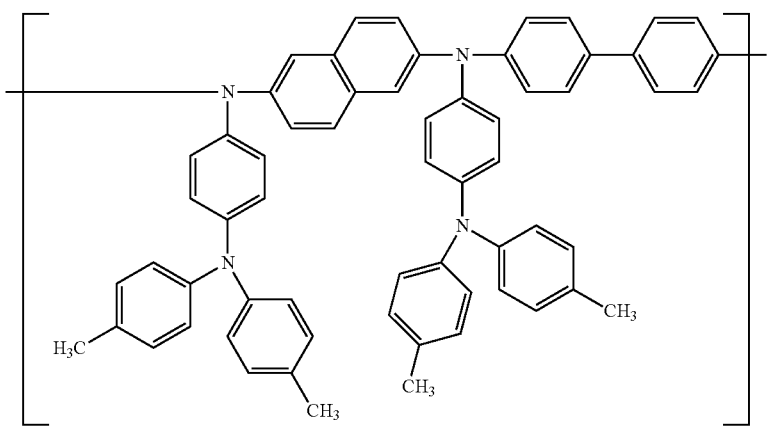
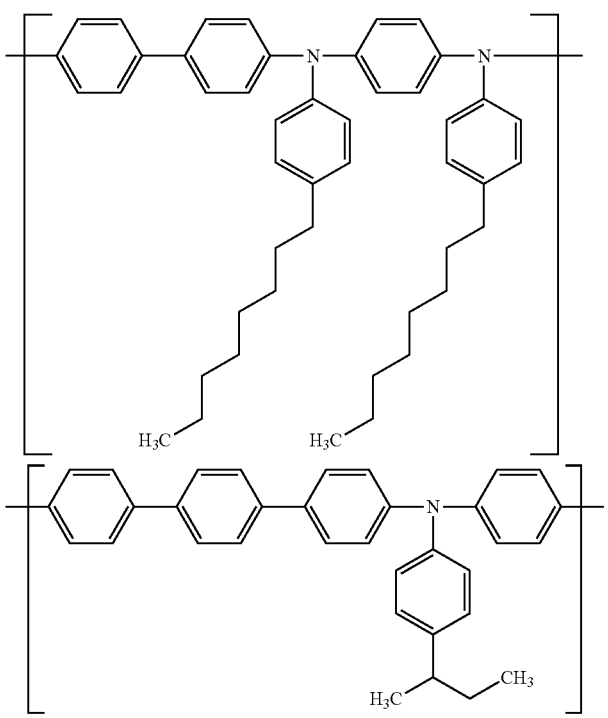
[Chemical Formula 34]

93 94
-continued
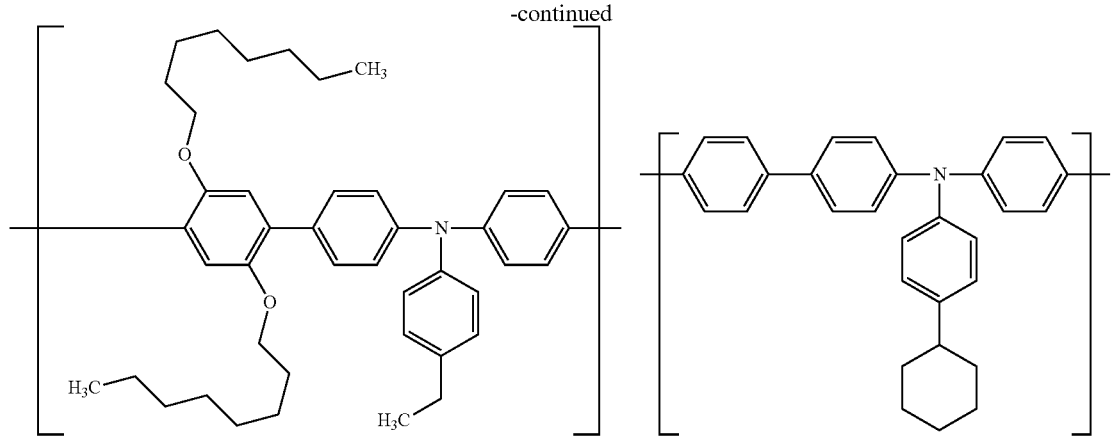
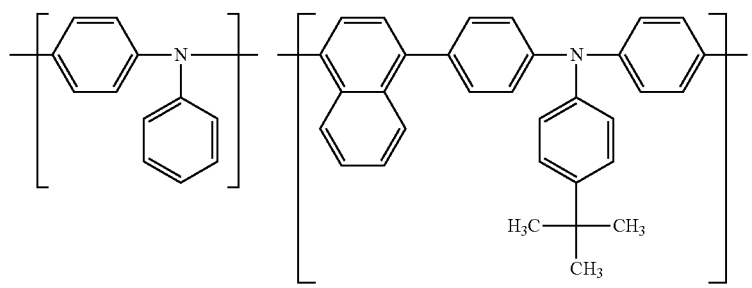
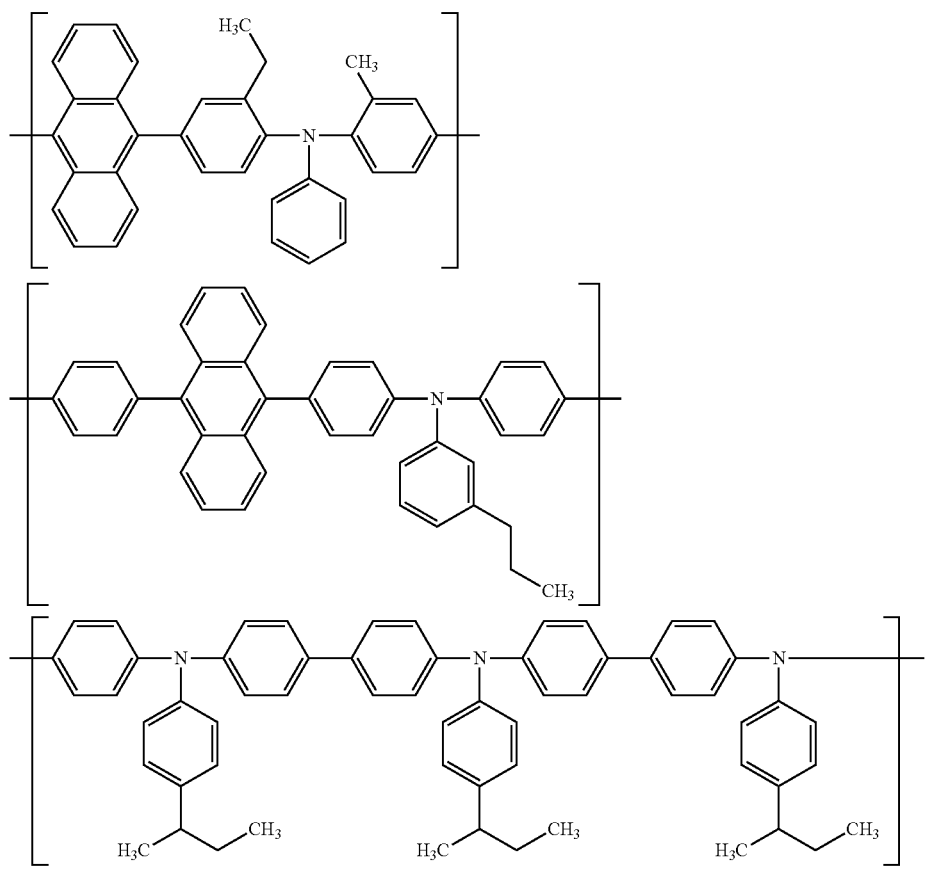

-continued

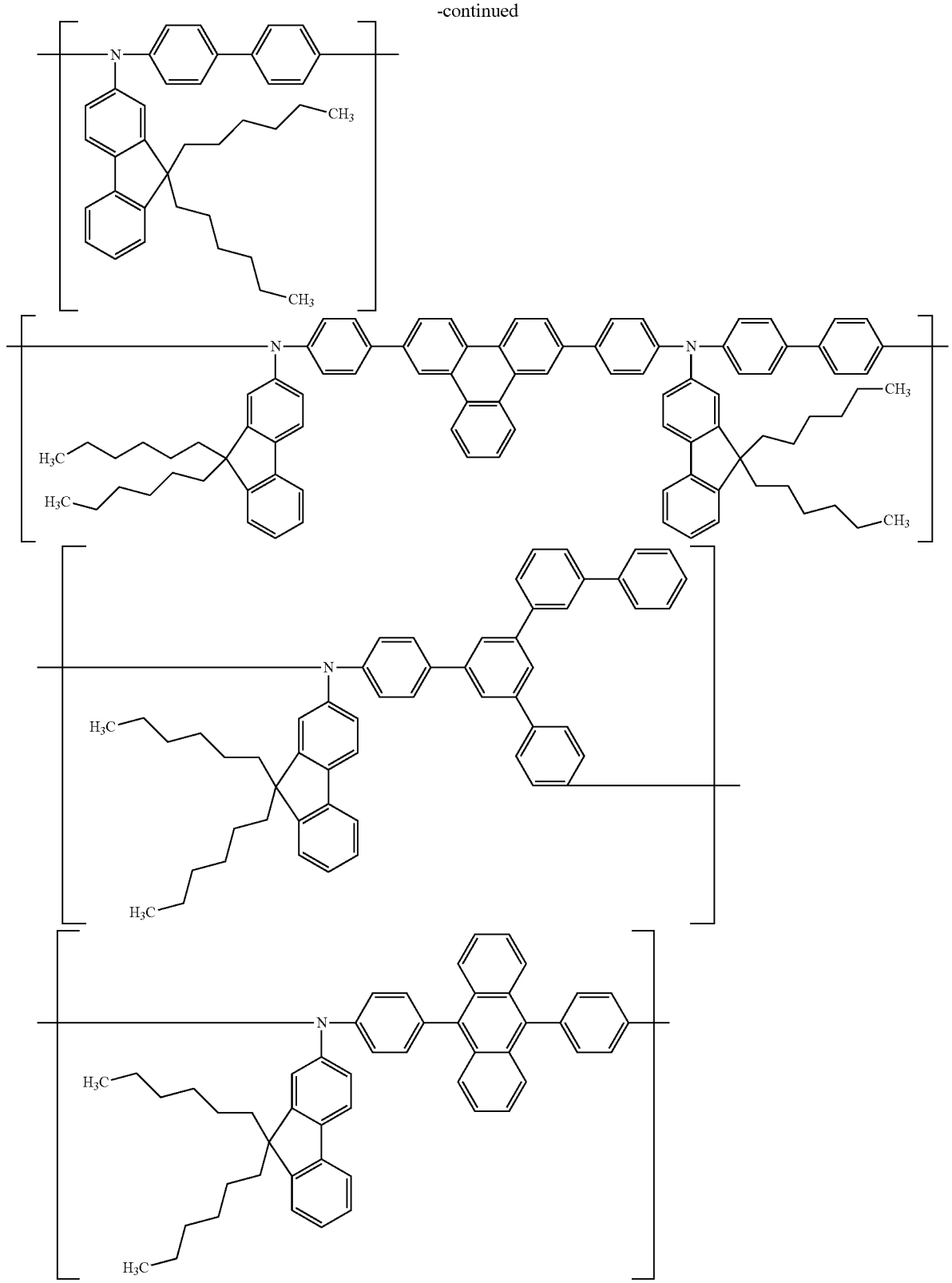

Of the specific examples described in the above section <Group of Repeating Units of Formula (I'), D>, those corresponding to the repeating unit of the formula (II') are also preferred examples of the repeating unit of the formula (II').

The other repeating unit than the repeating unit of the formula (II) and the repeating unit of the formula (II'), which may be in the polymer compound (ii) of the invention, may be any divalent group of the repeating unit mentioned below in which $Ar^a$ and $Ar^c$ do not contain a triarylamine structure, as described in the section of <4. Production Method> given below.

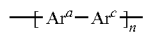

[Chemical Formula 35]

Preferred examples of the other repeating units than the repeating unit of the formula (II) and the repeating unit of the formula (II'), which may be in the polymer compound (ii) of the invention, are shown in the following <Group of Other Repeating Units H>, to which, however, the invention should not be limited.

<Group of Other Repeating Units H>

[Chemical Formula 36]

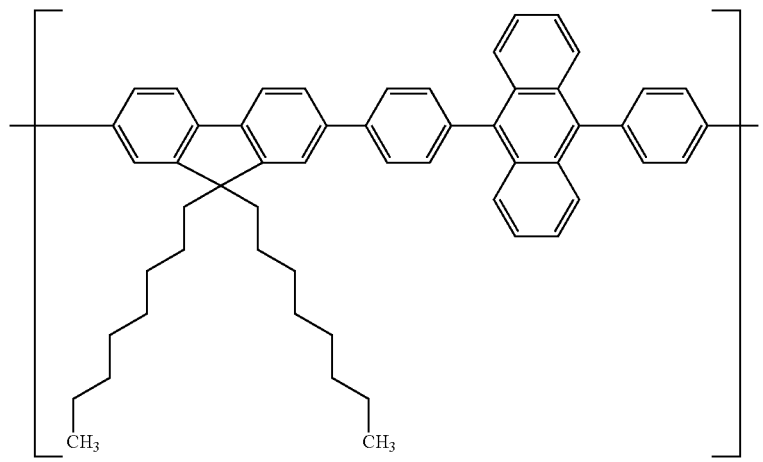

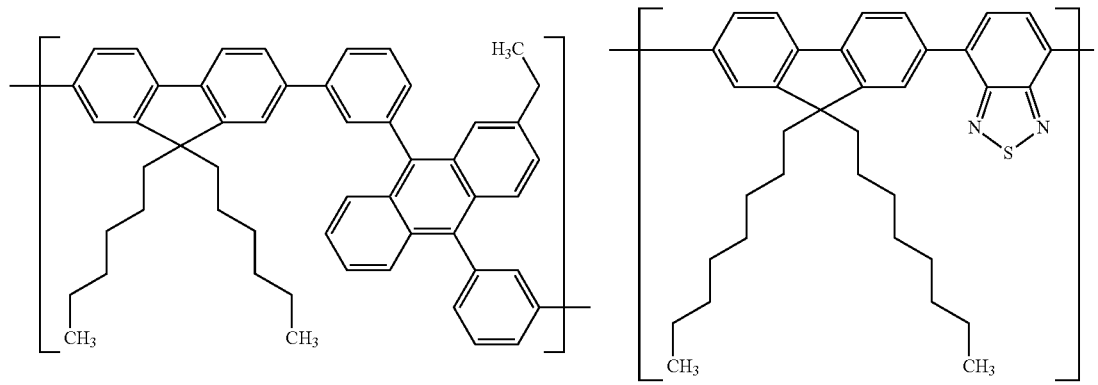

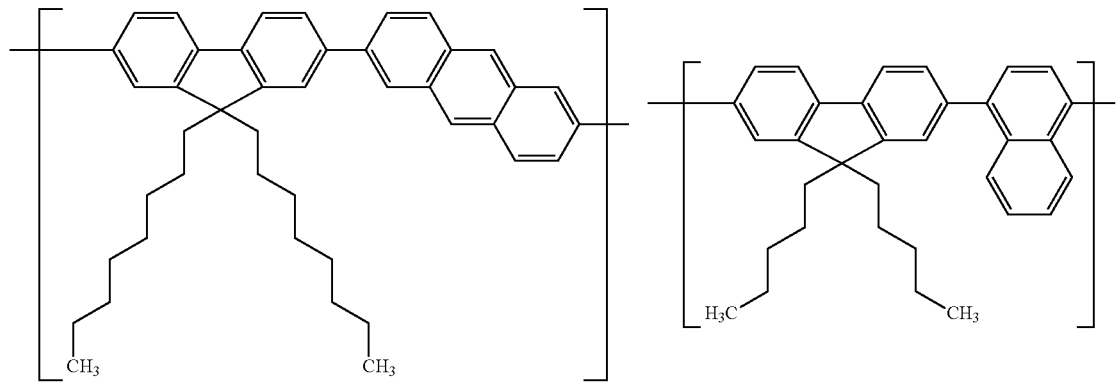

-continued
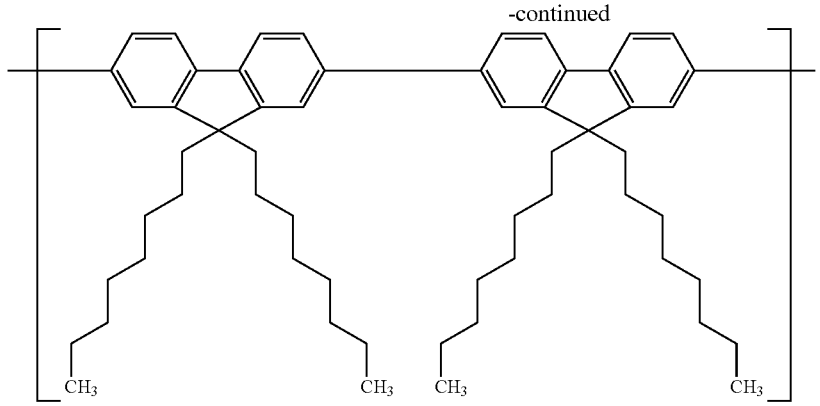
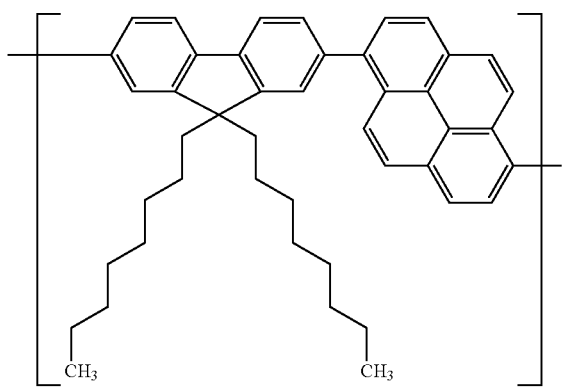
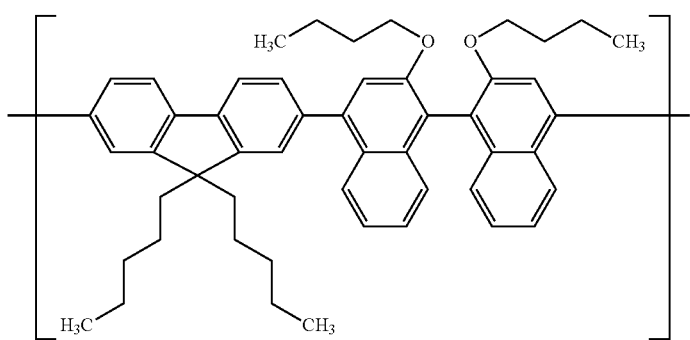
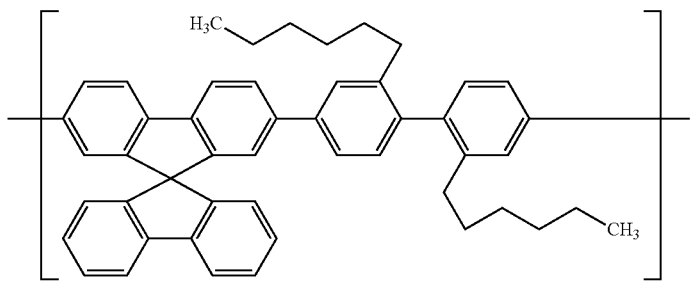

-continued
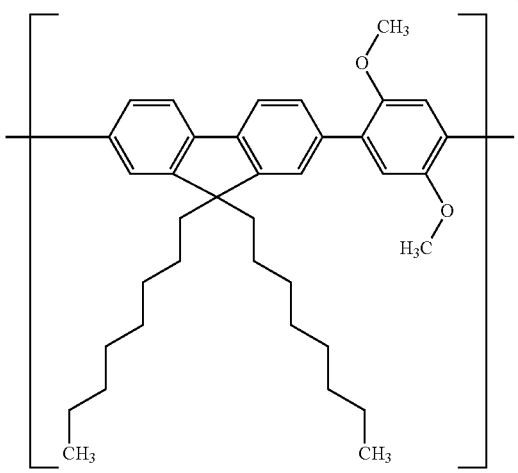
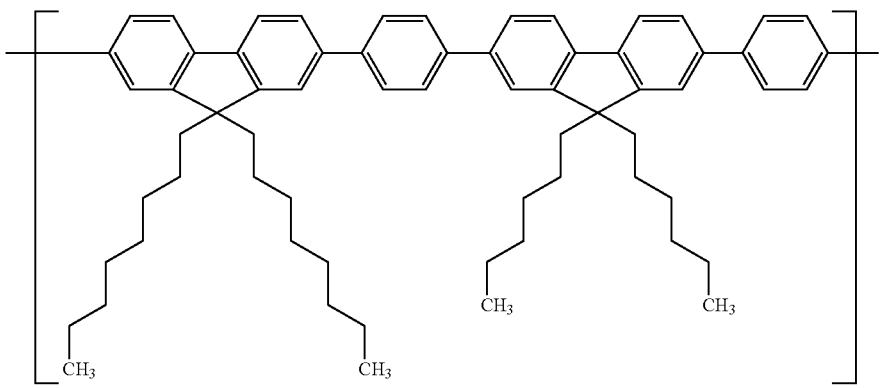
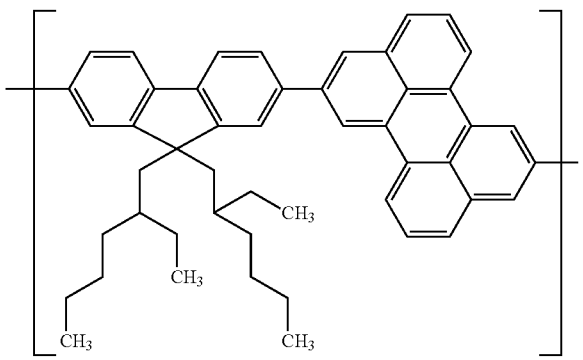

<3. Especially Preferred Polymer Compounds>

Especially preferably, the polymer compound of the invention is a polymer compound having at least one repeating unit selected from a group of the following repeating units A, and at least one repeating unit selected from a group of the following repeating units B.

<Group of Repeating Units A>

[Chemical Formula 37]

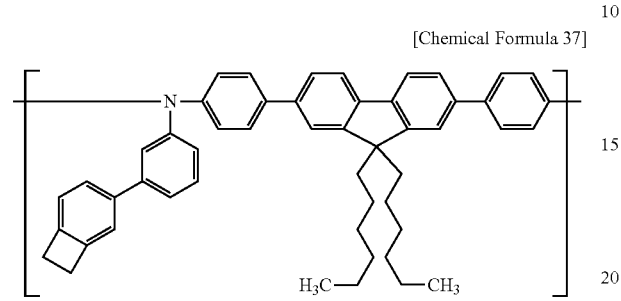

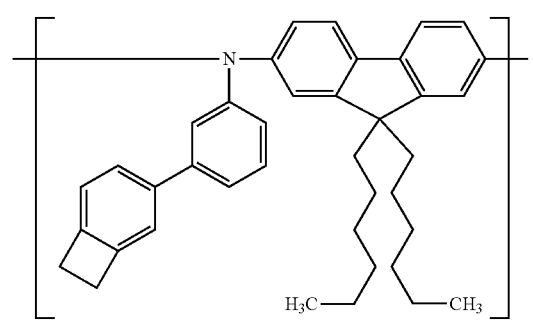

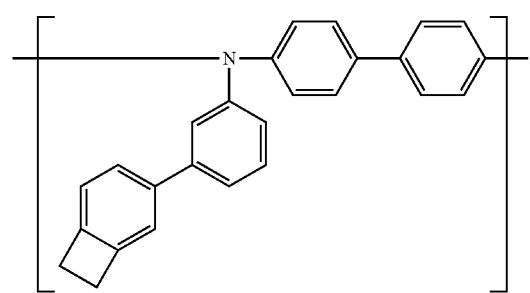

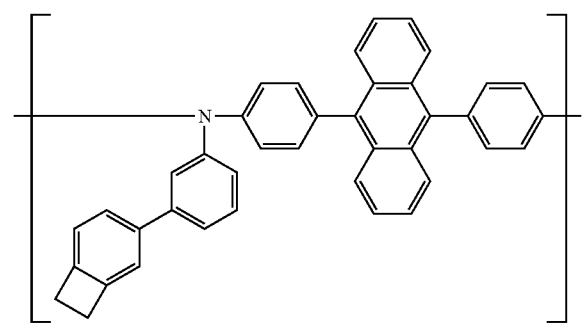

-continued

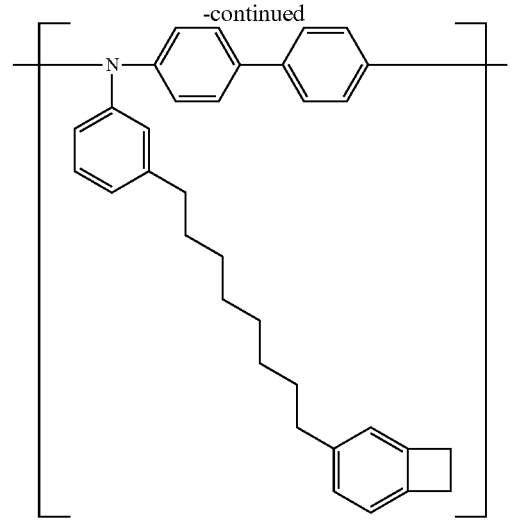

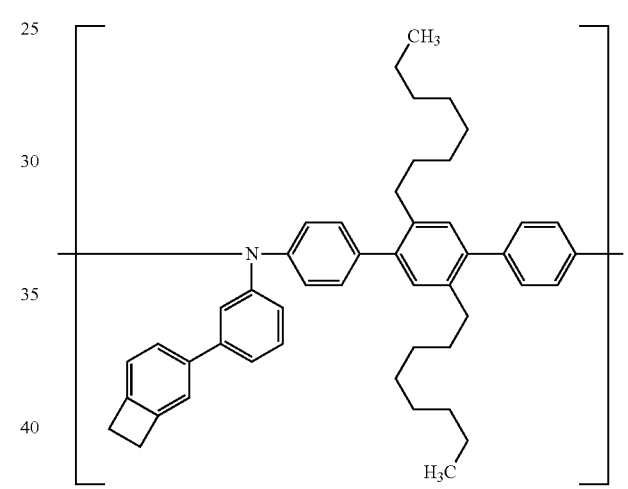

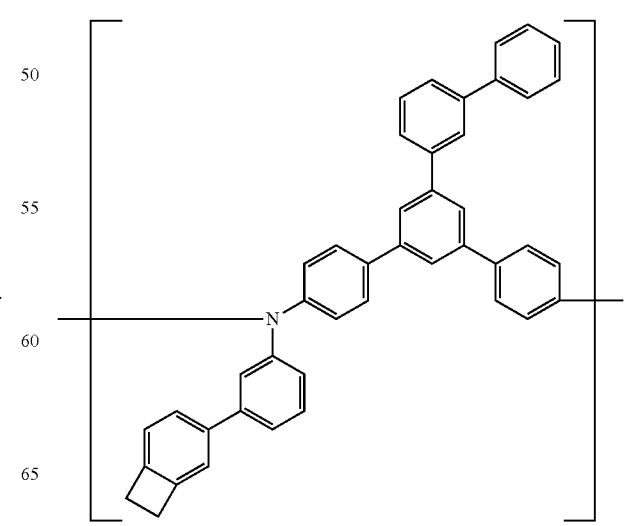

105
-continued
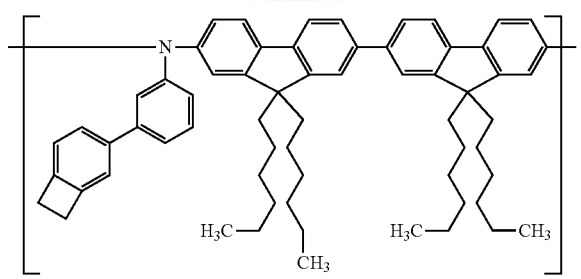
<Group of Repeating Units B>
106
-continued
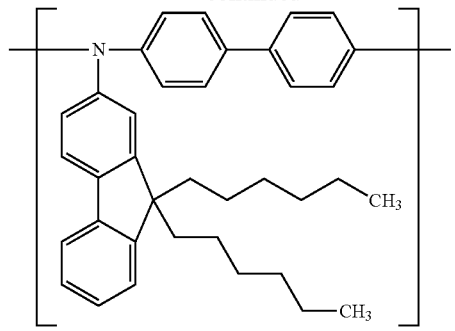
[Chemical Formula 38]
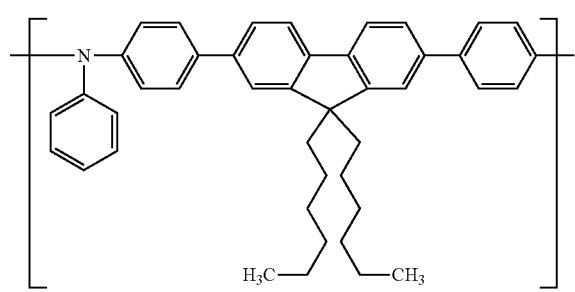
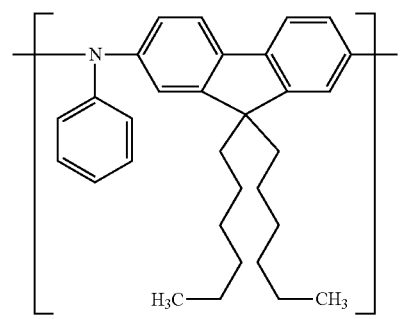
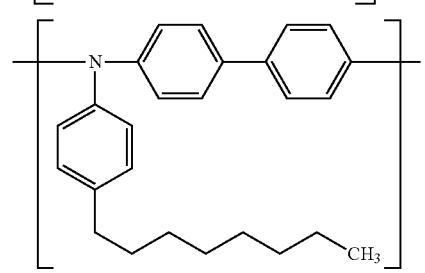
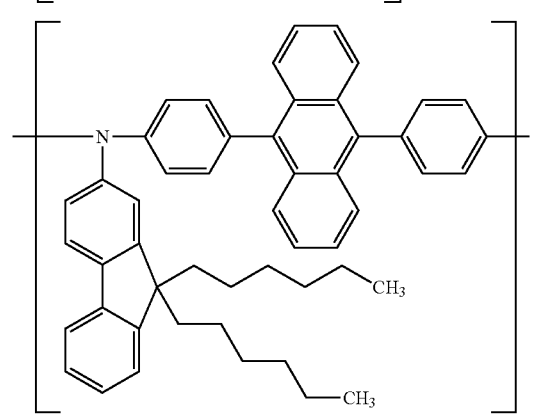
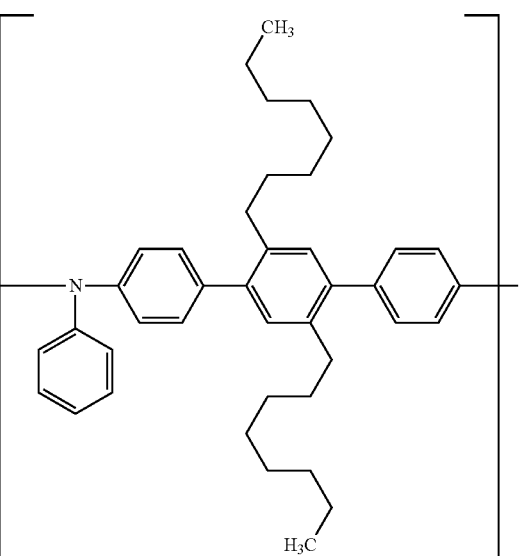
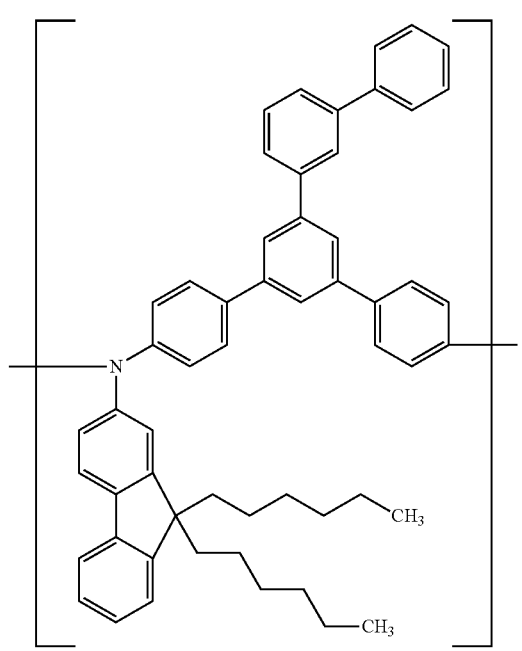

-continued

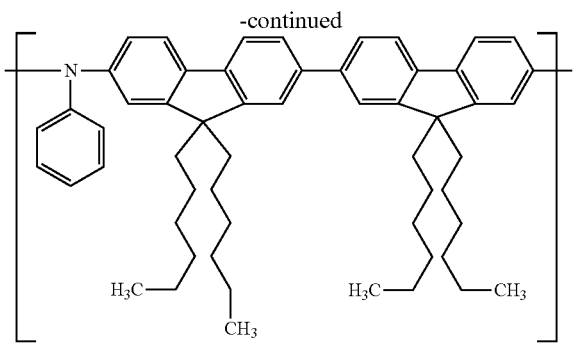

<4. Production Method>

The polymer compound of the invention can be produced according to a known method, using starting materials that are selected according to the structure of the intended compound.

The polymer compound of the invention can be produced through sequential polymerization of a halide of a general formula (Va) with a secondary amine of a general formula (Va) of with a boron compound of a general formula (Vc) in the presence of a base such as potassium carbonate, sodium tert-butoxide or triethylamine, according to the formula mentioned below. If desired, a transition metal catalyst such as copper or palladium complex may be used.

In other words, the polymer compound of the invention can be produced through sequential polymerization of reacting the formula (Va) and the formula (Vb) to form an N—Ar bond (for example, in a mode of Buchwald-Hartwig coupling or Ullmann coupling), or reacting the formula (Va) and the formula (Vc) to form an Ar—Ar bond (for example, in a mode of Suzuki coupling).

[Chemical Formula 39]

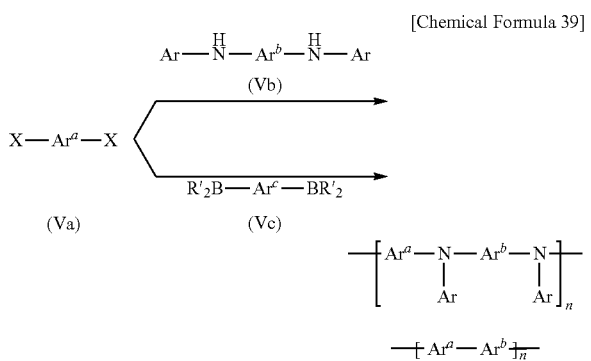

(In the formulae, X represents a halogen atom, or a sulfonate ester group such as $CF_3SO_2O$—; Ar represents an aromatic hydrocarbon group optionally having a substituent or an aromatic heterocyclic group optionally having a substituent;

R' represents a hydroxyl group or an alkoxy group that may bonds to each other to form a ring;

$Ar^a$, $Ar^b$ and $Ar^c$ each independently represent a divalent aromatic hydrocarbon group optionally having a substituent or a divalent aromatic heterocyclic group optionally having a substituent.)

However, in case where the polymer compound (i) of the invention is produced, at least one of $Ar^a$ or $Ar^b$, as well as $Ar^a$ or $Ar^c$ contains a divalent group of the following formula (VI):

[Chemical Formula 40]

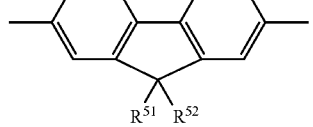

(VI)

(In the formula, $R^{51}$ and $R^{52}$ each independently represent a hydrogen atom, an aromatic hydrocarbon group optionally having a substituent, an aromatic heterocyclic group optionally having a substituent, or an alkyl group optionally having a substituent; and $R^{51}$ and $R^{52}$ may bond to each other to form a ring.)

$R^{51}$ and $R^{52}$ are the same as $R^1$ and $R^2$ in the above-mentioned section [1-6. $R^1$ and $R^2$]. Preferred examples are the same as therein.

$Ar^a$ and $Ar^c$ each independently represent an aromatic hydrocarbon group optionally having a substituent or an aromatic heterocyclic group optionally having a substituent. In the above-mentioned production method, preferred examples of $Ar^a$ and $Ar^c$ include those in <Group of Divalent Groups optionally having substituent, A>, <Group of Divalent Groups optionally having substituent, B> and <Group of Divalent Groups optionally having substituent, C> to be mentioned below.

Preferred examples of $Ar^b$ are represented by the formula (Vb), concretely including those in <Group of Specific Examples D> and <Group of Specific Examples E> to be mentioned below.

The polymer compound of the invention can be produced by suitably selected $Ar^a$, $Ar^c$ and the formula (Vb).

For example, in case where the polymer compound (i) of the invention is produced, $Ar^a$, $Ar^c$ and the formula (Vb) are suitably so selected that the produced polymer compound could contain a divalent group of the formula (VI) and a group containing a crosslinking group, thereby giving the polymer compound (i) of the invention.

The wording that at least one of $Ar^a$ and $Ar^c$ has a divalent group of the formula (VI) means that, for example, $Ar^a$ or $Ar^c$ is a group selected from <Group of Divalent Groups optionally having substituent, A> to be mentioned below.

Similarly, the wording that at least one of $Ar^a$ and $Ar^c$ has a crosslinking group means that, for example, $Ar^a$ or $Ar^c$ is a group selected from <Group of Divalent Groups optionally having substituent, B> to be mentioned below.

Accordingly, $Ar^a$ is selected from <Group of Divalent Groups optionally having substituent, A> and $Ar^c$ is selected from <Group of Divalent Groups optionally having substituent, B>, thereby giving the polymer compound (i) of the invention.

The same shall apply to $Ar^a$ and the formula (Vb).

In case where the polymer compound (ii) of the invention is produced, $Ar^a$, $Ar^c$ and the formula (Vb) are suitably so selected that the produced polymer compound could contain a group of the formula (IV), thereby giving the polymer compound (ii) of the invention.

The wording that at least one of $Ar^a$ and $Ar^c$ has a group of the formula (IV) means that, for example, $Ar^a$ or $Ar^c$ is a group having a group of the formula (IV) in the specific examples described in <Group of Divalent Groups optionally having a substituent, B> to be mentioned below.

The same shall apply to $Ar^a$ and the formula (Vb).

Preferred examples of the case where $Ar^a$ and $Ar^c$ each contain a divalent group of the formula (VI) but does not have a group containing a crosslinking group are shown in <Group of Divalent Groups optionally having substituent, A> to be given below, to which, however, the invention should not be limited.

<Group of Divalent Groups Optionally Having Substituent, A>

[Chemical Formula 41]

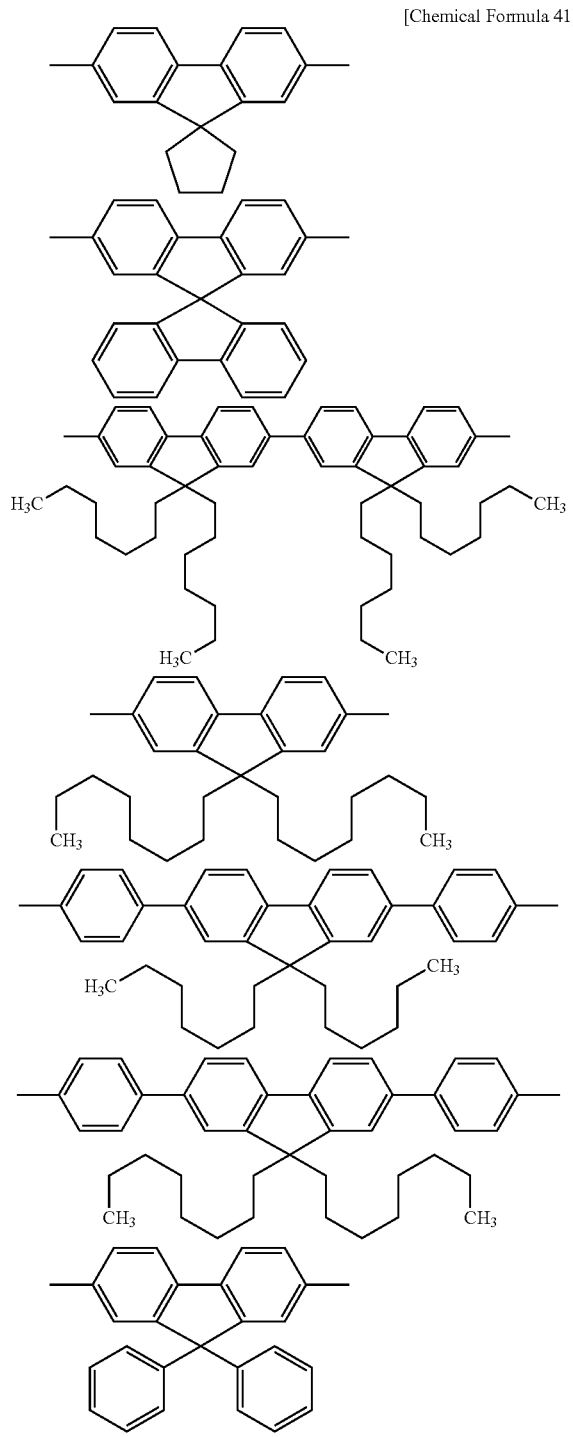
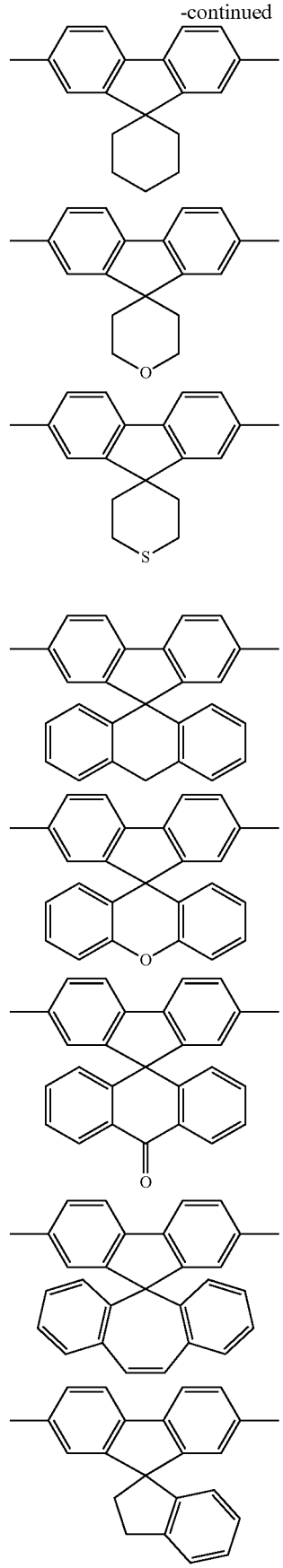

111

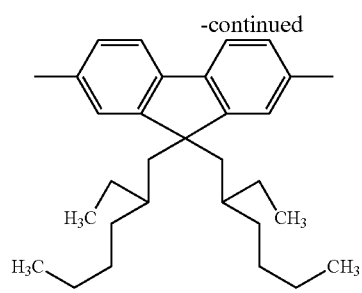

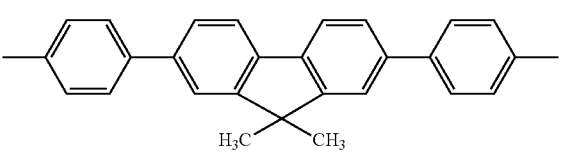

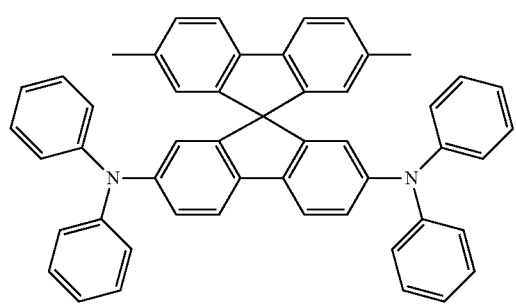

112

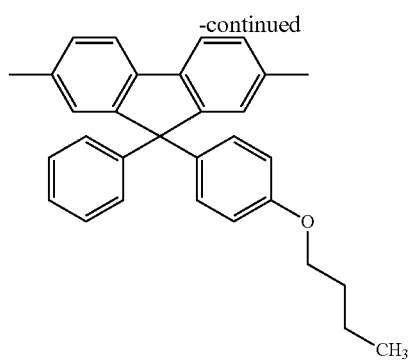

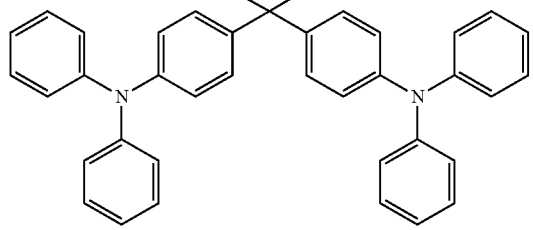

Preferred examples of the case where Ar$^a$ and Ar$^c$ do not have a divalent group of the formula (VI) but have a group containing a crosslinking group are shown in <Group of Divalent Groups optionally having substituent, B> to be given below, to which, however, the invention should not be limited.

<Group of Divalent Groups Optionally Having Substituent, B>

[Chemical Formula 42]

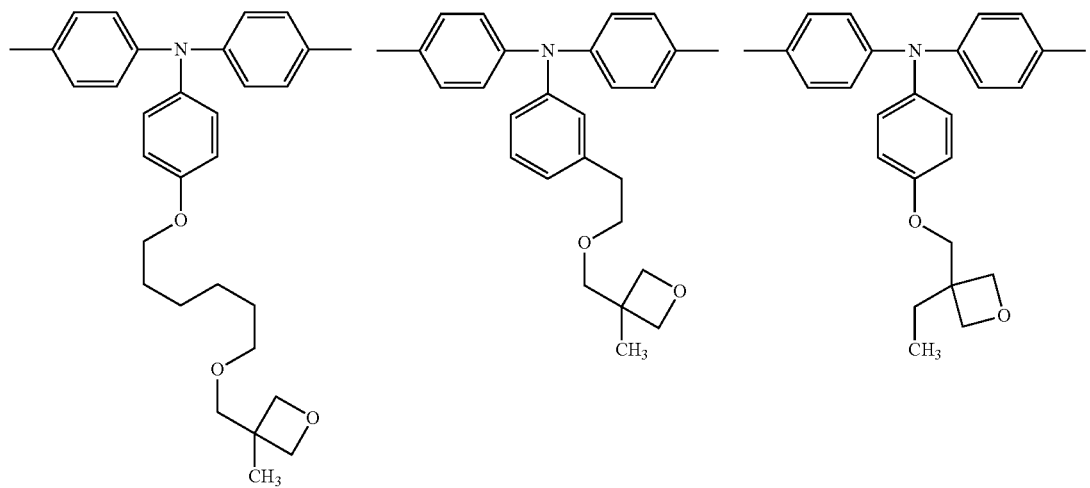

113
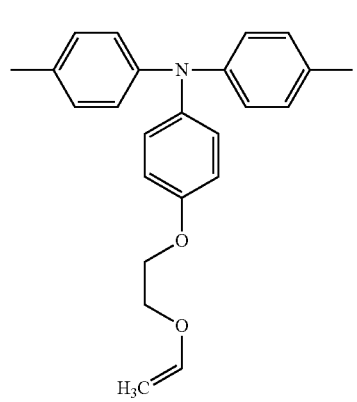
-continued
114
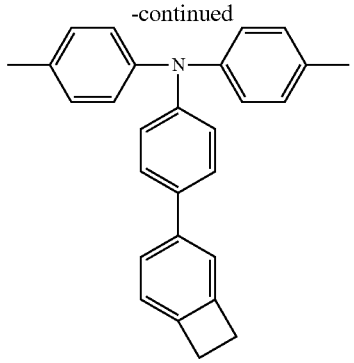
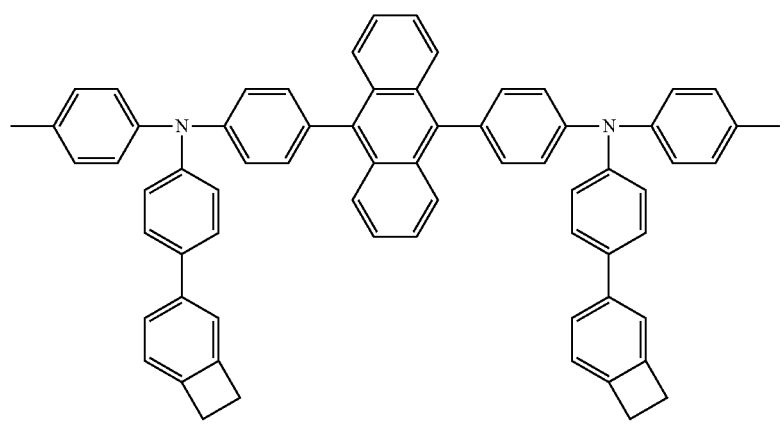
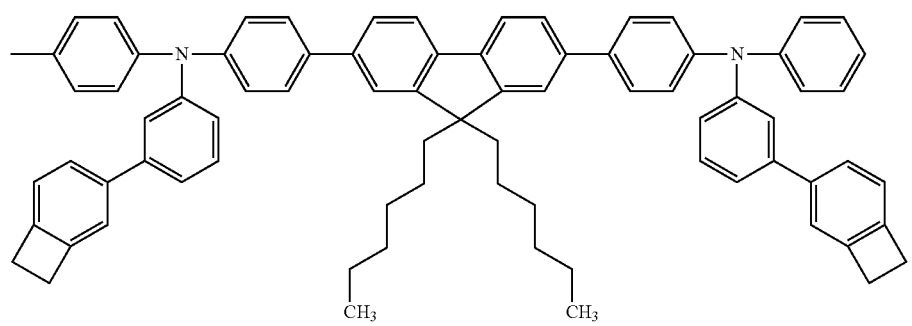
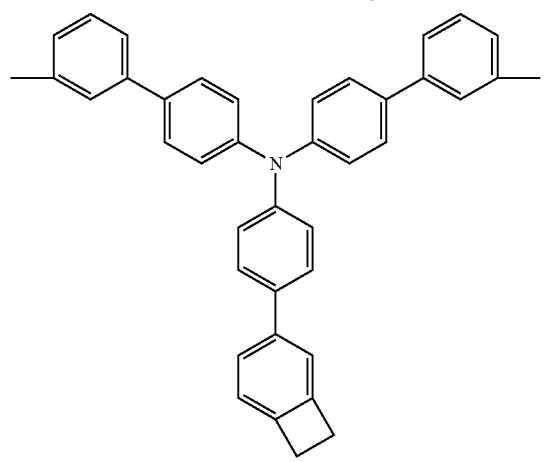

-continued
115
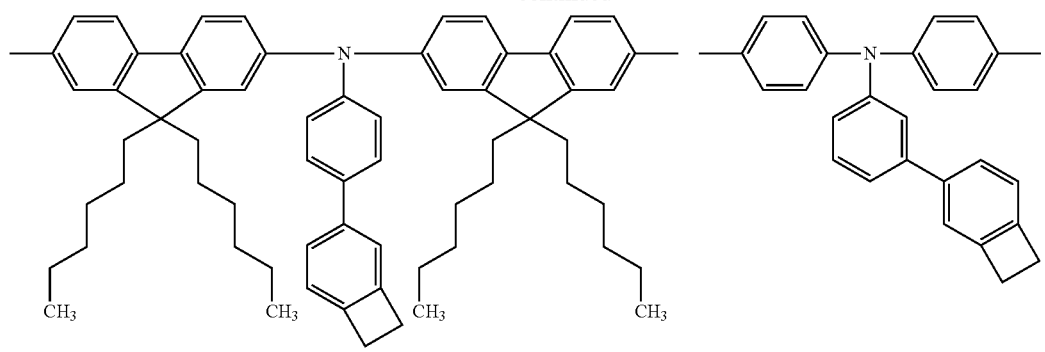
116
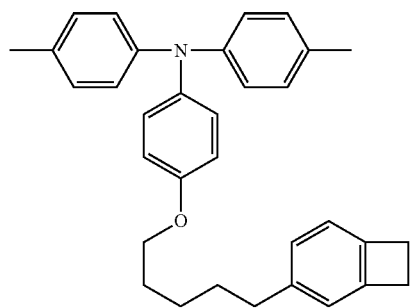
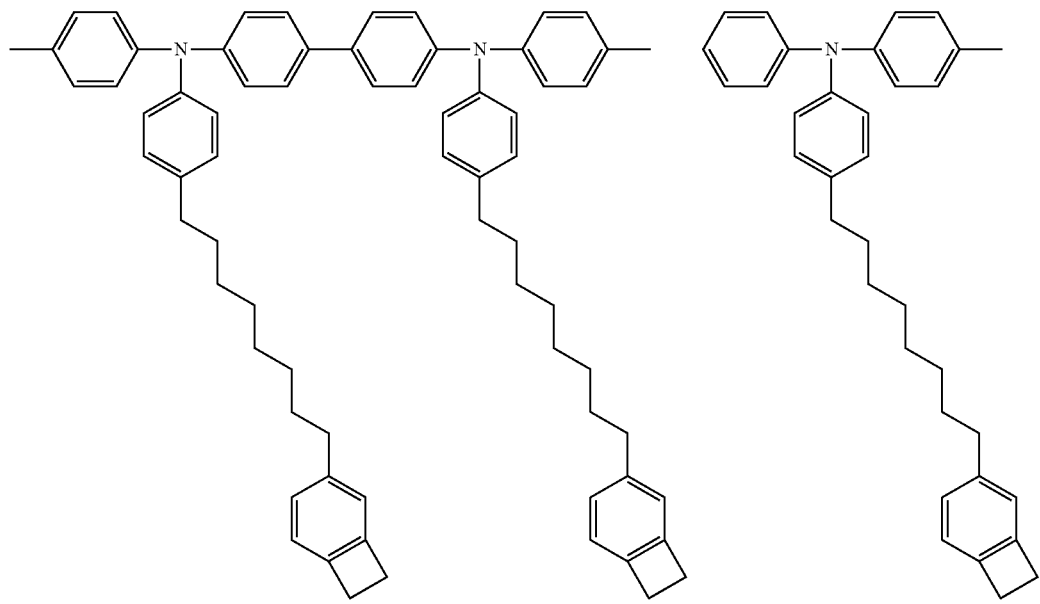

-continued

117

118

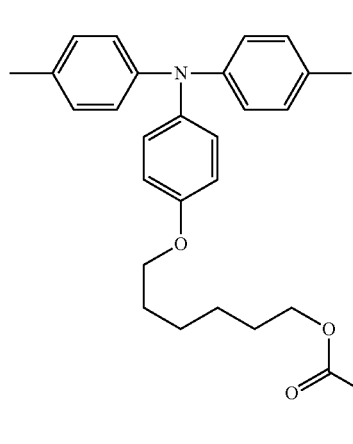

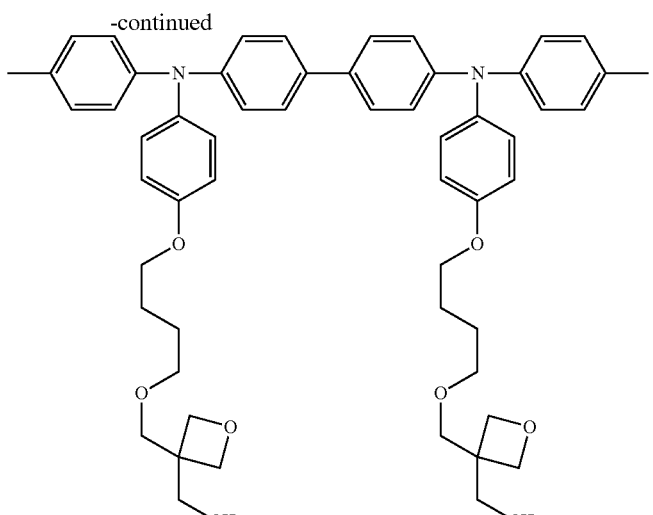

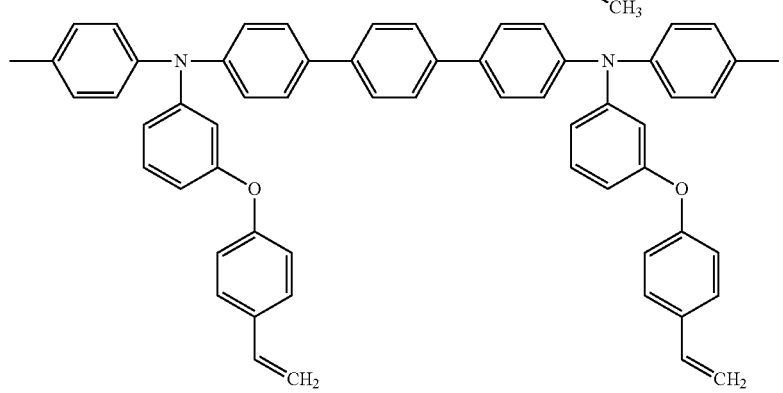

Preferred examples of the case where $Ar^a$ and $Ar^c$ do not have a divalent group of the formula (VI) and do not have a group containing a crosslinking group are shown in <Group of Divalent Groups optionally having substituent, C> to be given below, to which, however, the invention should not be limited.

<Group of Divalent Groups Optionally Having Substituent, C>

[Chemical Formula 43]

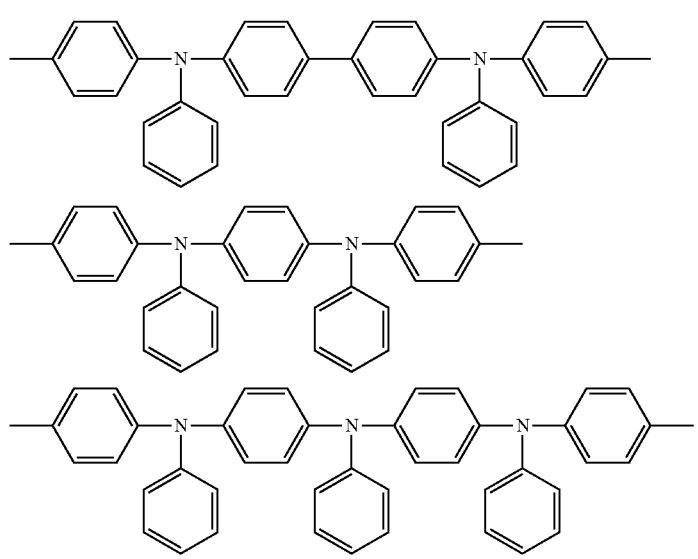

-continued
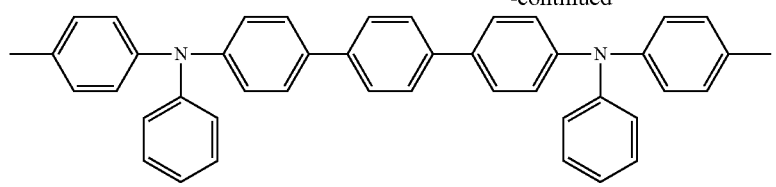
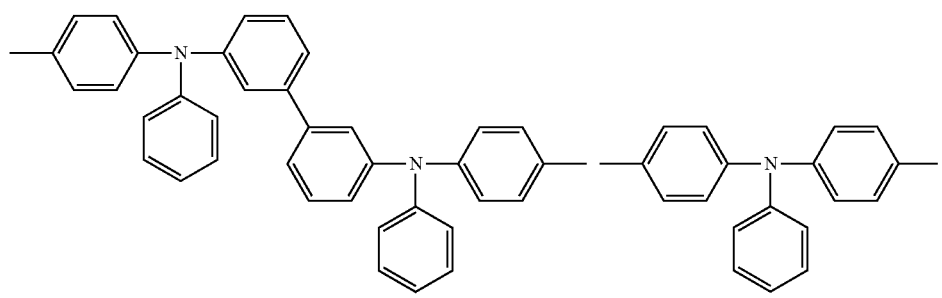
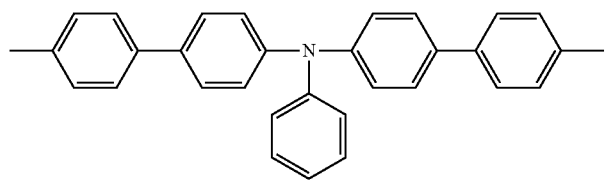
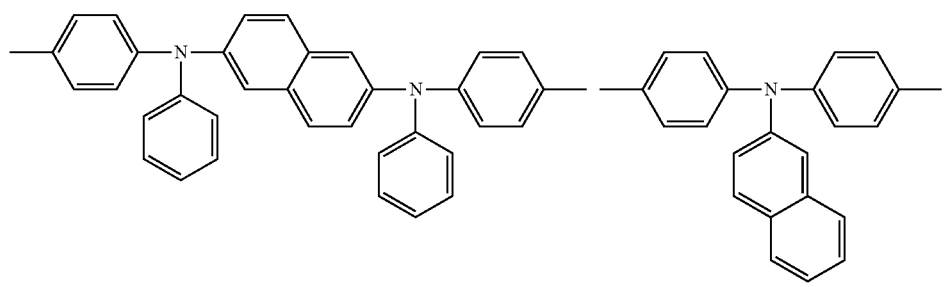
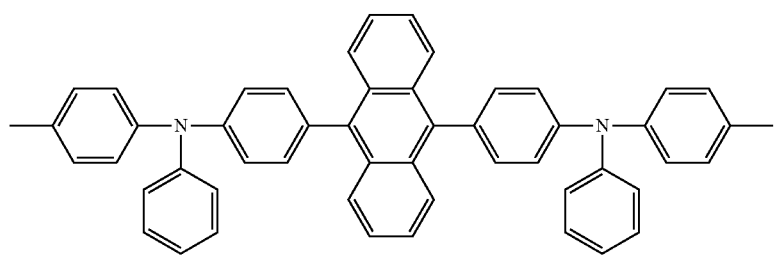
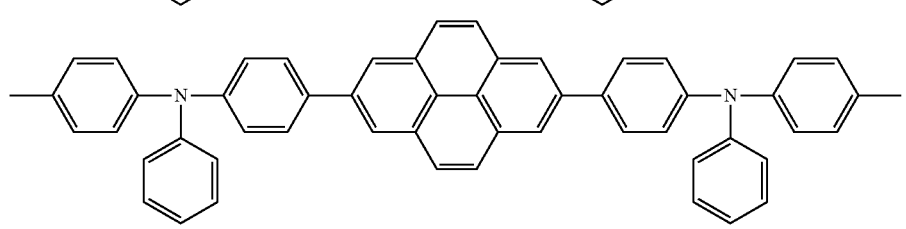

121
122
-continued
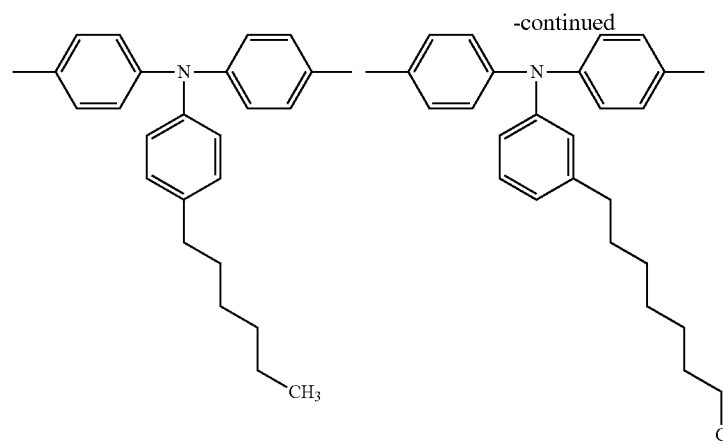
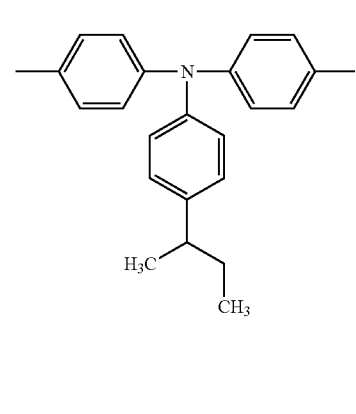
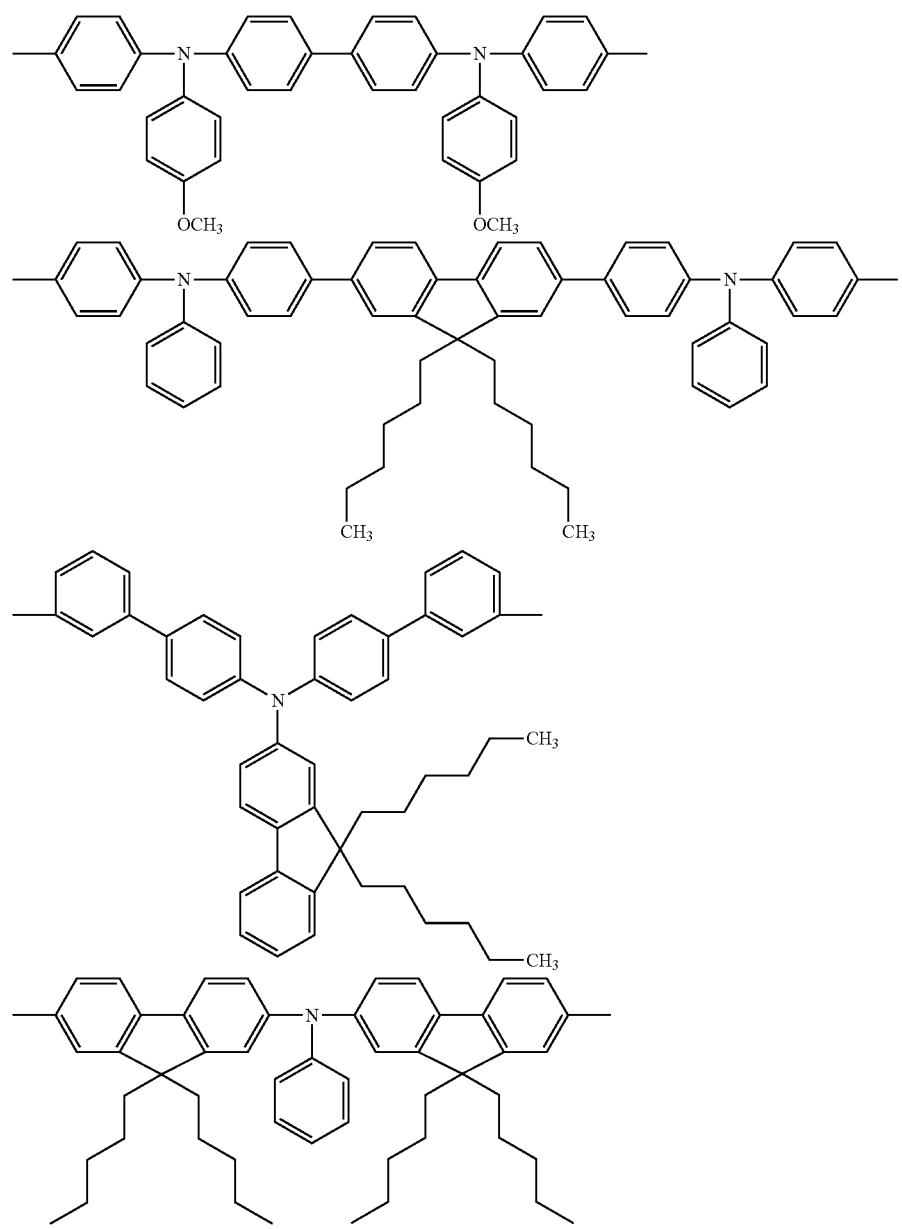

Preferred examples of the formula (Vb) not having a divalent group of the formula (VI) but having a group containing a crosslinking group are shown in <Group of Specific Examples D> to be given below, to which, however, the invention should not be limited.
<Group of Specific Examples D>
[Chemical Formula 44]
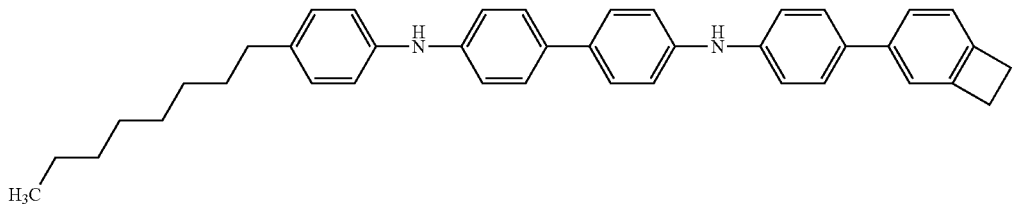
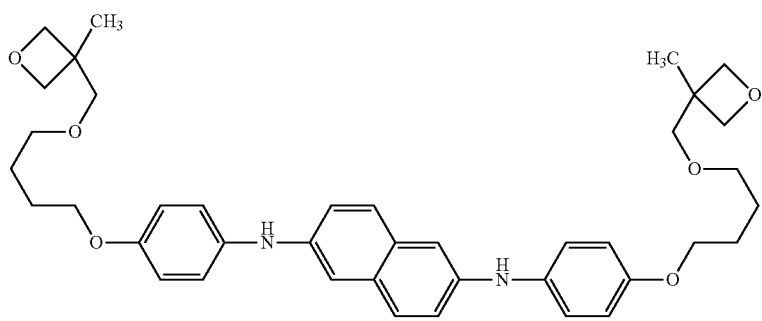
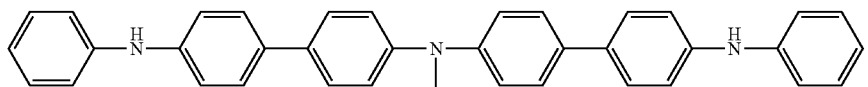
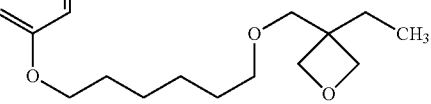
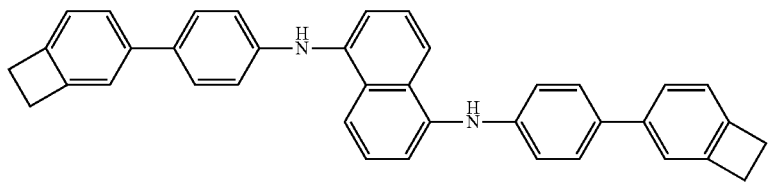
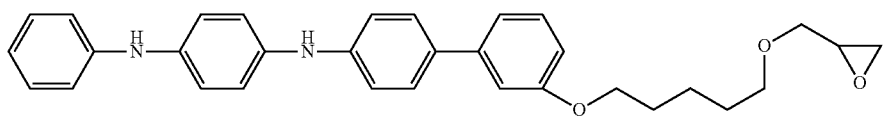
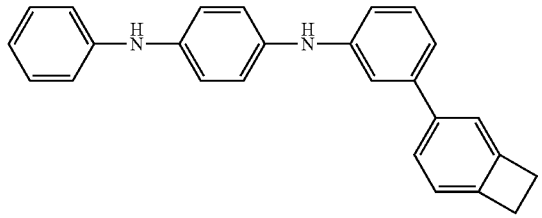
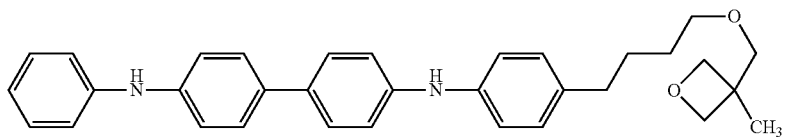

-continued
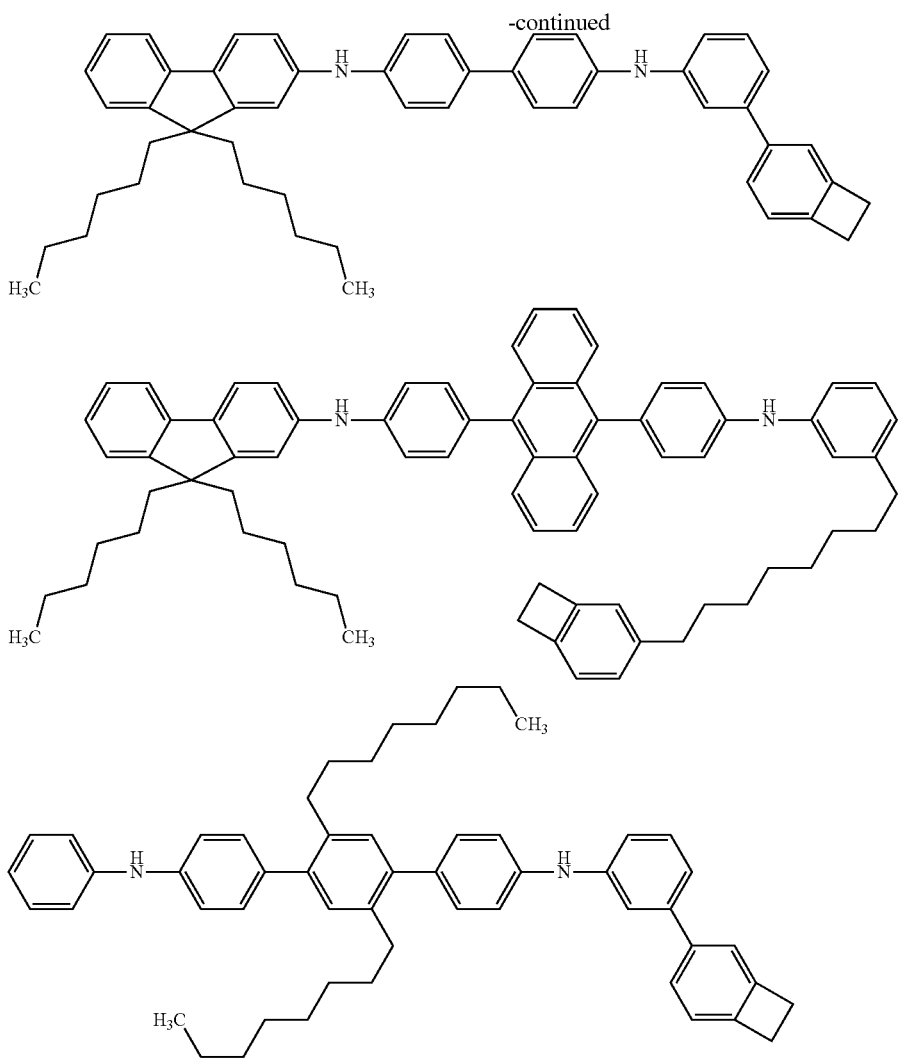
Preferred examples of the formula (Vb) not having a divalent group of the formula (VI) and not having a group containing a crosslinking group are shown in <Group of Specific Examples E> to be given below, to which, however, the invention should not be limited.
<Group of Specific Examples E>
[Chemical Formula 45]
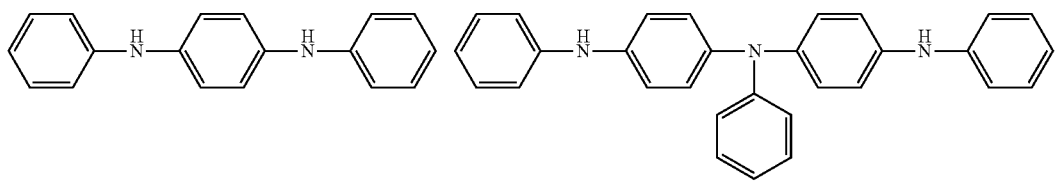
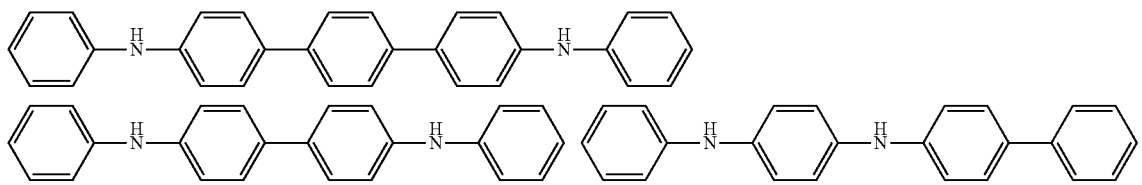

-continued
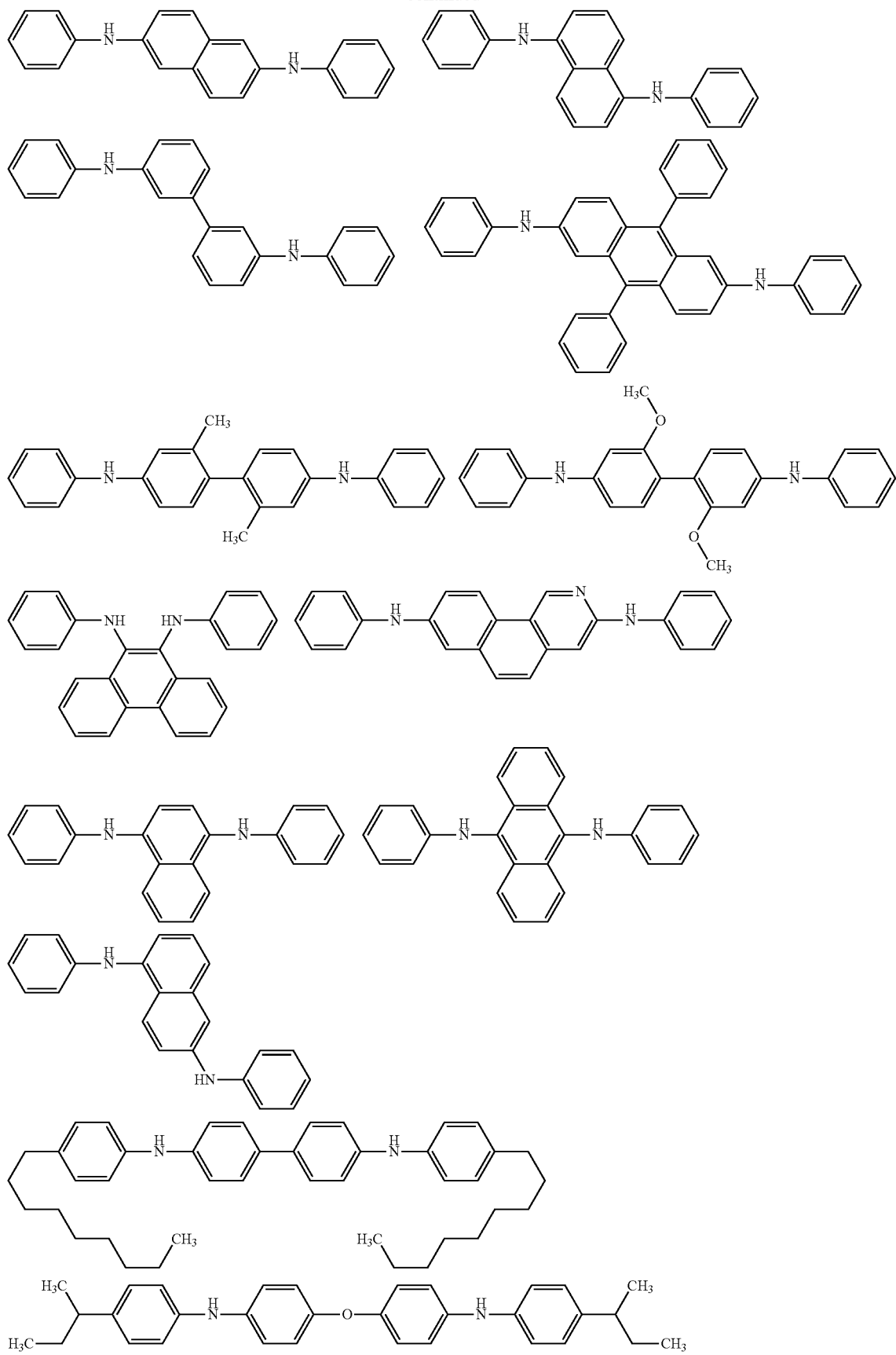

-continued
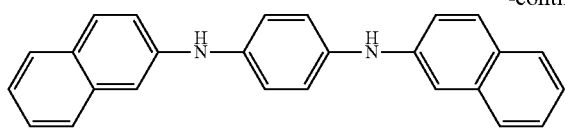
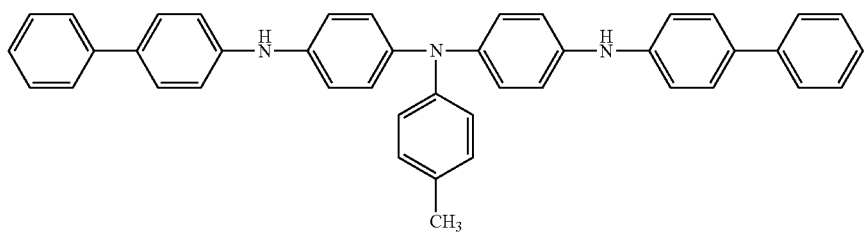
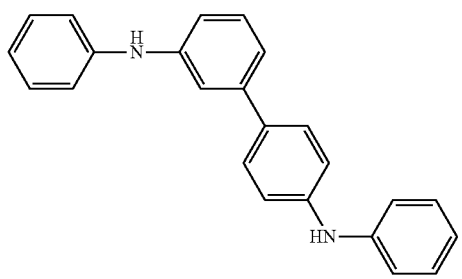
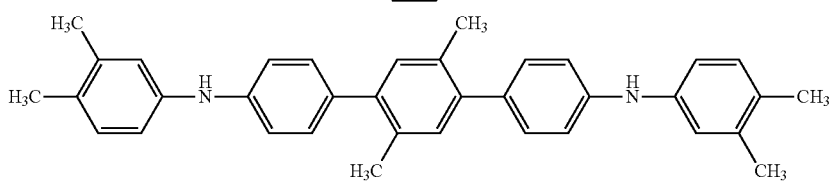
[Chemical Formula 46]
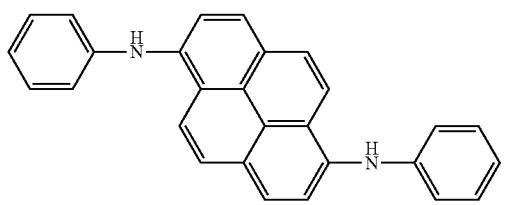
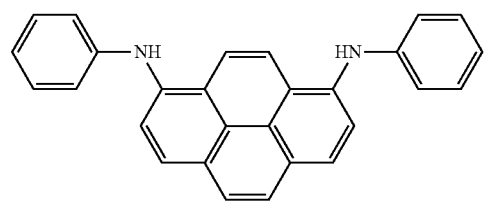
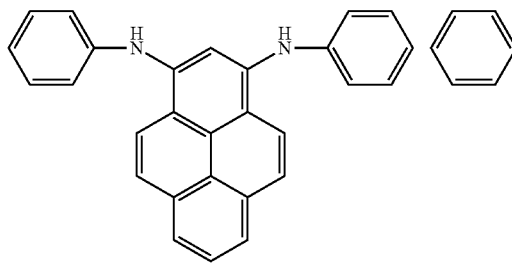
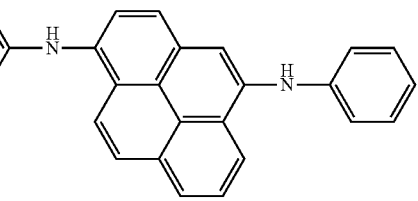
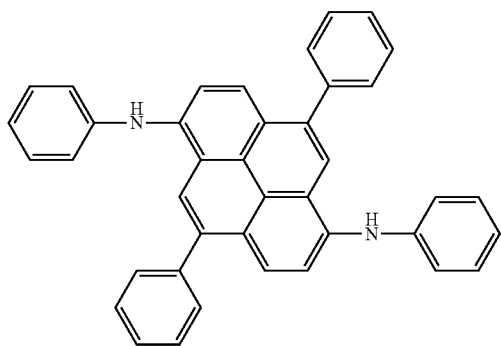
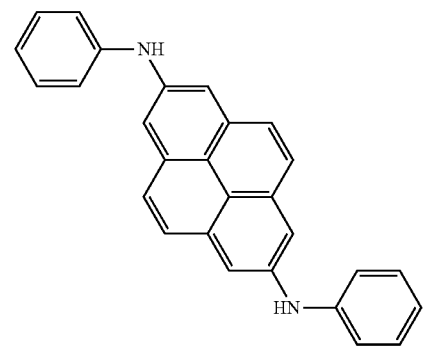

-continued
131
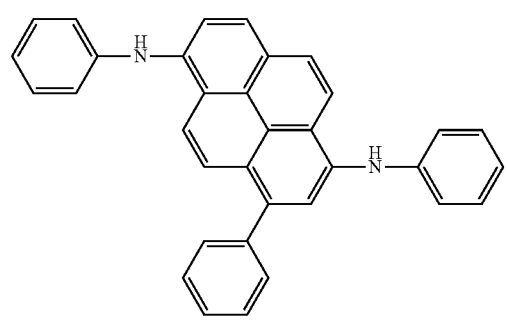
132
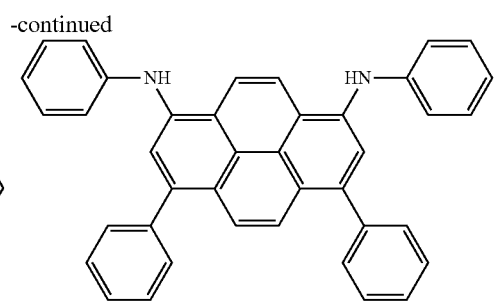
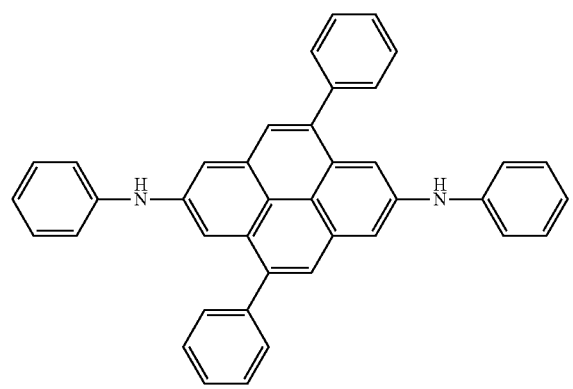
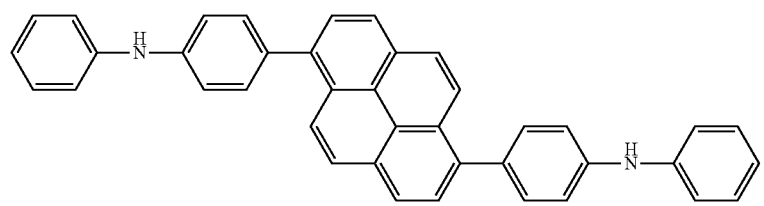
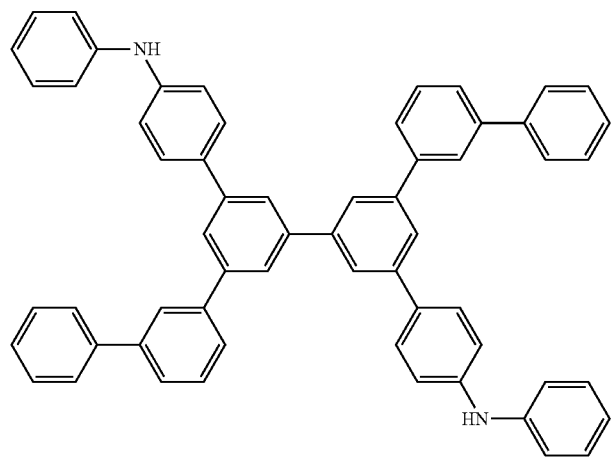

-continued
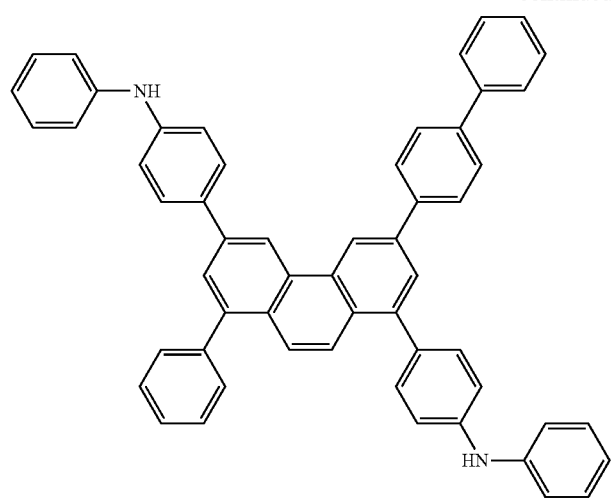
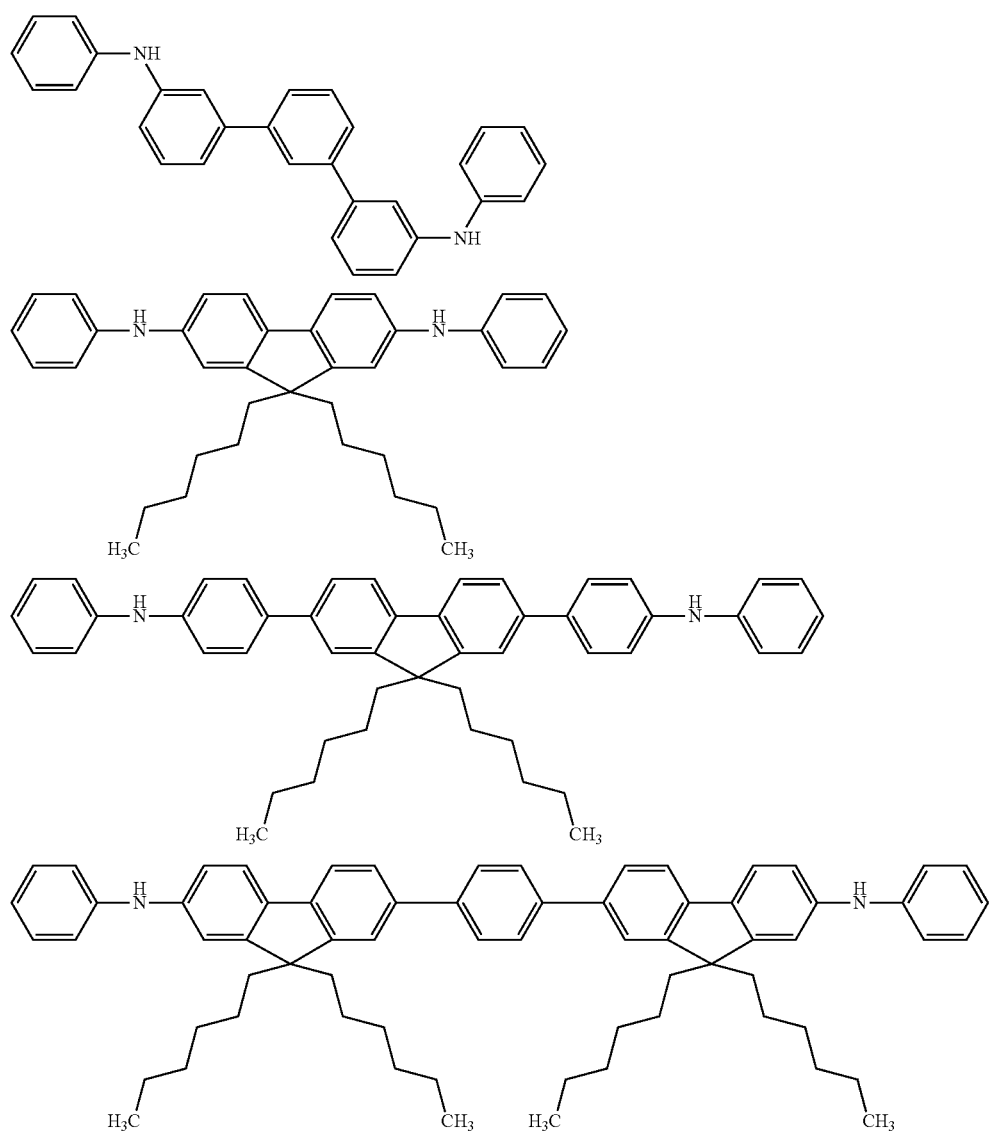

-continued

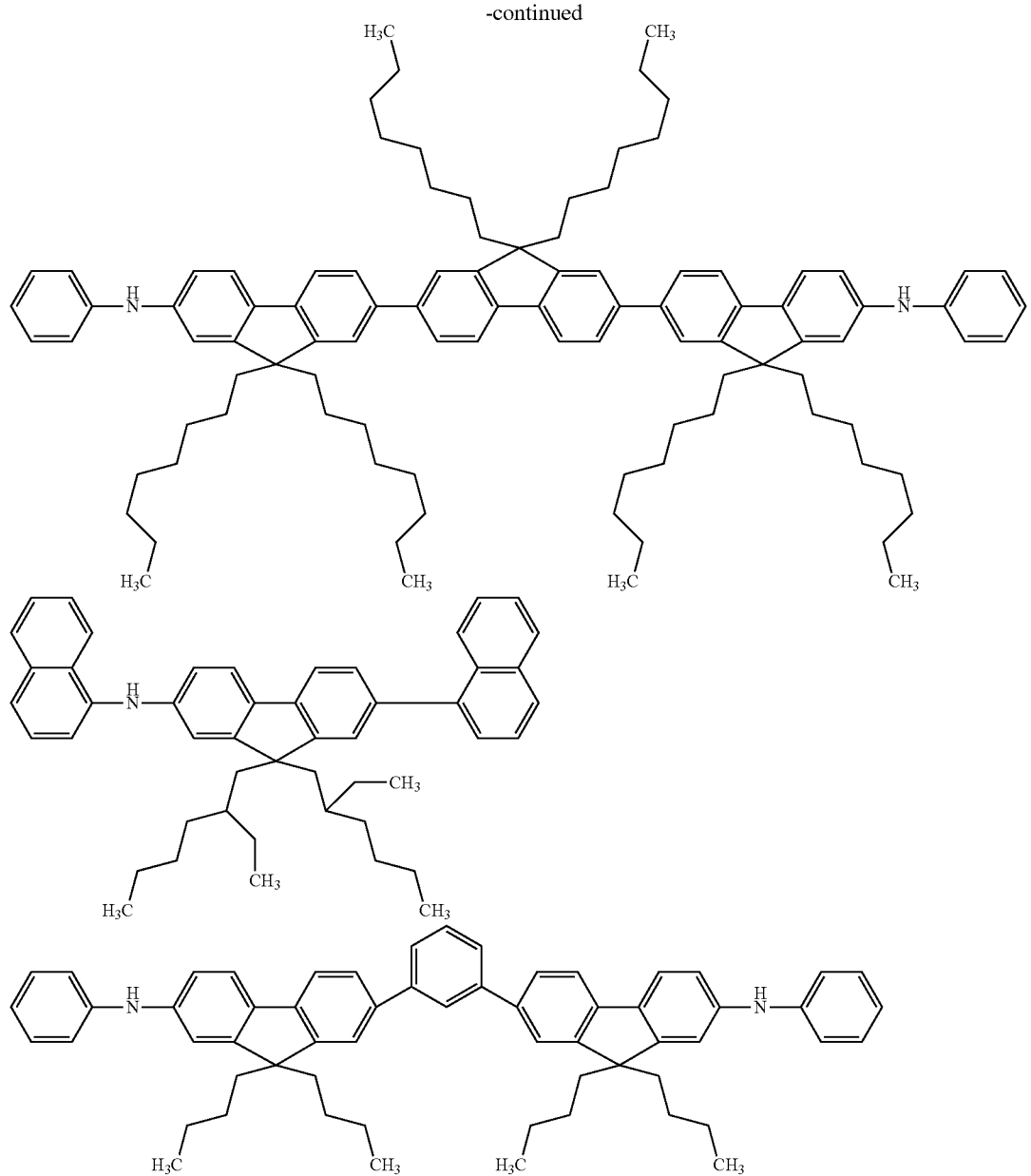

For methods of purification of compounds, herein usable are known techniques such as typically the methods described in "Handbook for Separation Purification Technology" (1993, by the Chemical Society of Japan), "High-Level Separation of Minor Components and Hardly-Purifying Substances by Chemical Conversion Method" (1988, by IPC), or those described in the section of "Separation and Purification" in "Lecture of Experimental Chemistry, 4th Ed., 1" (1990, by the Chemical Society of Japan). Concretely mentioned are extraction (including suspension washing, boiling washing, ultrasonic washing, acid/base washing), adsorption, absorption, melting, crystallization (including recrystallization and reprecipitation from solvent), distillation (normal pressure distillation, reduced pressure distillation), vaporization, sublimation (normal pressure sublimation, reduced pressure sublimation), ion exchange, dialysis, filtration, ultrafiltration, reverse osmosis, pressure osmosis, zone dissolution, electrophoresis, centrifugation, floating separation, precipitating separation, magnetic separation, various modes of chromatography (classification by configuration: column, paper, thin layer, capillary; classification by mobile phase: gas, liquid, micelle, ultra-critical fluid; separation mechanism; adsorption, partitioning, ion exchange, molecular sieving, chelation, gel filtration, exclusion, affinity), etc.

For analytical methods for product identification and purity determination, herein employable as needed are gas chromatography (GS), high-performance liquid chromatography (HPLC), high-speed amino acid analyzer (polymer compound), capillary electrophoresis (CE), size exclusion chromatography (SEC), gel permeation chromatography (GPC), cross fractionation chromatography (CFC), mass analysis (MS, LC/MS, GC/MS, MS/MS), nuclear magnetic resonance (NMR (1H-NMR, 13C-NMR)), Fourier Transform IR spectrometer (FT-IR), UV-visible-near IR spectrophotometer (UV-VIS-NIR), electronic spin resonator (ESR), transmission electronic microscope (TEM-EDX), electron probe microanalyzer (EPMA), metal element analysis (ion chromatography, induction coupled plasma emission spectrometry (ICP-AES), atomic absorption spectroscopy (AAS), X-ray fluorescence spectrometer (XRF), nonmetal elementary analysis, minor component analysis (ICP-MS, GF-AAS, GD-MS), etc.

<5. Use of Polymer Compound>

The polymer compound of the invention is favorably used as a charge-transporting material, and is especially favorably used as an organic electroluminescence element material. In case where the compound is used as an organic electroluminescence element material, it is favorably used as a charge-transporting material in the hole injection layer and/or the hole transport layer in an organic electroluminescence element.

As facilitating simple production of organic electroluminescence elements, the polymer compound of the invention is favorably used in an organic layer to be formed according to a wet film formation method.

<6. Net-like Polymer Compound>

The polymer compound of the invention undergoes crosslinking reaction by heating and/or by irradiation with active energy such as light to give a net-like polymer compound, as described in the following section <7. Composition for Organic Electroluminescence element> [Film Formation Method]. The layer that contains the net-like polymer compound is preferably a hole injection layer and/or a hole transport layer to be described in detail hereinunder.

The degree of crosslinking of the network-structure polymer compound of the invention is generally at least 70%, preferably at least 80% and is generally at most 120%, preferably at most 110%, as measured according to the method described in the section "6-1. Method for Determination of Degree of Crosslinking" mentioned below. Within the range, the layer containing the net-like polymer compound does not mix with the layer to be formed over that layer according to a wet film formation method, and is therefore favorable as not having any influence on the properties of the devices to be obtained.

6-1. Method for Determination of Degree of Crosslinking

In the invention, the degree of crosslinking is represented by L2/L1, for which the film thickness L1 and L2 are measured according to the methods mentioned below.

6-1-1. Method of Film Formation, and Method of Measurement of Film Thickness L1

A glass substrate having a size of 25 mm×37.5 mm is washed with ultra-pure water, then dried with dry nitrogen, and washed with UV/ozone.

The sample to be analyzed (in general, this is a solution of the subject compound prepared so that the solid concentration of the compound therein could be 1% by weight) is applied onto the glass substrate in a mode of spin coating to form a film thereon.

The spin coating condition is as follows:
[Spin Coating Condition]
Temperature: 23° C.
Relative humidity: 60%
Number of spinner rotations: 1500 rpm
Time of spinner rotation: 30 seconds After thus coated, this is heated at 80° C. for 1 minute, and then dried under heat at 230° C. for 60 minutes. The formed film is scraped out to have a width of about 1 mm, and its thickness L1 (nm) is measured with a thickness gauge (Tencor P-15, by KLA Tencor Corporation).

6-1-2. Method of Measurement of Film Thickness L2

After measurement of its thickness L1, the substrate is set on a spinner, and the same solvent as that used for the subject sample is dropwise given onto the site thereof at which its thickness was measured, and after 10 seconds, this is spin-coated in the same manner as in the above-mentioned <spin coating condition>. Subsequently, the thickness of the film at the same site is measured, L2 (nm). The degree of crosslinking is computed as L2/L1.

<7. Composition of Organic Electroluminescence Element>

The composition for organic electroluminescence element of the invention contains at least one polymer compound of the invention.

The composition for organic electroluminescence element of the invention is for an organic electroluminescence element having an organic layer disposed between an anode and a cathode; and in the device, in general, the composition is used as a coating liquid for forming the organic layer according to a wet film formation method. Preferably, the composition for organic electroluminescence element of the invention is used for forming a hole transport layer of the organic layer.

In this, in case where one layer is present between the anode and the light emission layer in an organic electroluminescent layer, this layer is referred to as "hole transport layer"; and in case where two or more layers are present between them, then the layer adjacent to the anode is referred to as "hole injection layer", and the other layers are generically as "hole transport layer". The layer between the anode and the light emission layer may be generically referred to as "hole injection/transport layer".

The composition for organic electroluminescence element of the invention is characterized by containing the polymer compound of the invention, and in general, it further contains a solvent.

The solvent is preferably one capable of dissolving the polymer compound of the invention, and in general, it is a solvent capable of dissolving the polymer compound to a degree of at least 0.05% by weight at room temperature, preferably at least 0.5% by weight, more preferably at least 1% by weight.

The composition for organic electroluminescence element of the invention may contain only one type or two or more types of the polymer compounds of the invention.

The composition for organic electroluminescence element of the invention contains the polymer compound of the invention generally to a degree of at least 0.01% by weight, preferably at least 0.05% by weight, more preferably at least 0.1% by weight, and generally at most 50% by weight, preferably at most 20% by weight, more preferably at most 10% by weight.

The composition may contain various additives. In this case, the solvent is preferably one capable of dissolving both the polymer compound of the invention and the additives to a degree of at least 0.05% by weight, more preferably at least 0.5% by weight, even more preferably at least 1% by weight.

The additive capable of promoting the crosslinking reaction of the polymer compound of the invention, that may be in the composition for electroluminescence element of the invention, includes a polymerization initiator such as alkylphenone compound, acylphosphine oxide compound, metallocene compound, oxime ester compound, azo compound, onium compound; and a light sensitizer such as condensed polycyclic hydrocarbon, porphyrin compound, diaryl ketone compound. One or more of these may be used either singly or as combined.

In case where the composition for organic electroluminescence element of the invention is used for forming a hole injection layer, it preferably contains an electron-receiving compound for lowering the resistance value of the formed layer.

The electron-receiving compound is preferably one having an oxidizing power and having the ability of receiving an electron from the above-mentioned hole-transporting compound. Concretely, preferred is a compound having an electron affinity of at least 4 eV, more preferably at least 5 eV.

Examples of the electron-receiving compound include, for example, organic group-substituted onium salts such as 4-isopropyl-4'-methyl diphenyliodonium tetrakis(pentafluorophenyl)borate; high-valent inorganic compounds such as iron (III) chloride (JP-A 11-251067), ammonium peroxodisulfate; cyano compounds such as tetracyanoethylene; aromatic boron compounds such as tris(pentafluorophenyl)borane (JP-A 2003-31365); fullerene derivatives, iodine, etc.

Of the above compounds, preferred are organic group-substituted onium salts and high-valent inorganic compounds as having a strong oxidizing power. Also preferred are organic group-substituted onium salts, cyano compounds and aromatic boron compounds as having a high solubility in various solvents and applicable to film formation according to a wet film formation method.

Specific examples of organic group-substituted onium salts, cyano compounds and aromatic boron compounds that are suitable for use as the electron-receiving compound are described in WO2005/089024, and preferred examples described therein are applicable to the present invention. For example, compounds represented by the following structural formula may be mentioned, to which, however, the invention is not limited.

[Chemical Formula 47]

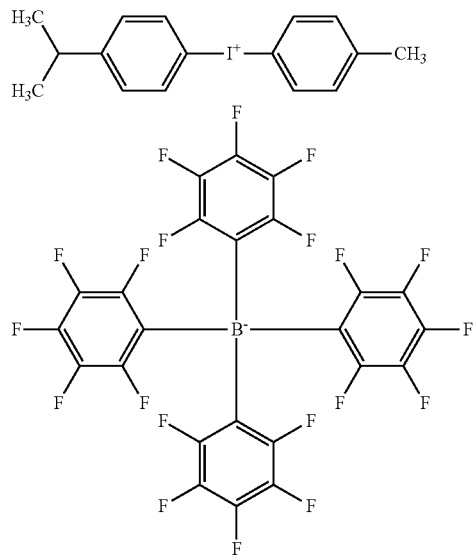

One or more different types of electron-receiving compounds may be used here either singly or as randomly combined in any desired ratio.

The solvent to be in the composition for organic electroluminescence element of the invention is not specifically defined, but must dissolve the polymer compound of the invention. Therefore, preferred are organic solvents including aromatic compounds such as toluene, xylene, mesitylene, cyclohexylbenzene; halogen-containing solvents such as 1,2-dichloroethane, chlorobenzene, o-dichlorobenzene; ether solvents such as aliphatic ethers, e.g., ethylene glycol dimethyl ether, ethylene glycol diethyl ether, propylene glycol 1-monomethyl ether acetate (PGMEA), aromatic ethers, e.g., 1,2-dimethoxybenzene, 1,3-dimethoxybenzene, anisole, phenetol, 2-methoxytoluene, 3-methoxytoluene, 4-methoxytoluene, 2,3-dimethylanisole, 2,4-dimethylanisole; aliphatic esters such as ethyl acetate, n-butyl acetate, ethyl lactate, n-butyl lactate; and ester solvents such as phenyl acetate, phenyl propionate, methyl benzoate, ethyl benzoate, isopropyl benzoate, propyl benzoate, n-butyl benzoate. One or more of these may be used here either singly or as combined.

The concentration of the solvent in the composition for organic electroluminescence element of the invention is generally at least 10% by weight, preferably at least 50% by weight, more preferably at least 80% by weight.

It is widely known that water may have the possibility of accelerating the performance degradation of organic electroluminescence element, especially the brightness depression thereof in continuous drive; and therefore, for reducing the water content to remain in the coating film, those solvents having a solubility of water therein at 25° C. of at most 1% by weight, preferably at most 0.1% by weight are preferred.

As the solvent to be in the composition for organic electroluminescence element of the invention, there is mentioned a solvent having a surface tension at 20° C. of less than 40 dyn/cm, preferably at most 36 dyn/cm, more preferably at most 33 dyn/cm.

Specifically, in case where the crosslinking layer in the invention is formed according to a wet film formation method, its affinity to the base is important. The uniformity of the coating film has great influences on the uniformity and the stability of light emission by organic electroluminescence element, and therefore, the coating liquid for use in the wet film formation method is required to have a low surface tension in order that a uniform coating film having a higher leveling degree can be formed. Using the solvent of the type, the crosslinking layer in the invention can be formed uniformly.

Specific examples of the low-surface-tension solvent are the above-mentioned aromatic solvents such as toluene, xylene, mesitylene, cyclohexylbenzene, ester solvents such as ethyl benzoate, ether solvents such as anisole, as well as trifluoromethoxyanisole, pentafluoromethoxybenzene, 3-(trifluoromethyl)anisole, ethyl (pentafluorobenzoate), etc.

The concentration of the solvent in the composition is generally at least 10% by weight, preferably at least 30% by weight, more preferably at least 50% by weight.

As the solvent to be in the composition for organic electroluminescence element of the invention, also mentioned is a solvent having a vapor pressure at 25° C. of at most 10 mmHg, preferably at most 5 mmHg, and generally at least 0.1 mmHg. Using the solvent of the type makes it possible to produce a composition suitable for the process of producing an organic electroluminescence element according to a wet film formation method and suitable for the nature of the polymer compound of the invention. Specific examples of the solvent of the type are the above-mentioned aromatic solvents such as toluene, xylene mesitylene, ether solvents, and ester solvents. The concentration of the solvent in the composition is generally at least 10% by weight, preferably at least 30% by weight, more preferably at least 50% by weight.

As the solvent to be in the composition for organic electroluminescence element of the invention, also mentioned is a mixed solvent that comprises a solvent having a vapor pressure at 25° C. of at least 2 mmHg, preferably at least 3 mmHg, more preferably at least 4 mmHg (its upper limit is preferably at most 10 mmHg), and a solvent having a vapor pressure at 25° C. of less than 2 mmHg, preferably at most 1 mmHg, more preferably at most 0.5 mmHg. Using the mixed solvent of the type makes it possible to form a homogeneous layer of the polymer compound of the invention optionally containing an electron-receiving compound, according to a wet film formation method. The concentration of the mixed solvent in the composition is generally at least 10% by weight, preferably at least 30% by weight, more preferably at least 50% by weight.

An organic electroluminescence element is produced by laminating a number of layers of an organic compound, in which, therefore, the uniformity of the film thickness of the constitutive layers is extremely important. In case where the layers are formed according to a wet film formation method, various film formation methods are employable, for example, a coating method of a spin coating method, a spray coating method or the like, or a printing method of an inkjet method, a screen method or the like, depending on the nature of the film material and the base. For example, a spraying method is effective for uniform film formation on an intended surface, and is therefore favorable in a case where a layer of an organic compound is formed on an indented surface having thereon patterned electrodes or pixels-partitioning walls. In coating according to a spraying method, the liquid droplets as jetted from a nozzle toward the surface to be coated are as small as possible for attaining uniform film quality. For this, preferably, a solvent having a high vapor pressure is mixed in the coating liquid so that a part of the solvent could evaporate away from the liquid droplets jetted out in the coating atmosphere and that fine liquid droplets could be formed just before the coating liquid reaches the substrate. For obtaining more uniform film quality, a period of time must be secured for leveling the liquid film formed on the substrate just after coating, and for attaining this object, there is employed a method of making the coating liquid contain a suitable amount of a solvent capable of evaporating away slowly, or that is, a solvent having a low vapor pressure.

Specific examples of the solvent having a vapor pressure at 25° C. of from 2 mmHg to 10 mmHg are organic solvents such as xylene, anisole, cyclohexanone, toluene. The solvent having a vapor pressure at 25° C. of lower than 2 mmHg includes ethyl benzoate, methyl benzoate, tetralin, phenetol.

Regarding the blend ratio of the mixed solvent, the solvent having a vapor pressure at 25° C. of not lower than 2 mmHg is in a ratio of at least 5% by weight of the total amount of the mixed solvent, preferably at least 25% by weight but less than 50% by weight, and the solvent having a vapor pressure at 25° C. of lower than 2 mmHg is in a ratio of at least 30% by weight of the total amount of the mixed solvent, preferably at least 50% by weight, more preferably at least 75% by weight but less than 95% by weight.

An organic electroluminescence element is produced by laminating a number of layers of an organic compound, in which, therefore, the uniformity of the constitutive layers is needed. In case where the layers are formed according to a wet film formation method, water may mix in the solution (composition) for film formation and water may mix in the coating film to detract from the uniformity of the film; and therefore, the water content of the solution is preferably as small as possible. Concretely, the water content of the composition for electroluminescence element is preferably at most 1% by weight, more preferably at most 0.1% by weight, even more preferably at most 0.05% by weight.

Materials that may be greatly degraded by water, such as cathode, are much used in an organic electroluminescence element, and therefore, from the viewpoint of preventing the degradation of the device, the existence of water is unfavorable. As a method for reducing the water content in the solution, for example, there are mentioned various techniques of nitrogen gas sealing, use of drying agent, previous dehydration of solvent, use of solvent having a low solubility of water therein, etc. Above all, in case where a solvent having a low solubility of water therein is used, it can prevent the phenomenon of whitening of the coating film to be caused by water absorption by the film, and the solvent of the type is favorable.

From this viewpoint, the composition for organic electroluminescence element of the invention preferably contains a solvent having a solubility of water therein at 25° C. of, for example, at most 1% by weight (preferably at most 0.1% by weight), in an amount of at least 10% by weight. The amount of the solvent satisfying the above-mentioned solubility condition is more preferably at least 30% by weight, even more preferably at least 50% by weight.

Apart from the above-mentioned solvent, the composition for organic electroluminescence element of the invention may contain any other solvent, if desired. The additional solvent includes, for example, amides such as N,N-dimethylformamide, N,N-dimethylacetamide; and dimethyl sulfoxide.

The composition for organic electroluminescence element of the invention may contain various additives, for example, coating improver, such as leveling agent, defoaming agent.

[Film Formation Method]

As described in the above, an organic electroluminescence element is produced by laminating a number of layers of an organic compound, and the uniformity of the film quality is extremely important. In case where the layers are formed according to a wet film formation method, various film formation methods are employable, for example, a coating method of a spin coating method, a spray coating method or the like, or a printing method of an inkjet method, a screen method or the like, depending on the nature of the film material and the base.

In the wet film formation method, the polymer compound of the invention and other optional components (electron-receiving compound, crosslinking reaction-accelerating additive, coating improver, etc.) are dissolved in a suitable solvent to prepare a composition for organic electroluminescence element. The composition is applied onto an underlayer on which the intended film is formed, according to a method of spin coating method, a dip coating method or the like, then dried thereon, and crosslinked to thereby form a crosslinked layer in the invention.

When the polymer compound of the invention is crosslinked to give a net-like polymer compound, it is generally heated.

The heating method is not specifically defined. For example, hot drying is employed. Regarding the condition of hot drying, the layer formed of the composition for organic electroluminescence element of the invention is heated generally at 120° C. or higher, preferably at 400° C. or higher.

The heating time may be generally at least 1 minute, preferably at most 24 hours. The heating means is not specifically defined. For example, a method of heating the laminate having the formed layer on a hot plate or in an even may be employed. For example, the laminate may be heated on a hot plate at 120° C. or higher for at least 1 minute.

The heating method is not specifically defined. In heating and drying, the layer formed of the composition for organic electroluminescent composition is heated generally at a temperature not lower than 100° C., preferably not lower than 120° C., more preferably not lower than 150° C., and generally not higher than 400° C., preferably not higher than 350° C., more preferably not higher than 300° C. The heating time is generally at least 1 minute and is preferably at most 24 hours. The heating means is not specifically defined. Employed is a method of heating the laminate having a formed layer on a hot plate or in an oven. For example, the laminate may be heated on a hot plate at 120° C. or higher for at least 1 minute.

For irradiation with active energy such as light, employed is a method of irradiating the laminate directly with a UV-visible-IR light source such as ultra-high-pressure mercury lamp, high-pressure mercury lamp, halogen lamp, IR lamp, or a method of using a mask aligner or a conveyor-type illuminator with the above-mentioned light source built therein, for the intended irradiation. For irradiation with active energy except light, for example, employed is a method of using an apparatus of radiating microwaves by the use of an magnetron, such as a microwave oven.

The irradiation time is preferably one necessary for sufficient crosslinking reaction, and in general, the irradiation may be for at least 0.1 seconds but preferably for at most 10 hours.

The heating and the active energy irradiation with light or the like may be effected either singly or as combined. When combined, the order of the operation is not specifically defined.

Preferably, the heating and the active energy irradiation with light or the like is carried out in a waterless atmosphere such as a nitrogen atmosphere, for the purpose of reducing the water content in the treated layer and/or the amount of water adsorbed by the surface of the layer. For the same purpose, when the heating and/or the active energy irradiation with light or the like are combined, preferably, at least the step just before the formation of the light emission layer is carried out in a waterless atmosphere such as a nitrogen gas atmosphere.

<8. Organic Electroluminescence Element>

The organic electroluminescence element of the invention has, on a substrate, an anode, a cathode and an organic layer between the anode and the cathode, wherein the organic layer has a layer containing the net-like polymer compound of the invention (this may be referred to as a crosslinked layer).

In the organic electroluminescence element of the invention, the crosslinked layer is preferably a hole injection layer and/or a hole transport layer.

Preferably, the crosslinked layer is formed of the composition for electroluminescence element of the invention according to a wet film formation method.

Preferably, the device has a light emission layer formed according to a wet film formation method on the cathode side of the hole transport layer. Also preferably, the device has a hole injection layer formed according to a wet film formation method on the anode side of the hole transport layer. Specifically, in the organic electroluminescence element of the invention, all the hole injection layer, the hole transport layer and the light emission layer are formed according to a wet film formation method. Especially preferably, the light emission layer formed according to a wet film formation method is a layer of a low-molecular material.

FIG. 1 is a cross-sectional view graphically showing one example of the structure of the organic electroluminescence element of the invention. The organic electroluminescence element shown in FIG. 1 comprises an anode, a hole injection layer, a hole transport layer, a light emission layer, a hole inhibition layer, an electron injection layer and a cathode, as laminated on a substrate in that order. In this constitution, in general, the hole transport layer corresponds to the above-mentioned, organic compound-containing layer of the invention.

[1] Substrate:

The substrate is a support for the organic electroluminescence element, for which is used a sheet of quartz or glass, a metal plate, a metal foil, or a plastic film or sheet. Especially preferred are glass sheets, and transparent synthetic resin sheets of polyester, polymethacrylate, polycarbonate, polysulfone, etc. In case where a synthetic resin sheet is used, attention should be paid to the gas barrier property thereof. When the gas barrier capability of the substrate is too low, then it is unfavorable since the organic electroluminescence element may be degraded by the outside air having passed through the substrate. Accordingly, preferably employed is a method of forming a dense silicon oxide film or the like on at least one surface of the synthetic resin substrate to secure the gas barrier property of the substrate.

[2] Anode:

The anode plays a role of hole injection into the layer on the side of the light emission layer to be mentioned below (hole injection layer or light emission layer). The anode is generally formed of a metal such as aluminium, gold, silver, nickel, palladium, platinum; a metal oxide such as indium and/or tin oxide; a metal halide such as copper iodide; carbon black; or a conductive polymer such as poly(3-methylthiophene), polypyrrole, polyaniline. The anode is formed generally according to a sputtering method or a vacuum evaporation method in many cases. Metal fine particles of silver or the like, fine particles of copper iodide or the like, carbon black, conductive metal oxide fine particles, or conductive polymer fine powder may be dispersed in a suitable binder solution, and the resulting dispersion may be applied onto a substrate to form an anode thereon. Further, a thin film of a conductive polymer may be formed on a substrate directly through electrolytic polymerization, or a conductive polymer may be applied onto a substrate and dried thereon to form an anode (see Applied Physics Letters, 1992, Vol. 60, p. 2711). The anode may be formed of a laminate of multiple layers of different substances.

The thickness of the anode differs depending on the necessary transparency. In case where the anode is required to be transparent, its visible light transmittance is preferably at least 60%, more preferably at least 80%, and in this case, the anode thickness is generally at least 5 nm, preferably at least 10 nm, and is generally at most 1000 nm, preferably at most 500 nm. In case where the anode may be nontransparent, the anode may be the same as the substrate. A different conductive material may be further laminated on the anode.

For the purpose of removing the impurities from the anode and for controlling the ionization potential thereof to thereby enhance the hole injection capability of the anode, the anode surface is preferably processed with UV rays (UV)/ozone, or processed with oxygen plasma or argon plasma.

[3] Hole Injection Layer:

A hole injection layer is formed on the anode.

The hole injection layer is a layer for hole transportation to the layer on the side of the cathode from the anode.

In the organic electroluminescence element of the invention, the hole injection layer may be omitted.

Preferably, the hole injection layer contains a hole-transporting compound, more preferably a hole-transporting compound and an electron-receiving compound. Further, the hole injection layer preferably contains a cationic radical compound, more preferably a cationic radical compound and a hole-transporting compound.

The hole injection layer may contain, if desired, a binder resin and a coating improver. Preferably, the binder resin hardly acts as a charge trap.

The hole injection layer may be formed of an electron-receiving layer alone on the anode according to a wet film formation method; and a charge-transporting material composition may be directly applied thereon to form a layer laminated thereon. In this case, a part of the charge-transporting material composition may interact with the electron-receiving compound to form a layer excellent in hole injectability.

(Hole-Transporting Compound)

The hole-transporting compound is preferably a compound having an ionization potential of from 4.5 eV to 6.0 eV. However, when the compound is used in a wet film formation method, the solubility of the compound in the solvent for use in the wet film formation method is preferably higher.

The hole-transporting compound is preferably the polymer compound of the invention as excellent in film formability and having a high charge transportation capability. In other words, the layer is preferably formed of the composition for electroluminescence element of the invention.

In case where any other compound than the polymer compound of the invention is used as the hole-transporting compound, examples of the hole-transporting compound include aromatic amine compounds, phthalocyanine derivatives, porphyrin derivatives, oligothiophene derivatives, polythiophene derivatives. Of those, preferred are aromatic amine compounds from the viewpoint of the amorphous nature and the visible transmittance thereof.

Not specifically defined in point of the type thereof, the aromatic amine compounds may be low-molecular compounds or polymer compounds; but from the viewpoint of the surface leveling effect thereof, preferred are polymer compounds having a weight-average molecular weight of at least 1000 and at most 1000000 (polymer-type hydrocarbon compounds with continuous repeating units).

As preferred examples of aromatic tertiary amine polymer compounds, also mentioned are polymer compounds having a repeating unit of the following formula (I):

[Chemical Formula 48]

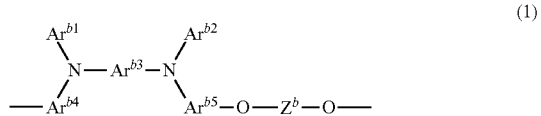

(1)

(In the formula (1), $Ar^{b1}$ and $Ar^{b2}$ each independently represent an aromatic hydrocarbon group optionally having a substituent, or an aromatic heterocyclic group optionally having a substituent. $Ar^{b3}$ to $Ar^{b5}$ each independently represent an aromatic hydrocarbon group optionally having a substituent, or an aromatic heterocyclic group optionally having a substituent. $Z^b$ represents a linking group selected from the following group of linking groups. Two groups of $Ar^{b1}$ to $Ar^{b5}$ bonding to the same N atom may bond to each other to form a ring.)

[Chemical Formula 49]

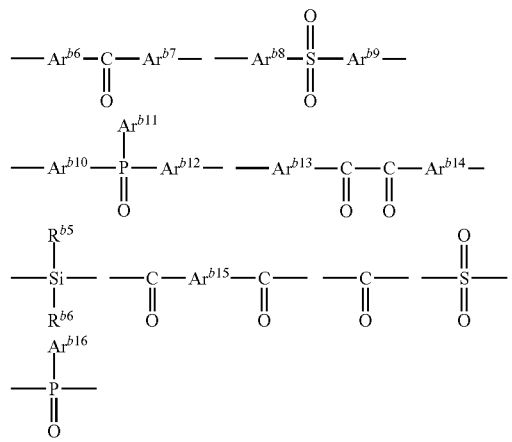

(In the above formulae, $Ar^{b6}$ to $Ar^{b16}$ each independently represent a monovalent or divalent group derived from an aromatic hydrocarbon ring optionally having a substituent or an aromatic hetero ring optionally having a substituent. $R^{b5}$ and $R^{b6}$ each independently represent a hydrogen atom or a substituent.

To $Ar^{b1}$ to $Ar^{b16}$, applicable is a monovalent or divalent group derived from an aromatic hydrocarbon ring or an aromatic hetero ring. These groups may be the same or different from each other. These group may have an additional substituent.

As specific examples of the aromatic tertiary amine polymer compound having a repeating unit of the general formula (1), there are mentioned compounds described in WO2005/089024.

The hole-transporting compound used as a material for the hole injection layer may contain any one of those compounds, or may contain two or more of them.

In case where the layer contains two or more different types of hole-transporting compounds, they may be combined in any desired manner. Preferably, one or more aromatic tertiary amine polymer compounds are combined with one or more other hole-transporting compounds.

(Electron-Receiving Compound)

The electron-receiving compounds may be the same as those described in the above-mentioned section <7. Composition for Organic Electroluminescence element>. Preferred examples are the same as therein.

(Cationic Radical Compound)

The cationic radical compound is anionic compound composed of a cationic radical of a chemical species derived from a hole-transporting compound by removing one electron therefrom, and a counter anion. However, in case where the cationic radical is derived from a hole-transporting polymer compound, it has a structure derived from the polymer compound by removing one electron from the repeating unit thereof.

Preferably, the cationic radical is a chemical species derived from the above-mentioned hole-transporting compound by removing one electron therefrom. More preferably, it is a chemical species derived from a preferred compound of those hole-transporting compounds by removing one electron therefrom, in view of the amorphous nature, the visible transmittance, the heat resistance and the solubility thereof.

The cationic radical compound may be produced by mixing the above-mentioned hole-transporting compound and the electron-receiving compound. Specifically, when the hole-transporting compound is mixed with the electron-receiving compound, then electron transfer occurs from the hole-transporting compound to the electron-receiving compound, thereby giving a cationic compound composed of the cationic radical of the hole-transporting compound and the counter anion.

Cationic radical compounds derived from polymer compounds such as PEDOT/PSS (Adv. Mater., 2000, Vol. 12, p. 481) or emeraldine hydrochloride (J. Phys. Chem., 1990, Vol. 94, 7716) can be produced through oxidative polymerization (dehydrogenation polymerization).

Oxidative polymerization as referred to herein comprises electrical or electrochemical oxidation of a monomer in an acidic solution using peroxodisulfate or the like. In the oxidative polymerization (dehydrogenation polymerization), the monomer is oxidized and polymerized to give a cationic radical derived from the repeating unit of the polymer by removing one electron therefrom and having a counter anion derived from the acidic solution.

The hole injection layer may be formed according to a wet film formation method, or a dry film formation method such as vacuum evaporation method. Preferably, the layer is formed according to a wet film formation method from the viewpoint of excellent film formability.

The thickness of the hole injection layer is generally at least 5 nm, preferably at least 10 nm, and is generally at most 1000 nm, preferably at most 500 nm.

The content ratio of the electron-receiving compound relative to the hole-transporting compound in the hole injection layer is generally at least 0.1 mol %, preferably at least 1 mol %, but is generally at most 100 mol %, preferably at most 40 mol %.

(Other Constitutive Material)

Any other component than the above-mentioned hole-transporting compound and the electron-receiving compound may be incorporated in the material of the hole injection layer, not greatly detracting from the advantage of the invention. Examples of the additional components are various light-emitting materials, electron-transporting compounds, binder resins, coating improvers, etc. Either singly or as combined, one or more such additional components may be incorporated in any desired combination and in any desired blend ratio.

(Solvent)

Preferably, at least one solvent in the composition for forming hole injection layer according to a wet film formation method is a compound capable of dissolving the above-mentioned constitutive material for the hole injection layer. Preferably, the boiling point of the solvent is generally not lower than 110° C., more preferably not lower than 140° C., even more preferably not lower than 200° C., and is generally not higher than 400° C., more preferably not higher than 300° C. When the boiling point of the solvent is too low, the drying speed may be too high and the film quality may worsen. When the boiling point of the solvent is too high, then the temperature in the drying step must be high and such a high temperature may have some negative influence on the other layers and the substrate.

The solvent includes, for example, ether solvents, ester solvents, aromatic hydrocarbon solvents, amide solvents.

The ether solvents include, for example, aliphatic ethers such as ethylene glycol dimethyl ether, ethylene glycol diethyl ether, propylene glycol 1-monomethyl ether acetate (PGMEA); aromatic ethers such as 1,2-dimethoxybenzene, 1,3-dimethoxybenzene, anisole, phenetol, 2-methoxytoluene, 3-methoxytoluene, 4-methoxytoluene, 2,3-dimethylanisole, 2,4-dimethylanisole.

The ester solvents include, for example, aromatic esters such as phenyl acetate, phenyl propionate, methyl benzoate, ethyl benzoate, propyl benzoate, n-butyl benzoate.

The aromatic hydrocarbon solvents include, for example, toluene, xylene, cyclohexylbenzene, 3-isopropylbiphenyl, 1,2,3,4-tetramethylbenzene, 1,4-diisopropyl benzene, cyclohexylbenzene, methylnaphthalene.

The amide solvents include, for example, N,N-dimethylformamide, N,N-dimethylacetamide.

In addition, dimethyl sulfoxide is also usable.

Either singly or as combined, one or more such solvents are usable in any desired combination and in any desired blend ratio.

(Film Formation Method)

After the composition for forming hole injection layer is prepared, the composition is applied onto an underlying layer on which the hole injection layer is to be formed (generally anode), and then dried to form the intended hole injection layer thereon.

The temperature in the film forming step is preferably not lower than 10° C., more preferably not lower than 50° C. for the purpose of preventing the film from being cracked owing to crystal formation in the composition.

The relative humidity in the film forming step is not specifically defined so far as it does not greatly detract from the advantage of the invention, but is generally at least 0.01 ppm and is generally at most 80%.

After the coating, the film of the composition for hole injection layer is heated generally by heating or the like. For drying the film, generally employed is a heating step. Examples of the heating means for use in the heating step include a clean oven, a hot plate, an IR ray, a halogen heater, microwave irradiation. Above all, preferred are a clean oven and a hot plate for homogeneously heating the entire film.

The heating temperature in the heating step is preferably not lower than the boiling point of the solvent used in the hole injection layer-forming composition so far as it does not greatly detract from the advantage of the invention. In case where a mixed solvent of two or more different types of solvents is used in the hole injection layer-forming composition, preferably, the film of the composition is heated at a temperature not lower than the boiling point of at least one of the mixed solvent. In consideration of the elevation of the boiling point of the solvent, the film is preferably heated at a temperature not lower than 120° C. and not higher than 410° C. in the heating step.

In the heating step, preferably, the heating temperature is not lower than the boiling point of the solvent in the hole injection layer-forming composition. The heating time is not specifically defined so far as the coating film is not fully crosslinked, but is preferably at least 10 seconds and is generally at most 180 minutes. When the heating time is too long, the component of the other layer may diffuse; but when too short, the hole injection layer may be inhomogeneous. The heating may be effected twice.

<Formation of Hole Injection Layer by Vacuum Evaporation Method>

In case where the hole injection layer is formed through vacuum evaporation, one or more of the constitutive materials for the hole injection layer (the above-mentioned hole-transporting layer, electron-receiving layer, etc.) are put in a crucible set in a vacuum chamber (in case where two or more different types of materials are used, they are individually put in different crucibles), then the vacuum chamber is degassed with a vacuum pump to $10^{-4}$ Pa or so, and thereafter the crucible is heated (in case where two or more different types of materials are used, the respective crucibles are heated)

whereby the material is evaporated under control of the evaporation rate (in case where two or more different types of materials are used, the evaporation rate of every material is individually controlled), and thus a hole injection layer is thereby formed on the anode of the substrate arranged to face the crucible. In case where two or more different types of materials are used, their mixture may be put in one crucible and heated and evaporated to form a hole injection layer.

The vacuum degree in vapor deposition is not specifically defined so far as it does not greatly detract from the advantage of the invention, but is generally at least $0.1 \times 10^{-6}$ Torr ($0.13 \times 10^{-4}$ Pa) and at most $9.0 \times 10^{-6}$ Torr ($12.0 \times 10^{-4}$ Pa). The deposition speed is not also specifically defined so far as it does not greatly detract from the advantage of the invention, but is generally at least 0.1 angstrom/sec and at most 5.0 angstrom/sec. The film formation temperature in vapor deposition is not specifically defined so far as it does not greatly detract from the advantage of the invention, but is preferably not lower than 10° C. and preferably not higher than 50° C.

The thickness of the hole injection layer is generally at least 5 nm, preferably at least 10 nm, and is generally at most 1000 nm, preferably at most 500 nm.

[4] Hole Transport Layer:

The hole transport layer may be formed on a hole injection layer, if any, or may be formed on an anode in case where the device does not have a hole injection layer. The organic electroluminescence element of the invention may have a constitution with no hole transport layer.

The material to form the hole transport layer is preferably one having a high hole transporting capability and capable of efficiently transporting the injected hole. Accordingly, the material is preferably one having a low ionization potential, having high transparency to visible light, having a high hole mobility, excellent in stability, and hardly generating impurities to be traps during production and use. In many cases, the hole transport layer is adjacent to a light emission layer, and therefore it is desirable that the material does not extinguish the light from the light emission layer and does not form an exciplex with the light emission layer to cause efficiency depression.

From the above-mentioned viewpoint, the hole-transporting compound is preferably the polymer compound of the invention. In case where any other compound than the polymer compound of the invention is used as the hole-transporting compound, a constitutive material heretofore used for hole transport layer may be used here. For example, those exemplified in the above for the hole-transporting compound for use in the hole injection layer may be used. In addition, also usable are aromatic diamines containing at least two tertiary amines and having at least two condensed aromatic rings bonding to the nitrogen atom such as typically 4,4'-bis[N-(1-naphthyl)-N-phenylamino]biphenyl (JP-A 5-234681), aromatic amine compounds having a starburst structure such as 4,4',4"-tris(1-naphthylphenylamino)triphenylamine (J. Lumin., Vols. 72-74, p. 985, 1997), aromatic amine compounds of triphenylamine tetramer (Chem. Commun., p. 2175, 1996), spiro compounds such as 2,2',7,7'-tetrakis-(diphenylamino)-9,9'-spirofluorene (Synth. Metals, Vol. 91, p. 209, 1997), and carbazole derivatives such as 4,4'-N,N'-dicarbazole-biphenyl. Further usable are, for example, polyvinylcarbazole, polyvinyltriphenylamine (JP-A 7-53953), polyarylene ether sulfones containing tetraphenylbenzidine (Polym. Adv. Tech., Vol. 7, p. 33, 1996).

In case where the hole transport layer is formed according to a wet film formation method, a hole transport layer-forming composition is prepared, then it is applied, and heated and dried, like that for the formation of the hole injection layer.

The hole transport layer-forming composition contains a solvent in addition to the above-mentioned, hole-transporting compound. The solvent to be used is the same as that used in the hole injection layer-forming composition. The coating condition and the heating and drying condition are also the same as those in the formation of the hole injection layer.

In case where the hole transport layer is formed through vacuum evaporation, the condition for film formation is the same as that in the formation of hole injection layer.

Apart from the hole-transporting compound, the hole transport layer may contain various light-emitting materials, electron-transporting compounds, binder resins, coating improvers, etc.

The hole transport layer may be a layer formed by crosslinking a crosslinking compound. The crosslinking compound is a compound having a crosslinking group, and forms a net-like polymer compound by crosslinking.

Examples of the crosslinking group are cyclic ether groups such as oxetane group, epoxy group; unsaturated double bond-having groups such as vinyl group, trifluorovinyl group, styryl group, acrylic group, methacryloyl group, cinnamoyl group; benzocyclobutene ring-derived groups.

The crosslinking compound may be any of monomers, oligomers or polymers. One or more different types of crosslinking compounds may be used here either singly or as randomly combined in any desired ratio.

As the crosslinking compound, preferably used is a hole-transporting compound having a crosslinking group. Examples of the hole-transporting compound include nitrogen-containing aromatic compound derivatives such as pyridine derivatives, pyrazine derivatives, pyrimidine derivatives, triazine derivatives, quinoline derivatives, phenanthroline derivatives, carbazole derivatives, phthalocyanine derivatives, porphyrin derivatives; triphenylamine derivatives; silole derivatives; oligothiophene derivatives, condensed polycyclic aromatic derivatives, metal complexes. Of those, preferred are nitrogen-containing aromatic derivatives such as pyridine derivatives, pyrazine derivatives, pyrimidine derivatives, triazine derivatives, quinoline derivatives, phenanthroline derivatives, carbazole derivatives; triphenylamine derivatives, silole derivatives, condensed polycyclic aromatic derivatives and metal complexes; and, in particular, more preferred are triphenylamine derivatives.

In case where the hole transport layer is formed by crosslinking a crosslinking compound, in general, the crosslinking compound is dissolved or dispersed in a solvent to prepare a hole transport layer-forming composition, and this is applied and crosslinked according to a wet film formation method.

In addition to the crosslinking compound, the hole transport layer-forming composition may contain an additive for promoting crosslinking reaction. Examples of the additive for promoting crosslinking reaction include polymerization initiators and polymerization promoters such as alkylphenone compounds, acylphosphine oxide compounds, metallocene compounds, oxime ester compounds, azo compounds, onium salts; photosensitizers such as condensed polycyclic hydrocarbons, porphyrin compounds, diaryl ketone compounds.

In addition, the composition may further contain a coating improver such as leveling agent, defoaming agent; an electron-receiving compound; a binder resin, etc.

The hole transport layer-forming composition contains a crosslinking compound generally in an amount of not smaller than 0.01% by weight, preferably not smaller than 0.05% by weight, more preferably not smaller than 0.1% by weight, and generally in an amount of not larger than 50% by weight, preferably not larger than 20% by weight, more preferably not larger than 10% by weight.

The hole transport layer-forming composition containing a crosslinking compound in such a concentration is applied onto the underlying layer (generally, hole injection layer), and then heated and/or irradiated with active energy such as light to thereby crosslink the crosslinking compound to give a net-like polymer compound.

The condition of temperature and humidity in coating, and the heating condition after coating are the same as those for the method described in the above section <7. Organic Electroluminescence element>[Film Formation Method]. Preferred embodiments are the same as therein.

The thickness of the hole transport layer is generally at least 5 nm, preferably at least 10 nm, and is generally at most 1000 nm, preferably at most 500 nm.

[5] Light Emission Layer:

The light emission layer is formed on the hole transport layer, if any; and in case where the device does not have a hole transport layer but has a hole injection layer, the light emission layer is formed on the hole injection layer; and in case where the device does not have a hole transport layer and a hole injection layer, the light emission layer is formed on the anode.

The light emission layer may be independent of the above-mentioned hole injection layer and hole transport layer, and of a hole inhibition layer, an electron transport layer and others to be mentioned below. However, not forming an independent light emission layer, the other organic layers such as the hole transport layer and the electron transport layer may serve additionally as the light emission layer.

The light emission layer is a layer to be the main light-emitting source, which is, between the electrodes given an electric field, excited through recombination of the hole injected thereinto directly from the anode or via the hole injection layer or the hole transport layer, and the electron injected thereinto directly from the cathode or via the cathode buffer layer, the electron transport layer or the hole inhibition layer.

The light emission layer may be formed in any desired method, not greatly detracting from the advantage of the invention, but is formed on the anode, for example, according to a wet film formation method of a vacuum evaporation method. However, in case where a large-area light emission device is produced, preferred is a wet film formation method. The wet film formation method and the vacuum evaporation method may be attained in the same manner as that for the formation of the hole injection layer.

The light emission layer contains at least a material having a light-emitting nature (light-emitting material), and preferably contains a material having a nature of hole transportation (hole-transporting material) or a material having a nature of electron transportation (electron-transporting material). Further, the light emission layer may contain any other ingredients, not overstepping the spirit and the scope of the invention. From the viewpoint of forming the light emission layer according to a wet film formation method as mentioned below, these materials are preferably low-molecular materials.

As the light-emitting material, usable is any known material. For example, it may be a fluorescent light-emitting material or a phosphorescent light-emitting material; however, from the viewpoint of the internal quantum efficiency, preferred is a phosphorescent light-emitting material.

For the purpose of increasing the solubility in organic solvent, it is important to lower the symmetricity and the rigidity of the molecules of the light-emitting material and to introduce an oleophilic substituent such as alkyl group into the material.

Examples of fluorescent dyes of light-emitting materials are mentioned below; however, the fluorescent dyes for use herein are not limited to the following examples.

Fluorescent light-emitting materials of giving blue light emission (blue fluorescent dyes) include, for example, naphthalene, chrysene, perylene, pyrene, anthracene, coumarin, p-bis(2-phenylethenyl)benzene and their derivatives.

Fluorescent dyes of giving green light emission (green fluorescent dyes) include, for example, quinacridone derivatives, coumarin derivatives, aluminium complexes such as $Al(C_9H_6NO)_3$.

Fluorescent light-emitting materials of giving yellow light emission (yellow fluorescent dyes) include, for example, rubrene, perimidone derivatives.

Fluorescent light-emitting materials of giving red light emission (red fluorescent dyes) include, for example, DCM (4-(dicyanomethylene)-2-methyl-6-(p-dimethylami-nostyryl)-4H-pyran) compounds, benzopyran derivatives, rhodamine derivatives, benzothioxanthene derivatives, aza-benzothioxanthene.

Concretely, phosphorescent light-emitting materials include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethyl-platinum-porphyrin, octaphenyl-platinum-porphyrin, octaethyl-palladium-porphyrin, octaphenyl-palladium-porphyrin.

Polymer-type light-emitting materials include polyfluorene materials such as poly(9,9-dioctylfluorene-2,7-diyl), poly[(9,9-dioctylfluorene-2,7-diyl)-co-(4,4'-(N-(4-sec-butylphenyl))diphenylamine)], poly[(9,9-dioctyl fluorene-2,7-diyl)-co-(1,4-benzo-2{2,1'-3}-triazole)]; polyphenylenevinylene materials such as poly[2-methoxy-5-(2-methylhexyloxy)-1,4-phenylenevinylene].

In addition, the polymer compound of the invention can be used as the light-emitting material.

The molecular weight of the compound to be used as the light-emitting material may be any desired one, not greatly detracting from the advantage of the invention; but in general, it is at most 10000, preferably at most 5000, more preferably at most 4000, even more preferably at most 3000, and is generally at least 100, preferably at least 200, more preferably at least 300, even more preferably at least 400. When the molecular weight of the light-emitting material is too small, then the heat resistance may be significantly low, or the material may be a cause of gas generation, or the material may lower the film quality in film formation, or the migration of the material may cause morphology change in the organic electroluminescence element. On the other hand, when the molecular weight of the light-emitting material is too large, then the organic compound may be difficult to purify, or the a lot of time may be taken in dissolving the material in solvent.

Any one or more of the above-mentioned light-emitting materials may be used here either singly or as randomly combined in any desired ratio.

The proportion of the light-emitting material in the light emission layer may be any desired one, not greatly detracting from the advantage of the invention, but is preferably at least 0.05% by weight and is preferably at most 35% by weight. When the amount of the light-emitting material is too small, then there may be a possibility of light emission unevenness; but when too large, there may be a possibility of current efficiency depression. In case where two or more different types of light-emitting materials are used as combined, the total content thereof is controlled to fall within the above range.

Examples of low-molecular hole-transporting materials include the compounds mentioned above as examples of the hole-transporting materials for the hole transport layer, as well as aromatic diamines containing at least two tertiary amines and having at least two condensed aromatic rings substituted on the nitrogen atom, such as typically 4,4'-bis[N-(1-naphthyl)-N-phenylamino]biphenyl (JP-A 5-234681), aromatic amine compounds having a starburst structure such as 4,4',4"-tris(1-naphthylphenylamino)triphenylamine (Journal of Luminescence, 1977, Vols. 72-74, p. 985), aromatic amine compounds of triphenylamine tetramer (Chemical Communications, 1996, p. 2175), spiro compounds such as 2,2',7,7'-tetrakis-(diphenylamino)-9,9'-spirofluorene (Synthetic Metals, 1997, Vol. 91, p. 209).

Examples of low-molecular electron-transporting materials include 2,5-bis(1-naphthyl)-1,3,4-oxadiazole (BND), 2,5-bis(6'-(2',2"-bipyridyl))-1,1-dimethyl-3,4-diphenylsilole (PyPySPyPy), bathophenanthroline (BPhen), 2,9-dimethyl-4,7-diphenyl-1,10-phenanthroline (BCP, bathocuproin), 2-(4-biphenyl)-5-(p-tert-butylphenyl)-1,3,4-oxadiazole (tBu-PBD), 4,4'-bis(9-carbazole)-biphenyl (CBP), 9,10-di-(2-naphthyl)anthracene (ADN).

Preferably, these hole-transporting material and electron-transporting material serve as a host material in the light emission layer. Specific examples of host materials usable herein are described in JP-A 2007-067383, 2007-88433 and 2007-110093, and preferred examples thereof are also described therein.

For forming the light emission layer, employable are a wet film formation method and a vacuum evaporation method. As described in the above, a wet film formation method is preferred from the viewpoint that a homogeneous and defectless thin film is easy to produce, the time to be taken for the film formation may be short, and further the method can enjoy the crosslinking effect of the hole transport layer brought about by the organic compound of the invention. In case where the light emission layer is formed according to a wet film formation method, the above-mentioned materials are dissolved in a suitable solvent to prepare a coating solution, and this is applied on the above-mentioned, formed hole transport layer to form a film thereon, and dried to remove the solvent. The forming method is the same as the forming method for the hole transport layer mentioned above.

The thickness of the light emission layer is generally at least 3 nm, preferably at least 5 nm and is generally at most 300 nm, preferably at most 100 nm.

[6] Hole Inhibition Layer:

A hole inhibition layer 6 may be provided between the light emission layer 5 and the electron injection layer 8 to be mentioned below. The hole inhibition layer 6 is a layer to be laminated on the light emission layer 5 so that it is adjacent to the interface of the light emission layer 5 on the side of the cathode 9.

The hole inhibition layer 6 plays a role of inhibiting the hole moving from the anode 2 from reaching the cathode 9, and a role of efficiently transporting the electron injected from the cathode 9 toward the light emission layer 5.

The physical properties necessary for the material constituting the hole inhibition layer 6 are that the electron mobility is high and the hole mobility is low, the energy gap (difference between HOMO and LUMO) is large and the excited triplet level (T1) is high. The material for the hole inhibition layer satisfying the requirements includes, for example, mixed ligand complexes such as bis(2-methyl-8-quinolato)(phenolato)aluminium, bis(2-methyl-8-quinolato)(triphenylsilanolato)aluminium; metal complexes such as bis(2-methyl-8-quinolato)aluminium-μ-oxo-bis(2-methyl-8-quinolato) aluminium binuclear metal complex; styryl compounds such as distyrylbiphenyl derivatives (JP-A 11-242996); triazole derivatives such as 3-(4-biphenylyl)-4-phenyl-5(4-tert-butylphenyl)-1,2,4-triazole (JP-A 7-41759); phenanthroline derivatives such as bathocuproin (JP-A 10-79297). Further, compounds having at least one 2,4,6-substituted pyridine ring as in WO2005/022962 are also preferred as the material for the hole inhibition layer 6.

One or more different types of materials may be used for the hole inhibition layer 6, either singly or as randomly combined in any desired ratio.

The method of forming the hole inhibition layer 6 is not specifically defined. Accordingly, the layer may be formed according to a wet film formation method, a vapor deposition method or any other method.

The thickness of the hole inhibition layer 6 may be any desired one, not greatly detracting from the advantage of the invention, but in general it is at least 0.3 nm, preferably at least 0.5 nm and is generally at most 100 nm, preferably at most 50 nm.

[7] Electron Transport Layer:

The electron transport layer is provided between the light emission layer and the electron injection layer for further enhancing the current efficiency of the device.

The electron transport layer is formed of a compound capable of efficiently transporting the electron injected from the cathode toward the light emission layer, between the electrodes given an electric field. The electron-transporting compound to be used for the electron transport layer must be a compound having a high electron injection efficiency from the cathode or the electron injection layer and having a high electron mobility and capable of efficiently transporting the injected electron.

The material satisfying the requirements includes metal complexes such as 8-hydroxyquinoline aluminium complex (JP-A 59-194393); 10-hydroxybenzo[h]quinoline metal complexes, oxadiazole derivatives, distyrylbiphenyl derivatives, silole derivatives, 3- or 5-hydroxyflavone metal complexes, benzoxazole metal complexes, benzothiazole metal complexes, trisbenzimidazolylbenzene (U.S. Pat. No. 5,645,978), quinoxaline compounds (JP-A 6-207169), phenanthroline derivatives (JP-A 5-331459), 2-t-butyl-9,10-N,N'-dicyanoanthraquinonediimine, n-type hydrogenated amorphous silicon carbide, n-type zinc sulfide, n-type zinc selenide.

The lower limit of the thickness of the electron transport layer is generally 1 nm, preferably 5 nm or so; and the upper limit thereof is generally 300 nm, preferably 100 nm or so.

The electron transport layer is laminated on the hole inhibition layer according to a wet film formation method or a vacuum evaporation method in the same manner as above. In general, a vacuum evaporation method is employed.

[8] Electro Injection Layer:

The electron injection layer plays a role of efficiently injecting the electron injected from the cathode to the electron transport layer or the light emission layer.

For efficient electron injection, the material for forming the electron injection layer is preferably a metal having a low work function. It examples include alkali metals such as sodium, cesium; alkaline earth metals such as barium, calcium. Its thickness is generally at least 0.1 nm and is preferably at most 5 nm.

Further, doping an organic electron-transporting material such as typically a nitrogen-containing heterocyclic compound, e.g., bathophenanthroline, or a metal complex, e.g., 8-hydroxyquinoline aluminium complex mentioned below, with an alkali metal such as sodium, potassium, cesium, lithium or rubidium (as described in JP-A 10-270171, 2002-100478, 2002-100782) is preferred as enhancing the electron injection/transportation capability and improving the film quality. In this case, the film thickness is generally at least 5 nm, preferably at least 10 nm, and is generally at most 200 nm, preferably at most 100 nm.

The electron injection layer is formed by lamination on the light emission layer or on the overlying hole inhibition layer, according to a wet film formation method or a vacuum evaporation method.

The details of the wet film formation method are the same as those for the hole injection layer and the light emission layer.

On the other hand, in case of the vacuum evaporation method, the vapor source is put in the crucible or the metal boat arranged in a vacuum chamber, then the vacuum chamber is degassed with a vacuum pump to $10^{-4}$ Pa or so, and the crucible or the metal boat is heated and the vapor source is evaporated, whereby the intended electron injection layer is formed on the light emission layer, the hole inhibition layer or the electron transport layer on the substrate disposed to face the crucible or the metal boat.

Vapor deposition of alkali metal to give the electron injection layer is attained, using an alkali metal dispenser prepared by filling an alkali metal chromate and a reducing agent in Nichrome. The dispenser is heated in the vacuum chamber whereby the alkali metal chromate is reduced and the alkali metal is thereby evaporated. In case of co-evaporation of an organic electron-transporting material and an alkali metal, the organic electron-transporting material is put in the crucible arranged inside the vacuum chamber, then the vacuum chamber is degassed with a suitable vacuum pump to $10^{-4}$ Pa or so, and the crucible and the dispenser are heated for evaporation at the same time to thereby form the intended electron injection layer on the substrate arranged to face the crucible and the dispenser.

In this, the two are co-deposited uniformly in the thickness direction of the electron injection layer, but may have a concentration profile in the thickness direction.

[9] Cathode:

The cathode plays a role of injecting an electron into the layer on the side of the light emission layer (electron injection layer or light emission layer). As the material for the cathode, the material for use of the above-mentioned anode may be used; however, for efficient electron injection, preferred is a metal having a low work function. Suitable metals such as tin, magnesium, indium, calcium, aluminium or silver or they alloys may be used. Specific examples are low-work-function alloy electrodes of magnesium-silver alloy, magnesium-indium alloy, aluminium-lithium alloy, etc.

The thickness of the cathode is generally the same as that of the anode.

For the purpose of protecting the cathode formed of a low-work-function metal, a metal layer having a high work function and is stable to air is preferably laminated on the cathode, whereby the stability of the device could increase. For this purpose, metals are used, such as aluminium, silver, copper, nickel, chromium, gold or platinum.

[10] Others:

In the above, an example of the organic electroluminescence element having a layer constitution of FIG. 1 has been described; however, the organic electroluminescence element of the invention may have any other constitution, not overstepping the spirit and the scope thereof. For example, not detracting from the performance, any other layer than the layers described above may be provided between the anode and the cathode, and any layer therebetween may be omitted.

In the invention, the polymer compound of the invention may be used in the hole transport layer, and in that manner, all the hole injection layer, the hole transport layer and the light emission layer can be formed by lamination according to a wet film formation method. Accordingly, a large-area display can be produced.

An opposite structure to FIG. 1 may also be employed, or that is, on the substrate, a cathode, an electron injection layer, a light emission layer, a hole injection layer and an anode may be laminated in that order; and as previously mentioned, the organic electroluminescence element of the invention may be arranged between two substrates of which at least one has high transparency.

Further, the invention may employ a laminate structure comprising a plurality of the layer constructions shown in FIG. 1 (laminate structure of plural light emission units). In this case, in place of the interlayer between the unit layer constructions (light emission units) (when the anode is ITO and the cathode is Al, in place of both the two layers), for example, $V_2O_5$ or the like may be used as a charge generation layer (CGL), and this is favorable from the viewpoint of the current efficiency and the drive voltage since the barrier between the units may be reduced.

The invention is applicable to any of device structures where the organic electroluminescence element is arranged as a single device or as an array, or device structures where the anode and the cathode are arranged as X-Y matrices.

<Organic EL Display and Organic EL Lighting>

The organic EL display and the organic EL light of the invention comprise the organic electroluminescence element of the invention as above. The type and the structure of the organic EL display and the organic EL lighting of the invention are not specifically defined; and they can be constructed using the organic electroluminescence element of the invention and according to an ordinary method.

For example, the organic EL display and the organic EL lighting of the invention can be constructed according to the method described in "Organic EL Displays" (Ohmsha, issued on Aug. 20, 2004, written by Seiji Tokitoh, Chihaya Adachi, Hideyuki Murata).

EXAMPLES

The invention is described more concretely with reference to the following Examples. However, the invention is not limited to the following Examples, and the invention can be changed and modified in any desired manner not overstepping the spirit and the scope thereof. Unless otherwise specifically indicated, in the following description, dba means dibenzylideneacetone, tBu means a t-butyl group, THF means tetrahydrofuran, Me means a methyl group, Et means an ethyl group, iPr means an i-propyl group, Ph means a phenyl group, Ac means an acetyl group, DMSO means dimethyl sulfoxide, TBAB means tetrabutylammonium bromide, DME means dimethoxyethane, $Tf_2O$ means trifluoromethanesulfonic acid anhydride, DMF means dimethylformamide, dppf means 1,1'-diphenylphosphinoferrocene, NBS means N-bromosuccinimide.

Production Examples

Production Examples for the polymer compound of the invention are shown below.

Production of Monomer

Production Example 1

[Chemical Formula 50]

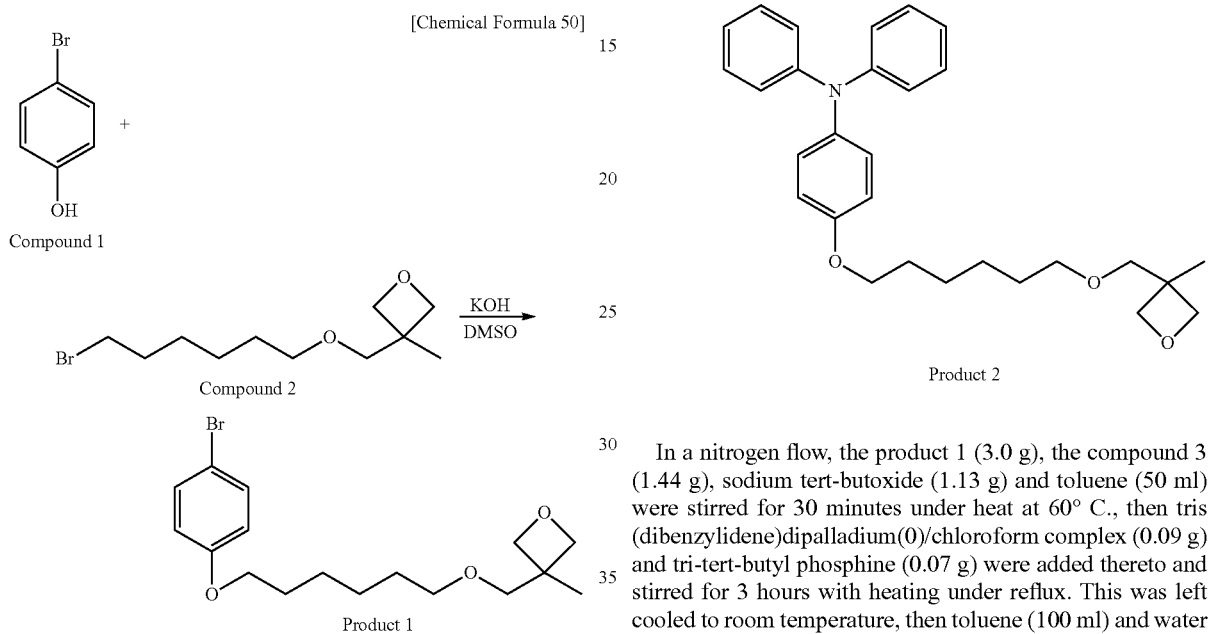

Potassium hydroxide was added to the compound 1 (10.0 g), the compound 2 (16.3 g) and dimethyl sulfoxide (80 ml), and stirred at room temperature for 6 hours. Ethyl acetate (100 ml) and water (100 ml) were added to the reaction liquid, stirred, then processed for liquid-liquid separation; the aqueous layer was extracted with ethyl acetate (100 ml×twice); the organic layers were combined, dried with magnesium sulfate and then concentrated. Further, this was purified through silica gel column chromatography (n-hexane/ethyl acetate=10/1) to give the intended product 1 (13.3 g).

Production Example 2

[Chemical Formula 51]

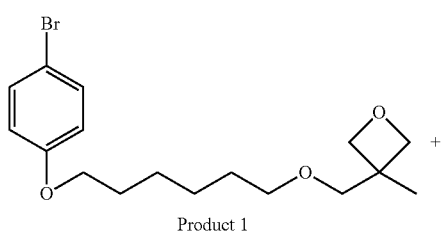

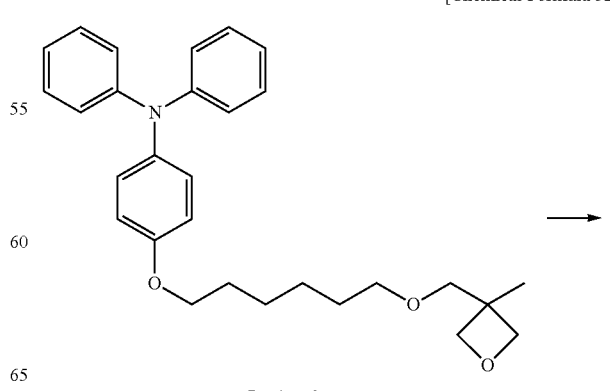

In a nitrogen flow, the product 1 (3.0 g), the compound 3 (1.44 g), sodium tert-butoxide (1.13 g) and toluene (50 ml) were stirred for 30 minutes under heat at 60° C., then tris(dibenzylidene)dipalladium(0)/chloroform complex (0.09 g) and tri-tert-butyl phosphine (0.07 g) were added thereto and stirred for 3 hours with heating under reflux. This was left cooled to room temperature, then toluene (100 ml) and water (100 ml) were added to the reaction liquid, stirred, processed for liquid-liquid separation; and the aqueous layer was extracted with toluene (100 ml×twice), the organic layers were combined, dried with magnesium sulfate, and concentrated. Further, this was purified through silica gel column chromatography (n-hexane/ethyl acetate=10/1) to give the intended product 2 (3.4 g).

Production Example 3

[Chemical Formula 52]

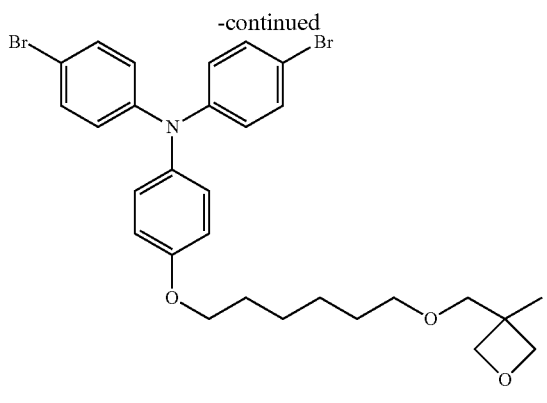

Product 3

In a nitrogen flow at −5° C., NBS (30 ml) dissolved in DMF was dropwise added to the product 2 (3.4 g) and DMF (100 ml), and stirred for 2 hours at the temperature. Ethyl acetate (100 ml) and water (100 ml) were added to the reaction liquid, stirred, processed for liquid-liquid separation; and the aqueous layer was extracted with ethyl acetate (100 ml×twice), the organic layers were combined, dried with magnesium sulfate, and concentrated. Further, this was purified through silica gel column chromatography (n-hexane/ethyl acetate=10/1) to give the intended product 3 (2.3 g).

Production Example 4

[Chemical Formula 53]

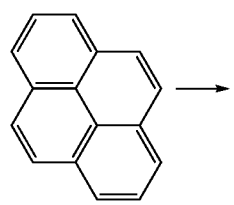

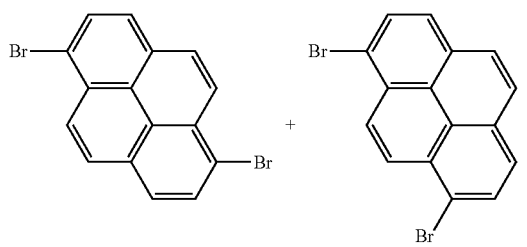

Product 4

In a nitrogen flow, pyrene (10.11 g) and dimethoxyethane (400 ml) were stirred with cooling at 0° C. in an ice bath, and bromine (15.18 g) dissolved in dimethoxyethane (50 ml) was dropwise added thereto, heated up to room temperature and stirred for 8 hours, and then left overnight. The precipitated crystal was taken out through filtration, washed with ethanol by suspension, and recrystallized from toluene to give the intended product 4 (mixture of 1,6-dibromopyrene and 1,8-dibromopyrene) (5.8 g).

1H NMR (CDCl$_3$, 400 MHz)
1,8-dibromopyrene
δ 8.53 (2, 2H), 8.28 (d, 2H, J=8.40), 8.05 (d, 2H, J=8.00), 8.04 (s, 2H)
1,6-dibromopyrene
δ 8.47 (d, 2H, J=9.60), 8.27 (d, 2H, J=8.40), 8.13 (d, 2H, J=9.20), 8.06 (d, 2H, J=8.40)

Production Example 5

[Chemical Formula 54]

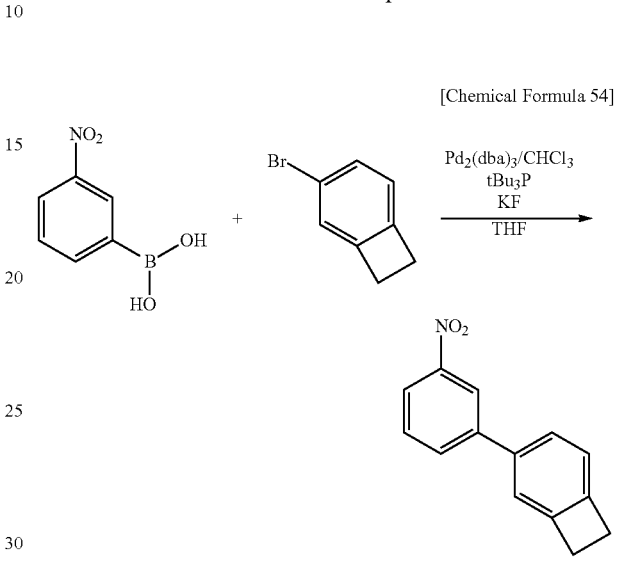

Product 5

Potassium fluoride (23.01 g) was put into a reactor, and under reduced pressure, the system was made to have a nitrogen atmosphere through repeated drying under heat and purging with nitrogen. 3-Nitrophenylboronic acid (6.68 g), 4-bromo-benzocyclobutene (7.32 g) and dewatered tetrahydrofuran (50 ml) were put into it and stirred. Tris(dibenzylideneacetone)dipalladium/chloroform complex (0.21 g) was added thereto, and the system was further fully purged with nitrogen, tri-t-butyl phosphine (0.47 g) was added to it. After the addition, this was stirred as it was. After the reaction, water was added to the reaction liquid, and extracted with ethyl acetate. The resulting organic layer was washed twice with water, dewatered and dried with sodium sulfate added thereto, and concentrated. The crude product was purified through silica gel column chromatography (hexane/ethyl acetate) to give the intended product 5 (8.21 g).

Production Example 6

[Chemical Formula 53]

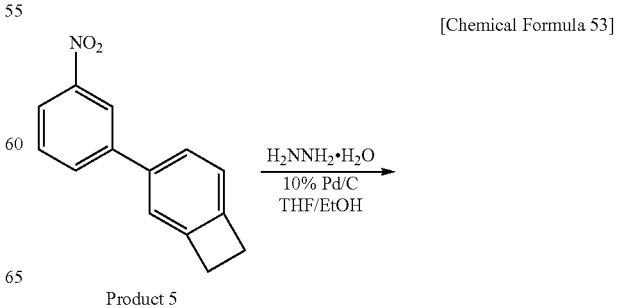

Product 5

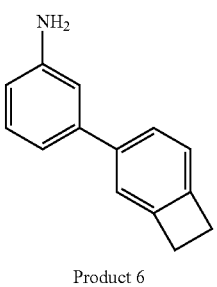

Product 6

The product 5 (8.11 g), tetrahydrofuran (36 ml), ethanol (36 ml) and 10% Pd/C (1.15 g) were put in a reactor, and stirred under heat at 70° C. Hydrazine monohydrate (10.81 g) was gradually and dropwise added to it. After reacted for 2 hours, this was left cooled, the reaction liquid was filtered through Celite and the filtrate was concentrated. Ethyl acetate was added to the filtrate, washed with water, and the organic layer was concentrated. The resulting crude product was purified through silica gel column chromatography (hexane/ethyl acetate) to give the intended product 6 (4.90 g).

Production Example 7

[Chemical Formula 56]

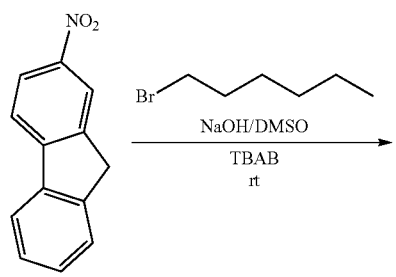

Product 7

2-Nitrofluorene (25.0 g), 1-bromohexane (58.61 g), tetrabutylammonium bromide (7.63 g) and dimethyl sulfoxide (220 ml) were put in a reactor, and aqueous 17 M sodium hydroxide solution (35 ml) was gradually and dropwise added thereto, and reacted at room temperature for 3 hours. Ethyl acetate (200 ml) and water (100 ml) were added to the reaction liquid, stirred, processed for liquid-liquid separation, and the aqueous layer was extracted with ethyl acetate. The organic layers were combined, dried with magnesium sulfate, and concentrated. The resulting crude product was purified through silica gel column chromatography (hexane/ethyl acetate) to give the intended product 7 (44.0 g).

Production Example 8

[Chemical Formula 57]

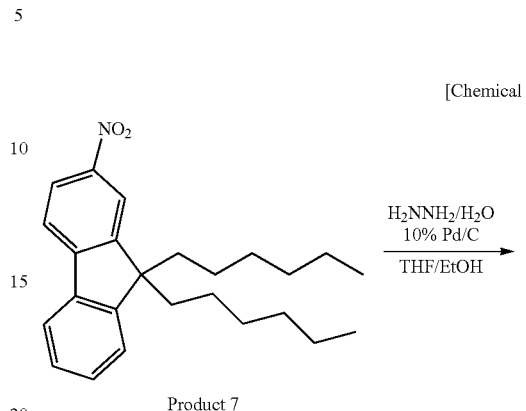

Product 8

10% Pd/C (8.6 g) was added to the product 7 (44.0 g), tetrahydrofuran (120 ml) and ethanol (120 ml), and stirred under heat at 50° C. Hydrazine monohydrate (58.0 g) was gradually and dropwise added to it, and reacted for 3 hours at the temperature. The reaction liquid was left cooled, filtered through Celite under pressure, and the filtrate was concentrated, methanol was added to the residue, and the precipitated crystal was collected through filtration and dried to give the intended product 8 (34.9 g).

Production Example 9

[Chemical Formula 58]

Product 9

Dichlorobis(acetonitrile)palladium(II) (212 mg, 0.03 equivalents) and copper iodide (104 mg, 0.02 equivalents) were put into a 200-mL four-neck flask with nitrogen kept introduced thereinto, and dioxane (75 mL) previously deaerated by nitrogen bubbling thereinto was put into it and stirred.

Tri-t-butyl phosphine (331 mg, 0.06 equivalents) was added to this liquid, and stirred for 15 minutes at room temperature. Di-i-propylamine (3.31 g, 1.2 equivalents), 4-bromobenzocyclobutene (5.00 g, 1.0 equivalent) and 1,7-octadiyne (20.3 g, 7.0 equivalents) were added to the solution, and reacted at room temperature for 9 hours. The resulting reaction mixture was processed under a reduced pressure of 400 Pa and at a bath temperature of 60° C. to remove the light volatile fraction through vaporization, then saturated saline water (50 mL) and 1 N hydrochloric acid (5 mL) were added thereto, and extracted three times with ethyl acetate (30 mL), and the resulting ethyl acetate layer was washed twice with saturated saline water (30 mL). The ethyl acetate layer was concentrated to give a crude product (7.7 g). The crude product was purified through silica gel column chromatography (solvent: n-hexane/ethyl acetate mixed solvent) to give the intended equivalent) dissolved in dimethoxyethane (2 mL) was added to the liquid, and reacted under heat in a bath at 70° C. (inner temperature, 63° C.) for 7 hours. The resulting reaction mixture was filtered through Celite, concentrated with an evaporator, and 1 N hydrochloric acid (25 mL) was added to it, extracted three times with ethyl acetate (30 mL), and the resulting ethyl acetate layer was washed three times with saturated saline water (20 mL). The ethyl acetate layer was concentrated, and the resulting crude product was recrystallized from a mixed solvent of ethyl acetate/n-hexane to give the intended product 10 (2.50 g; yield, 57.1%; purity after analyzed through gas chromatography, 99.5%) as a thin pale yellow acicular crystal.

Production Example 11

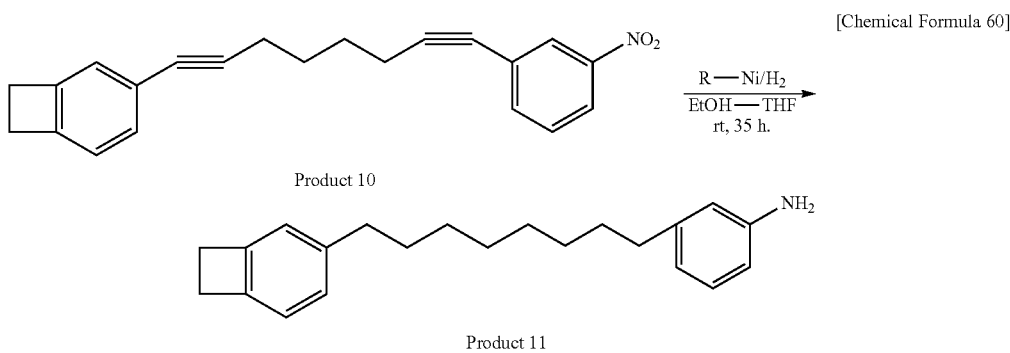

product 9 (2.78 g; yield, 48.0%; purity after analyzed through gas chromatography, 95.4%) as a colorless oil.

Production Example 10

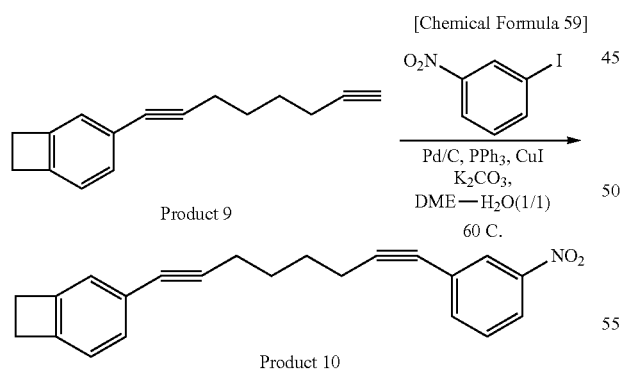

M-iodonitrobenzene (3.64 g, 1.1 equivalents), potassium carbonate (5.06 g, 2.75 equivalents), copper iodide (111 mg, 0.044 equivalents), triphenyl phosphine (307 g, 0.088 equivalents) and 5% Pd/C (623 mg, 0.022 equivalents as Pd) were put into a 100-mL four-neck flask with nitrogen kept introduced thereinto, and a mixed solvent of dimethoxyethane/water (1/1 by volume) (95 mL) previously deaerated by nitrogen bubbling thereinto was put into it and stirred at room temperature for 1 hour. A solution of the product 9 (2.77 g, 1.0

The product 10 (2.31 g), tetrahydrofuran (15 mL) and ethanol (15 mL) were put into a 100-mL eggplant-type flask and dissolved. As a hydrogenation catalyst, Raney nickel (1.07 g, Nikko Rika's R-200) was added to the solution, purged three times with hydrogen, and in hydrogen, this was reacted at room temperature for 35 hours. The reaction liquid was filtered through Celite and concentrated to give a crude product (2.8 g). The crude product was purified through silica gel column chromatography (solvent: n-hexane/ethyl acetate mixed solvent) to give the intended product 11 (1.72 g; yield, 80.1%; purity after analyzed through liquid chromatography, 99.1%) as a white acicular crystal.

Production Example 12

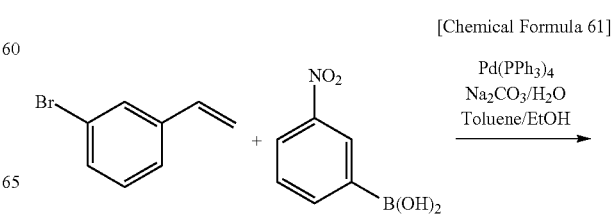

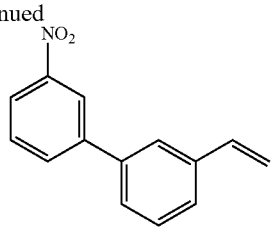

Product 12

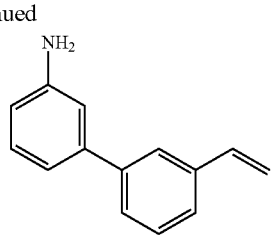

Product 13

In a nitrogen flow, 3-bromostyrene (5.0 g), 3-nitrophenyl-boronic acid (5.5 g), toluene/ethanol (80 ml/40 ml) and aqueous 2 M sodium carbonate solution were put into a reactor, and stirred and deaerated under heat at 60° C. for 30 minutes. Tetrakis(triphenylphosphine)palladium (0.95 g) was added to it and refluxed for 6 hours. After left cooled to room temperature, methylene chloride (100 ml) and water (100 ml) were added to the reaction liquid, stirred, processed for liquid-liquid separation, and the aqueous layer was extracted with methylene chloride. The organic layers were combined, dried with magnesium sulfate, and concentrated. The resulting crude product was purified through silica gel column chromatography (n-hexane/methylene chloride) to give the intended product 12 (5.5 g).

Production Example 13

[Chemical Formula 62]

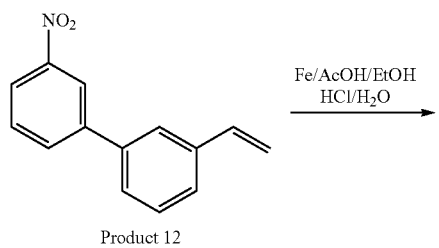

In a nitrogen flow, the product 12 (2.5 g), acetic acid (60 ml), ethanol (60 ml), 1 N hydrochloric acid (2 ml), water (8 ml) and reduced iron (12.4 g) were put in a reactor and heated under reflux for 1 hour. The reaction liquid was filtered at room temperature, ethyl acetate (100 ml) and water (100 ml) were added thereto, stirred, then neutralized with aqueous saturated sodium hydrogencarbonate solution, processed for liquid-liquid separation, and the aqueous layer was extracted with ethyl acetate. The organic layers were combined, dried with magnesium sulfate, and concentrated. The resulting crude product was purified through silica gel column chromatography (n-hexane/ethyl acetate) to give the intended product 13 (2.1 g).

Production Example 14

[Chemical Formula 63]

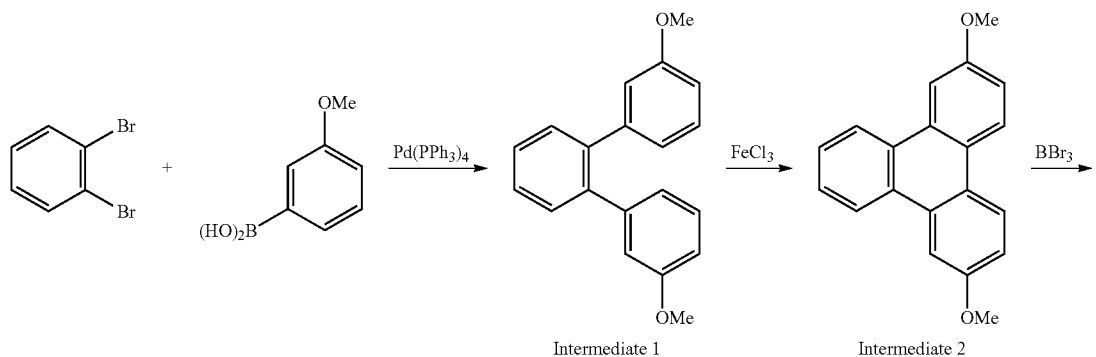

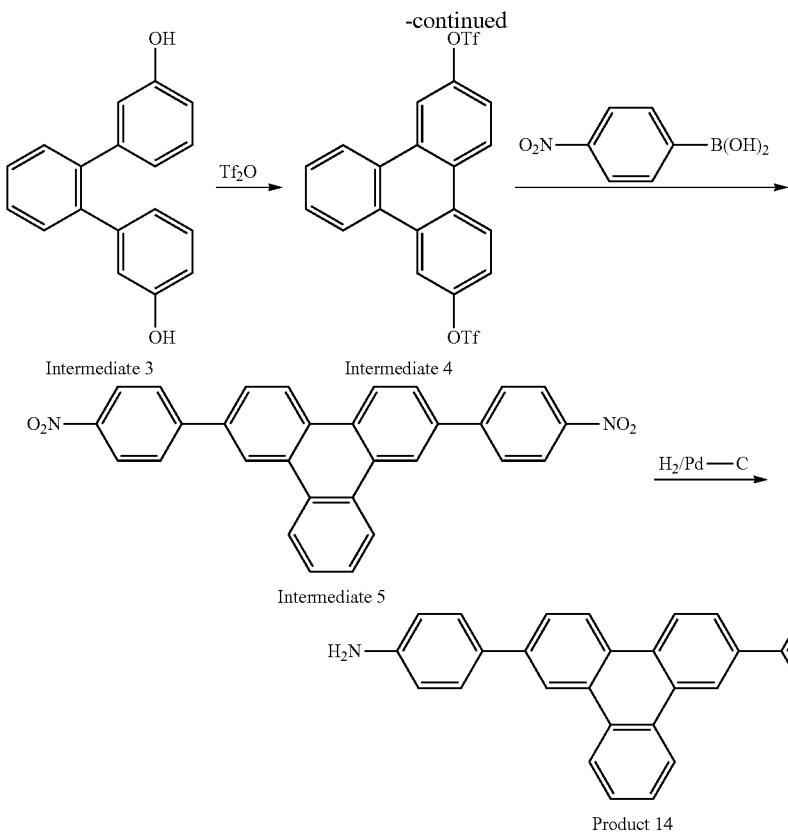

In a nitrogen flow, 1,2-dibromobenzene (21.0 g), 3-methoxyphenylboronic acid (29.9 g), toluene/ethanol (147 ml/147 ml) and aqueous 2 M sodium carbonate solution (295 ml) were put in a reactor, and deaerated with stirring under heat at 60° C. for 30 minutes. Tetrakis(triphenylphosphine)palladium (6.17 g) was added thereto, and refluxed for 6 hours. After this was left cooled to room temperature, water was added thereto, stirred, processed for liquid-liquid-separation, and the aqueous layer was extracted with toluene. The organic layers were combined, dried with magnesium sulfate, and concentrated. The resulting crude product was purified through silica gel column chromatography (n-hexane/methylene chloride) to give the intermediate 1 (15.5 g).

The intermediate 1 (15.5 g) was dissolved in methylene chloride (70 ml), and concentrated sulfuric acid (1.4 g) was added thereto. Iron chloride (21.6 g) was gradually added thereto little by little. After reacted for 7 hours, methylene chloride (100 ml) was added to it, which was put into cold methanol, and the precipitated crystal was collected through filtration. The crude crystal was dissolved in methylene chloride (250 ml), washed with 1 N hydrochloric acid (100 ml), and the organic layer was filtered through Celite, concentrated, and washed with methanol by suspension to give the intermediate (7.41 g).

The intermediate 2 (7.41 g) was dissolved in methylene chloride (110 ml), and with cooling with ice, boron trifluoride (1 M methylene chloride solution, 65 ml) was added thereto and stirred for 3 hours. Water was added to the reaction liquid, and extracted with ethyl acetate. The organic layer was washed with water, dried with magnesium sulfate, and concentrated. The precipitated crystal was washed with a methylene chloride/ethyl acetate (5/1) solution by suspension to give the intermediate 3 (6.58 g).

Methylene chloride (130 ml) was added to the intermediate 3 (6.58 g), and trifluoromethanesulfonic acid anhydride (17.8 g) was added thereto. Further, pyridine (4.4 g) was gradually added, and reacted at room temperature for 5 hours. The precipitated crystal was collected through filtration, washed with water, washed with methanol by suspension, and washed twice with methylene chloride/methanol (1/9) by suspension to give the intermediate 4 (5.9 g).

In a nitrogen flow, the intermediate 4 (3.88 g), 4-nitrophenylboronic acid (2.72 g), toluene/ethanol (48 ml/48 ml), and aqueous 2 M sodium carbonate solution (24 ml) were put in a reactor, and stirred and deaerated for 30 minutes with heating at 40° C. Tetrakis(triphenylphosphine)palladium (0.53 g) was added thereto and refluxed for 6 hours. After left cooled to room temperature, water was added to it and stirred, and the precipitated crystal was collected through filtration. This was washed with ethyl acetate by suspension to give the intermediate 5 (2.35 g).

The intermediate 5 (2.35 g) was dissolved in N,N-dimethylformamide (195 ml), 5% Pd/C (1.06 g) was added thereto, the system was purged with hydrogen, and in hydrogen, this was reacted for 4 hours at 70° C. The reaction liquid was purged with nitrogen, filtered through Celite, the filtrate was concentrated to about 30 ml, and added to methanol. Water was added to it, and the precipitated crystal was collected through filtration to give the intended product 14 (1.03 g).

Production Example 15

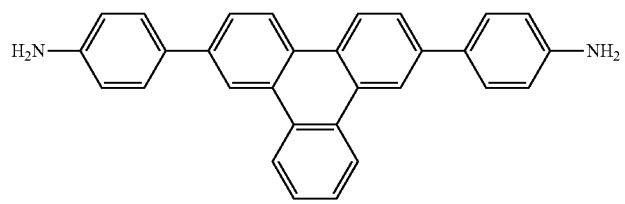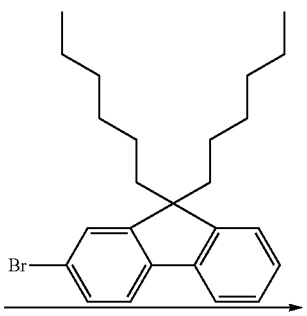

Product 14

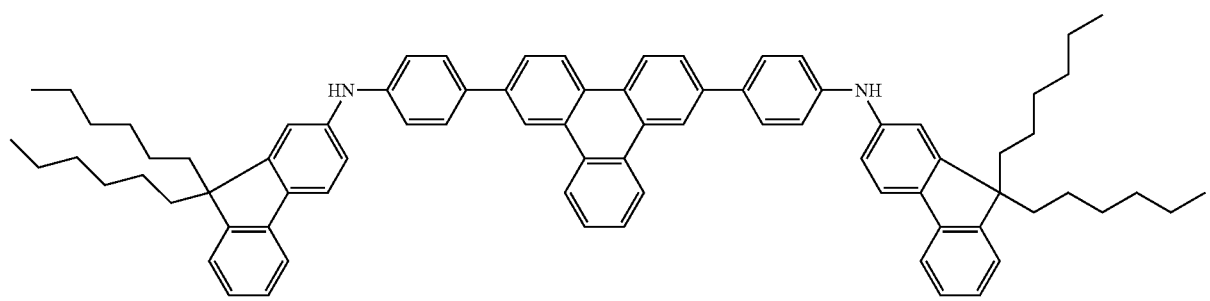

Product 15

The product 14 (1.82 g), 2-bromo-9,9-dihexylfluorene (3.7 g), sodium tert-butoxide (0.94 g) and toluene (25 ml) were put in a reactor, the system was fully purged with nitrogen and heated up to 50° C. (solution A).

On the other hand, diphenylphosphinoferrocene (0.20 g) was added to a toluene (4 ml) solution of tris(dibenzylideneacetone)palladium/chloroform complex (0.09 g), and heated up to 50° C. (solution B).

In a nitrogen flow, the solution B was added to the solution A, and reacted for 5 hours with heating under reflux. The absence of the starting materials was confirmed, and tetrahydrofuran was added to it, filtered through Celite, and the filtrate was concentrated and purified through silica gel column chromatography (n-hexane/ethyl acetate). The resulting crude crystal was washed by suspension with n-hexane and methanol to give the intended product 15 (1.34 g).

Production Example 16

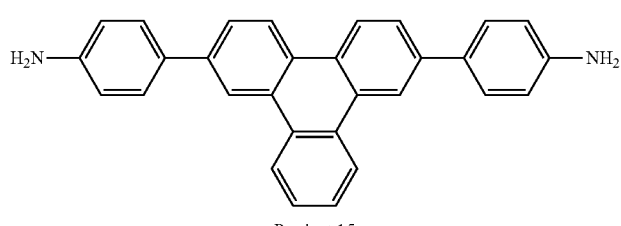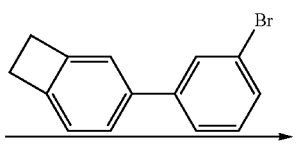

Product 15

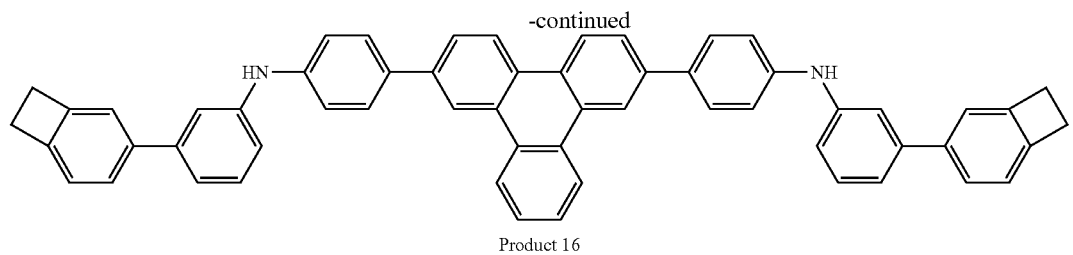

Product 16

The product 15 (0.50 g), 3-(3-bromophenyl)benzocyclobutene (0.63 g), sodium tert-butoxide (0.26 g) and toluene (15 ml) were put in a reactor, the system was fully purged with nitrogen and heated up to 50° C. (solution A).

On the other hand, diphenylphosphinoferrocene (0.05 g) was added to a toluene (1 ml) solution of tris(dibenzylideneacetone)palladium/chloroform complex (0.02 g), and heated up to 50° C. (solution B).

In a nitrogen flow, the solution B was added to the solution A, and reacted for 6 hours with heating under reflux. The absence of the starting materials was confirmed, and tetrahydrofuran was added to it, filtered through Celite, and the filtrate was concentrated and purified through silica gel column chromatography (n-hexane/ethyl acetate) to give the intended product 16 (0.12 g).

Production Example 17

[Chemical Formula 66]

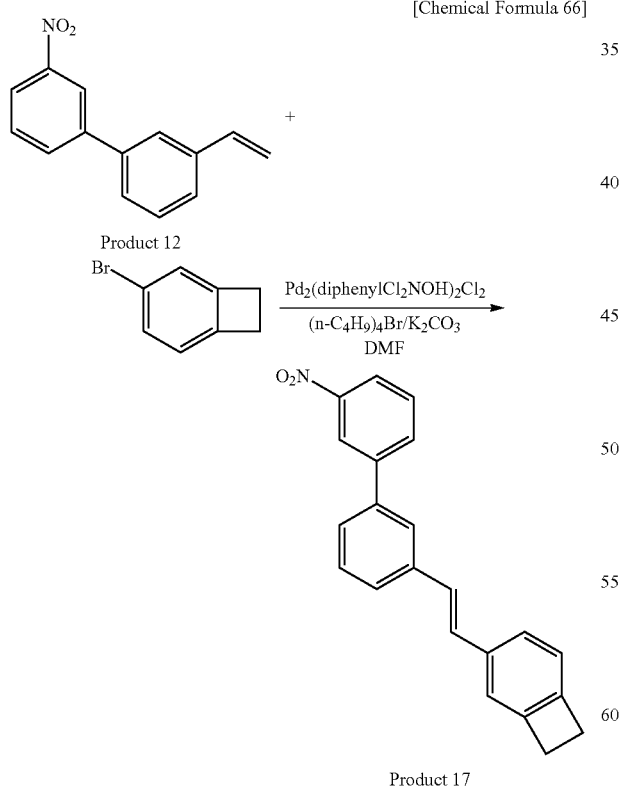

In a nitrogen flow, the product 12 (2.8 g), 4-bromobenzocyclobutene (3.65 g), potassium carbonate (2.73 g), $(n-C_4H_9)_4$ Br (2.67 g), dewatered DMF (76 ml) and a palladium catalyst $Pd_2(diphenyl-Cl_2NOH)_2Cl_2$ (15.1 mg) were reacted at 130° C. for 8 hours, then ethyl acetate (100 ml) and water (100 ml) were added to the reaction liquid at room temperature, stirred, processed for liquid-liquid separation, and the aqueous layer was extracted twice with ethyl acetate (100 ml). The organic layers were combined, dried with magnesium sulfate, and concentrated. Further, this was purified through silica gel column chromatography (n-hexane/ethyl acetate=10/1) to give the intended product 17 (trans, 1.7 g; LC, 98%).

Production Example 18

[Chemical Formula 67]

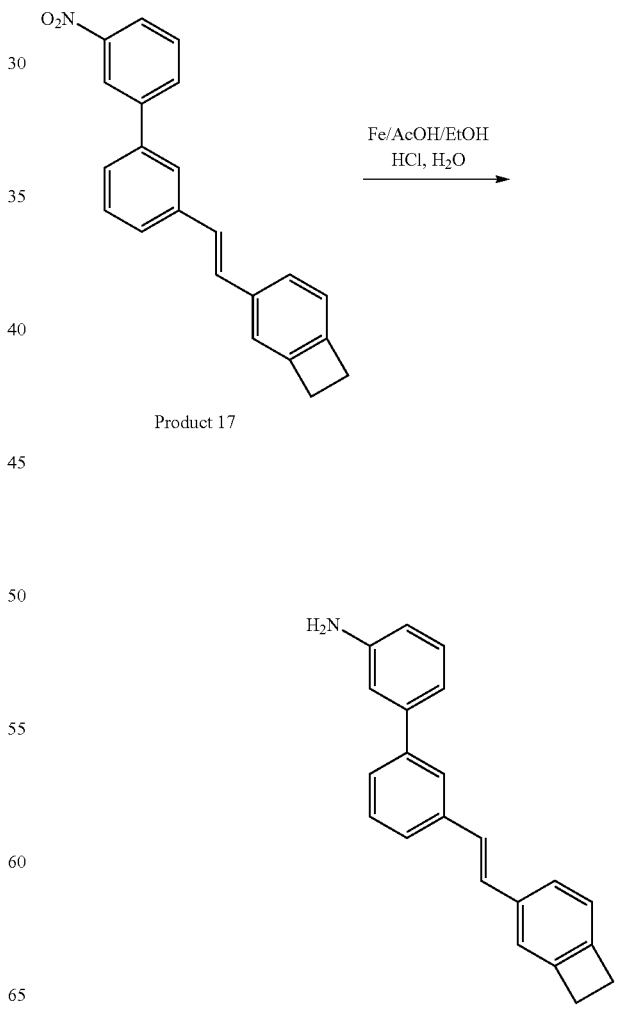

In a nitrogen flow, the product 17 (1.6 g), acetic acid (30 ml), ethanol (30 ml), hydrochloric acid (1 N, 1 ml) water (4 ml) and reduced iron (5.5 g) were refluxed for 2 hours. The reaction liquid was filtered at room temperature, ethyl acetate (100 ml) and water (100 ml) were added thereto, stirred, neutralized with aqueous saturated sodium hydrogencarbonate solution, processed for liquid-liquid separation, and the aqueous layer was extracted twice with ethyl acetate (50 ml). The organic layers were combined, dried with magnesium sulfate, and concentrated. Further, this was purified through silica gel column chromatography (n-hexane/ethyl acetate=3/1) to give the intended product 18 (1.3 g).

Production Example 19

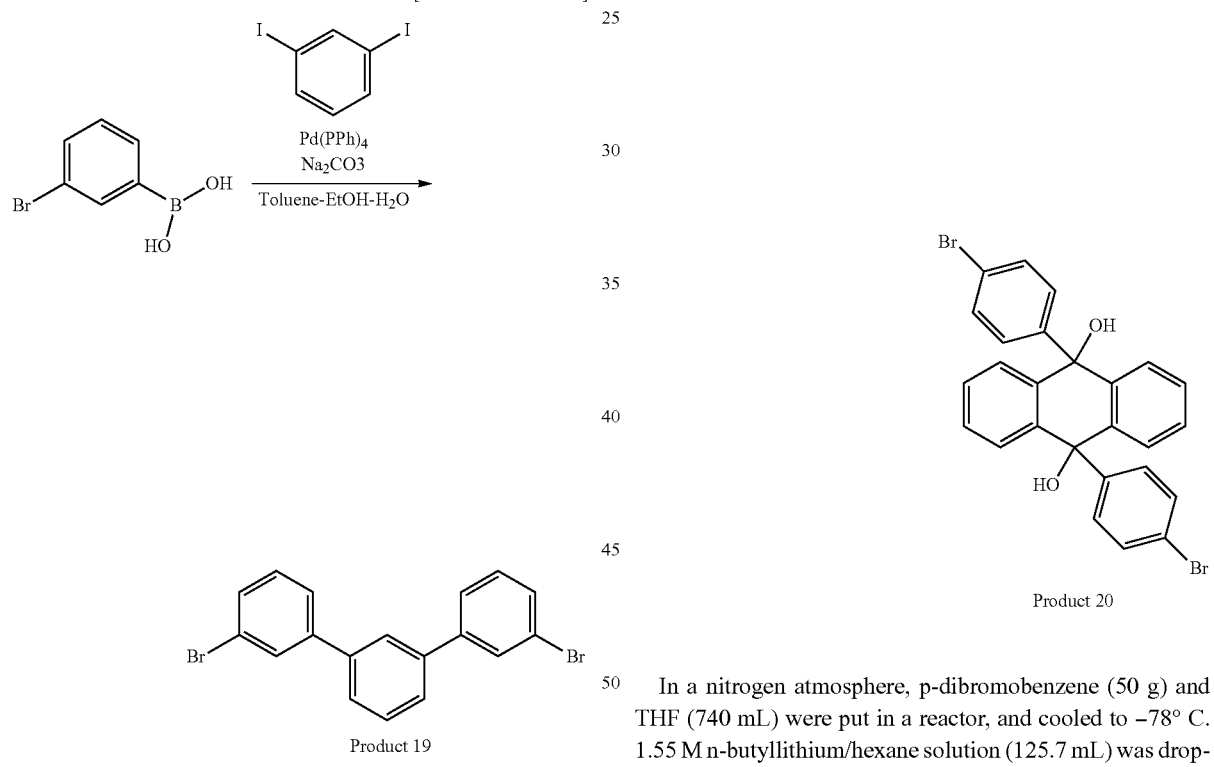

Product 19

3-Bromophenylboronic acid (10.0 g), m-diiodobenzene (8.21 g), sodium carbonate (15.83 g), toluene (150 mL), ethanol (150 mL) and water (75 mL) were put in a reactor, deaerated under reduced pressure, and in a nitrogen atmosphere, tetrakis(triphenylphosphine)palladium(0) (1.726 g) was added thereto. After stirred at 80° C. for about 4.5 hours, this was left cooled to room temperature. Water was added to the reaction liquid, extracted with a mixed solvent of ethyl acetate/hexane, and the resulting organic layer was concentrated. The crude product was purified through silica gel column chromatography (hexane) to give the intended product 19 (7.39 g).

Production Example 20

[Chemical Formula 69]

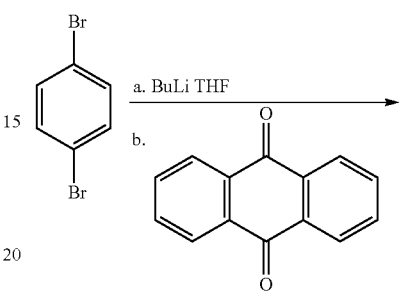

Product 20

In a nitrogen atmosphere, p-dibromobenzene (50 g) and THF (740 mL) were put in a reactor, and cooled to −78° C. 1.55 M n-butyllithium/hexane solution (125.7 mL) was dropwise added thereto, taking about 40 minutes. Further, this was stirred for about 1 hour, and anthraquinone (15.44 g) was added thereto. This was further stirred for about 3 hours, and then heated up to room temperature, taking about 1 hour. Further, this was stirred for about 3.5 hours, then water (100 mL) was added thereto, and THF was evaporated away under reduced pressure. This was extracted with ethyl acetate, the organic layer was washed with water, dried with anhydrous sodium sulfate, filtered, and concentrated. The resulting crude product was washed by suspension with a mixed solvent of methylene chloride/hexane, and washed with methanol by suspension to give the intended product 20 (25.8 g).

Production Example 21

[Chemical Formula 70]

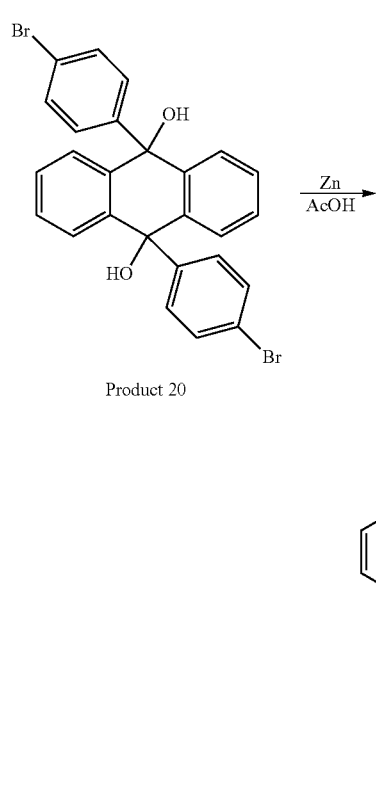

Product 20

In a nitrogen atmosphere, the product 20 (25.7 g), acetic acid (400 mL) and zinc powder (27.4 g) were put in a reactor, and heated under reflux. After 8 hours, acetic acid (190 ml) was additionally added to it, and heated under reflux for about 8 hours. After left cooled to room temperature, water (400 mL) was added to it, the solid was collected through filtration and washed with water. The resulting solid was suspended in methylene chloride (2.5 L), the insoluble matter was removed through filtration, and the filtrate was concentrated. The resulting crude product was dissolved in methylene chloride (3 L), and purified through silica gel column chromatography (methylene chloride), then washed by suspension with methylene chloride, and washed by suspension with chloroform to give the intended product 21 (10.7 g).

Production Example 22

[Chemical Formula 71]

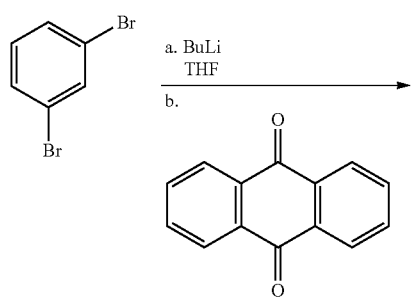

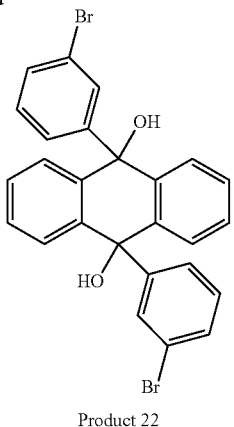

Product 22

In a nitrogen atmosphere, m-dibromobenzene (25 g) and THF (370 mL) were put in a reactor, and cooled to −78° C. 1.6 M n-butyllithium/hexane solution (61 mL) was dropwise added to it, taking about 10 min. Further, this was stirred for about 1 hour, and anthraquinone (7.72 g) was added thereto. This was further stirred for about 1 hour, and then heated up to room temperature, taking about 1 hour. Further, this was stirred for about 3.5 hours, then water (150 mL) was added thereto, and THF was evaporated away under reduced pressure. This was extracted with ethyl acetate, the organic layer was washed with water, dried with anhydrous sodium sulfate, filtered, and concentrated. The resulting crude product was washed by suspension with a mixed solvent of methylene chloride/hexane to give the intended product 22 (17.4 g).

Production Example 23

[Chemical Formula 72]

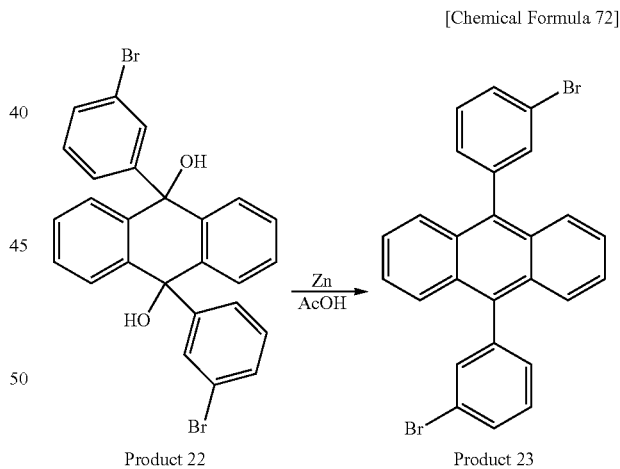

Product 22            Product 23

In a nitrogen atmosphere, the product 22 (17.4 g), acetic acid (242 mL) and zinc powder (18.6 g) were put in a reactor, and heated under reflux. After 10.5 hours, this was left cooled to room temperature, water (250 mL) was added to it, the solid was collected through filtration and washed with water. The resulting solid was suspended in methylene chloride (500 mL), the insoluble matter was removed through filtration, the filtrate was concentrated, and washed with hexane by suspension. The resulting crude product was dissolved in methylene chloride (200 mL), and purified through silica gel column chromatography (methylene chloride). The resulting solid was completely dissolved in 1,2-dimethoxyethane (102 mL) with heating under reflux, and gradually cooled to room temperature. The precipitated solid was collected through filtration to give the intended product 23 (3.7 g).

Production Example 24

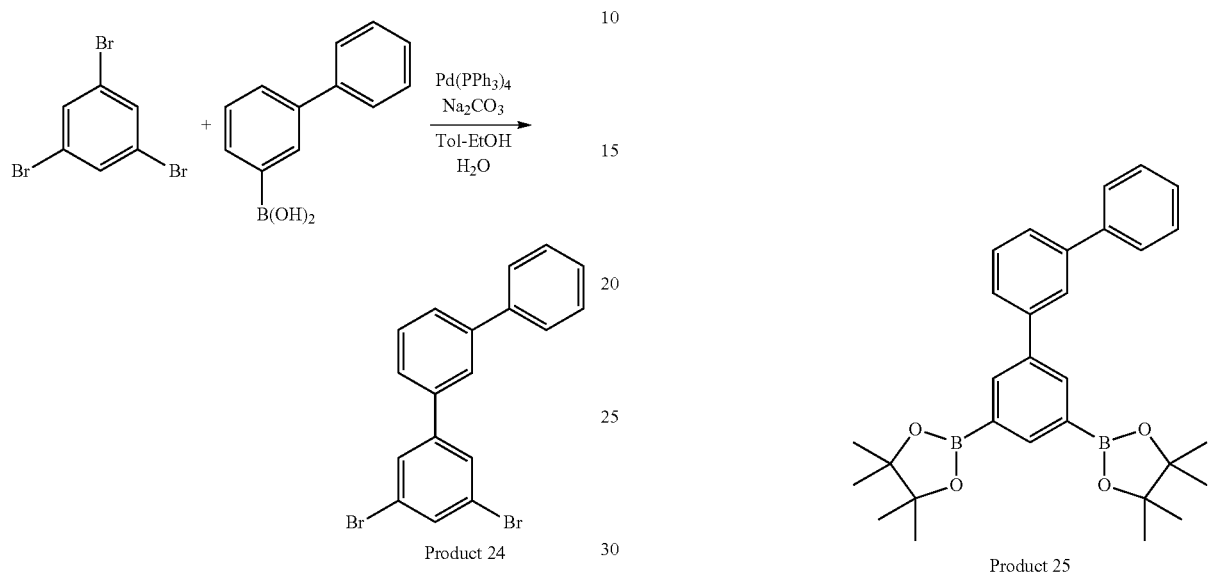

1,3,5-Tribromobenzene (22 g), 3-biphenylboronic acid (4.95 g), toluene (110 ml) and ethanol (100 ml) were put in a reactor, and deaerated by bubbling with nitrogen for 10 minutes. Sodium carbonate (7.9 g) and water (38 ml) were put in a different container, and with stirring, this was deaerated by bubbling with nitrogen. The aqueous solution was added to the previous reactor, and immediately tetrakis(triphenylphosphine)palladium(0) (866 mg) was added thereto, heated, and kept heated under reflux. After the reaction, water was added to the reaction liquid, and extracted with toluene. The resulting organic layer was dewatered and dried with sodium sulfate added thereto, and concentrated. The crude product was purified through silica gel column chromatography (hexane/dichloromethane) to give the intended product 24 (7.51 g).

Production Example 25

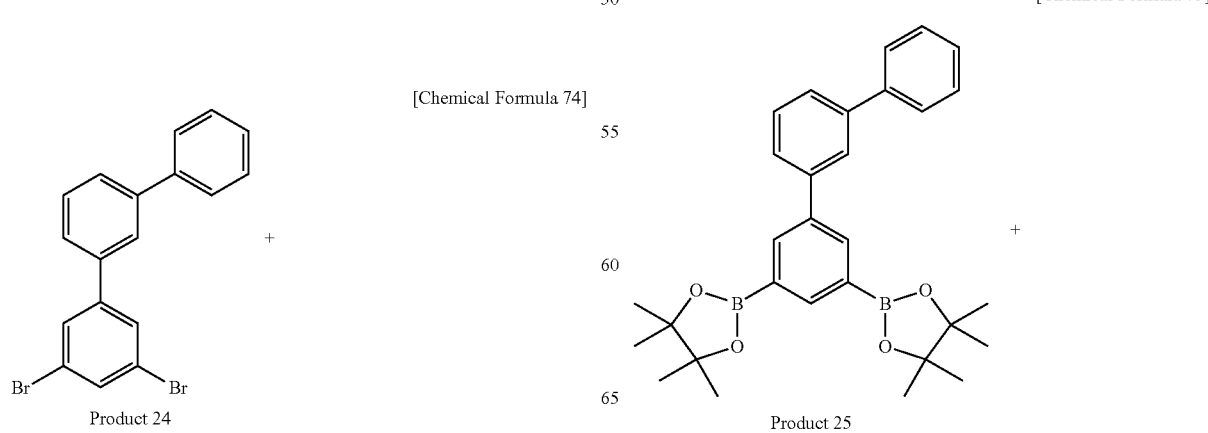

The product 24 (7.0 g), bis(pinacolato)diboron (11.68 g), potassium acetate (9.71 g), and dimethylformamide (100 ml) were put in a reactor, and stirring it was started with bubbling with nitrogen. After 15 minutes, the nitrogen bubbling was changed to flowing, and PdCl$_2$(dppf).CH$_2$Cl$_2$ (660 mg) was added thereto and heated up to 80° C. After the reaction, this was left cooled, washed by extraction with dichloromethane and water, dried with sodium sulfate, and concentrated. The resulting crude product was purified through column chromatography (hexane/ethyl acetate) to give the intended product 25 (10 g).

Production Example 26

[Chemical Formula 75]

-continued

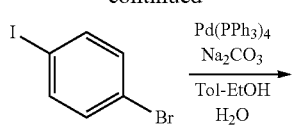

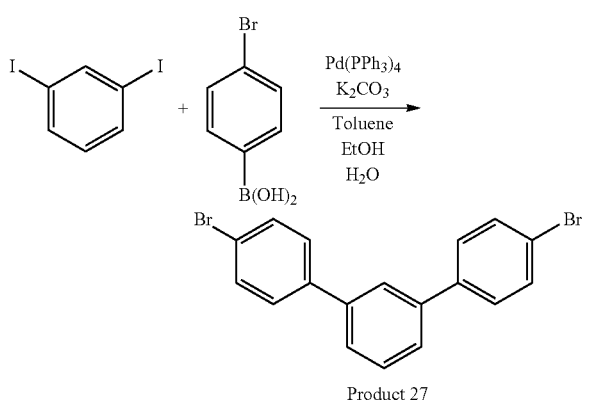

Product 26

The product 25 (5.8 g), 4-bromoiodobenzene (7.5 g), toluene (72 ml) and ethanol (72 ml) were put in a reactor, and deaerated by bubbling with nitrogen for 10 minutes. Sodium carbonate (7.6 g) and water (36 ml) were put in a different container, and with stirring, this was deaerated by bubbling with nitrogen. The aqueous solution was added to the previous reactor, and immediately tetrakis(triphenylphosphine)palladium(0) (1.0 g) was added thereto, heated, and kept heated under reflux. After the reaction, water was added to the reaction liquid, and extracted with dichloromethane. The resulting organic layer was dewatered and dried with sodium sulfate added thereto, and concentrated. The crude product was purified through silica gel column chromatography (hexane/ethyl acetate) to give the intended product 26 (3.9 g).

Production Example 27

[Chemical Formula 76]

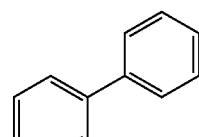

Product 27

Toluene (100 ml), ethanol (50 ml), 4-bromophenylboronic acid (9.99 g), 1,3-diiodobenzene (8.41 g), sodium carbonate (8.41 g) and water (35 ml) were put in a reactor, and by bubbling with nitrogen, the system was made to have fully a nitrogen atmosphere, and stirred. Tetrakis(triphenylphosphine)palladium (0.884 g) was added to it, and heated, and kept heated under reflux for 7 hours.

After the reaction, water was added to the reaction liquid and extracted with toluene. The resulting organic layer was washed twice with water, and dewatered and dried with sodium sulfate added thereto, and concentrated. The crude product was purified through silica gel column chromatography (hexane/toluene) to give the intended product 27 (3.54 g).

Production Example 28

[Chemical Formula 77]

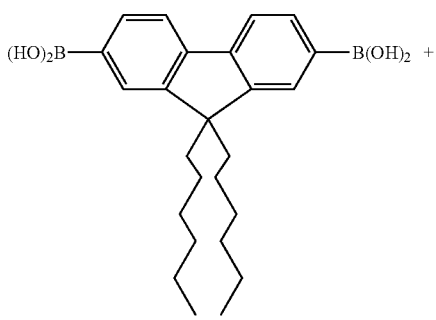

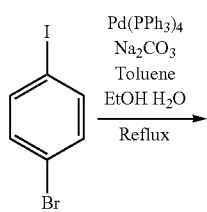

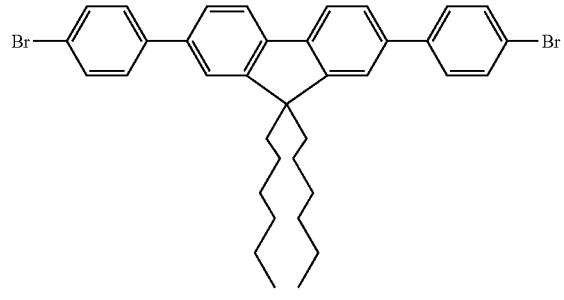

Product 28

9,9-Dihexylfluorene-2,7-diboronic acid (3.0 g, 7.1 mmol), 4-bromoidodobenzene (4.42 g, 15.6 mmol), toluene (45 ml) and ethanol (45 ml) were put in a reactor, and the system was made to have a nitrogen atmosphere by repeated nitrogen purging under reduced pressure. Further, the system was fully purged with nitrogen, and tetrakis(triphenylphosphine)palladium (0.54 g, 0.5 mmol) was added to it, and an aqueous solution (22 ml) of deaerated sodium carbonate (4.52 g, 43 mmol) was added thereto and reacted for 6 hours. After the reaction, water was added to the reaction liquid and extracted with toluene. The resulting organic layer was washed twice with water, and dewatered and dried with sodium sulfated added thereto, and then concentrated. The crude product was washed with n-hexane, purified through silica gel column chromatography (hexane/methylene chloride), and washed by suspension with methylene chloride/methanol to give the intended product 28 (3.15 g).

Production Example 29

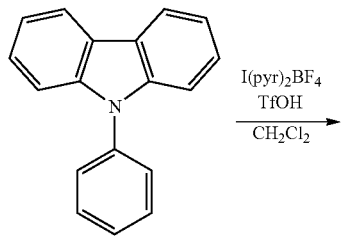

[Chemical Formula 78]

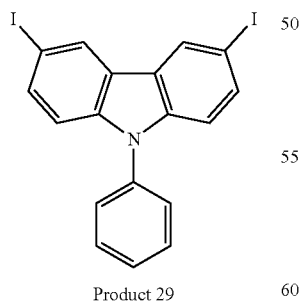

Product 29

Dichloromethane (200 ml) was put in a reactor in a nitrogen atmosphere, and N-phenylcarbazole (2.29 g) and bis(pyridine)iodonium tetrafluoroborate (7.76 g) were dissolved therein. Next, with cooling with ice, trifluoromethanesulfonic acid (1.75 ml) was dropwise added thereto, and with heating up to room temperature, this was stirred for one full day. After the reaction, aqueous 0.5 M sodium thiosulfate solution was added to the reaction liquid and extracted with dichloromethane. The resulting organic layer was washed with water, dewatered and dried with sodium sulfate added thereto, and concentrated. Methanol was added to a dichloromethane solution of the crude product for reprecipitation, and the precipitated product was washed under reflux of methanol to give the intended product 29 (4.00 g).

Production Example 30

[Chemial Formula 79]

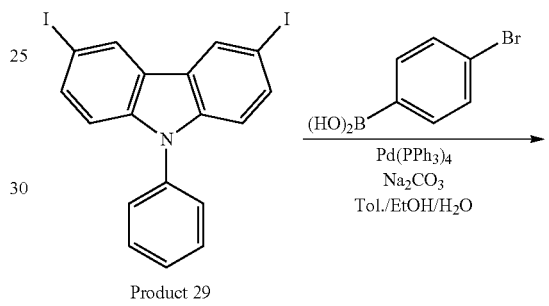

Product 29

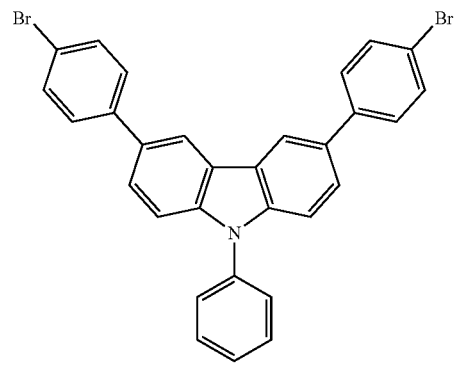

Product 30

The product 29 (4.00 g), p-bromophenylboronic acid (3.05 g), toluene (30 ml), ethanol (15 ml) and aqueous 2.6 M sodium carbonate solution (20 ml) were put in a reactor, and this was degassed into vacuum with vibrating it with an ultrasonic washer, and the system was purged with nitrogen. Tetrakis(triphenylphosphine)palladium (0.27 g) was added to it, and stirred under heat at 75° C. for 3 hours. After the reaction, water was added to the reaction liquid, and extracted with dichloromethane. The resulting organic layer was dewatered and dried with sodium sulfate added thereto, and concentrated. The crude product was isolated through silica gel column chromatography (hexane/dichloromethane) and purified through recrystallization from hot dimethoxyethane to give the intended product 30 (2.25 g).

Production Example 31

[Chemical Formula 80]

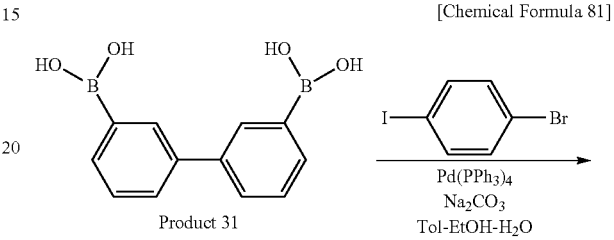

Product 31

Diethyl ether (100 ml) was put in a reactor in a nitrogen atmosphere, 3,3'-dibromo-1,1'-biphenyl (9.00 g) was dissolved therein, and cooled to −78° C. 1.6 M n-butyllithium/hexane solution (40 ml) was dropwise added to it, taking 15 minutes, then stirred at −78° C. for 1 hour, heated up to 0° C., and further stirred for 2 hours. On the other hand, in a different container, trimethyl borate (33 ml) was dissolved in diethyl ether (160 ml) in a nitrogen atmosphere, and cooled to −78° C. to prepare a solution. The above-mentioned mixed liquid was dropwise put into the solution, taking 45 minutes, and then stirred for 4 hours with gradually restoring the liquid temperature to room temperature. After the reaction, 3 N hydrochloric acid (144 ml) was gradually added to the reaction liquid at 0° C., stirred for 4 hours at room temperature, and the white precipitate was collected through a 3G glass funnel. This was washed with water and diethyl ether, and dried to give the intended product 31 (3.16 g).

Production Example 32

[Chemical Formula 81]

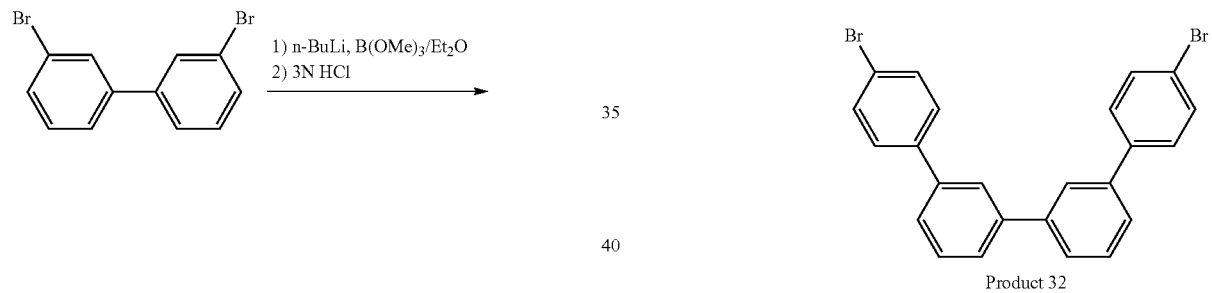

The product 31 (2.85 g), p-iodobromobenzene (6.68 g), toluene (40 ml), ethanol (20 ml) and aqueous 2.6 M sodium carbonate solution (30 ml) were put in a reactor, and this was degassed into vacuum with vibrating it with an ultrasonic washer, and the system was purged with nitrogen. Tetrakis(triphenylphosphine)palladium (0.41 g) was added to it, and stirred under heat at 75° C. for 6 hours. After the reaction, water and toluene were added to the reaction liquid, the toluene layer was washed with 0.1 N hydrochloric acid and water, then dewatered and dried with sodium sulfate added thereto, and concentrated. The crude product was purified through silica gel column chromatography (hexane/chloroform) to give the intended product 32 (3.01 g).

Production of Polymer Compound

Production Example 33

[Chemical Formula 82]
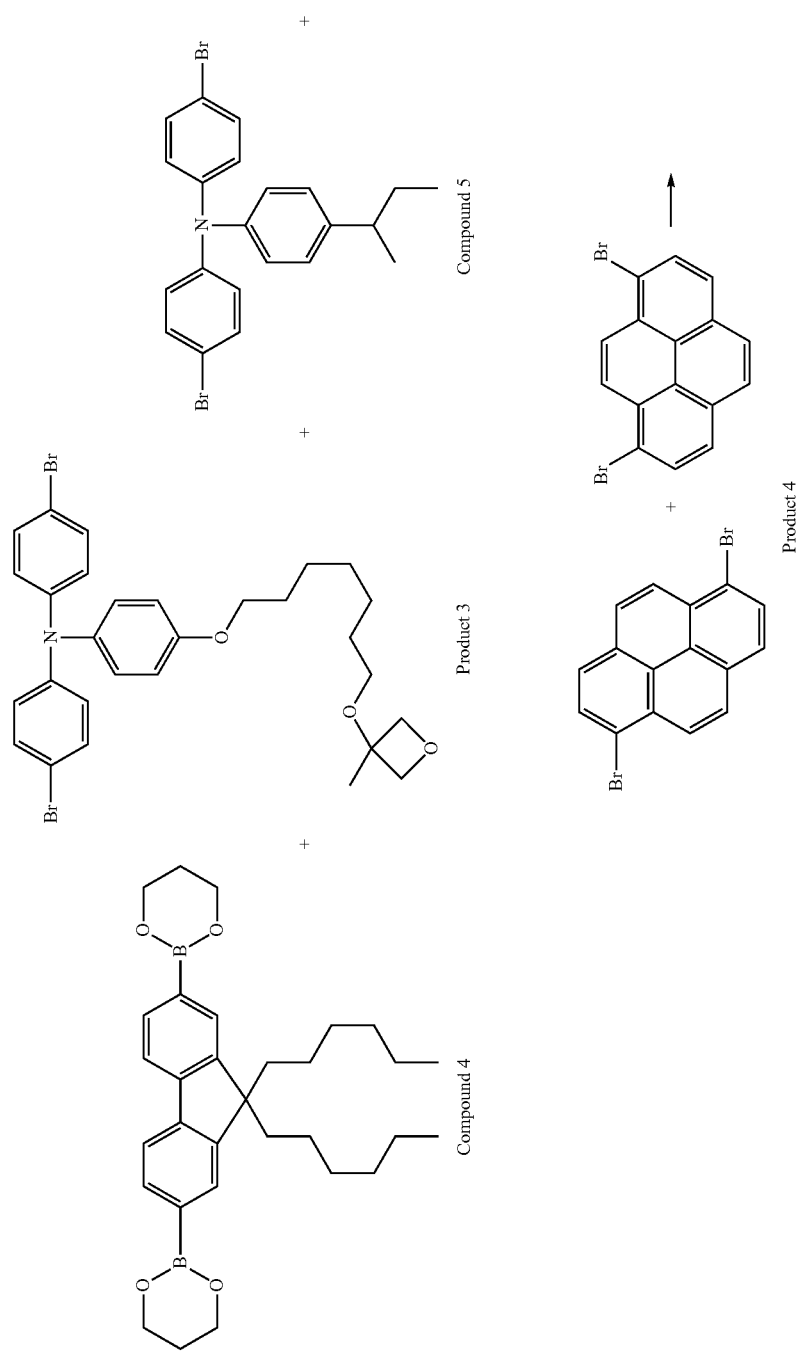

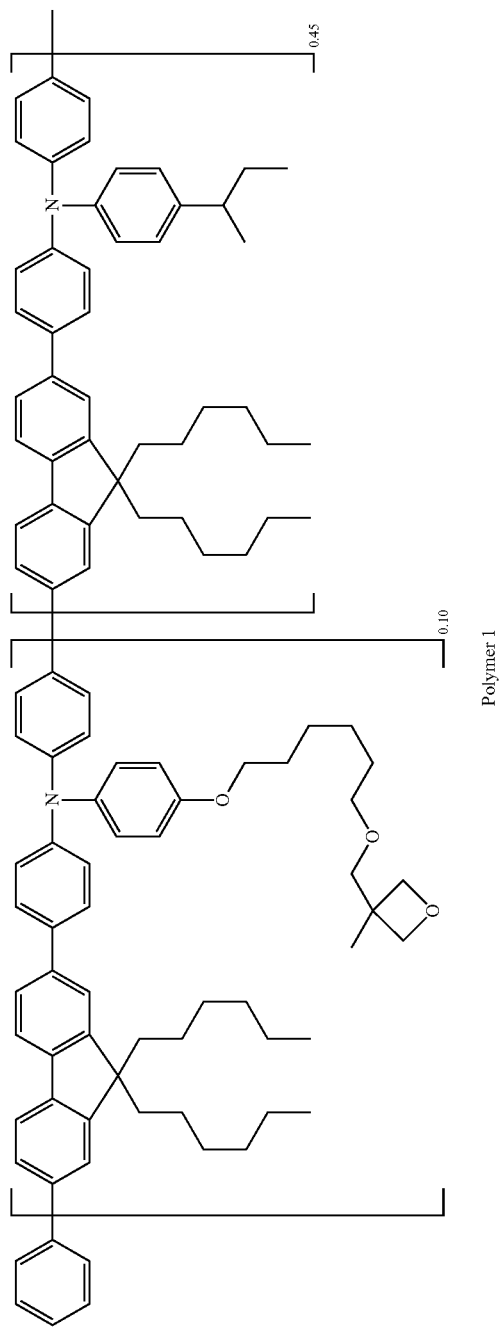
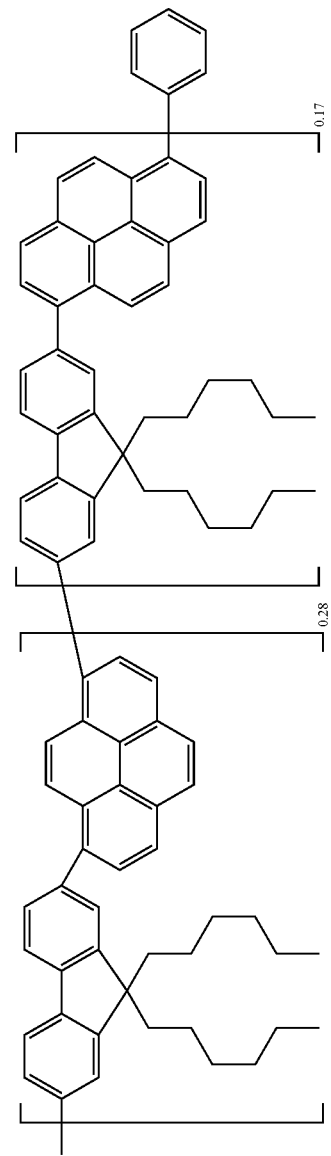
Polymer 1

In a nitrogen flow, aqueous 20% tetraethylammonium hydroxide solution (20 ml) was added to a solution of the compound 4 (2.512 g), the product 3 (0.302 g), the compound 5 (1.033 g), the product 4 (0.792 g; 1,8-dibromopyrene/1,6-dibromopyrene=37/63) and toluene (40 ml), and tetrakis(triphenylphosphine)palladium(0) (0.058 g) was added to it, and stirred with heating under reflux for 8 hours. After left cooled, the reaction liquid was added to ethanol, and the precipitated crude polymer 1 was collected through filtration and dried. In a nitrogen flow, aqueous 20% tetraethylammonium hydroxide solution (50 ml) was added to a solution of the crude polymer 1, bromobenzene (0.140 g) and toluene (100 ml), and tetrakis(triphenylphosphine)palladium(0) (0.058 g) was added to it, and stirred fro 2.5 hours with heating under reflux. Subsequently, phenylboronic acid (0.610 g) was added thereto, and stirred for 6 hours with heating under reflux. After left cooled, toluene and water were added thereto, the organic layer was concentrated into 50 ml, ethanol was added, and the precipitated crude polymer was collected through filtration and dried, and purified through a silica gel column with a developing solvent of toluene and tetrahydrofuran. From the tetrahydrofuran solution, the product was reprecipitated in ethanol, collected through filtration and dried to give the intended polymer 1 (2.20 g).

Weight-Average Molecular Weight (Ms)=26,000

Number-Average Molecular Weight (Mn)=13,000

Dispersity (Mw/Mn)=2.0

Production Example 34

[Chemical Formula 83]

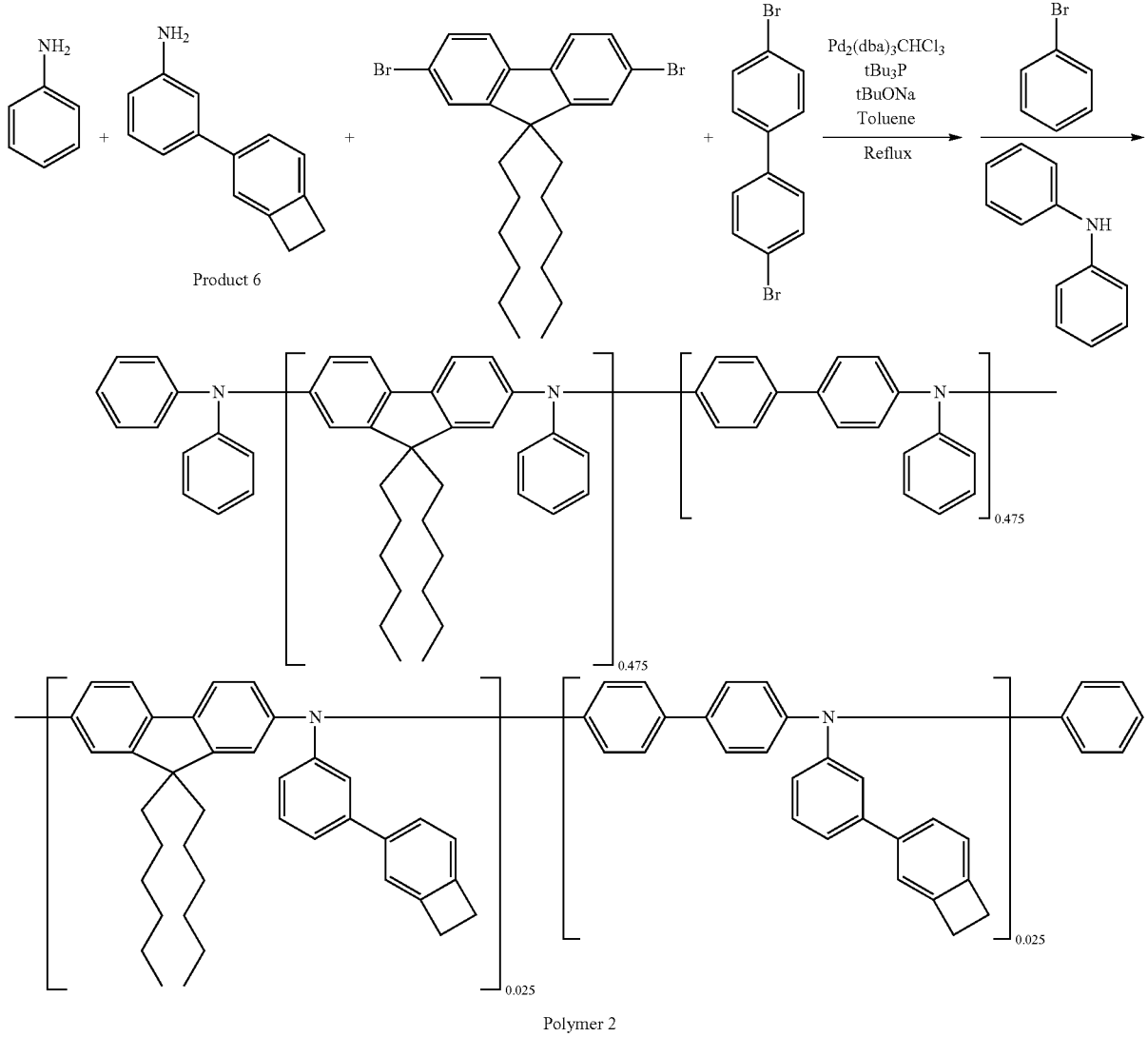

Polymer 2

Aniline (1.98 g, 21.3 mmol), the product 6 obtained in Production Example 6 (0.22 g, 1.1 mmol), 2,7-dibromo-9,9-dihexylfluorene (5.52 g, 11.2 mmol), sodium tert-butoxide (6.90 g, 71.8 mmol) and toluene (51 ml) were put in a reactor, and the system was fully purged with nitrogen, and heated up to 50° C. (solution A). Tri-t-butyl phosphine (0.37 g, 1.8 mmol) was added to a toluene (15 ml) solution of tris(dibenzylideneacetone)dipalladium/chloroform complex (0.23 g, 0.2 mmol), and heated up to 50° C. (solution B). In a nitrogen flow, the solution B was added to the solution A, and reacted for 1 hour with heating under reflux. The absence of the starting materials was confirmed, and 4,4'-dibromobiphenyl (3.29 g, 10.5 mmol) was additionally added to it. After this was heated under reflux for 1 hour, the start of polymerization was confirmed; and 4,4'-dibromobiphenyl (0.07 g, 0.2 mmol) was additionally added to it at hourly intervals for a total of three times (0.21 g in total). After the total amount of 4,4'-dibromobiphenyl was added, this was further heated under reflux for 30 hours, then the reaction liquid was left cooled, and the reaction liquid was dropwise added to an aqueous ethanol solution (ethanol 300 ml+water 50 ml), in which a crude polymer 2 was thereby precipitated.

The resulting crude polymer 2 was dissolved in toluene (140 ml), and bromobenzene (0.70 g, 4.5 mmol) and sodium tert-butoxide (3.45 g, 35.9 mmol) were added thereto, then the system was fully purged with nitrogen, and heated up to 50° C. (solution C). Tri-t-butyl phosphine (0.19 g, 0.9 mmol) was added to a toluene (8 ml) solution of tris(dibenzylidene-acetone)dipalladium/chloroform complex (0.11 g, 0.1 mmol), and heated up to 50° C. (solution D). In a nitrogen flow, the solution D was added to the solution C, and reacted for 2 hours with heating under reflux. A toluene (2 ml) solution of N,N-diphenylamine (3.80 g, 22.5 mmol) was added to the reaction liquid, and further reacted for 6 hours with heating under reflux. The reaction liquid was left cooled, and dropwise put into an aqueous ethanol solution (ethanol 300 ml+50 ml) to give a crude polymer 2 of which the terminal residues were capped.

The crude polymer 2 with capped terminal residues was dissolved in toluene, and reprecipitated in acetone, and the formed polymer was collected through filtration. The resulting polymer was dissolved in toluene, washed with diluted hydrochloric acid, and reprecipitated in ammonia-containing ethanol. The polymer collected through filtration was purified twice through column chromatography to give the intended polymer 2 (1.38 g).

Weight-Average Molecular Weight (Ms)=67850
Number-Average Molecular Weight (Mn)=35400
Dispersity (Mw/Mn)=1.92

Production Example 35

[Chemical Formula 84]

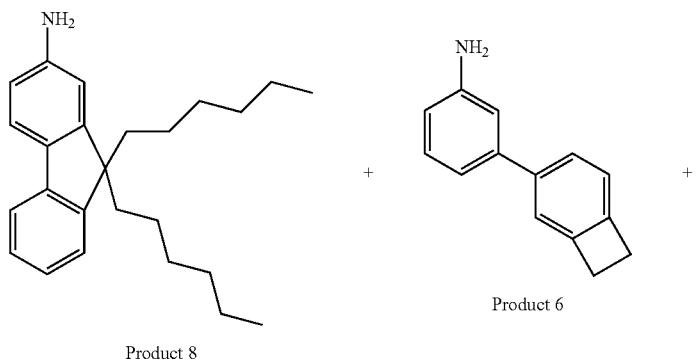

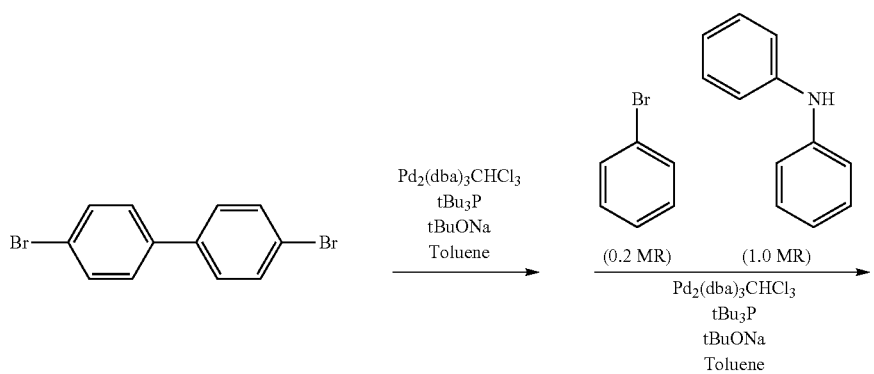

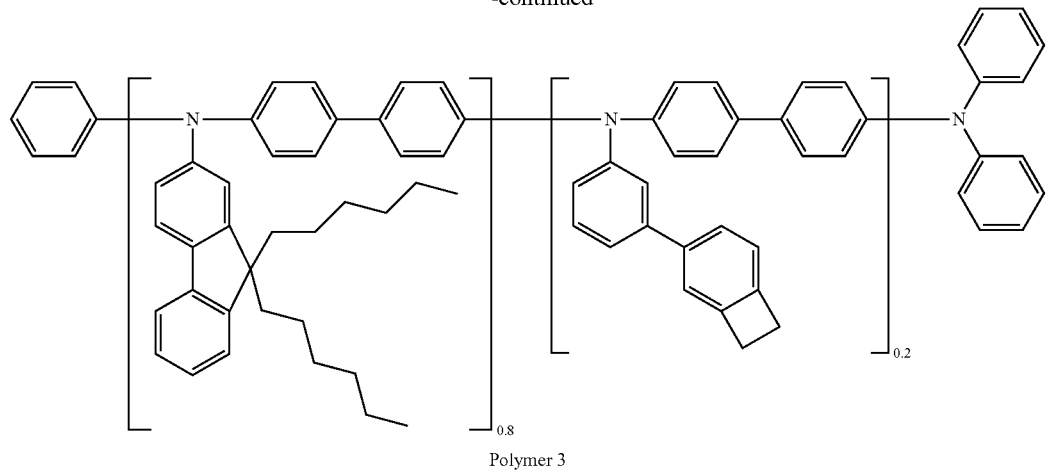

Polymer 3

The product 8 (3.64 g, 10.4 mmol) obtained in Production Example 8, the product 6 (0.51 g, 2.6 mmol) obtained in Production Example 6, 4,4'-dibromobiphenyl (2.03 g, 13 mmol), sodium tert-butoxide (2.88 g, 30.0 mmol) and toluene (20 ml) were put in a reactor, and the system was fully purged with nitrogen and heated up to 50° C. (solution A).

On the other hand, tri-t-butyl phosphine (0.210 g, 0.104 mmol) was added to a toluene (15 ml) solution of tris(dibenzylideneacetone)dipalladium/chloroform complex (0.148 g, 0.0143 mmol), and heated up to 50° C. (solution B).

In a nitrogen flow, the solution B was added to the solution A, and reacted for 1 hour with heating under reflux. The absence of the starting materials was confirmed, and 4,4'-dibromobiphenyl (1.91 g, 6.1 mmol) was additionally added to it. After this was heated under reflux for 1 hour, the start of polymerization was confirmed; and 4,4'-dibromobiphenyl (0.041 g, 0.13 mmol) was additionally added to it, and further reacted for 1 hour with heating under reflux. The reaction liquid was left cooled, and dropwise put into methanol (200 ml) to give a crude polymer 3.

The resulting crude polymer 3 was dissolved in toluene (200 ml), and bromobenzene (2.04 g, 13 mmol) and sodium tert-butoxide (1.50 g, 16 mmol) were added thereto, then the system was fully purged with nitrogen, and heated up to 50° C. (solution C).

On the other hand, tri-t-butyl phosphine (0.026 g, 13 mmol) was added to a toluene (10 ml) solution of tris(dibenzylideneacetone)dipalladium/chloroform complex (0.108 g, 10.4 mmol), and heated up to 50° C. (solution D).

In a nitrogen flow, the solution D was added to the solution C, and reacted for 2 hours with heating under reflux. A toluene (2 ml) solution of N,N-diphenylamine (3.82 g, 22.6 mmol) was added to the reaction liquid, and further reacted for 8 hours with heating under reflux. The reaction liquid was left cooled, and dropwise put into methanol to give a crude end-capped polymer 3.

The crude end-capped polymer 3 was dissolved in toluene, and reprecipitated in acetone, and the formed polymer was collected through filtration. The resulting polymer was dissolved in toluene, washed with diluted hydrochloric acid, and reprecipitated in ammonia-containing ethanol. The polymer collected through filtration was purified through column chromatography to give the intended polymer 3 (1.01 g). The weight-average molecular weight and the number-average molecular weight of the polymer 3 were measured, and were as follows:

Weight-Average Molecular Weight (Ms)=43300
Number-Average Molecular Weight (Mn)=26400
Dispersity (Mw/Mn)=1.64

Production Examples 36 to 41

Intended polymers 4 to 9 were produced according to the production method of Production Example 35 but changing the monomers (the product 6, the product 8 and 4,4'-dibromobiphenyl) to the compounds shown in Table 1 below. The thus-obtained polymers are shown in Table 1.

[Chemical Formula 85]

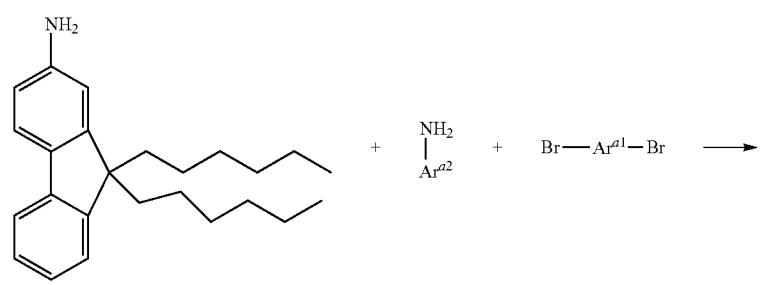

-continued
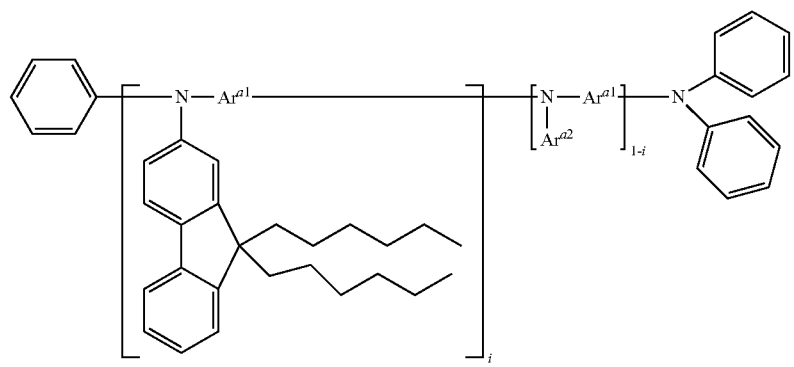
TABLE 1
| Production Example | Polymer | Amount of Fluorenamine | Ar$^{a1}$ | Amount of Br—Ar$^{a1}$—Br |
|---|---|---|---|---|
| 35 | 3 | 3.64 g | biphenyl-4,4'-diyl | 3.98 g |
| 36 | 4 | 7.5 g | biphenyl-4,4'-diyl | 7.95 g |
| 37 | 5 | 2.99 g | 9,9-dihexylfluorene-2,7-diyl | 4.43 g |
| 38 | 6 | 1.485 g | 9,10-bis(4-phenyl)anthracene-diyl | 2.425 g |
| 39 | 7 | 0.863 g | 9-phenyl-3,6-bis(4-phenyl)carbazole-diyl | 1.680 g |

TABLE 1-continued
| | | | | | |
|---|---|---|---|---|---|
| 40 | 8 | 1.06 g | 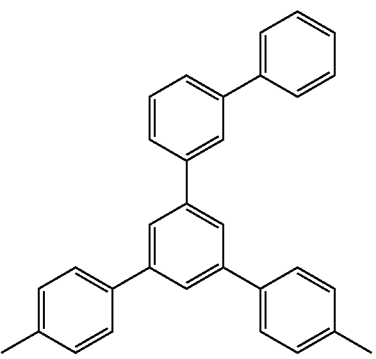 | | 1.776 g |
| 41 | 9 | 0.875 g | 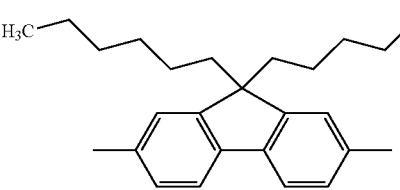 | | 3.0 g |
| Production Example | $Ar^{a2}$ | Amount of $Ar^{a2}$—$NH_2$ | i | Yield of Polymer | Mw | Mn | Mw/Mn |
|---|---|---|---|---|---|---|---|
| 35 | 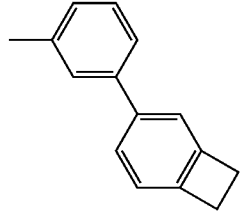 | 0.51 g | 0.8 | 1.01 g | 43300 | 26400 | 1.6 |
| 36 | 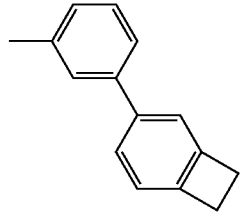 | 0.22 g | 0.95 | 1.20 g | 35000 | 19000 | 1.8 |
| 37 | 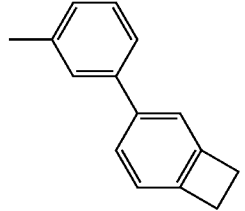 | 0.09 g | 0.95 | 0.87 g | 39000 | 24400 | 1.6 |
| 38 | 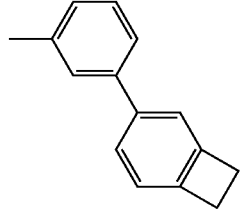 | 0.17 g | 0.83 | 0.27 g | 68000 | 27400 | 2.5 |

TABLE 1-continued
| | | | | | | | |
|---|---|---|---|---|---|---|---|
| 39 | 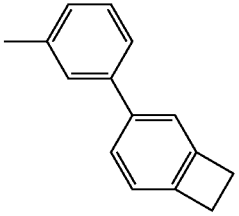 | 0.111 g | 0.81 | 0.88 g | 25000 | 11900 | 2.1 |
| 40 | 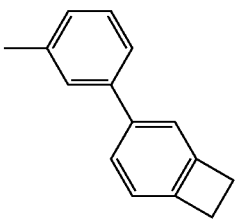 | 0.046 g | 0.9272 | 0.921 g | 24000 | 11800 | 2 |
| 41 | 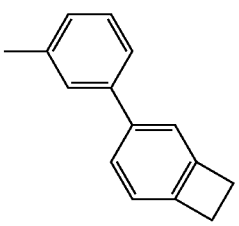 | 0.7 g | 0.41 | 1.9 g | 47900 | 29500 | 1.6 |
Production Example 42
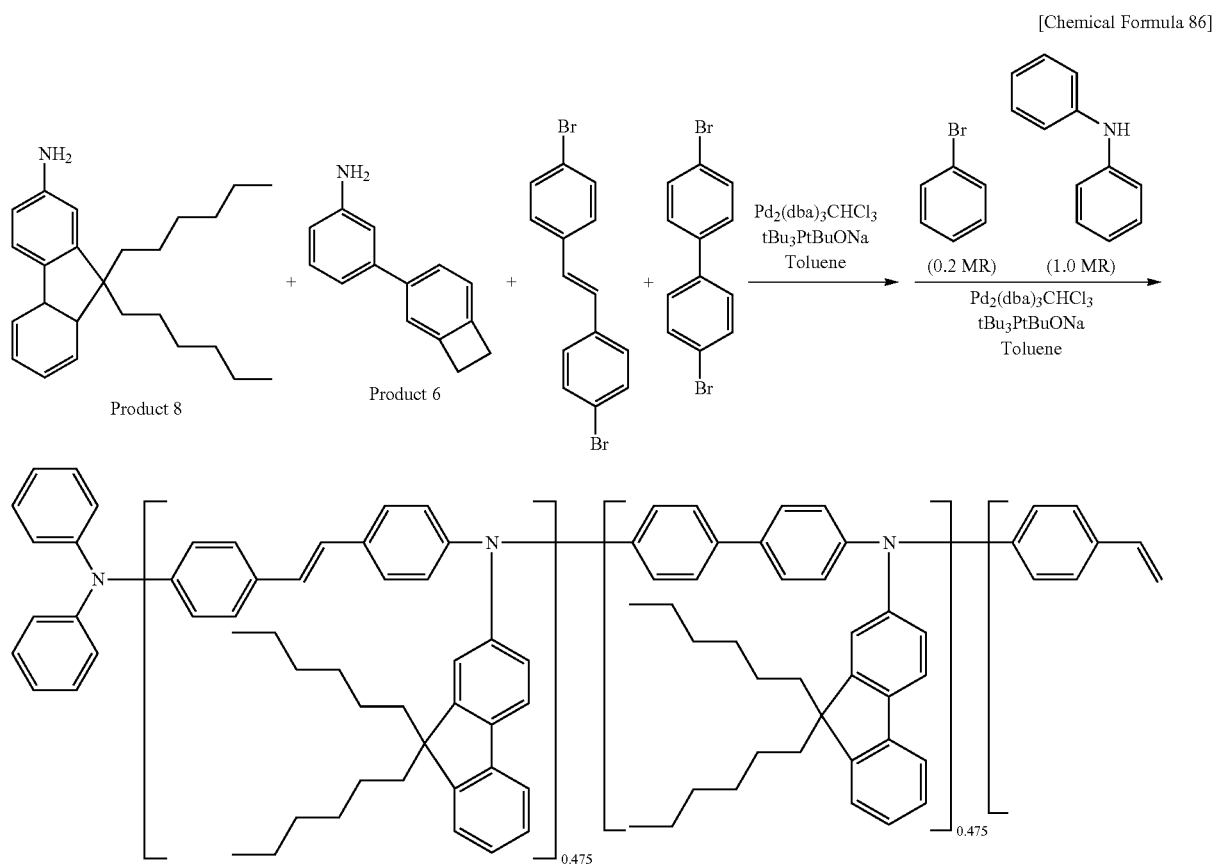
[Chemical Formula 86]

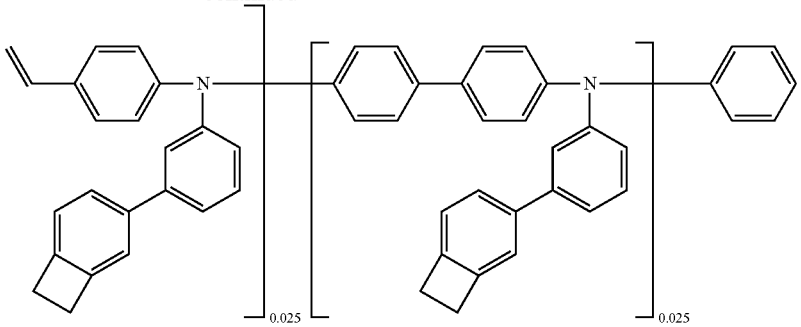

Polymer 10

The product 8 (7.5 g, 21.5 mmol) obtained in Production Example 8, the product 6 (0.22 g, 1.1 mmol) obtained in Production Example 6, 4,4'-dibromostilbene (3.82 g, 11.3 mmol), sodium tert-butoxide (6.95 g, 72.3 mmol) and toluene (120 ml) were put in a reactor, and the system was fully purged with nitrogen and heated up to 50° C. (solution A).

On the other hand, tri-t-butyl phosphine (0.33 g, 0.45 mmol) was added to a toluene (5 ml) solution of tris(dibenzylideneacetone)dipalladium/chloroform complex (0.06 g, 0.06 mmol), and heated up to 50° C. (solution B).

In a nitrogen flow, the solution B was added to the solution A, and reacted for 3 hours with heating under reflux. The absence of the starting materials was confirmed, and 4,4'-dibromobiphenyl (3.31 g, 10.6 mmol) was additionally added to it. After this was heated under reflux for 1.5 hours, the start of polymerization was confirmed; and 4,4'-dibromobiphenyl (0.07 g, 0.2 mmol) was additionally added to it at intervals of 1.5 hours for a total of 3 times. After the total amount of 4,4'-dibromobiphenyl was added, this was further heated under reflux for 1 hour, and the reaction liquid was left cooled, and dropwise put into methanol (300 ml) to give a crude polymer 10 through crystallization.

The resulting crude polymer 10 was dissolved in toluene (180 ml), and bromobenzene (0.71 g, 4.5 mmol) and sodium tert-butoxide (3.5 g, 36.4 mmol) were added thereto, then the system was fully purged with nitrogen, and heated up to 50° C. (solution C).

On the other hand, tri-t-butyl phosphine (0.18 g, 0.9 mmol) was added to a toluene (10 ml) solution of tris(dibenzylideneacetone)dipalladium/chloroform complex (0.12 g, 0.1 mmol), and heated up to 50° C. (solution D).

In a nitrogen flow, the solution D was added to the solution C, and reacted for 2 hours with heating under reflux. A toluene (2 ml) solution of N,N-diphenylamine (3.82 g, 22.6 mmol) was added to the reaction liquid, and further reacted for 8 hours with heating under reflux. The reaction liquid was left cooled, and dropwise put into ethanol/water (250 ml/50 ml) to give a crude end-capped polymer 10.

The crude end-capped polymer 10 was dissolved in toluene, and reprecipitated in acetone, and the formed polymer was collected through filtration. The resulting polymer was dissolved in toluene, washed with diluted hydrochloric acid, and reprecipitated in ammonia-containing ethanol. The polymer collected through filtration was purified through column chromatography to give the intended polymer 10 (0.9 g). The weight-average molecular weight and the number-average molecular weight of the polymer 10 were measured, and were as follows:

Weight-Average Molecular Weight (Ms)=60000
Number-Average Molecular Weight (Mn)=27000
Dispersity (Mw/Mn)=2.2

Production Examples 43 to 47

Intended polymers, arylamine polymers 11 to 15 were produced according to the production method of Production Example 42 but changing the monomers to the compounds shown in Table 2 below. The thus-obtained polymers are shown in Table 2.

[Chemical Formula 87]

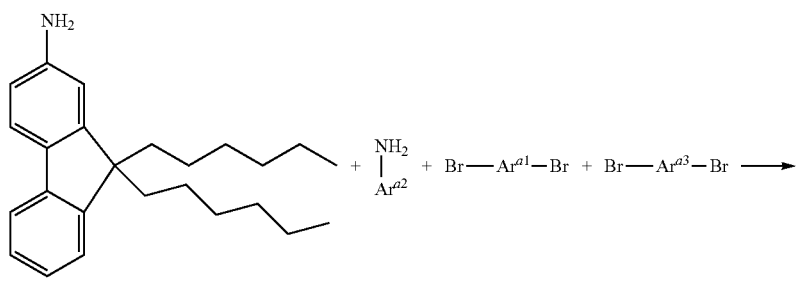

-continued
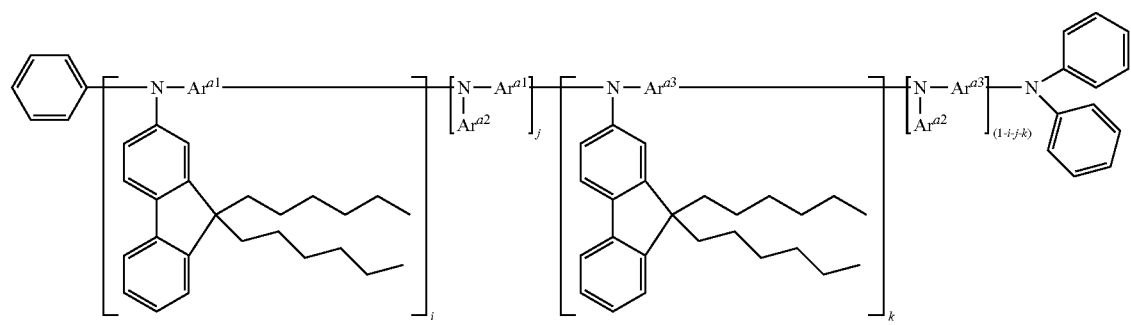
TABLE 2
| PE. | Po. | Amount of Fluorenamine | Ar$^{a1}$ | Amount of Br—Ar$^{a1}$—Br | Ar$^{a2}$ | Amount of Ar$^{a2}$—NH$_2$ |
|---|---|---|---|---|---|---|
| 42 | 10 | 7.50 g | biphenyl-4,4'-diyl | 3.52 g | benzocyclobutenyl-phenyl | 0.22 g |
| 43 | 11 | 3.320 g | biphenyl-4,4'-diyl | 1.560 g | benzocyclobutenyl-phenyl | 0.100 g |
| 44 | 12 | 1.16 g | biphenyl-4,4'-diyl | 0.55 g | benzocyclobutenyl-phenyl | 0.0404 g |
| 45 | 13 | 1.645 g | biphenyl-4,4'-diyl | 0.748 g | benzocyclobutenyl-phenyl | 0.057 g |
| 46 | 14 | 2.02 g | biphenyl-4,4'-diyl | 0.92 g | benzocyclobutenyl-phenyl | 0.073 g |

TABLE 2-continued
| | | | | | | |
|---|---|---|---|---|---|---|
| 47 | 15 | 1.852 g | 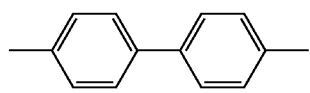 | 0.874 g | 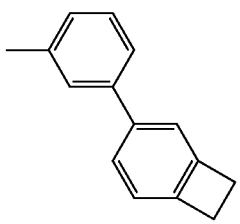 | 0.0589 g |
| PE. | Ar$^{a3}$ | Amount of Br—Ar$^{a3}$—Br | i | j | k | Yield of Polymer |
|---|---|---|---|---|---|---|
| 42 | 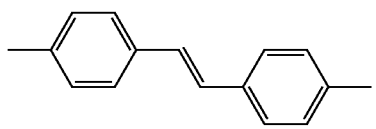 | 3.82 g | 0.475 | 0.025 | 0.475 | 0.9 g |
| 43 | 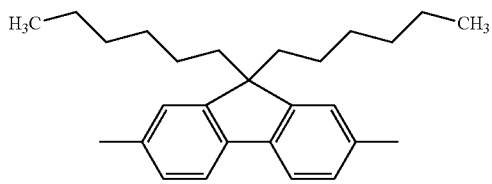 | 2.462 g | 0.475 | 0.475 | 0.025 | 0.208 g |
| 44 | 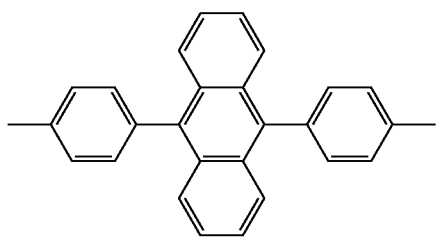 | 0.86 g | 0.47 | 0.03 | 0.47 | 0.73 g |
| 45 | 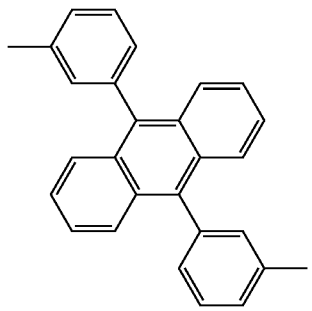 | 1.22 g | 0.471 | 0.029 | 0.471 | 1.24 g |
| 46 | 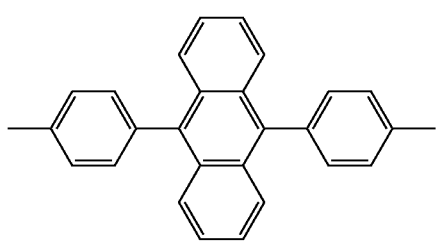 | 1.50 g | 0.471 | 0.029 | 0.471 | 1.86 g |

TABLE 2-continued

| 47 | | 1.089 g | 0.47 | 0.03 | 0.47 | 0.83 g |
|---|---|---|---|---|---|---|

| | PE. | Mw | Mn | Mw/Mn |
|---|---|---|---|---|
| | 42 | 60000 | 27000 | 2.2 |
| | 43 | 46000 | 17000 | 2.7 |
| | 44 | 52000 | 24700 | 2.1 |
| | 45 | 56500 | 34900 | 1.6 |
| | 46 | 76100 | 34600 | 2.2 |
| | 47 | 84400 | 55900 | 1.5 |

PE.: "Production Example".
Po.: "Polymer"

Production Examples 48 to 58

Intended polymers, various arylamine polymers 16 to 26 were produced in the same manner as in the production methods of Production Examples 35 and 42, for which, however, monomers as in the following reaction formula were reacted according to the following reaction formula and Table 3. The obtained polymers are shown in Table 3.

[Chemical Formula 88]

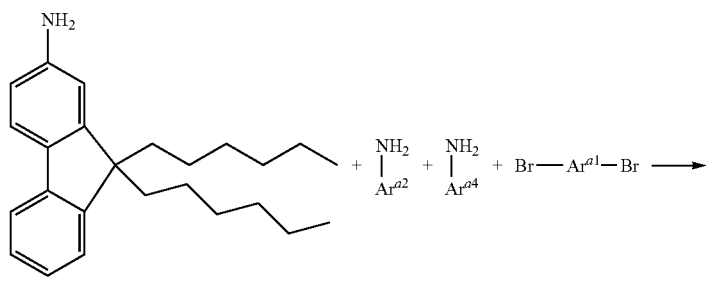

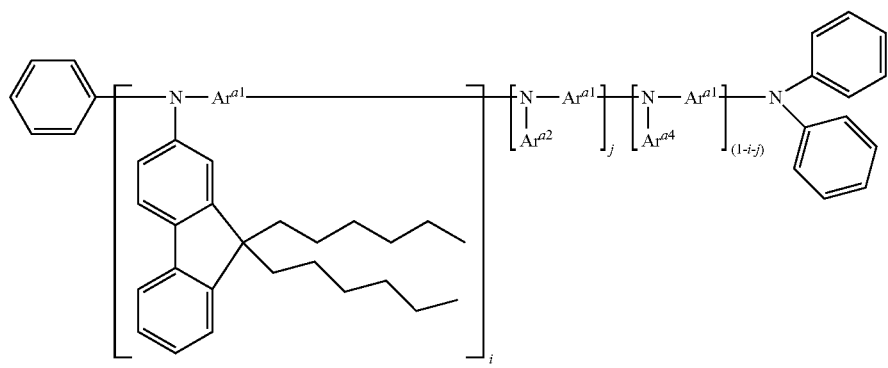

TABLE 3
| PE | PO | Amount of Fluorenamine | Ar$^{a1}$ | Amount of Br—Ar$^{a1}$—Br | Ar$^{a2}$ |
|---|---|---|---|---|---|
| 48 | 16 | 2.630 g | 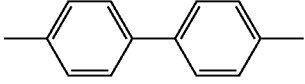 | 2.500 g | 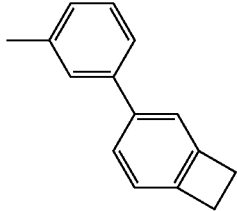 |
| 49 | 17 | 1.754 g | 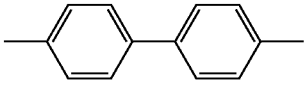 | 3.000 g | 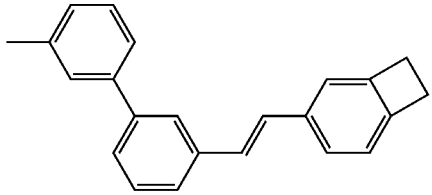 |
| 50 | 18 | 1.68 g | 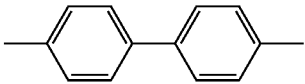 | 3.0 g | 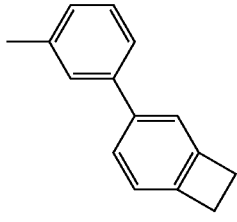 |
| 51 | 19 | 2.065 g |  | 3.493 g | 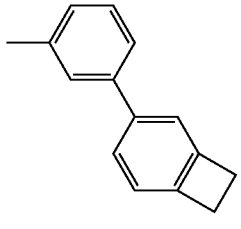 |
| 52 | 20 | 2.241 g | 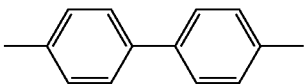 | 4.0 g | 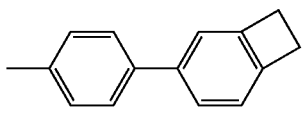 |
| 53 | 21 | 1.153 g | 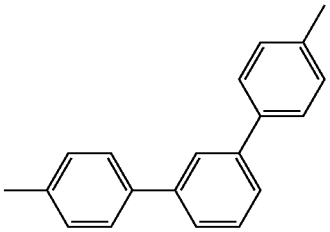 | 2.0 g | 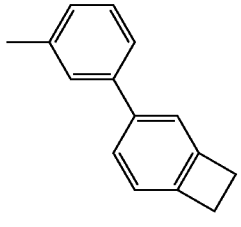 |
| 54 | 22 | 1.086 g | 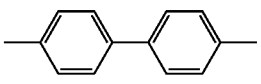 | 1.774 g | 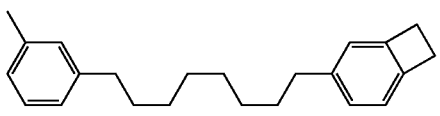 |

TABLE 3-continued
| | | | 211 | 212 |
|---|---|---|---|---|
| 55 | 23 | 1.185 g | 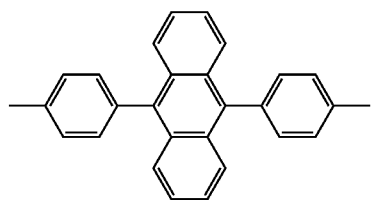 | 1.950 g 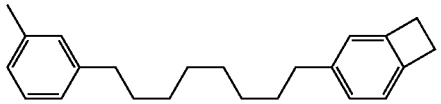 [SMILES: Cc1cccc(CCCCCCCCc2ccc3c(c2)CC3)c1] |
| 56 | 24 | 1.90 g | 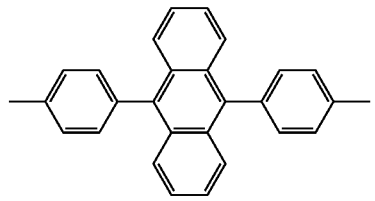<br>mol. ratio 1:1 | 1.57 g<br>0.98 g 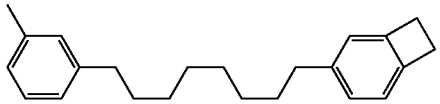 [SMILES: Cc1cccc(CCCCCCCCc2ccc3c(c2)CC3)c1] |
| 57 | 25 | 0.918 g | 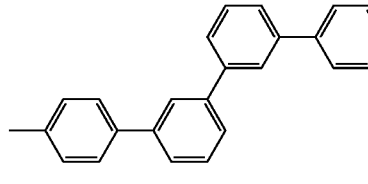 | 1.5 g 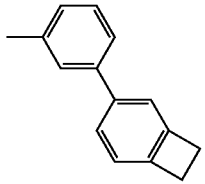 |
| 58 | 26 | 2.097 g | 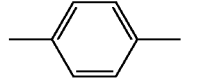 | 3.538 g 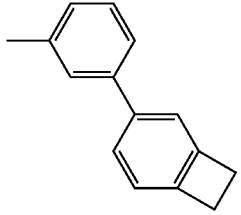 |
| PE | Amount of Ar$^{a2}$—NH$_2$ | Ar$^{a4}$ | Amount of Ar$^{a4}$—NH$_2$ | i | j | Yield of Polymer | Mw | Mn | Mw/Mn |
|---|---|---|---|---|---|---|---|---|---|
| 48 | 0.047 g | 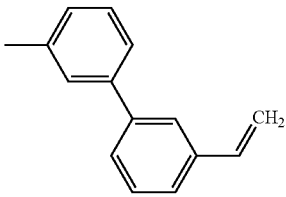 | 0.047 g | 0.94 | 0.03 | 0.9 g | 31300 | 15100 | 2.1 |
| 49 | 0.299 g | 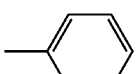 | 0.335 g | 0.51 | 0.10 | 0.7 g | 26200 | 15000 | 1.7 |
| 50 | 0.19 g | 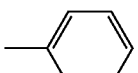 | 0.36 g | 0.5 | 0.1 | 1.71 g | 46800 | 20100 | 2.3 |
| 51 | 0.178 g | 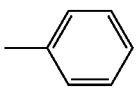 | 0.231 g | 0.66 | 0.131 | 0.7 g | 31700 | 21100 | 1.5 |
| 52 | 0.250 g | 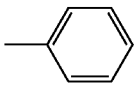 | 0.478 g | 0.5 | 0.1 | 2.7 g | 57000 | 30000 | 1.9 |

TABLE 3-continued

| 53 | 0.050 g | 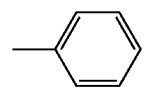 | 0.149 g | 0.64 | 0.05 | 0.5 g | 29000 | 12600 | 2.3 |
| 54 | 0.184 g | 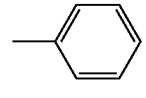 | 0.197 g | 0.54 | 0.105 | 2.2 g | 27300 | 14400 | 1.9 |
| 55 | 0.1087 g | 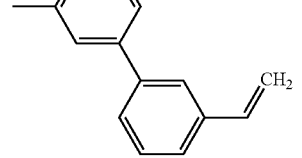 | 0.0690 g | 0.83 | 0.086 | 1.63 g | 332300 | 36300 | 9.2 |
| 56 | 0.148 g | 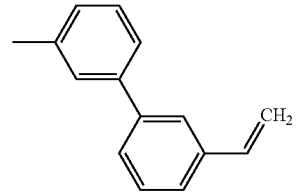 | 0.094 g | 0.85 | 0.075 | 1.6 g | 137000 | 53000 | 2.6 |
| 57 | 0.1026 g | 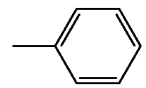 | 0.0074 g | 0.81 | 0.16 | 0.54 g | 42000 | 20400 | 2.1 |
| 58 | 0.880 g | 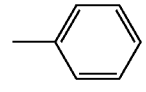 | 0.418 g | 0.4 | 0.301 | 0.476 g | 23100 | 13500 | 1.7 |

PE.: "Production Example".
PO.: "Polymer"

Production Example 59

An intended polymer, arylamine polymer 27 was produced in the same manner as in the production methods of Production Examples 35 and 42, for which, however, monomers as in the following reaction formula were reacted according to the following reaction formula and Table 4. The obtained polymer is shown in Table 4.

[Chemical Formula 90]

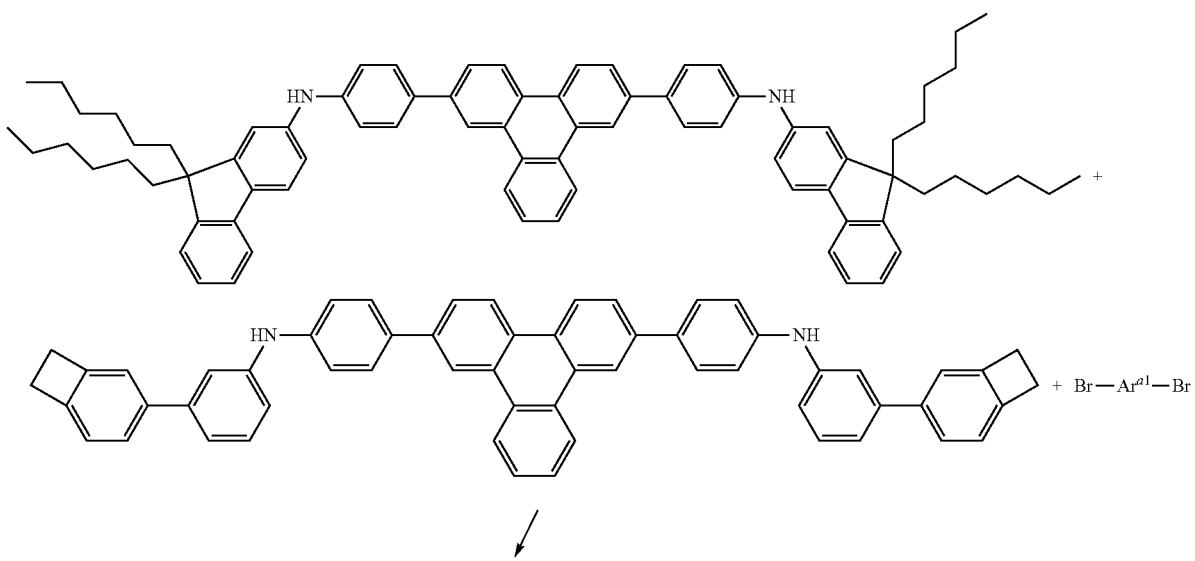

-continued
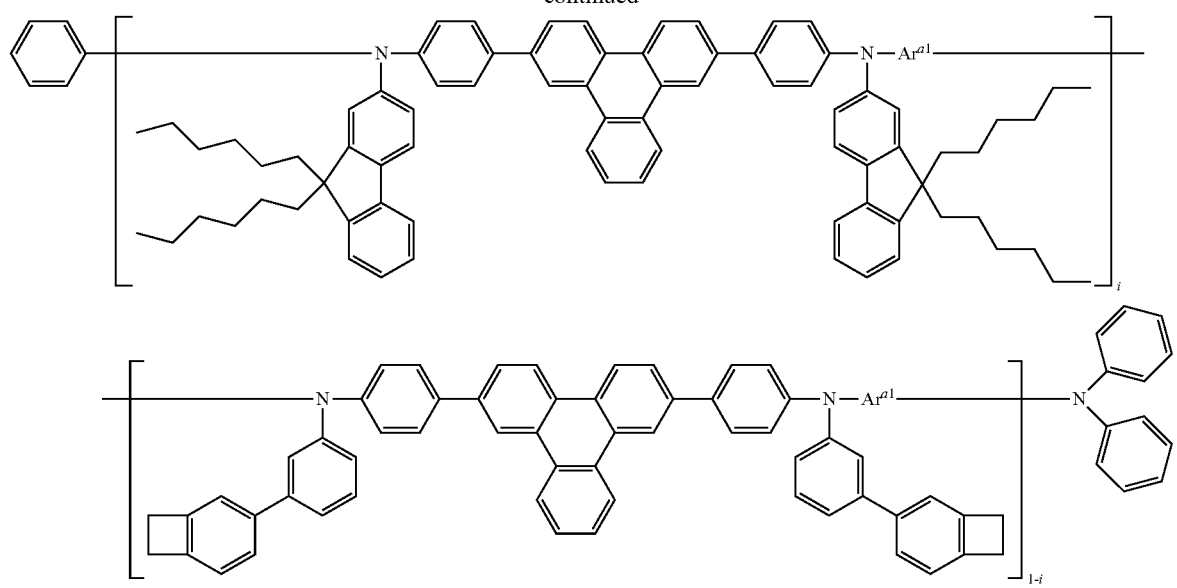
TABLE 4
| Production Example | Polymer | Ar$^{a1}$ | Amount of Br—Ar$^{a1}$—Br | Amine 1 |
|---|---|---|---|---|
| 59 | 27 | (4,4'-biphenyl) | 0.185 g | (fluorenyl-dihexyl amine with triphenylene); (tolyl-NH-fluorenyl dihexyl) |
| Production Example | Amount of Amine 1 | Amine 2 | Amount of Amine 2 | i | Yield of Polymer | Mw |
|---|---|---|---|---|---|---|
| 59 | 0.60 g | (benzocyclobutene-phenyl-NH-phenyl-triphenylene) | 0.03 g | 0.9387 | 0.41 g | 70000 |

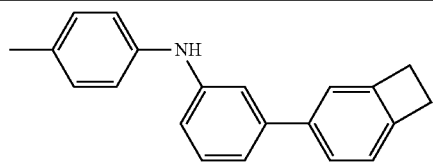

Production Examples 60 to 64

Intended polymers 28 to 32 were produced in the same manner as in the production methods of Production Examples 35 and 42, for which, however, monomers as in the following reaction formula were reacted according to the following reaction formula and Table 5. The obtained polymers are shown in Table 5.

[Chemical Formula 90]

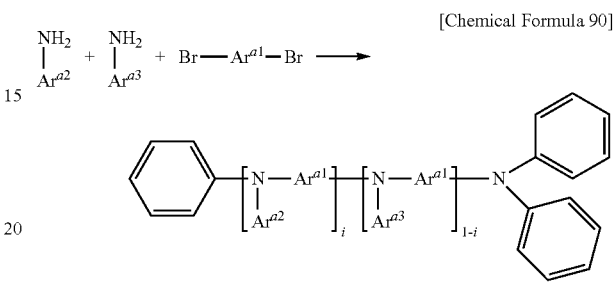

TABLE 5

| Production Example | Polymer | $Ar^{a1}$ | Amount of Br—$Ar^{a1}$—Br | $Ar^{a2}$ |
|---|---|---|---|---|
| 60 | 28 | biphenyl-4,4'-diyl | 7.05 g | 4-heptylphenyl |
| 61 | 29 | biphenyl-4,4'-diyl | 2.82 g | 4-heptylphenyl |
| 62 | 30 | 1,4-phenylene | 2.32 g | 4-heptylphenyl |
| 63 | 31 | 2,5-dipentyl-1,4-phenylene-bis(4-phenyl) | 2.08 g | phenyl |
| 64 | 32 | 9,9-dihexylfluorene-2,7-diyl-bis(4-phenyl) | 3.59 g | phenyl |

| Production Example | Amount of | Amount of | Mw/ |

TABLE 5-continued
| ample | Ar$^{a2}$NH$_2$ | Ar$^{a3}$ | Ar$^{a3}$NH$_2$ | n | Yield | Mw | Mn | Mn |
|---|---|---|---|---|---|---|---|---|
| 60 | 3.71 g | 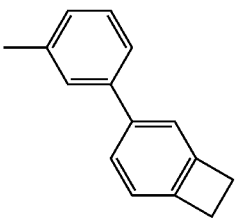 | 0.90 g | 0.8 | 0.7 g | 63900 | 40300 | 1.6 |
| 61 | 1.80 g | 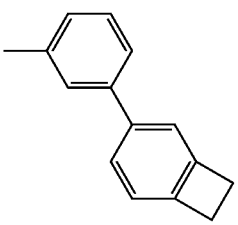 | 0.09 g | 0.95 | 0.37 g | 46500 | 28300 | 1.6 |
| 62 | 1.49 g | 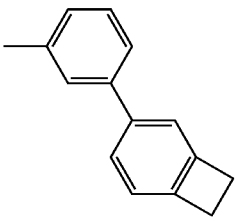 | 0.54 g | 0.7234 | 0.61 g | 28000 | 16600 | 1.7 |
| 63 | 0.30 g | 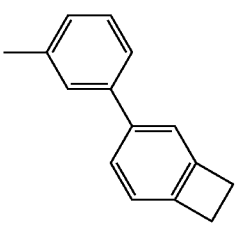 | 0.04 g | 0.9442 | 0.90 g | 72300 | 35500 | 2.0 |
| 64 | 0.95 g | 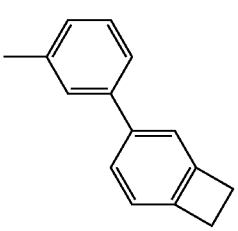 | 0.13 g | 0.9409 | 3.59 g | 67900 | 35400 | 1.9 |

Production of Comparative Polymers
Comparative Production Example 1
[Chemical Formula 91]
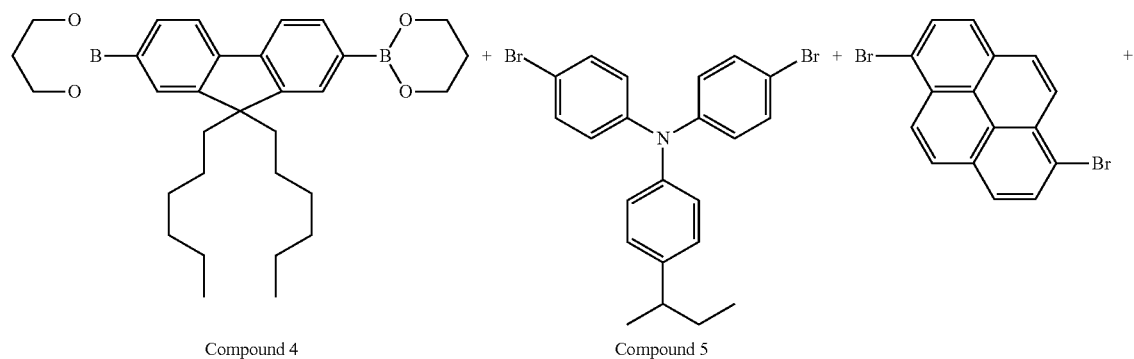
Compound 4      Compound 5
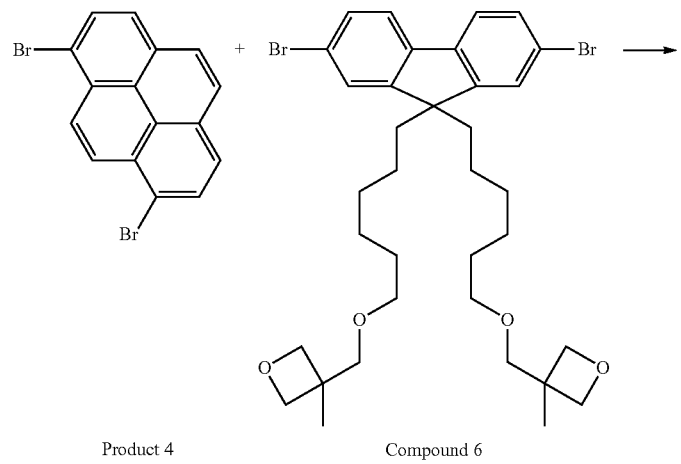
Product 4      Compound 6
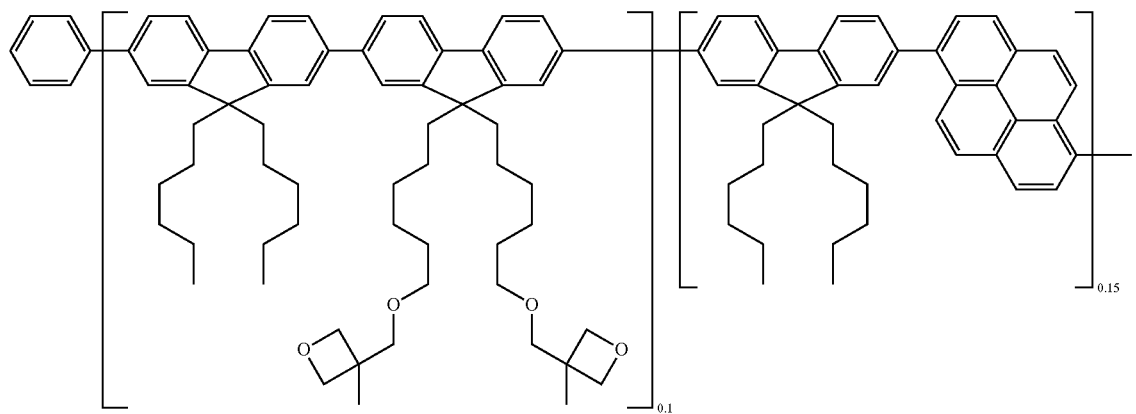

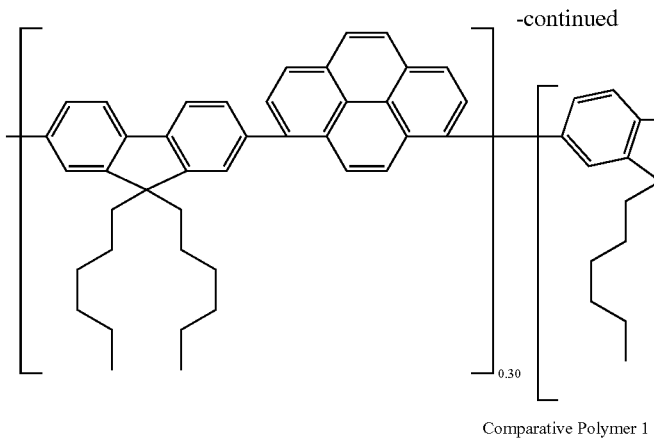

Comparative Polymer 1

In a nitrogen flow, aqueous 20% tetraethylammonium hydroxide solution (11 ml) was added to a toluene (59 ml) solution of the compound 4 (3.26 g), the compound 6 (0.45 g), the product 4 (1.530 g; 1,8-dibromopyrene/1,6-dibromopyrene=33/67) and the compound 5 (1.34 g), and tetrakis(triphenylphosphine)palladium(0) (0.075 g) was added thereto, and stirred for 6 hours with heating under heat. After left cooled, the reaction liquid was added to methanol, the precipitated crude polymer was collected through filtration and dried. In a nitrogen flow, aqueous 20% tetraethylammonium hydroxide solution (24 ml) was added to a solution of the resulting crude polymer, bromobenzene (0.20 and toluene (100 ml), and tetrakis(triphenylphosphine)palladium(0) (0.451 g) was added thereto, and stirred for 2 hours with heating under heat. Subsequently, phenylboronic acid (1.80 g) was added to it, and stirred for 6 hours with heating under heat. After left cooled, the reaction liquid was added to ethanol, the precipitated crude polymer was collected through filtration, dried, and purified through silica gel column with a developing solvent of toluene and tetrahydrofuran. From the tetrahydrofuran solution, the product was reprecipitated in ethanol, collected through filtration and dried to give a comparative polymer 1 (1.45 g).

Weight-Average Molecular Weight (Ms)=22,000
Number-Average Molecular Weight (Mn)=14,000

Comparative Production Example 2

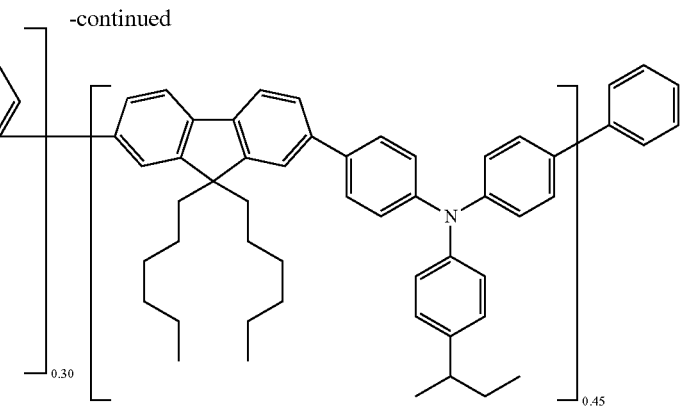

Product 33

In a nitrogen flow, the compound 1 (10.0 g), bis(pinacolato)diborane (10.8 g), potassium acetate (10.13 g) and dimethyl sulfoxide (150 ml) were put in a reactor, heated up to 60° C., stirred for 30 minutes, and (bisdiphenylphosphinoferrocene)dichloropalladium complex was added to it and reacted at 80° C. for 6 hours. After the reaction, this was left cooled to room temperature, and toluene (100 ml) and water (120 ml) were added to the reaction liquid, stirred, processed for liquid-liquid separation, and the aqueous layer was extracted with toluene. The organic layers were combined, dried with magnesium sulfate, and concentrated. The resulting crude product was purified through silica gel column chromatography (n-hexane/ethyl acetate) to give the intended product 33 (7.9 g).

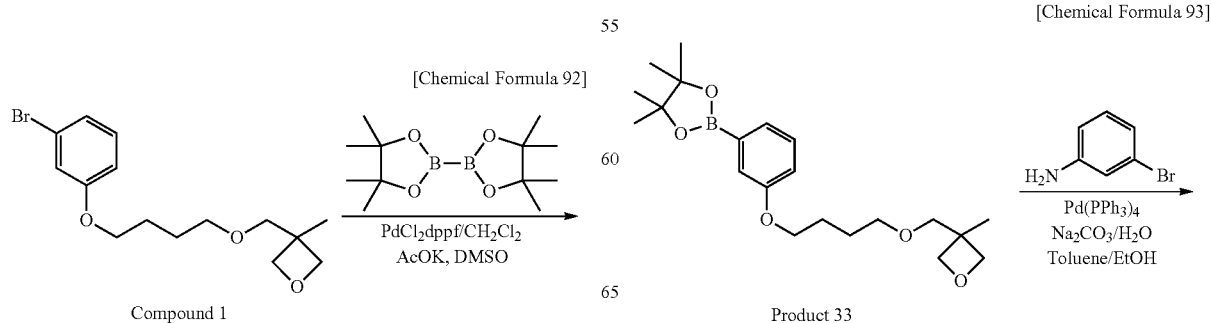

-continued

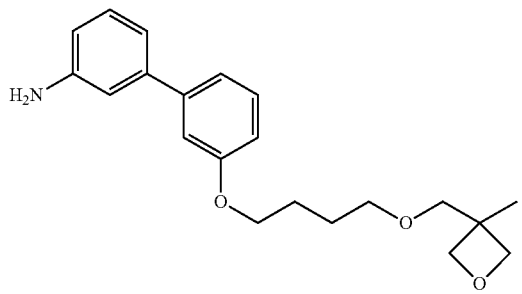

Product 34

In a nitrogen flow, the product 33 (7.9 g), 3-bromoaniline (3.47 g), toluene/ethanol (60 ml/30 ml) and aqueous 2 M sodium carbonate solution (20 ml) were put in a reactor, stirred for 30 minutes under heat at 60° C., the system was degassed, and tetrakis(triphenylphosphine)palladium (0.7 g) was added thereto and refluxed for 6 hours. After left cooled to room temperature, toluene (100 ml) and water (120 ml) were added to the reaction liquid, stirred, processed for liquid-liquid separation, and the aqueous layer was extracted with toluene. The organic layers were combined, dried with magnesium sulfate, and concentrated. The resulting crude product was purified through silica gel column chromatography (n-hexane/ethyl acetate) to give the intended product 34 (3.8 g).

[Chemical Formula 94]

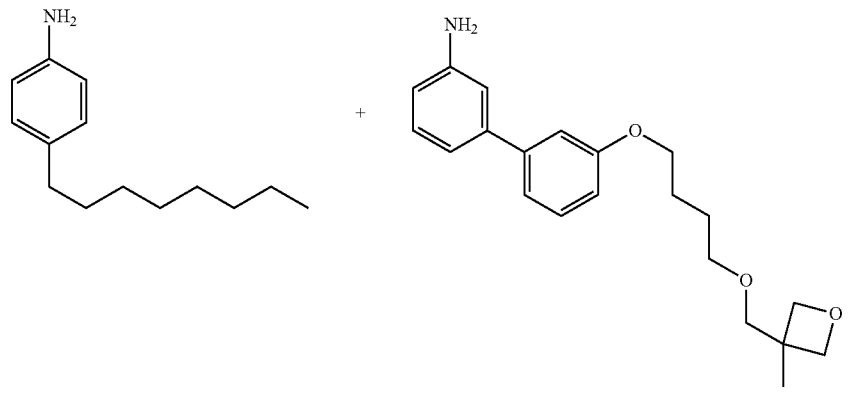

Product 34

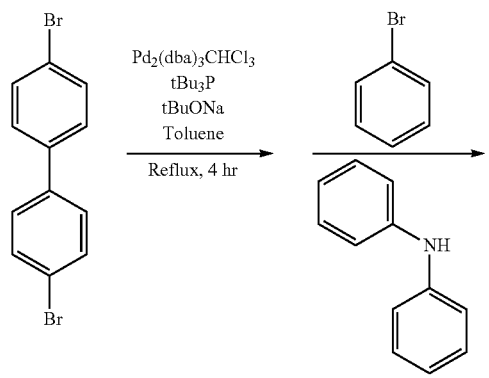

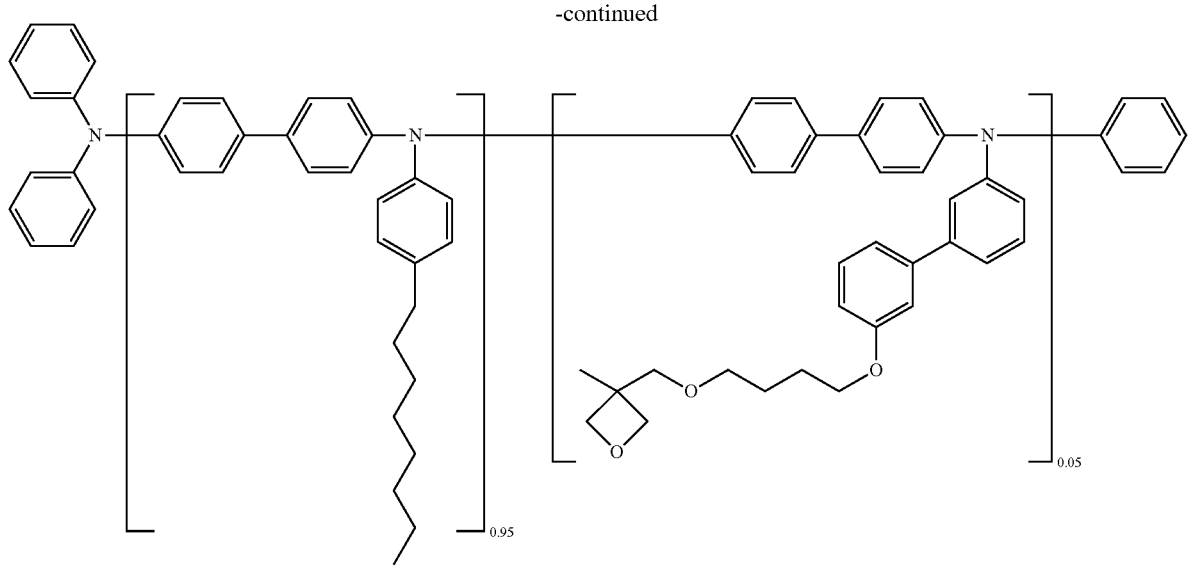

Comparative Polymer 2

4-N-octylaniline (2.285 g, 11.13 mmol), the product 34 (0.2 g, 0.59 mmol), 4,4'-dibromobiphenyl (1.83 g, 5.86 mmol), sodium tert-butoxide (3.6 g, 37.49 mmol), and toluene (20 ml) were put in a reactor, and the system was fully purged with nitrogen and heated up to 50° C. (solution A). Tri-t-butyl phosphine (0.189 g, 0.94 mmol) was added to a toluene (10 ml) solution of tris(dibenzylideneacetone)dipalladium/chloroform complex (0.12 g, 0.12 mmol), and heated up to 50° C. (solution B). In a nitrogen flow, the solution B was added to the solution A, and reacted for 1 hour with heating under reflux. The absence of the starting materials was confirmed, and 4,4'-dibromobiphenyl (1.72 g, 5.51 mmol) was additionally added to it. After this was heated under reflux for 1 hour, the start of polymerization was confirmed; and 4,4'-dibromobiphenyl (0.036 g, 0.12 mmol) was additionally added to it at intervals of 40 minutes for a total of 3 times (0.11 g in total). After the total amount of 4,4'-dibromobiphenyl was added, this was further heated under reflux for 1 hour, and the reaction liquid was left cooled, and dropwise put into methanol (300 ml) to give a crude comparative polymer 2 through crystallization.

The resulting crude comparative polymer 2 was dissolved in toluene (110 ml), and bromobenzene (0.39 g, 2.48 mmol) and sodium tert-butoxide (3.8 g, 39.74 mmol) were added thereto, then the system was fully purged with nitrogen, and heated up to 50° C. (solution C). Tri-t-butyl phosphine (0.2 g, 0.99 mmol) was added to a toluene (10 ml) solution of tris (dibenzylideneacetone)dipalladium/chloroform complex (0.13 g, 0.12 mmol), and heated up to 50° C. (solution D). In a nitrogen flow, the solution D was added to the solution C, and reacted for 2 hours with heating under reflux. A toluene (2 ml) solution of N,N-diphenylamine (2.1 g, 12.4 mmol) was added to the reaction liquid, and further reacted for 6 hours with heating under reflux. The reaction liquid was left cooled, and dropwise put into ethanol/water (250 ml/50 ml) to give a crude comparative polymer 2 of which the terminal residues were capped.

The crude end-capped comparative polymer 2 was dissolved in toluene, and reprecipitated in acetone, and the formed polymer was collected through filtration. The resulting polymer was dissolved in toluene, washed with diluted hydrochloric acid, and reprecipitated in ammonia-containing ethanol. The polymer collected through filtration was purified through column chromatography to give the intended comparative polymer 2 (0.84 g).

Weight-Average Molecular Weight (Ms)=51600

Number-Average Molecular Weight (Mn)=26500

Dispersity (Mw/Mn)=1.95

Comparative Production Example 3

[Chemical Formula 95]

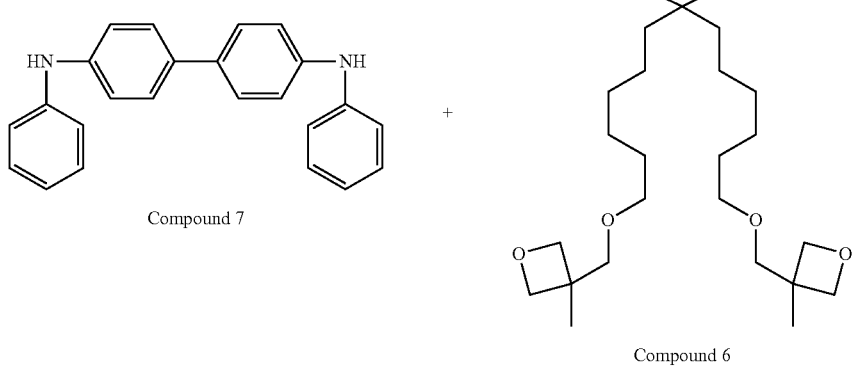

Compound 7     +     Compound 6

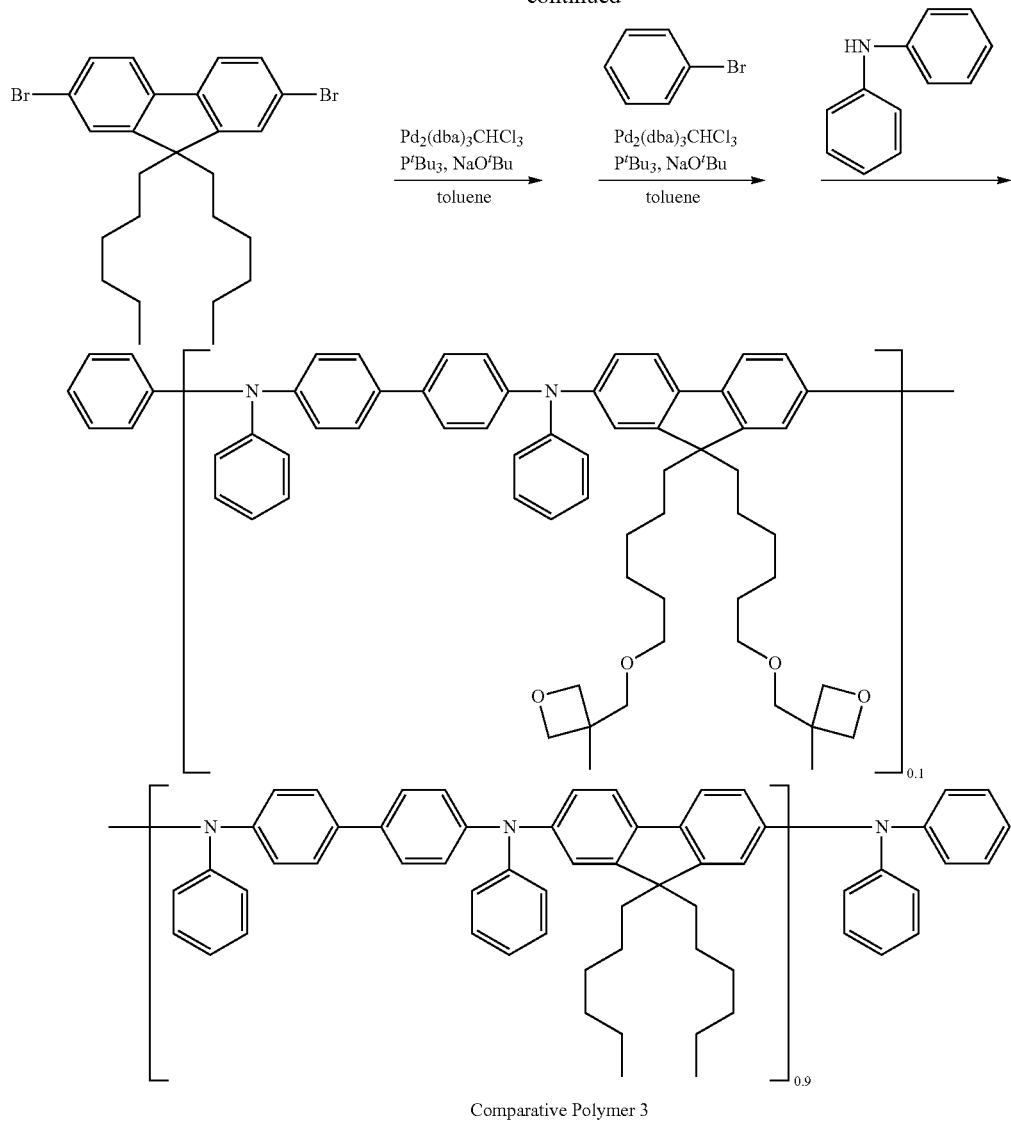

Comparative Polymer 3

The compound 7 (10.09 g), the compound 6 (2.08 g), 2,7-dibromo-9,9′-dihexylfluorene (12.85 g), sodium tert-butoxide (9.23 g) and toluene (70 ml) were put in a reactor, and the system was fully purged with nitrogen and heated up to 60° C. (solution A). Tri-t-butyl phosphine (0.24 g) was added to a toluene (5 ml) solution of tris(dibenzylideneacetone) dipalladium/chloroform complex (0.16 g), and heated up to 60° C. (solution B). In a nitrogen flow, the solution B was added to the solution A, and reacted for 1 hour with heating under reflux. 2,7-Dibromo-9,9-dihexylfluorene (0.15 g) was further added to it at intervals of 30 minutes for a total of 3 times. Further, this was heated under reflux, then the reaction liquid was left cooled, and dropwise put into ethanol to precipitate a crude comparative polymer 3.

The resulting crude comparative polymer 3 was dissolved in toluene (290 ml), and bromobenzene (0.94 g) and sodium tert-butoxide (4.32 g) were added thereto, then the system was fully purged with nitrogen, and heated up to 60° C. (solution C). Tri-t-butyl phosphine (0.24 g) was added to a toluene (10 ml) solution of tris(dibenzylideneacetone)dipalladium/chloroform complex (0.16 g), and heated up to 60° C. (solution D). In a nitrogen flow, the solution D was added to the solution C, and reacted for 2 hours with heating under reflux. A toluene (10 ml) solution of N,N-diphenylamine (5.08 g) was added to the reaction liquid, and further reacted for 4 hours with heating under reflux. The reaction liquid was left cooled, and dropwise put into ethanol to give a crude comparative polymer 3 of which the terminal residues were capped.

The crude end-capped comparative polymer 3 was dissolved in toluene, and reprecipitated in acetone, and the formed polymer was collected through filtration. The resulting polymer was dissolved in toluene, washed with diluted hydrochloric acid, and reprecipitated in ammonia-containing ethanol. The polymer collected through filtration was purified through column chromatography to give the intended comparative polymer 3 (11.27 g).

Weight-Average Molecular Weight (Ms)=47500
Number-Average Molecular Weight (Mn)=23700
Dispersity (Mw/Mn)=2.00

Comparative Production Example 4
[Chemical Formula 96]
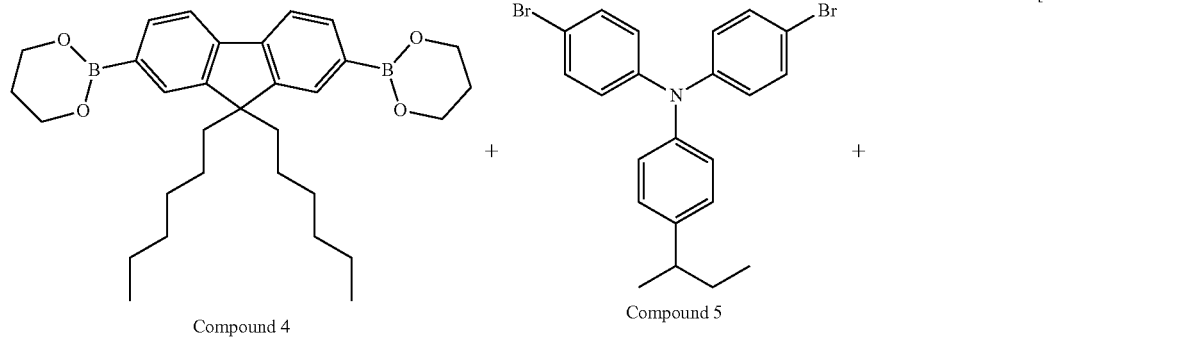
Compound 4 + Compound 5 +
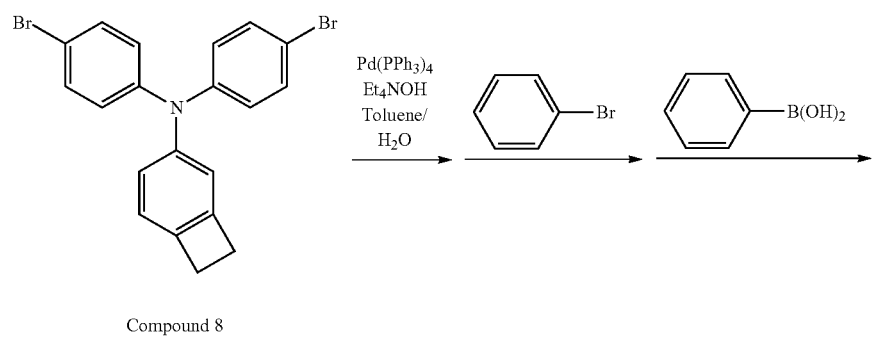
Compound 8
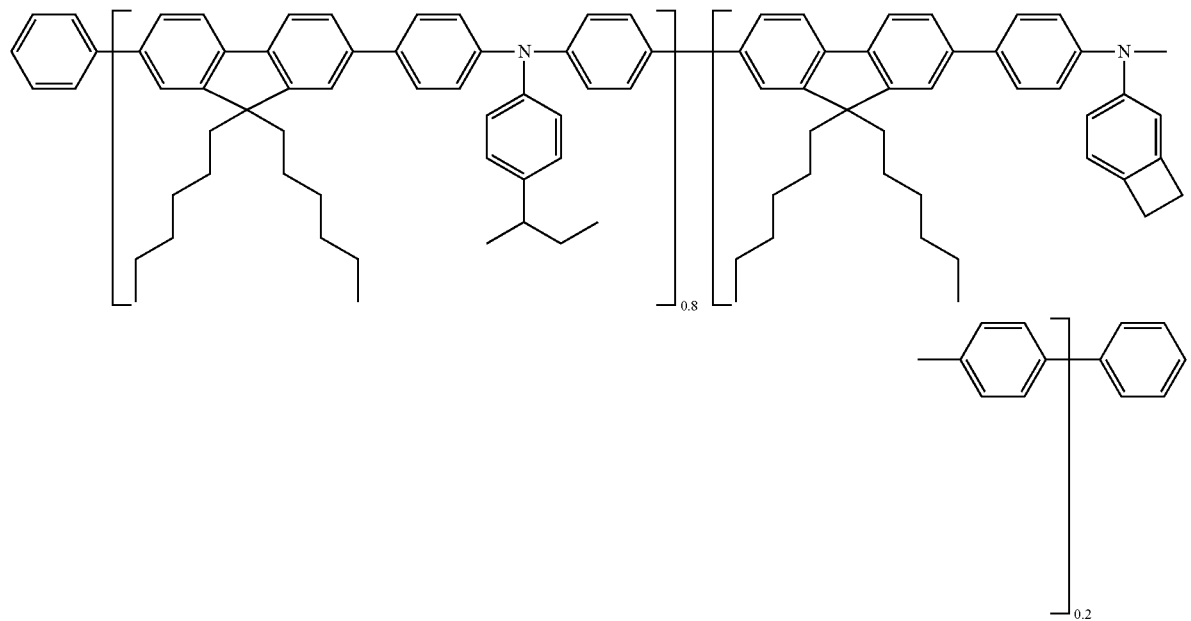
Comparative Polymer 4

In a nitrogen flow, aqueous 20% tetraethylammonium hydroxide solution (25 ml) was added to a toluene (50 ml) solution of the compound 4 (3.57 g), the compound 5 (2.61 g) and the compound 8 (0.61 g), and tetrakis(triphenylphosphine)palladium(0) (0.06 g) was added to it and stirred for 4 hours with heating under reflux. After left cooled, the reaction liquid was added to ethanol, and the precipitated crude polymer was collected through filtration and dried. In a nitrogen flow, aqueous 20% tetraethylammonium hydroxide solution (40 ml) was added to a solution of the resulting polymer, bromobenzene (0.22 g) and toluene (100 ml), and tetrakis(triphenylphosphine)palladium(0) (0.06 g) was added to it and stirred for 2 hours with heating under reflux. Subsequently, phenylboronic acid (0.87 g) was added thereto and stirred for 6 hours with heating under reflux. After left cooled, the reaction liquid was added to ethanol, the precipitated crude comparative polymer 4 was collected through filtration, dried, and purified through silica gel column with a developing solvent of toluene and tetrahydrofuran. The product was reprecipitated from the tetrahydrofuran solution in ethanol, collected through filtration and dried to give the comparative polymer 4 (2.80 g).

Weight-Average Molecular Weight (Ms)=41400

Number-Average Molecular Weight (Mn)=22600

Dispersity (Mw/Mn)=1.83

Construction of Organic Electroluminescence Element

Example 1

An organic electroluminescence element shown in FIG. 1 was constructed.

On a glass substrate 1 having, as deposited thereon, an indium tin oxide (ITO) transparent conductive film having a thickness of 120 nm (Sanyo Vacuum Industries' sputtered product), an anode 2 was formed by patterning thereon to be a stripe having a width of 2 mm, according to ordinary photolithography combined with hydrochloric acid etching. The thus-patterned ITO substrate was ultrasonically washed with an aqueous surfactant solution, washed with ultrapure water, ultrasonically washed with ultrapure water, and washed with ultrapure water in that order, then dried with compressed air, and finally washed with UV/ozone.

First, a coating liquid for forming hole injection layer was prepared, comprising a hole-transporting polymer material represented by the following structural formula (P1) (weight-average molecular weight, 26500; number-average molecular weight, 12000), 4-isopropyl-4'-methyldiphenyliodonium tetrakis(pentafluorophenyl)borate represented by the following structural formula (A1) and ethyl benzoate. The coating liquid was applied onto the anode 2 in a mode of spin coating, thereby forming a hole injection layer 3 having a thickness of 30 nm.

[Chemical Formula 97]

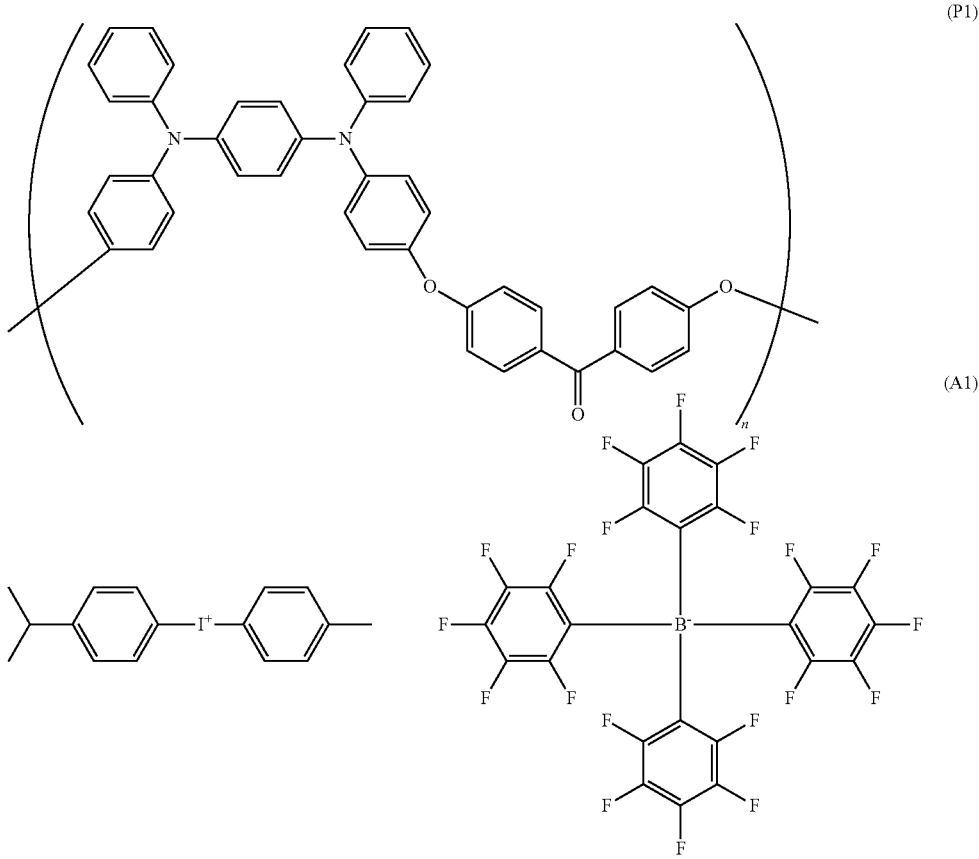

<Coating Liquid for Forming Hole Injection Layer>

| Solvent | ethyl benzoate |
| --- | --- |
| Coating liquid concentration | P1: 2.0% by weight |
|  | A1: 0.8% by weight |

<Condition for Forming Hole Injection Layer 3>

| Number of spinner rotations | 1500 rpm |
| --- | --- |
| Spinner rotation time | 30 seconds |
| Spin coating atmosphere | in air |
| Heating condition | in air, 230° C., 3 hours |

Subsequently, a composition for organic electroluminescence element containing a polymer compound (i) of the invention represented by the following structural formula (H1) (the polymer 1 obtained in Production Example 33) was prepared, and this was applied in a mode of spin coating under the condition mentioned below, and crosslinked by heating to form a hole transport layer 4 having a thickness of 22 mm.

[Chemical Formula 98]

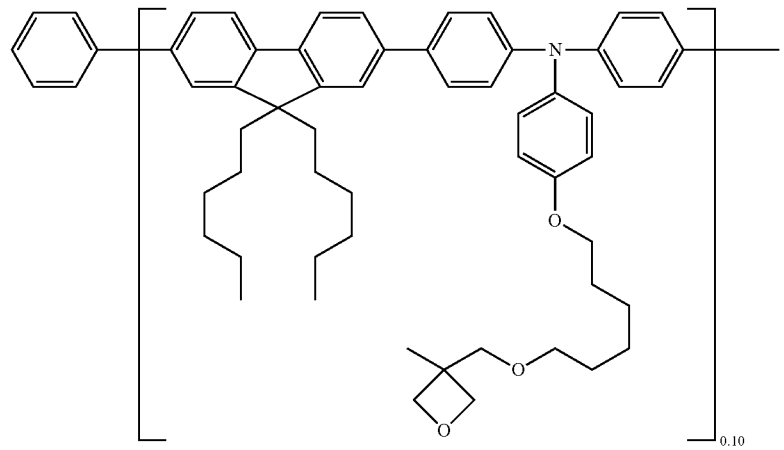

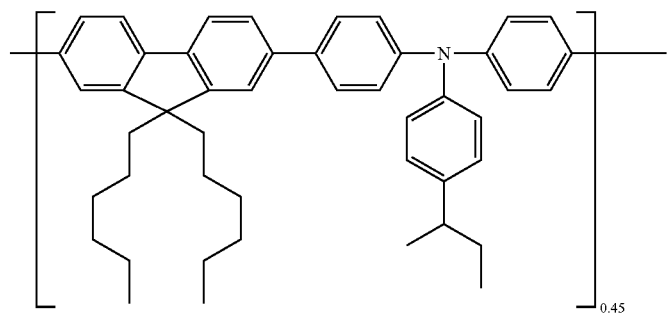

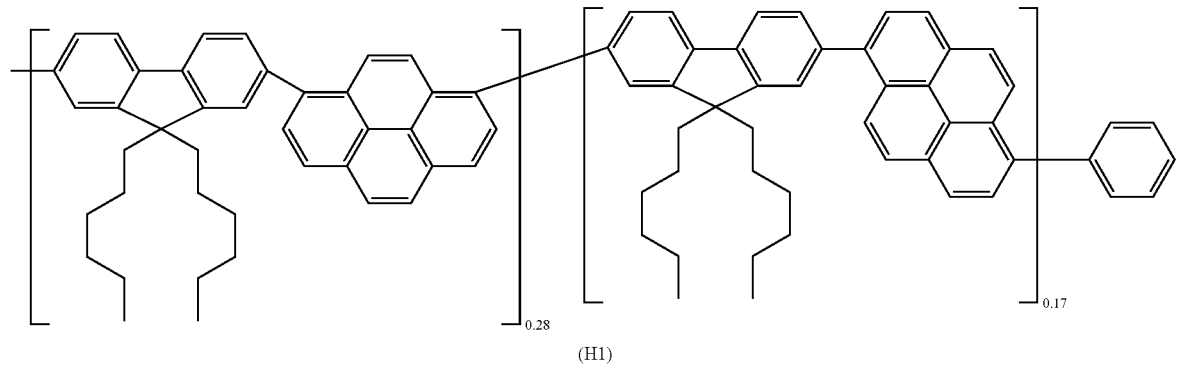

(H1)

<Coating Liquid for Forming Hole Transport Layer>

| Solvent | toluene |
|---|---|
| Solid concentration | 0.4% by weight |

<Condition for Forming Hole Transport Layer 4>

| Number of spinner rotations | 1500 rpm |
|---|---|
| Spinner rotation time | 30 seconds |
| Spin coating atmosphere | in nitrogen |
| Heating condition | in nitrogen, 230° C., 1 hour |

The substrate with the hole injection layer 3 and the hole transport layer 4 formed thereon was transferred into a vacuum deposition chamber, the chamber was roughly degassed via an oil-sealed rotary pump, and then further degassed so that the vacuum degree inside the chamber could reach $1.3 \times 10^{-4}$ Pa or less via a cryopump; and a film comprising a compound having the following structural formula (E4) and an iridium complex (D2) shown below was formed thereon according to a vacuum evaporation method to form a light emission layer 5. The light emission layer 5 having a thickness of 32 nm was thus formed with the vapor deposition rate of (E4) controlled to be 0.5 angstrom/second and the vapor deposition rate of the iridium complex (D2) to be 0.03 angstrom/second.

[Chemical Formula 99]

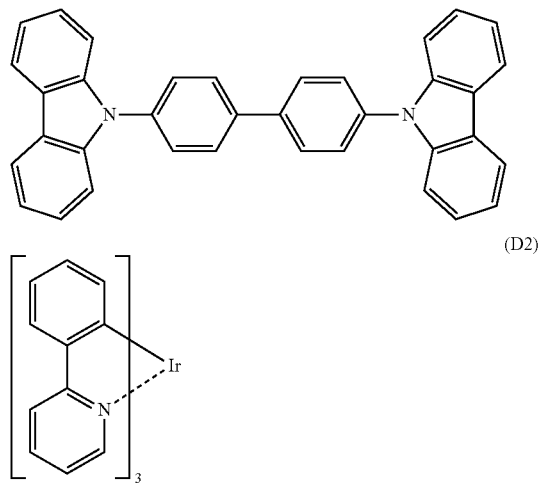

(E4)

(D2)

Next, a compound (E3) having the following structural formula was laminated on it according to a vacuum evaporation method to form a hole inhibition layer 6. The hole inhibition layer 6 having a thickness of 10 nm was thus formed, as laminated on the light emission layer 5, with the vapor deposition rate controlled to be from 0.7 to 1.2 angstrom/second.

[Chemical Formula 100]

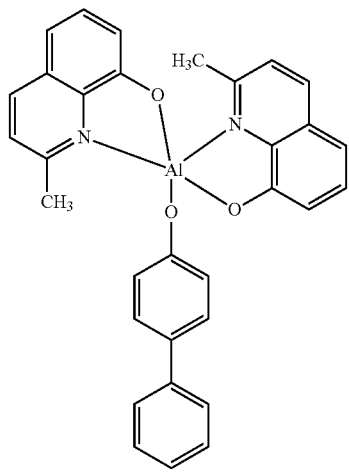

(E3)

Subsequently, tris(8-hydroxyquinolinato)aluminium was heated and vapor-deposited to form an electron transport layer 7. In this case, the vapor deposition speed was controlled to be within a range of from 0.7 to 1.3 angstroms/second, and the electron transport layer 7 having a thickness of 30 nm was formed as laminated on the hole inhibition layer 6.

The device processed for vapor deposition thereon up to the electron transport layer 7 was once taken out from the vacuum deposition chamber into air, and a 2-mm wide stripe shadow mask for cathode deposition was stuck to the device in such a manner that the mask could be in perpendicular to the ITO stripe of the anode 2, and the device was put in a different vacuum deposition chamber, and similarly the chamber was degassed to a vacuum degree of at most $1.3 \times 10^{-4}$ Pa.

Using a molybdenum boat, lithium fluoride (LiF) was vapor-deposited on the electron transport layer 7 at a controlled vapor deposition speed falling within a range of from 0.08 to 0.13 angstrom/second, thereby forming thereon an electron injection layer 8 having a thickness of 0.5 nm. Next, similarly to the above, aluminium was heated on a molybdenum boat and vapor-deposited at a deposition speed falling within a range of from 0.5 to 6.0 angstrom/sec, thereby forming an aluminium layer having a thickness of 80 nm as a cathode 9. In forming the above two layers, the substrate temperature was room temperature.

Subsequently, the device was sealed up according to the method mentioned below, for preventing the device from being degraded by moisture in air during storage.

In the nitrogen globe box connected to the vacuum deposition chamber, a photocurable resin 30Y-437 (by Three Bond) was applied to the outer periphery of a glass sheet having a size of 23 mm×23 mm, to a width of about 1 mm, and a moisture getter sheet (by Dynic) was arranged in the center part. The substrate after cathode formation thereon was put on it and stuck thereto in such a manner that the coated side of the substrate could face the desiccant sheet. Subsequently, the area coated with the photocurable resin was irradiated with UV rays and the resin was thereby cured.

In the manner as above, an organic electroluminescence element having a light emission area part with a size of 2 mm×2 mm was obtained. The light emission characteristics of the device are as follows:

Brightness/current: 17.2 [cd/A] @ 100 cd/m$^2$
Voltage: 5.5 [V] @ 100 cd/m$^2$
Current efficiency: 9.7 [lm/W] @ 100 cd/m$^2$ The maximum wavelength of the light emission spectrum of the device was 516 nm, and this was identified as one from the iridium complex (D2). The chromaticity was CIE (x, y)=(0.311, 0.622).

The light emission characteristics and the lifetime of the device are shown in Table 1. The drive lifetime indicates the brightness half-value period at an initial brightness of 2500 cd/m$^2$ in room temperature driving.

As shown in Table 6, it is known that the organic electroluminescence element constructed by the use of the polymer compound of the invention has a low drive voltage, a high current efficiency and a long drive lifetime.

Comparative Example 1

An organic electroluminescence element shown in FIG. 1 was constructed in the same manner as in Example 1, for which, however, the polymer compound (i) having the structural formula (H1) of the invention was changed to a polymer compound represented by the following structural formula (H2) (comparative polymer 1 produced in Comparative Production Example 1) in forming the hole transport layer 4. In this, the thickness of the hole transport layer was 20 nm.

[Chemical Formula 101]

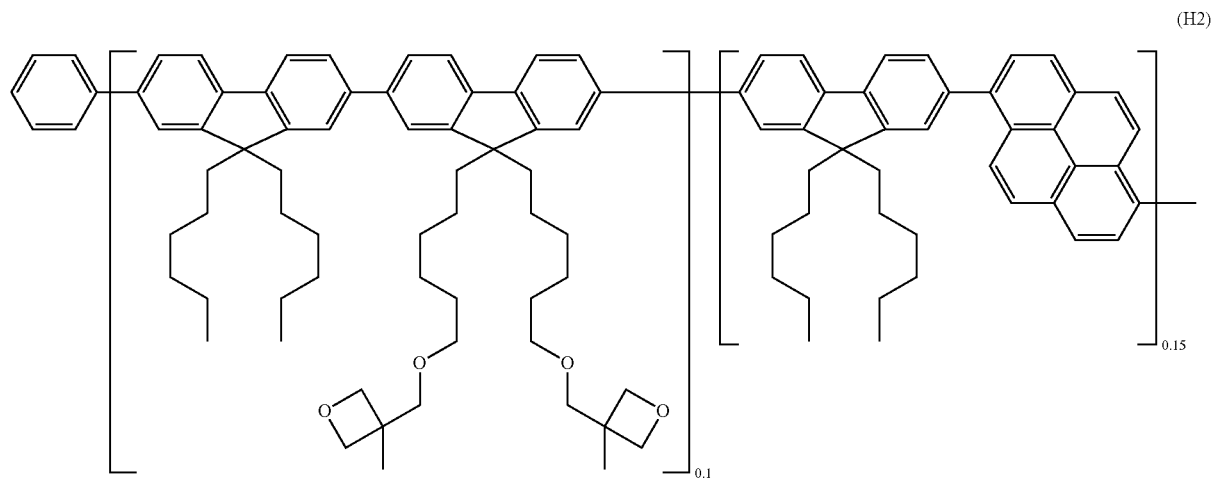

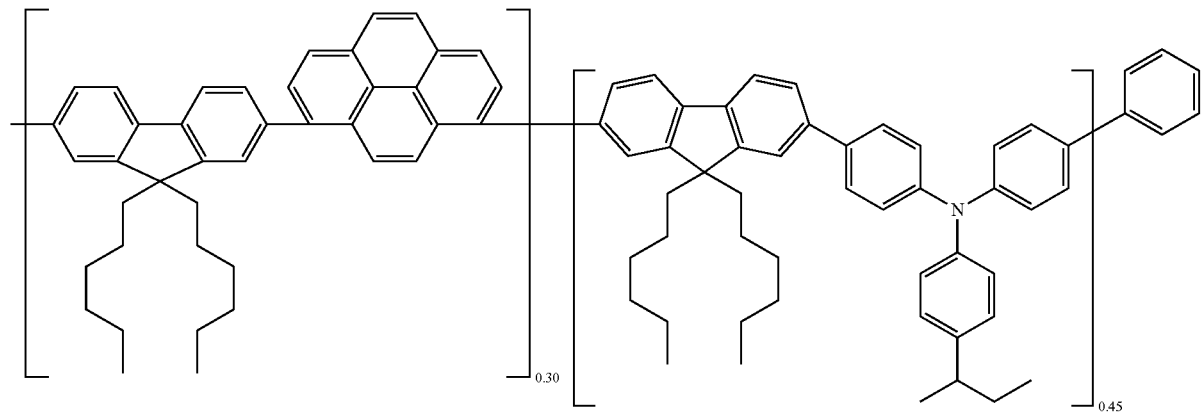

In the manner as above, an organic electroluminescence element having a light emission area part with a size of 2 mm×2 mm was obtained. The light emission characteristics of the device are as follows:

Brightness/current: 18.5 [cd/A] @ 100 cd/m$^2$
Voltage: 6.1 [V] @ 100 cd/m$^2$
Current efficiency: 9.5 [lm/W] @ 100 cd/m$^2$ The maximum wavelength of the light emission spectrum of the device was 516 nm, and this was identified as one from the iridium complex (D2). The chromaticity was CIE (x, y)=(0.311, 0.622).

The brightness half-value period at an initial brightness of 2500 cd/m$^2$ in room temperature driving of the thus-obtained organic electroluminescence element is shown below.

TABLE 6

| | Voltage [V] @ 100 cd/m$^2$ | Current Efficiency [lm/W] @ 100 cd/m$^2$ | Standardized Drive Lifetime relative to 1 of Comparative Example 1 |
|---|---|---|---|
| Example 1 | 5.5 | 9.7 | 1.1 |
| Comparative Example 1 | 6.1 | 9.5 | 1.0 |

Example 2

An organic electroluminescence element shown in FIG. 1 was constructed in the same manner as in Example 1, for which, however, the polymer compound (i) having the structural formula (H1) of the invention was changed to a polymer compound of the invention represented by the following structural formula (H3) (polymer 32 produced in Production Example 64) in forming the hole transport layer 4. In this, the thickness of the hole transport layer was 20 nm.

[Chemical Formula 102]

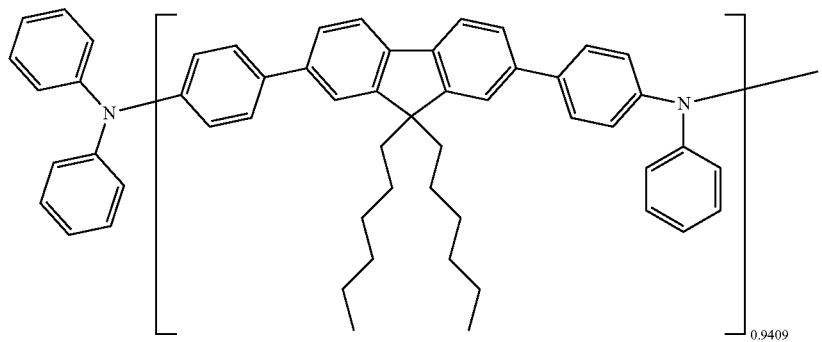

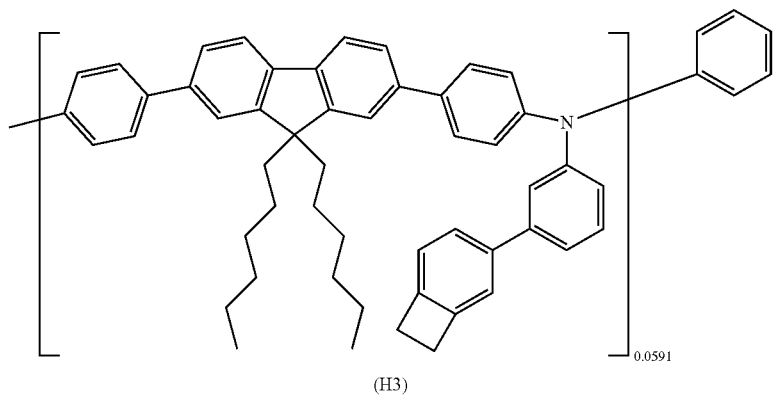

(H3)

The light emission characteristics of the obtained device are as follows:

Brightness/current: 13.4 [cd/A] @ 100 cd/m²

Voltage: 5.3 [V] @ 100 cd/m²

Current efficiency: 7.5 [lm/W] @ 100 cd/m²

Comparative Example 2

An organic electroluminescence element shown in FIG. 1 was constructed in the same manner as in Example 1, for which, however, the polymer compound (i) having the structural formula (H1) of the invention was changed to a polymer compound represented by the following structural formula (H4) (comparative polymer 9 produced in Comparative Production Example 9) in forming the hole transport layer 4. In this, the thickness of the hole transport layer was 20 nm.

[Chemical Formula 103]

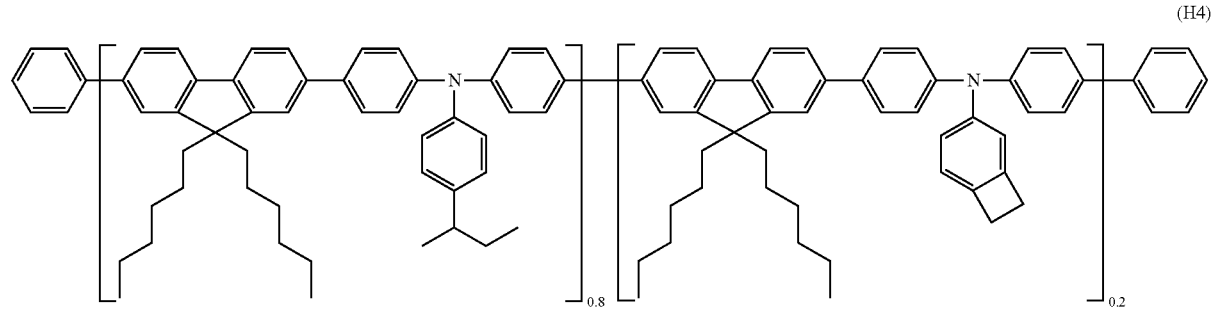

(H4)

The light emission characteristics of the obtained device are as follows:

Brightness/current: 17.1 [cd/A] @ 100 cd/m²
Voltage: 5.5 [V] @ 100 cd/m²
Current efficiency: 9.7 [lm/W] @ 100 cd/m²

The voltage and the current efficiency at 100 cd/m², and the drive lifetime at an initial brightness of 2,500 cd/m², as standardized relative to the value in Comparative Example 2, of the organic electroluminescence elements obtained in Example 2 and Comparative Example 2 are shown in Table 7.

TABLE 7

|  | Voltage [V] @ 100 cd/m² | Standardized Drive Lifetime relative to 1 of Comparative Example 2 |
|---|---|---|
| Example 2 | 5.3 | 1.1 |
| Comparative Example 2 | 5.5 | 1.0 |

As shown in Table 7, it is known that the organic electroluminescence element constructed by the use of the polymer compound of the invention has a low drive voltage and a long drive lifetime.

Example 3

An organic electroluminescence element was constructed in the same manner as in Example 2, for which, however, the light emission layer 5 was formed as follows:

A composition for organic electroluminescence element was prepared, comprising a compound represented by the following structural formula (E5) and a compound repre sented by the following structural formula (D3); and this was formed into a film according to spin coating under the condition mentioned below, and heated to give a light emission layer 5 having a thickness of 40 nm.

[Chemical Formula 104]

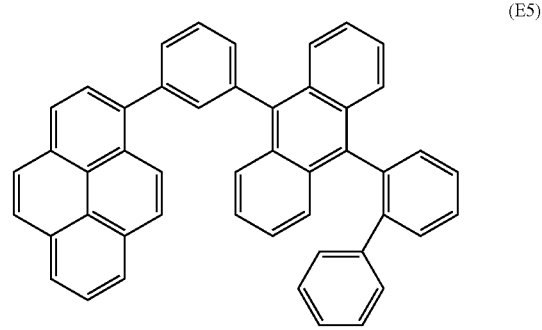

(E5)

(D3)

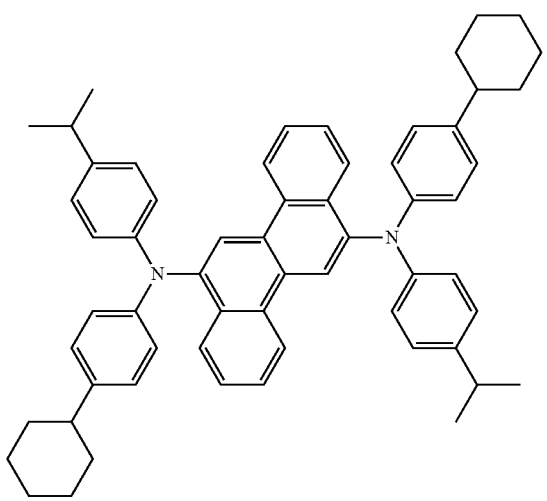

<Coating Liquid for Forming Light Emission Layer>

| Solvent | toluene |
|---|---|
| Coating liquid concentration | (E5) 0.80% by weight |
| | (D3) 0.08% by weight |

[Chemical Formula 105]

<Condition for Forming Light Emission Layer>

| Number of spinner rotations | 1500 rpm |
|---|---|
| Spinner rotation time | 30 seconds |
| Spin coating atmosphere | in nitrogen |
| Heating condition | 130° C., 1 hour, under reduced pressure (0.1 MPa) |

The light emission characteristics of the obtained device are as follows:

Brightness/current: 4.3 [cd/A] @ 1,000 cd/m$^2$

Voltage: 8.1 [V] @ 1,000 cd/m$^2$

Example 4

An organic electroluminescence element shown in FIG. 1 was constructed in the same manner as in Example 3, for which, however, the polymer compound having the structural formula (H3) of the invention was changed to a polymer compound of the invention represented by the following structural formula (H5) (polymer 2 produced in Production Example 34) in forming the hole transport layer 4. In this, the thickness of the hole transport layer was 20 nm.

(H5)

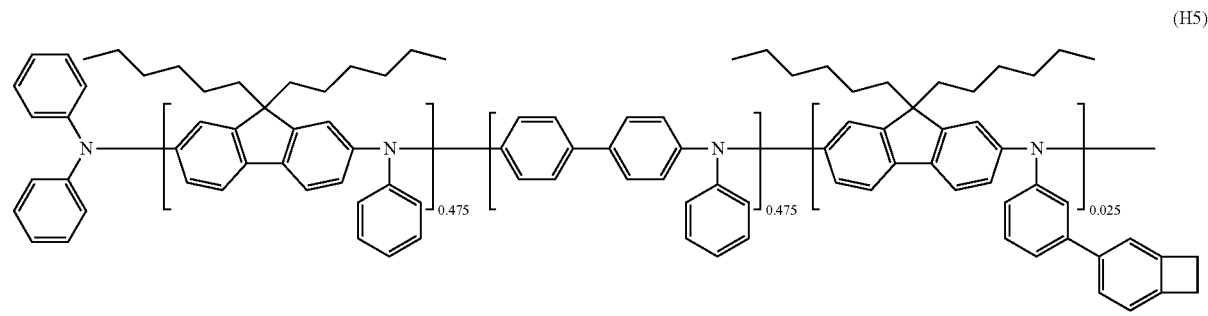

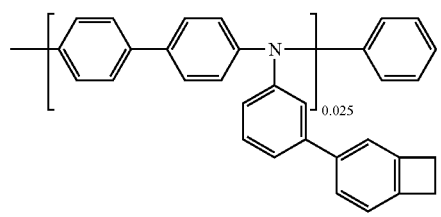

The light emission characteristics of the obtained device are as follows:
Brightness/current: 2.7 [cd/A] @ 1,000 cd/m²
Voltage: 6.6 [V] @ 1,000 cd/m²

Example 5

An organic electroluminescence element shown in FIG. 1 was constructed in the same manner as in Example 3, for which, however, the polymer compound having the structural formula (H3) of the invention was changed to a polymer compound (ii) of the invention represented by the following structural formula (H6) (polymer 12 produced in Production Example 44) in forming the hole transport layer 4. In this, the thickness of the hole transport layer was 20 nm.

[Chemical Formula 105]

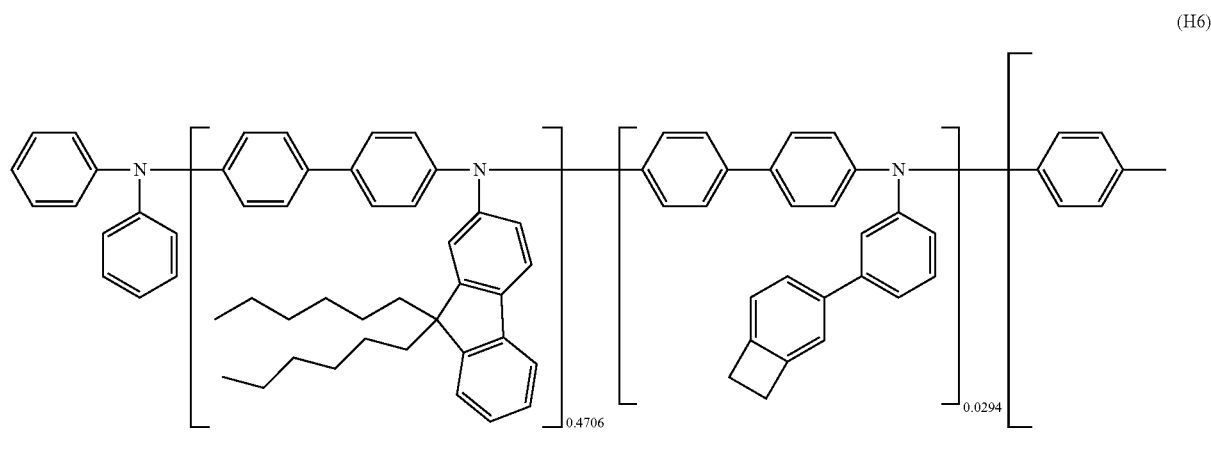

(H6)

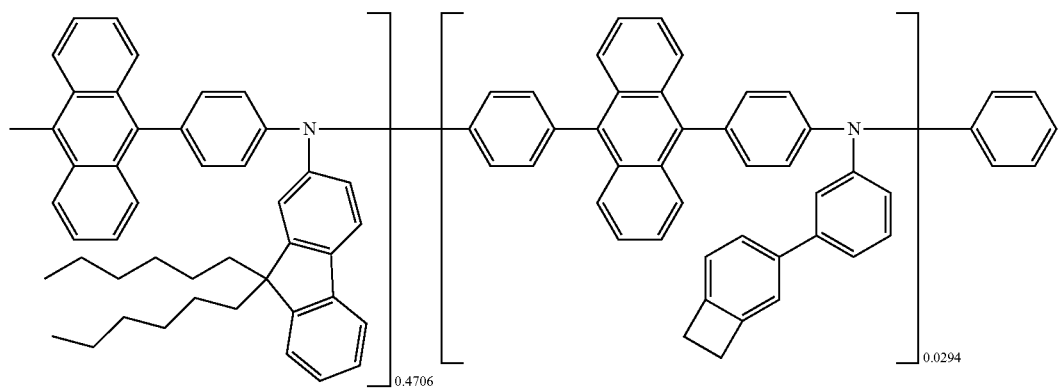

The light emission characteristics of the obtained device are as follows:
Brightness/current: 3.9 [cd/A] @ 1,000 cd/m²
Voltage: 6.9 [V] @ 1,000 cd/m²

Example 6

An organic electroluminescence element shown in FIG. 1 was constructed in the same manner as in Example 3, for which, however, the polymer compound having the structural formula (H3) of the invention was changed to a polymer compound (ii) of the invention represented by the following structural formula (H7) (polymer 24 produced in Production Example 56) in forming the hole transport layer 4. In this, the thickness of the hole transport layer was 20 nm.

[Chemical Formula 107]

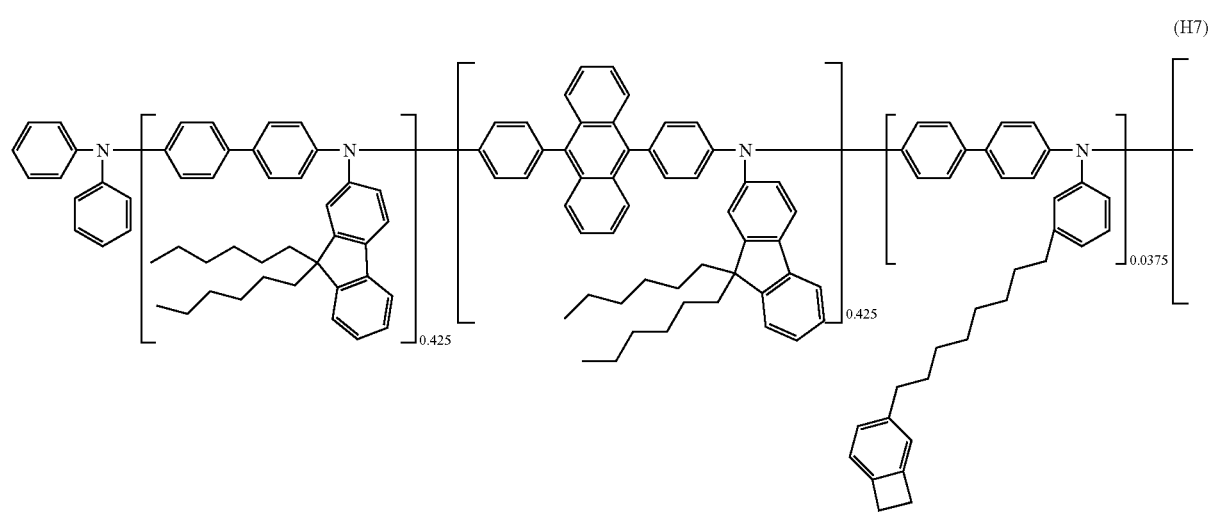

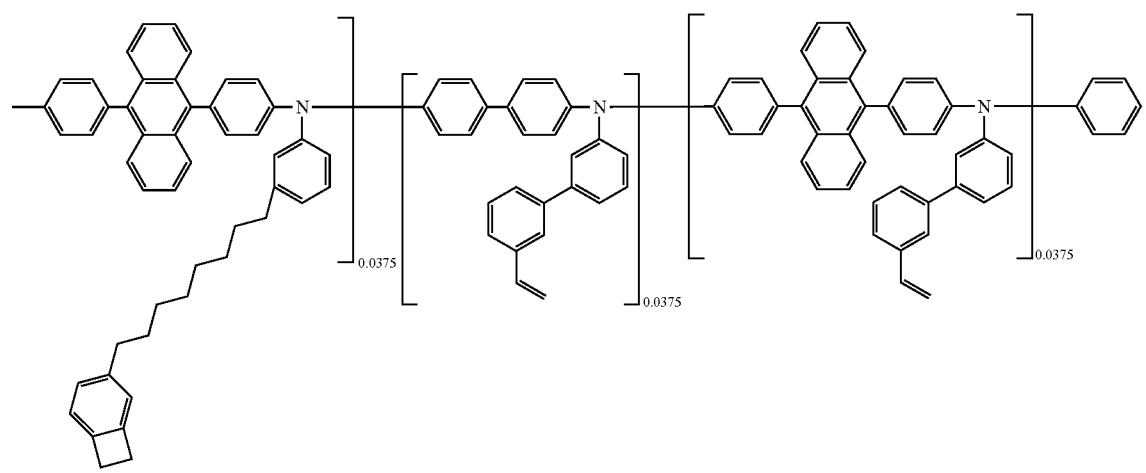

The light emission characteristics of the obtained device are as follows:

Brightness/current: 4.0 [cd/A] @ 1,000 cd/m²

Voltage: 7.7 [V] @ 1,000 cd/m²

Example 7

An organic electroluminescence element shown in FIG. 1 was constructed in the same manner as in Example 3, for which, however, the polymer compound having the structural formula (H3) of the invention was changed to a polymer compound (ii) of the invention represented by the following structural formula (H8) (polymer 31 produced in Production Example 63) in forming the hole transport layer 4. In this, the thickness of the hole transport layer was 20 nm.

[Chemical Formula 108]

[Chemical Formula 109]

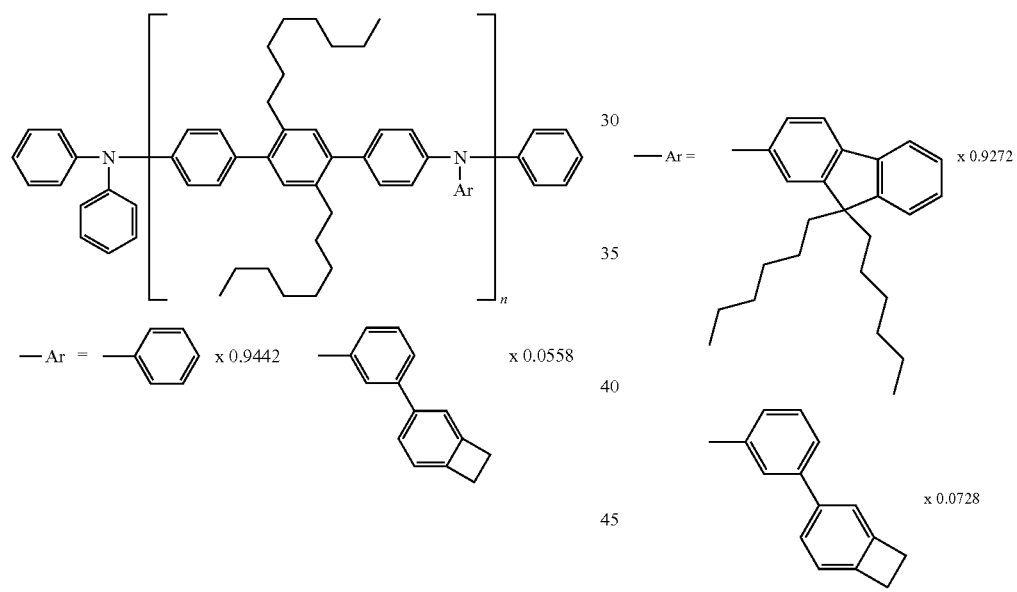

(H8)

(H9)

The light emission characteristics of the obtained device are as follows:

Brightness/current: 3.7 [cd/A] @ 1,000 cd/m²

Voltage: 8.1 [V] @ 1,000 cd/m²

Example 8

An organic electroluminescence element shown in FIG. 1 was constructed in the same manner as in Example 3, for which, however, the polymer compound having the structural formula (H3) of the invention was changed to a polymer compound (ii) of the invention represented by the following structural formula (H9) (polymer 8 produced in Production Example 40) in forming the hole transport layer 4. In this, the thickness of the hole transport layer was 20 nm.

The light emission characteristics of the obtained device are as follows:

Brightness/current: 3.8 [cd/A] @ 1,000 cd/m²

Voltage: 7.2 [V] @ 1,000 cd/m²

Comparative Example 3

An organic electroluminescence element shown in FIG. 1 was constructed in the same manner as in Example 3, for which, however, the polymer compound having the structural formula (H3) of the invention was changed to a polymer compound represented by the following structural formula (H10) (comparative polymer 3 produced in Comparative Production Example 3) in forming the hole transport layer 4. In this, the thickness of the hole transport layer was 20 nm.

[Chemical Formula 110]

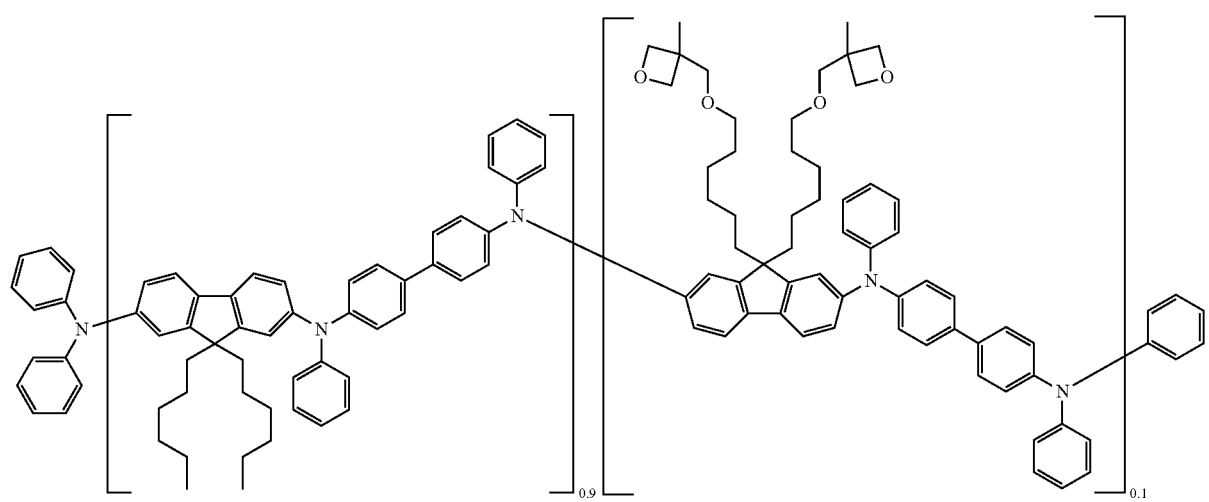

(H10)

The light emission characteristics of the obtained device are as follows:

Brightness/current: 2.9 [cd/A] @ 1,000 cd/m$^2$

Voltage: 8.5 [V] @ 1,000 cd/m$^2$

The voltage and the current efficiency at 1,000 cd/m$^2$, and the drive lifetime at an initial brightness of 1,000 cd/m$^2$, as standardized relative to the value in Comparative Example 3, of the organic electroluminescence elements obtained in Examples 3 to 8 and Comparative Example 3 are shown in Table 8.

TABLE 8

|  | Voltage [V] @ 1,000 cd/m$^2$ | Current Efficiency [cd/A] @ 1,000 cd/m$^2$ | Standardized Drive Lifetime relative to 1 of Comparative Example 3 |
| --- | --- | --- | --- |
| Example 3 | 8.1 | 4.3 | 2.0 |
| Example 4 | 6.6 | 2.7 | 2.4 |
| Example 5 | 6.9 | 3.9 | 1.5 |
| Example 6 | 7.7 | 4.0 | 1.5 |
| Example 7 | 8.1 | 3.7 | 1.5 |
| Example 8 | 7.2 | 3.8 | 1.4 |
| Comparative Example 3 | 8.5 | 2.9 | 1.0 |

As shown in Table 8, it is known that the organic electroluminescence elements constructed by the use of the polymer compound of the invention have a low drive voltage, a high current efficiency and a long drive lifetime.

Example 9

An organic electroluminescence element was constructed in the same manner as in Example 3, for which, however, the hole transport layer 4 and the light emission layer 5 were formed in the manner mentioned below. (Formation of Hole Transport Layer 4)

A hole transport layer having a thickness of 20 nm was formed in the same manner as in Example 3, for which, however, the polymer compound having the structural formula (H3) of the invention to form the hole transport layer 4 in Example 3 was changed to a polymer compound (ii) of the invention represented by the following structural formula (H11) (polymer 29 produced in Production Example 61).

[Chemical Formula 111]

(H11)

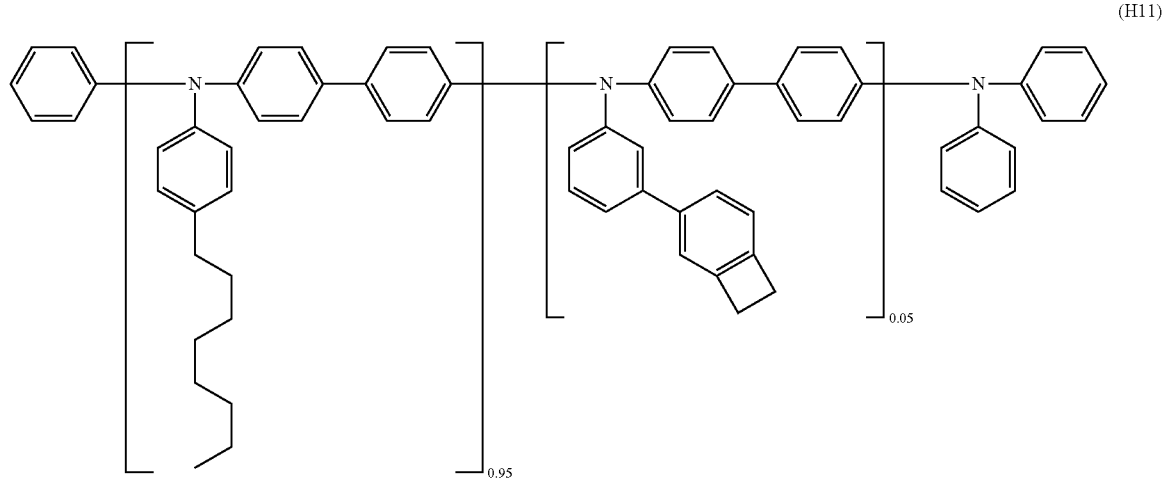

(Formation of Light Emission Layer)

A light emission layer 5 having a thickness of 47 nm was formed in the same manner as in Example 3, for which, however, the compound of the above formula (E5) was changed to a compound represented by the following structural formula (E6) and the composition of the light emission layer-forming coating liquid was changed as follows:

[Chemical Formula 112]

(E6)

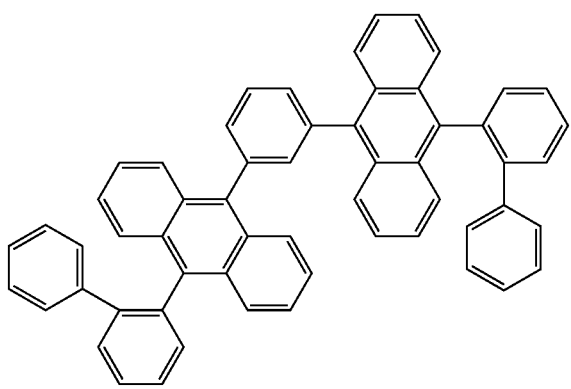

<Coating Liquid for Forming Light Emission Layer>

| Solvent | Cyclohexylbenzene |
|---|---|
| Coating Liquid Concentration | E6: 2.30% by weight |
| | D3: 0.23% by weight |

In the manner as above, an organic electroluminescence element having a light emission area part with a size of 2 mm×2 mm was obtained. The light emission characteristics of the device are as follows:

Brightness/current: 2.5 [cd/A] @ 100 cd/m$^2$

The maximum wavelength of the light emission spectrum of the device was 464 nm, and this was identified as one from the compound (D1). The chromaticity was CIE (x, y)=(0.142, 0.161).

Comparative Example 4

An organic electroluminescence element shown in FIG. 1 was constructed in the same manner as in Example 9, for which, however, the polymer compound (ii) having the structural formula (H11) of the invention was changed to a polymer compound represented by the following structural formula (H12) (comparative polymer 2 produced in Comparative Production Example 2) in forming the hole transport layer 4. In this, the thickness of the hole transport layer was 20 nm.

[Chemical Formula 113]

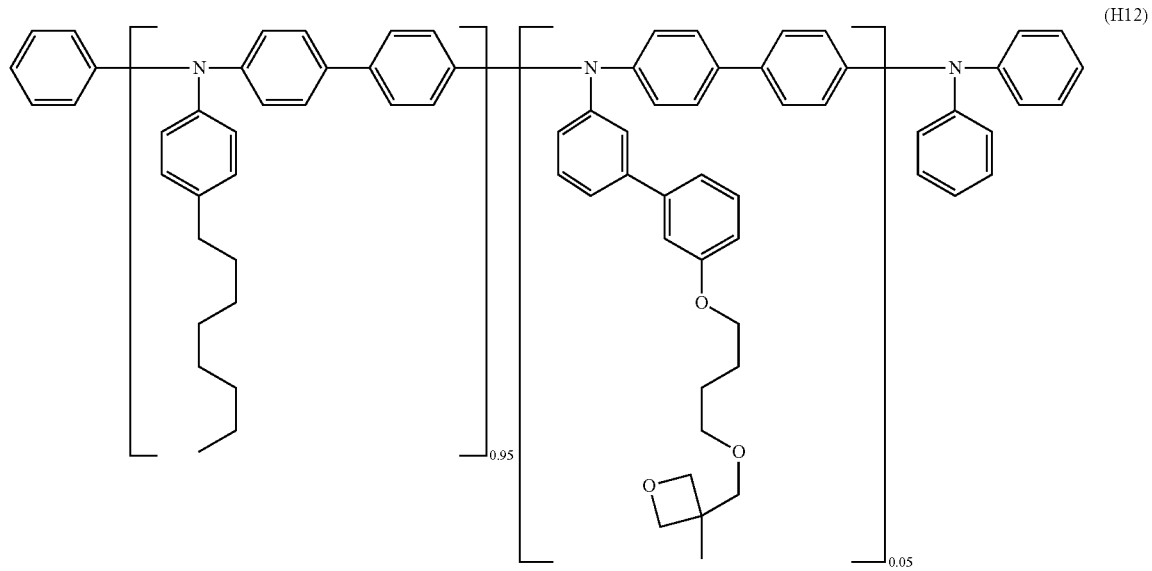

The light emission characteristics of the thus-constructed organic electroluminescence element having a light emission area part with a size of 2 mm×2 mm are as follows:

Brightness/current: 2.1 [cd/A] @ 100 cd/m$^2$

The maximum wavelength of the light emission spectrum of the device was 464 nm, and this was identified as one from the compound (D1). The chromaticity was CIE (x, y)=(0.143, 0.173).

The current efficiency at 100 cd/m$^2$ of the organic electroluminescence elements obtained in Example 9 and Comparative Example 4 is shown in Table 9.

TABLE 9

|  | Current Efficiency [cd/A] @ 100 cd/m$^2$ |
|---|---|
| Example 9 | 2.5 |
| Comparative Example 4 | 2.1 |

As shown in Table 9, the device constructed by the use of the polymer compound of the invention has a high current efficiency.

While the invention has been described in detail and with reference to specific embodiments thereof, it will be apparent to one skilled in the art that various changes and modifications can be made therein without departing from the spirit and scope thereof.

The present application is based on a Japanese patent application filed Apr. 2, 2008 (Japanese Patent Application No. 2008-096522), and the contents thereof are hereby incorporated by reference.

INDUSTRIAL APPLICABILITY

The polymer compound of the invention is favorably used in various fields where organic EL devices are used, for example, in the device of flat panels and displays (for example, for OA computers and wall-mounted televisions), light sources taking advantage of surface-emitting devices (for example, light sources for duplicators, backlight sources for liquid-crystal displays and meter gauges), sign boards, sign lamps, etc.

As having substantially excellent oxidation-reduction resistant stability, the polymer compound of the invention is useful not only for organic electroluminescence elements but also for general organic devices such as electrophotographic photoreceptors, organic solar cells, etc.

DESCRIPTION OF REFERENCE NUMERALS

1 Substrate
2 Anode
3 Hole injection Layer
4 Hole Transport Layer
5 Light Emission Layer
6 Hole Inhibition Layer
7 Electron Transport Layer
8 Electron Injection Layer
9 Cathode

The invention claimed is:

1. A polymer compound comprising a repeating unit represented by the following formula (I):

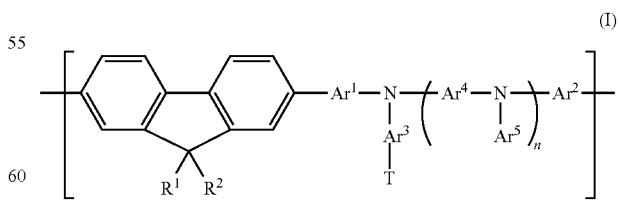

wherein $R^1$ and $R^2$ each independently represent a hydrogen atom, an aromatic hydrocarbon group optionally having a substituent except a crosslinking group, an aromatic heterocyclic group optionally having a substituent except a crosslinking group, or an alkyl group optionally having a substituent except a crosslinking group, $R^1$ and $R^2$ may bond to each other to form a ring;

n indicates an integer of from 0 to 3;

$Ar^1$ and $Ar^2$ each independently represent a direct bond, an aromatic hydrocarbon group optionally having a substituent, or an aromatic heterocyclic group optionally having a substituent;

$Ar^3$ to $Ar^5$ each independently represent an aromatic hydrocarbon group optionally having a substituent, or an aromatic heterocyclic group optionally having a substituent;

T represents a group comprising a crosslinking group, wherein the crosslinking group is selected from the group of crosslinking groups consisting of:

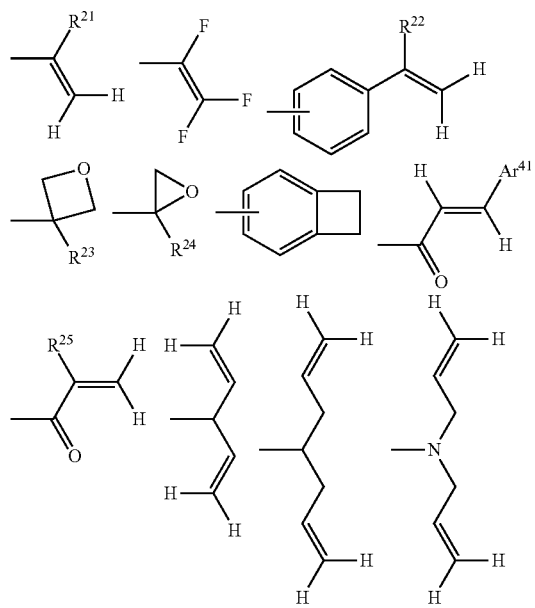

wherein $R^{21}$ and $R^{23}$ to $R^{25}$ each independently represent a hydrogen atom or an alkyl group; $Ar^{41}$ represents an aromatic hydrocarbon group optionally having a substituent, or an aromatic heterocyclic group optionally having a substituent;

the benzocyclobutene ring may have a substituent;

the substituents may together form a ring, provided that when $Ar^1$, $Ar^2$ and $Ar^4$ are fluorene rings, then they do not have a group comprising a crosslinking group as the substituent.

2. The polymer compound as claimed in claim 1, further comprising a repeating unit represented by the following formula (I'):

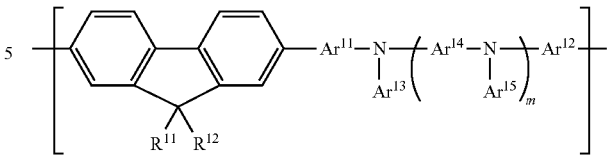

wherein $R^{11}$ and $R^{12}$ each independently represent a hydrogen atom, an aromatic hydrocarbon group optionally having a substituent, an aromatic heterocyclic group optionally having a substituent, or an alkyl group optionally having a substituent, $R^{11}$ and $R^{12}$ may bond to each other to form a ring;

m indicates an integer of from 0 to 3;

$Ar^{11}$ and $Ar^{12}$ each independently represent a direct bond, an aromatic hydrocarbon group optionally having a substituent, or an aromatic heterocyclic group optionally having a substituent;

$Ar^{13}$ to $Ar^{15}$ each independently represent an aromatic hydrocarbon group optionally having a substituent, or an aromatic heterocyclic group optionally having a substituent;

provided that $R^{11}$ and $R^{12}$, and $Ar^{11}$ to $Ar^{15}$ do not have a crosslinking group as the substituent.

3. A net-like polymer compound produced by a process comprising crosslinking the polymer compound of claim 1.

4. An organic electroluminescence element comprising, on a substrate, an anode, a cathode and an organic layer between the anode and the cathode, wherein the organic layer comprises a layer comprising the net-like polymer compound of claim 3.

5. The organic electroluminescence element as claimed in claim 4;

wherein the organic layer comprises a hole injection layer, a hole transport layer and a light emission layer, and all of the hole injection layer, the hole transport layer and the light emission layer are formed according to a wet film formation method.

6. An organic EL display, comprising the organic electroluminescence element of claim 4.

7. An organic EL lighting, comprising the organic electroluminescence element of claim 4.

8. The organic electroluminescence element as claimed in claim 4, wherein the layer comprising the net-like polymer compound is a hole injection layer or a hole transport layer.

9. A composition for organic electroluminescence element, comprising the polymer compound of claim 1.

* * * * *